United States Patent [19]

Nishizawa et al.

[11] Patent Number: 5,910,010
[45] Date of Patent: Jun. 8, 1999

[54] SEMICONDUCTOR INTEGRATED CIRCUIT DEVICE, AND PROCESS AND APPARATUS FOR MANUFACTURING THE SAME

[75] Inventors: Hirotaka Nishizawa, Kokubunji; Tomoyoshi Miura, Kodaira; Ichirou Anjou, Koganei; Masamichi Ishihara, Hamura; Masahiro Yamamura, Higashimurayama; Sadao Morita, Ome; Takashi Araki; Kiyoshi Inoue, both of Tokyo; Toshio Sugano, Kodaira; Tetsuji Kohara, Tokyo; Toshio Yamada, Hamura; Yasushi Sekine, Ome; Yoshiaki Anata, Hidaka; Masakatsu Goto, Atsugi; Norihiko Kasai, Sagamihara; Shinobu Takeura, Yamato; Mutsuo Tsukuda, Zama; Yasunori Yamaguchi, Fussa; Jiro Sawada, Kokubunji; Hidetoshi Iwai, Ome; Seiichiro Tsukui, Sayama; Tadao Kaji, Tokyo; Noboru Shiozawa, Ome, all of Japan

[73] Assignees: Hitachi, Ltd., Tokyo; Hitachi ULSI Engineering Corp., Kodaira; Hitachi Tohbu Semiconductor, Ltd., Moroyama-machi; Hitachi Hokkai Semiconductor, Ltd., Kameda-gun, all of Japan

[21] Appl. No.: 08/732,215

[22] PCT Filed: Apr. 5, 1995

[86] PCT No.: PCT/JP95/00662

§ 371 Date: Feb. 18, 1997

§ 102(e) Date: Feb. 18, 1997

[87] PCT Pub. No.: WO95/29506

PCT Pub. Date: Nov. 2, 1995

[30] Foreign Application Priority Data

Apr. 26, 1994 [JP] Japan .................................. 6-88973
Aug. 20, 1994 [JP] Japan .................................. 6-217814

[51] Int. Cl.$^6$ ........................... H01L 21/52; H01L 21/56; H01L 21/58; H01L 21/60

[52] U.S. Cl. .................................. 438/15; 438/16; 438/17; 438/109; 438/111; 438/112; 438/124; 264/272.17

[58] Field of Search .................................. 438/15, 16, 17, 438/109, 111, 112, 124, FOR 367, FOR 368, FOR 372, FOR 374, FOR 377, FOR 379, FOR 380, FOR 384, FOR 426; 264/272, 17

[56] References Cited

U.S. PATENT DOCUMENTS

| | | |
|---|---|---|
| 4,480,975 | 11/1984 | Plummer et al. . |
| 4,631,100 | 12/1986 | Pellegrino . |
| 4,915,607 | 4/1990 | Medders . |
| 5,032,438 | 7/1991 | Sakumoto et al. . |
| 5,241,454 | 8/1993 | Ameen . |
| 5,515,241 | 5/1996 | Werther . |
| 5,535,903 | 7/1996 | Fujioka . |
| 5,544,125 | 8/1996 | Yokoyama et al. . |

OTHER PUBLICATIONS

Electronic Materials, Sep. 1, 1993, Kogyo Chosakai, pp. 33–39.

*Primary Examiner*—David Graybill
*Attorney, Agent, or Firm*—Fay, Sharpe, Beall, Fagan, Minnich & McKee

[57] ABSTRACT

A method of manufacturing a semiconductor integrated circuit device includes the steps of constructing a plurality of lead frames having leads which each include an inner portion and an outer portion and electrically connecting a semiconductor chip to the inner portions of the leads of each frame. The lead frames are then stacked one above each other to form a vertical stack and plates are then inserted between each of the lead frames with each plate having an opening in the center whereby a central cavity is formed in the stack. The stack is then placed between a top mold member and a bottom mold member and a resin is injected into the central cavity whereupon the resin is cured to form a single resin package encapsulating the semiconductor chips. The resin package is then released from the mold members.

11 Claims, 135 Drawing Sheets

9(Vcc)   9   9   9(Vcc)

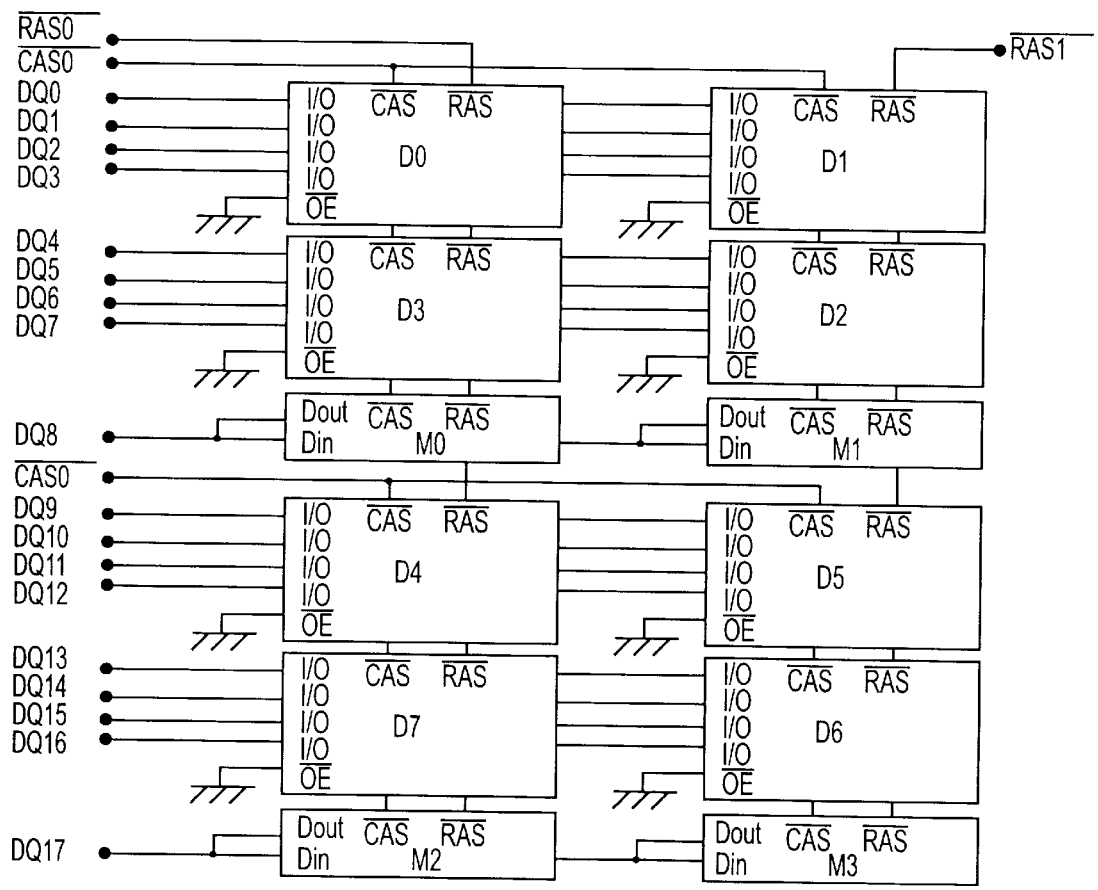
FIG. 79.1

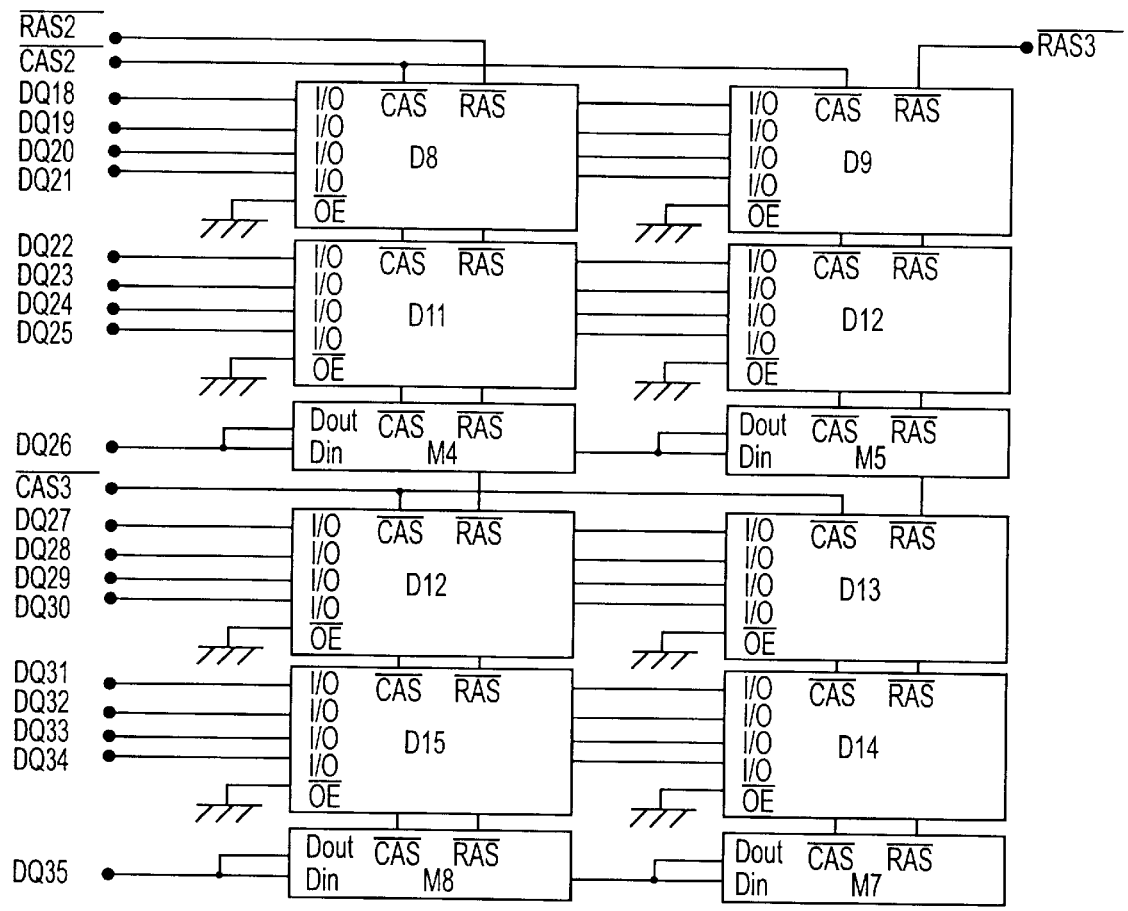
FIG. 79.2

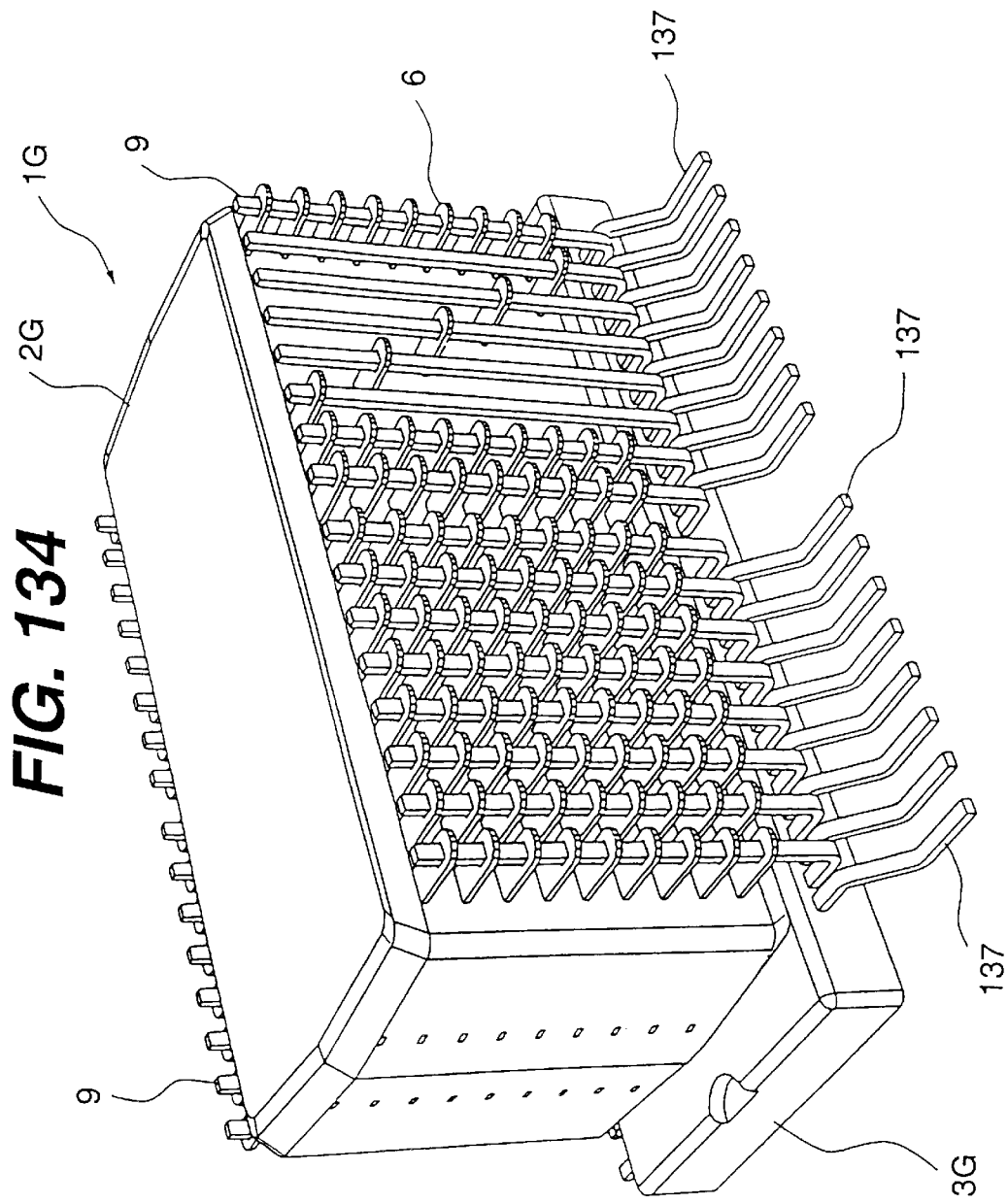

SEMICONDUCTOR INTEGRATED CIRCUIT DEVICE, AND PROCESS AND APPARATUS FOR MANUFACTURING THE SAME

TECHNICAL FIELD

The present invention relates to a semiconductor integrated circuit device and a technique for manufacturing it and, more particularly, to a technique which is effective when applied to a semiconductor integrated circuit device having a small-size/high-performance multi-chip module.

BACKGROUND ART

A memory module, as represented by the SIMM (i.e., Single In-line Memory Module), is widely utilized as a semiconductor memory to be mounted on an engineering workstation (EWS) or a computer. The SIMM is usually given a construction in which a semiconductor chip having a memory LSI such as a DRAM (Dynamic Random Access Memory) or a SRAM (Static Random Access Memory) is packaged into an LSI package such as an SOJ (Small Out-line J-leaded Package) and in which a plurality of semiconductor chips are mounted on one or both sides of a printed circuit board.

For the EWS or a parallel processing computer of recent years, however, there is required a memory (RAM) of large capacity for processing massive data at a high speed. In order to meet this requirement, therefore, a three-dimensional technique has been investigated for the memory module. This is because a system having an LSI package planarly (or two-dimensionally) over a printed circuit board has a larger size in the printed circuit board as the memory capacity grows larger.

As a specific example of a three-dimensional memory module, there is known the structure (as disclosed on pp. 33 to 39 of "Electronic Materials" issued on Sep. 1, 1993 by Kogyo Chosakai) in which several layers of very thin LSI packages such as TSOP (Thin Small Out-line Package) are stacked, with the printed circuit boards on their two side walls and in which the leads of the TSOP are held by the side boards.

According to the three-dimensional memory module of this kind, more LSI packages can be mounted on the printed circuit board of the same area to realize a small-size/large-capacity memory module. Moreover, the wiring length for connecting the packages can be made smaller than that of the case that the LSI packages are planarly mounted on the printed circuit board, to raise a great advantage in the aspect of high speed.

However, the three-dimensional memory module of the conventional structure, in which the very thin LSI packages such as TSOP are stacked, has found it difficult to reduce the size of the module and the heat resistance of the package at the same time.

Specifically, when the LSI packages such as TSOP are stacked, the thickness of the resin between the upper and lower semiconductor chips is doubled to increase the heat resistance of the package. In order to lower this heat resistance, therefore, a suitable gap has to be established between the packages so that the external size of the module in the vertical direction is enlarged.

Effective means for reducing the size of the three-dimensional memory module is to package a plurality of semiconductor chips into one package. With this means, the thickness of the resin between the upper and lower semiconductor chips is thinned to reduce not only the external size of the package in the vertical direction but also the heat resistance of the package.

Merely by packaging a plurality of semiconductor chips simply into one package, however, it is impossible to provide a highly reliable memory module. Specifically, when a plurality of semiconductor chips are packaged into one package, it is anticipated that the temperature difference between the center portion and the peripheral portion of the package may become large to cause a serious heat stress in the package. Hence, it is essential to provide a structure design for dissipating the heat of the central portion of the package quickly to the outside.

When a plurality of semiconductor chips are packaged into one package, their testing, screening and aging methods are serious problems. Specifically for the module in which a plurality of semiconductor modules are packaged into one package, none of the semiconductor chips can be replaced even if it is found defective after the packaging step. In order to improve the manufacture yield of the module, therefore, after the semiconductor chips are mounted on the lead frames and subjected to the wire bonding, it is necessary to perform the testing, screening and aging steps for confirming whether or not all the semiconductor chips are normally operating, immediately before the step of packaging the semiconductor chips. In the lead frames before packaged, however, all the leads are electrically connected through tie bars so that the lead frames cannot be tested, screened and aged as they are.

When a plurality of semiconductor chips are packaged into one package, on the other hand, the yield and through-put of the packaging step raise another problem. It is ordinary that the LSI package such as TSOP is molded by the insert molding method of injecting a resin into the gaps between the lead frames sandwiched between the upper part and the lower part. However, when the lead frames mounted with the semiconductor chips are stacked and packaged altogether, it is necessary to eliminate the difficulty which is encountered when parting the package from the conventional mold composed of the top and bottom forces. Other countermeasures are further required against the reluctant flow of the resin into the gaps between the stacked lead frames and against the voids (or clearances).

In the three-dimensional memory module of the conventional structure, on the other hand, all the semiconductor chips are mounted on the lead frames having the same pin array. However, the connections of the data pins are different for the individual semiconductor chips, the lead frames cannot be simply connected in the vertical direction if they have the same pin array. This makes it necessary to arrange the printed circuit board on both side walls of the stacked LSI packages as in the aforementioned memory module disclosed in the foregoing Publication, so that the reduction in the size of the module is restricted.

Moreover, it is difficult for the three-dimensional memory module having the conventional structure to be adapted to multiple bits. Specifically, a multi-bit device having a large data width such as a memory module of 36 bits has found it difficult to design the lead frames in a small size because of many data lines, so that the package size and the bonding wire length have to be increased. Thus, it has been difficult for the prior art to mount a multi-bit device on a small-sized memory module.

An object of the present invention is to provide a small-size/high-performance multi-chip module and a small-size/large-capacity memory module.

An object of the present invention is to provide a method for manufacturing a small-size/high-performance multi-chip module.

An object of the present invention is to provide an apparatus for manufacturing a small-size/high-performance multi-chip module.

Another object of the present invention is to provide a technique which can provide the small-size/ high-performance multi-chip module at a reasonable cost.

Another object of the present invention is to provide a technique which can reduce the size of the multi-chip module mounted with multi-bit devices.

Another object of the present invention is to provide a technique which can improve the heat radiation properties of the multi-chip module.

The foregoing and other objects and novel features of the present invention will become apparent from the following description to be made with reference to the accompanying drawings.

DISCLOSURE OF THE INVENTION

A semiconductor integrated circuit device according to the present invention is a multi-chip module constructed such that a resin package, in which a predetermined number of lead frames mounted with semiconductor chips are stacked and packaged, is mounted on a socket, and such that the outer leads of the lead frames led from the resin package, and the leads of the socket extending in the direction perpendicular to the direction in which the outer leads extend, are electrically connected. Using this multi-chip module, the plurality of semiconductor chips are packaged altogether into the package. As a result, the external size can be made far smaller than that of the module in which the LSI packages such as TSOP each having a resin-encapsulated semiconductor chip are stacked in several layers. By connecting the outer leads led from the package and the leads of the socket in a crossing manner, matrix-shaped heat dissipation paths can be formed to dissipate the heat at the central portion of the package quickly to the outside. Since the outer leads are led out from the side walls of the package to provide a leaf spring structure, the vertical expansion of the resin in the gaps between the stacked lead frames can be reduced.

According to the semiconductor integrated circuit device, in the aforementioned multi-chip module, the semiconductor chips encapsulated as a whole into the resin package, individually have multi-bit input/ output terminals, which partially have defective terminals not electrically connected to the lead frame, and the resin package has a predetermined number of input/output terminals connected electrically to the lead frames, in the entirety of the semiconductor chip. As a result, a multi-bit multi-chip module having normal input/ output terminals can be realized by bonding only the ordinary input/ output terminals of the multi-bit semiconductor chip having a defective terminal partially of the input/output terminals, selectively to the lead frames.

According to the semiconductor integrated circuit device, in the aforementioned multi-chip module, the outer leads of the lead frames led out from the resin packages, and the leads extending in the direction crossing the extending direction of the outer leads are electrically connected, and the lower end portions of the leads are formed into the shape of the letter J thereby to construct the external terminals of the resin package. As a result, the leads of the resin package can be connected directly to the printed circuit board so that the socket can be eliminated to reduce the number of parts. As a result, it is possible to lower the cost for the multi-chip module and to reduce the external size.

According to the semiconductor integrated circuit device of the present invention, when the multi-chip module is manufactured, a predetermined number of lead frames are packaged altogether by using a mold which is composed of top and bottom forces and a predetermined number of movable plates individually halved and inserted into the individual gaps between the predetermined number of lead frames. As a result, the package can be easily parted from the mold after the molding step merely by halving the individual movable plates to the right and left.

BRIEF DESCRIPTION OF THE DRAWINGS

FIG. 79 is an equivalent circuit diagram showing another embodiment of the DRAM module;

FIG. 125(a) is a diagram of a construction of the package and showing a method of manufacturing the module, in which an error correcting circuit is bult in.

FIG. 134 is a perspective view showing another embodiment of the DRAM module.

BEST MODE FOR CARRYING OUT THE INVENTION

The present invention will be described in more detail with reference to the accompanying drawings.

Figure 1:
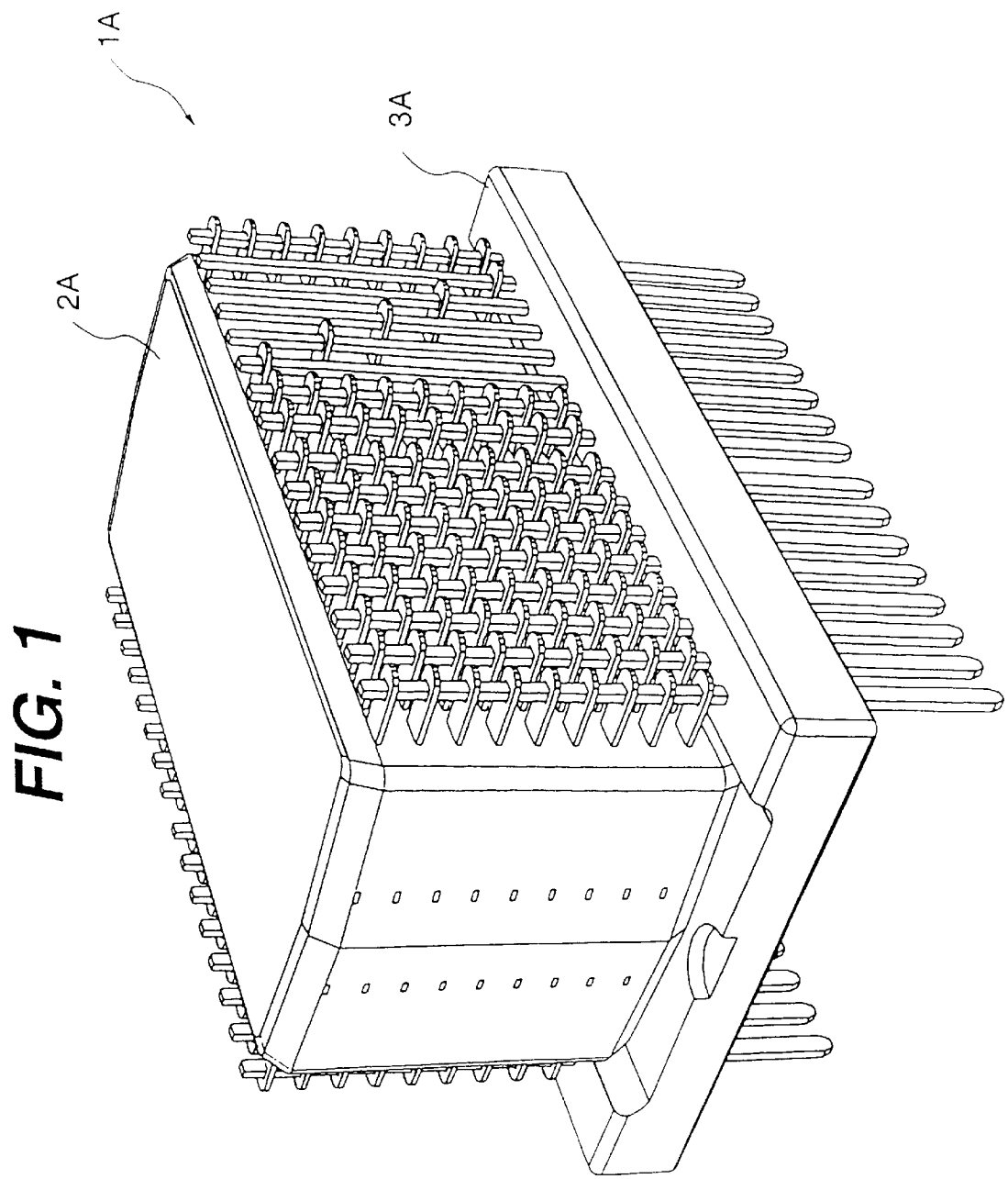
FIG. 1 is a front perspective view showing a DRAM module of one embodiment according to the present invention.
Figure 2:
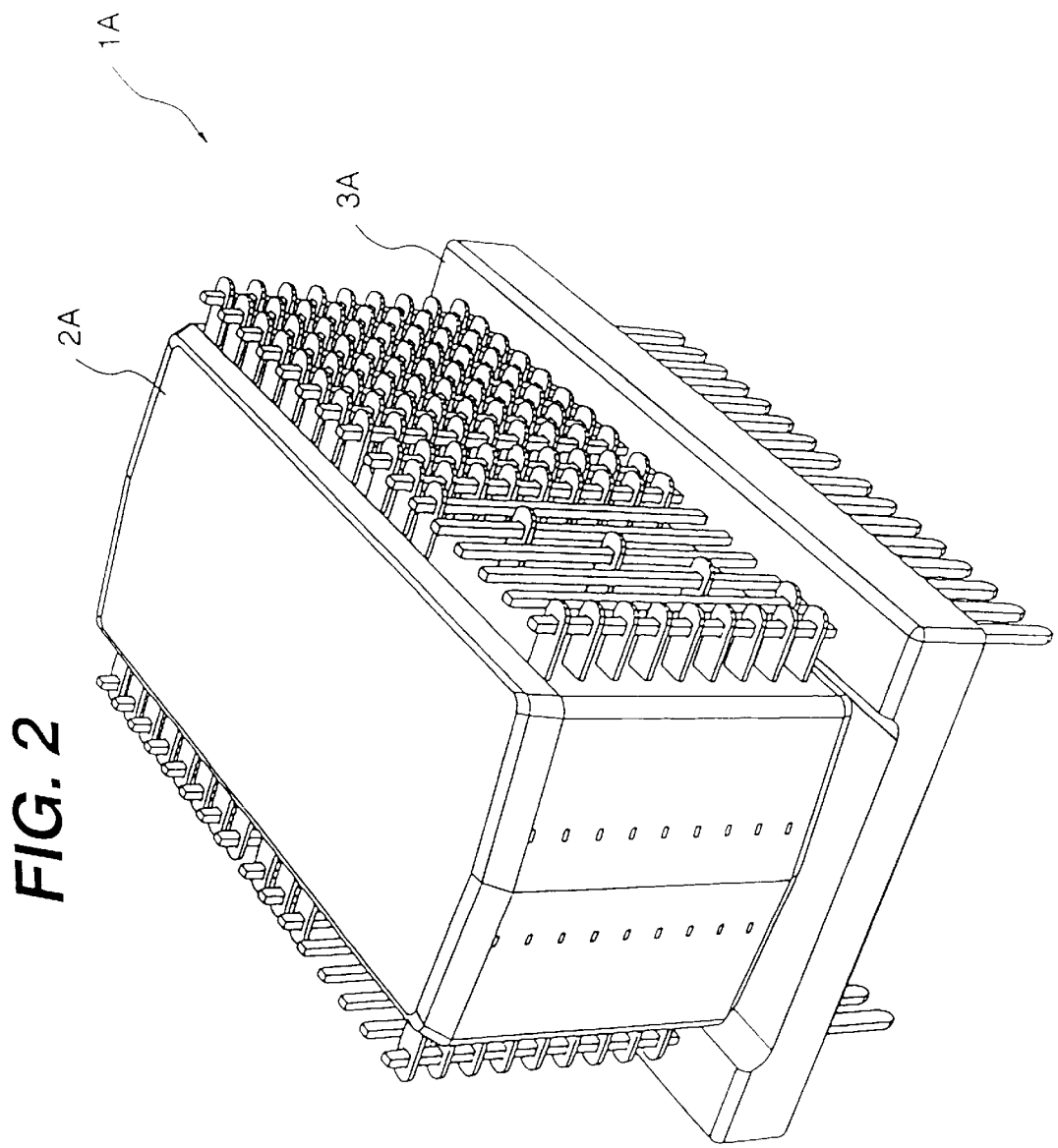
FIG. 2 is a back perspective view showing the DRAM module.
Figure 3:
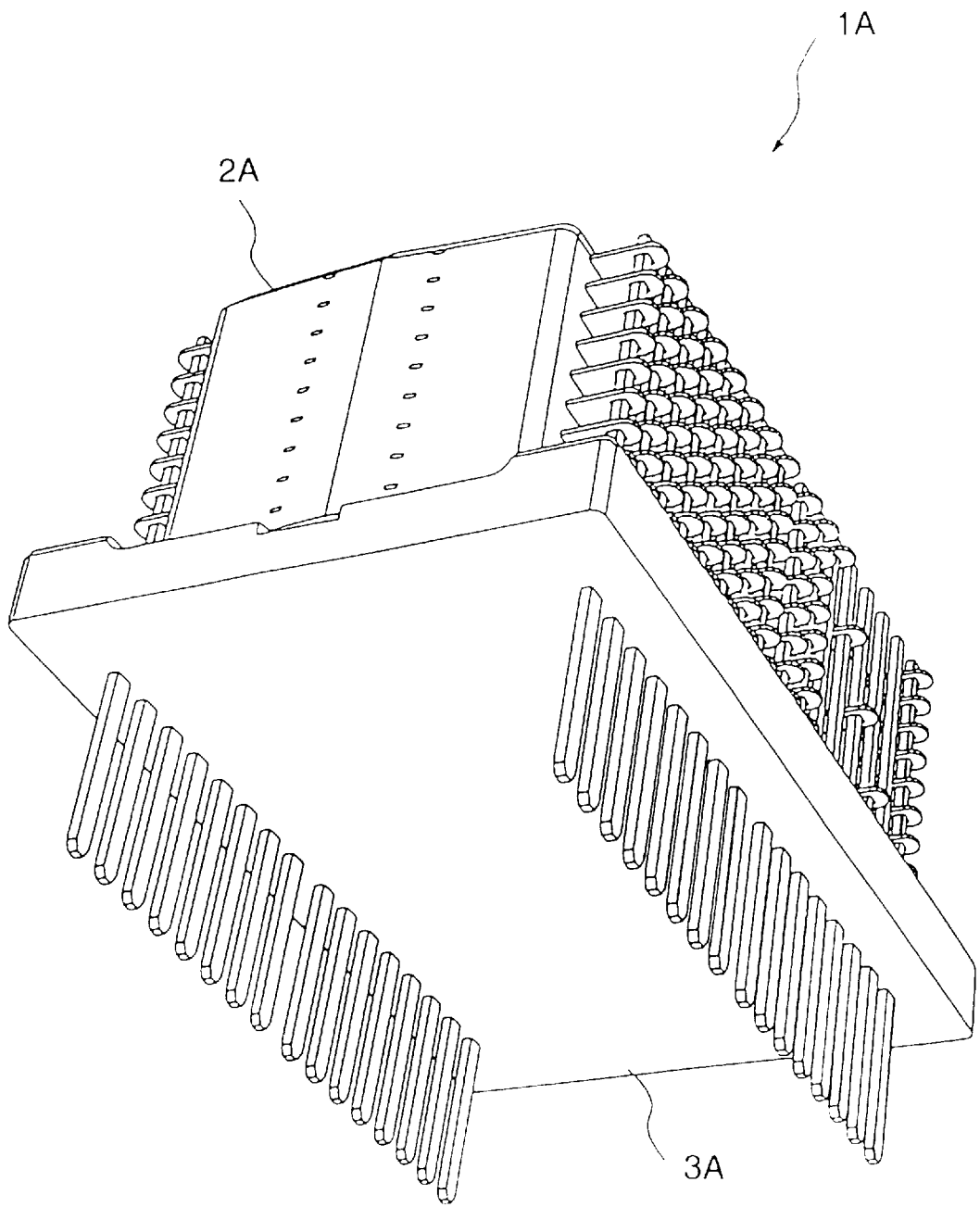
FIG. 3 is a bottom perspective view showing the DRAM module.
Figure 4:
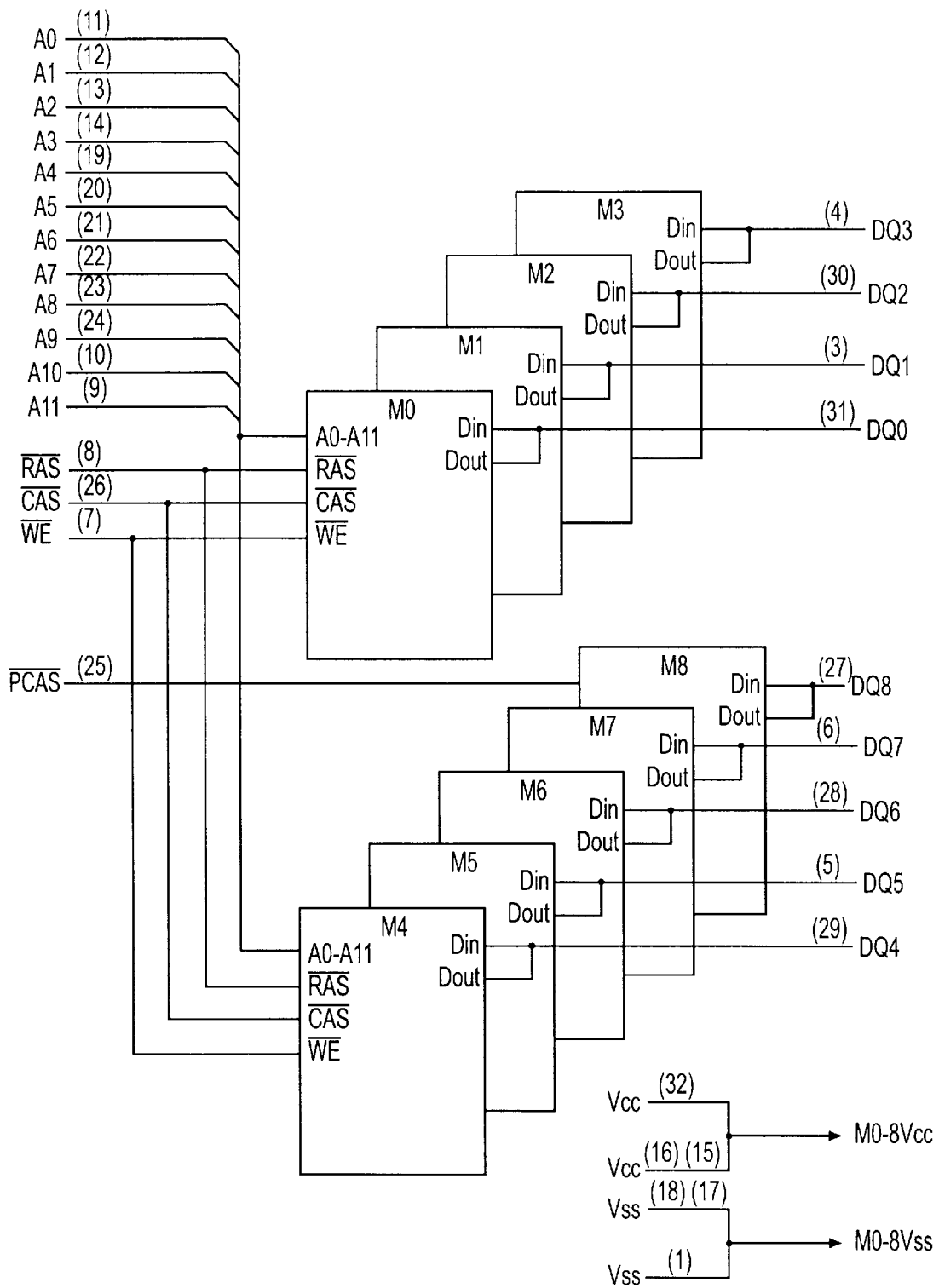
FIG. 4 is a block diagram showing the internal construction of the DRAM module.

FIG. 1 is a front perspective view showing a DRAM module of one embodiment according to the present invention; FIG. 2 is a rear perspective view showing the DRAM module; FIG. 3 is a rear perspective view showing the DRAM module; and FIG. 4 is a block diagram showing an internal construction of the DRAM module.

A DRAM module 1A of the present embodiment is constructed of a package 2A or the module body and a mother socket 3A mounted with the package 2A. The package 2A and mother socket 3A are made of a synthetic resin such as an epoxy resin or a heat resistant liquid crystal polymer and is insert-molded by using the later-described mold.

In the package 2A, there are so encapsulated nine semiconductor chips ($M_0$ to $M_8$) and totally nine sheets of lead frames mounted with the semiconductor chips ($M_0$ to $M_8$) individually that they are stacked vertically into the package 2A. In each of the nine semiconductor chips ($M_0$ to $M_8$), encapsulated in the package 2A, there is formed a CMOS-DRAM having a construction of [16777216 words×1 bit] and a large capacity of 16 Mbits. By connecting these nine semiconductor chips ($M_0$ to $M_8$), there is constructed the DRAM module having a construction of [16777216 words×9 bits], as shown in FIG. 4. In short, the DRAM module 1A of the present embodiment realizes a large capacity DRAM module for effecting the memory access in units of 9 bits by connecting in parallel the nine DRAM chips ($M_0$ to $M_8$) of 16 megabits [Mbits] for effecting the memory access in units of 1 bit.

Figure 5:
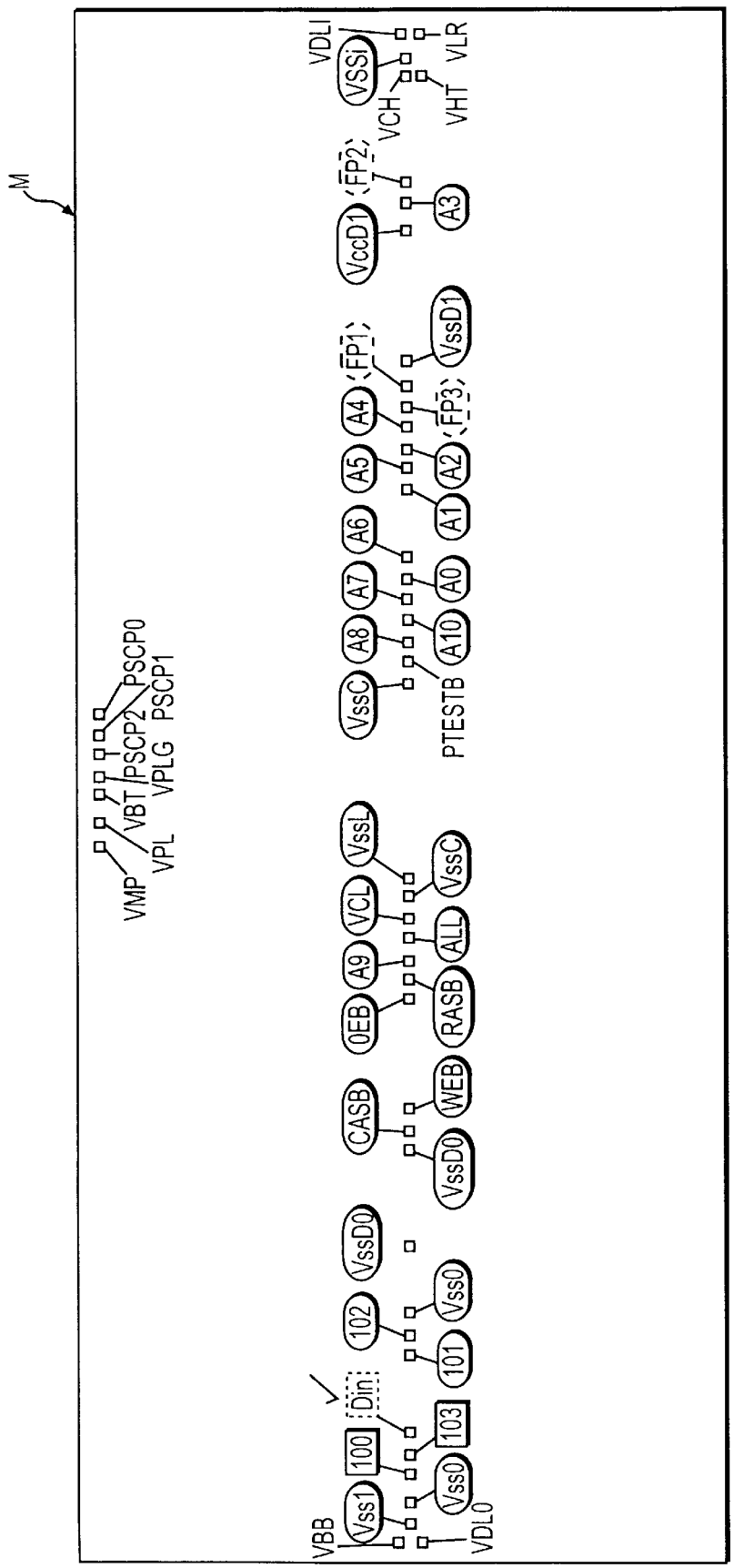
FIG. 5 is a top plan view showing a pad layout of the semiconductor chip used in the DRAM module.

FIG. 5 is a top plan view showing a pad layout of the aforementioned semiconductor chip (M) having the DRAM of 16 megabits [Mbits]. This semiconductor chip (M) is so constructed that the mode of [4194304 words×4 bits] and the mode of [16777216 words×1 bit] are switched by a bonding option. When the semiconductor chip (M) is to be operated in the [16777216 words×1 bit] mode, the shown FP2 pad is shorted to Vss (or GND). In order to prevent an increase in the number of pins (or terminals), on the other hand, the data input pin Din and the data output pin Dout of the semiconductor chip (M), as shown in FIG. 4, are internally connected to the common lead at the wire bonding time.

FIGS. 6 to 14 are top plan views showing the nine lead frames ($S_1$ to $S_9$) mounted with the aforementioned semiconductor chips ($M_0$ to $M_8$). In each of the lead frames ($S_1$ to $S_9$), there are arranged two rows of leads 6 in the long side direction. The number of the leads 6 is thirty two for each row of sixteen leads. The leading end or outer portion of each lead 6 has a square opening 8 into which is inserted the module lead of the later-described mother socket 3A. Each lead also has an inner portion adapted to be electrically connected to a semiconductor chip. In the outer periphery of the lead frames ($S_1$ to $S_9$), there are formed round openings 4, into which are inserted the guide pins of the later-described mold.

The patterns (or pin arrangements) of the leads 6 are individually designed for the lead frames ($S_1$ to $S_9$). Specifically, the pins to be commonly connected, including the power (and GND) pins, the address pins and the control signal pins, are commonly arranged among all the lead frames ($S_1$ to $S_9$), but the arrangements of the data input/output pins are different among the individual lead frames ($S_1$ to $S_9$). The power supply (and GND) pins are constructed as the bus bar lead. The power (and GND) pins are connected at a plurality of positions to the power pads (and GND pads) of the semiconductor chip so as to lower the wiring impedance.

Figure 6:
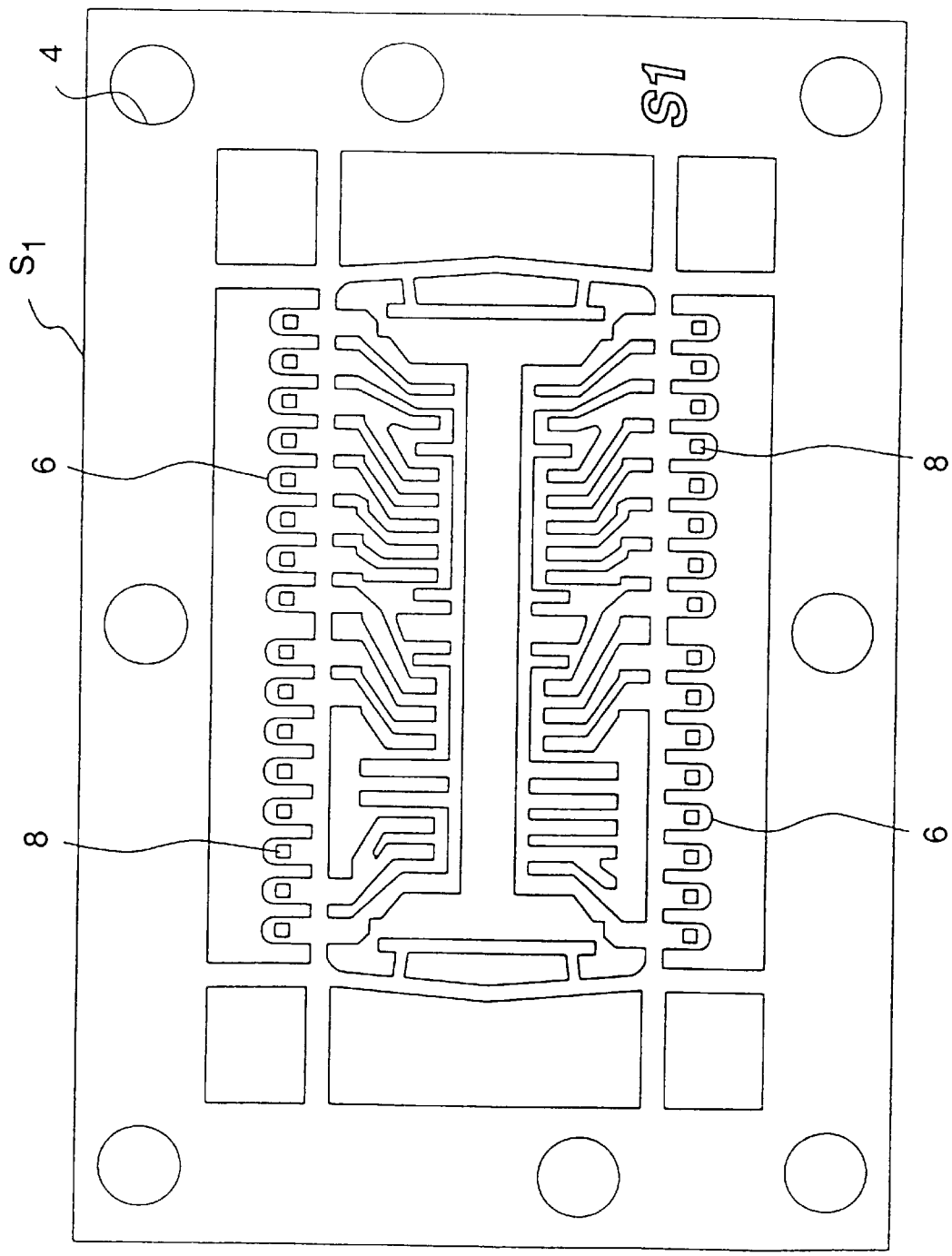
FIGS. 6 to 14 are top plan views of the nine lead frames mounted with the semiconductor chips.
Figure 7:
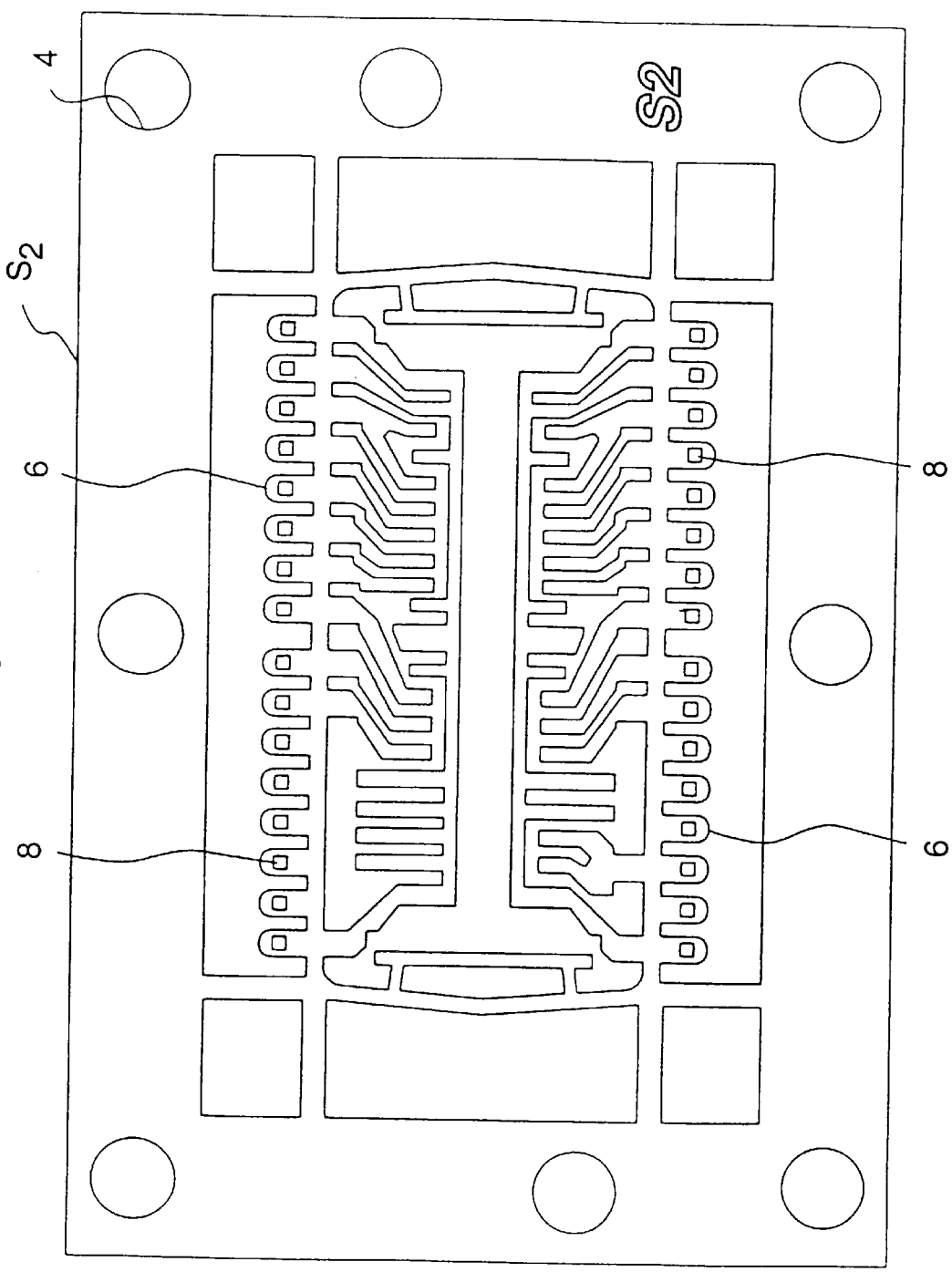
Figure 8:
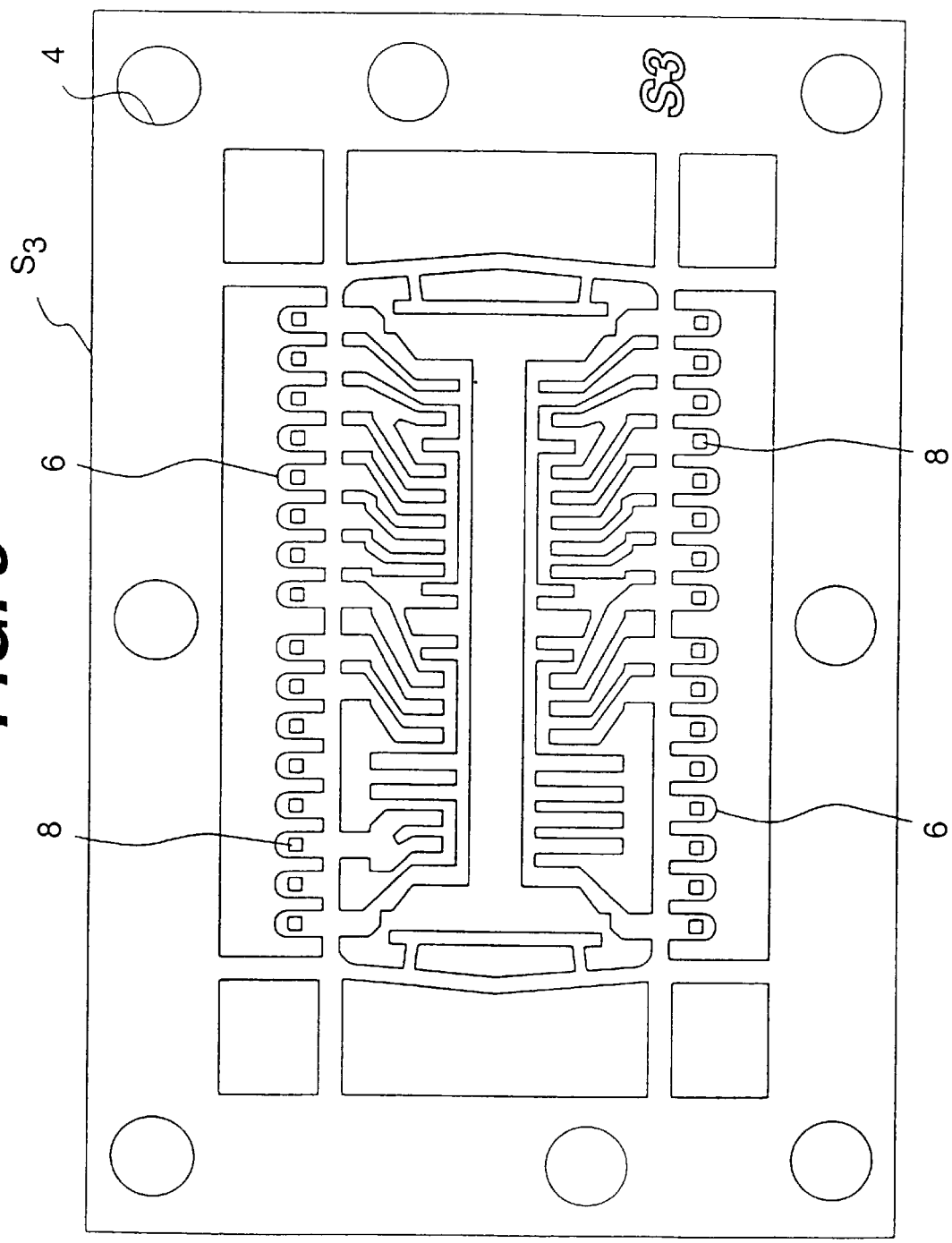
Figure 9:
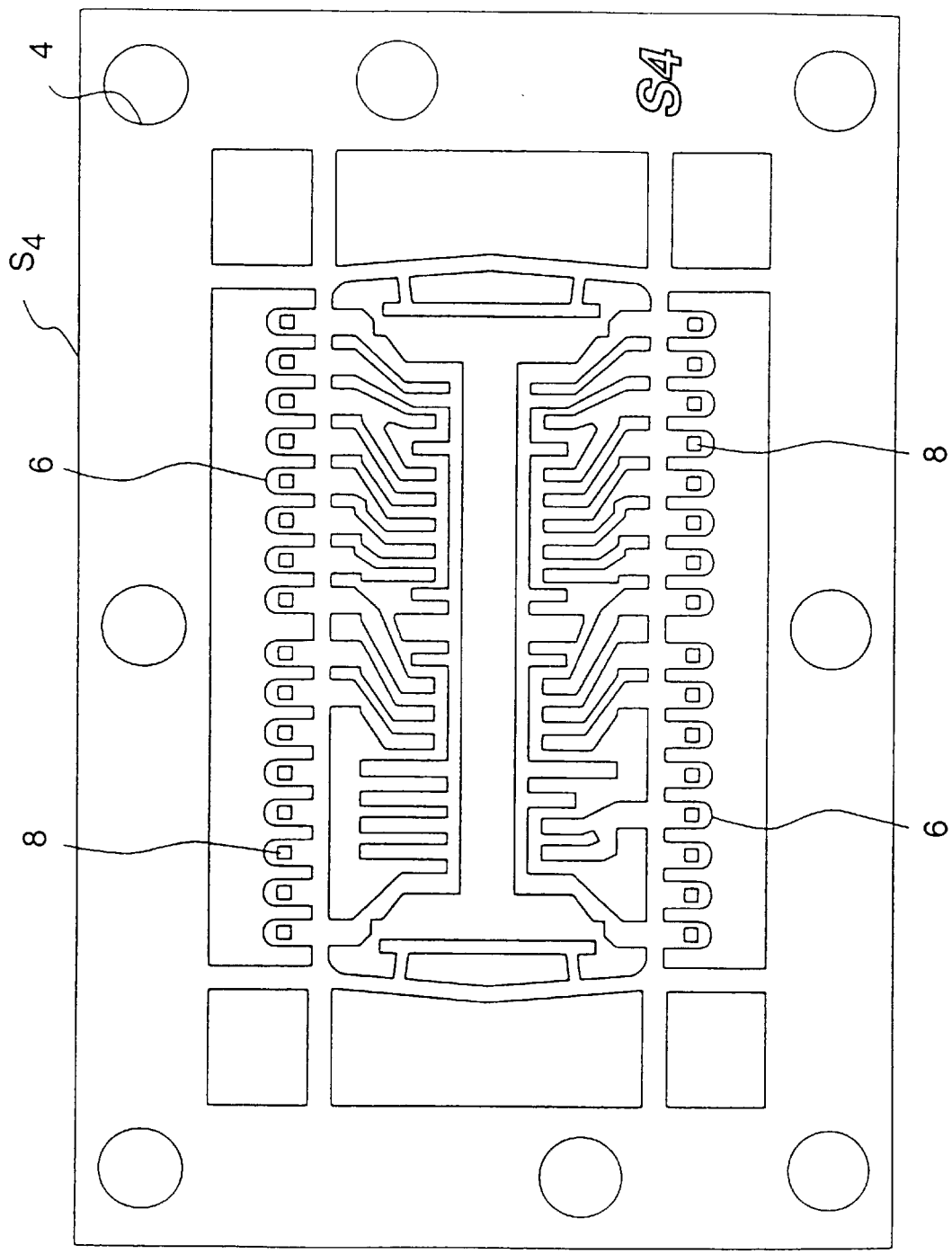
Figure 10:
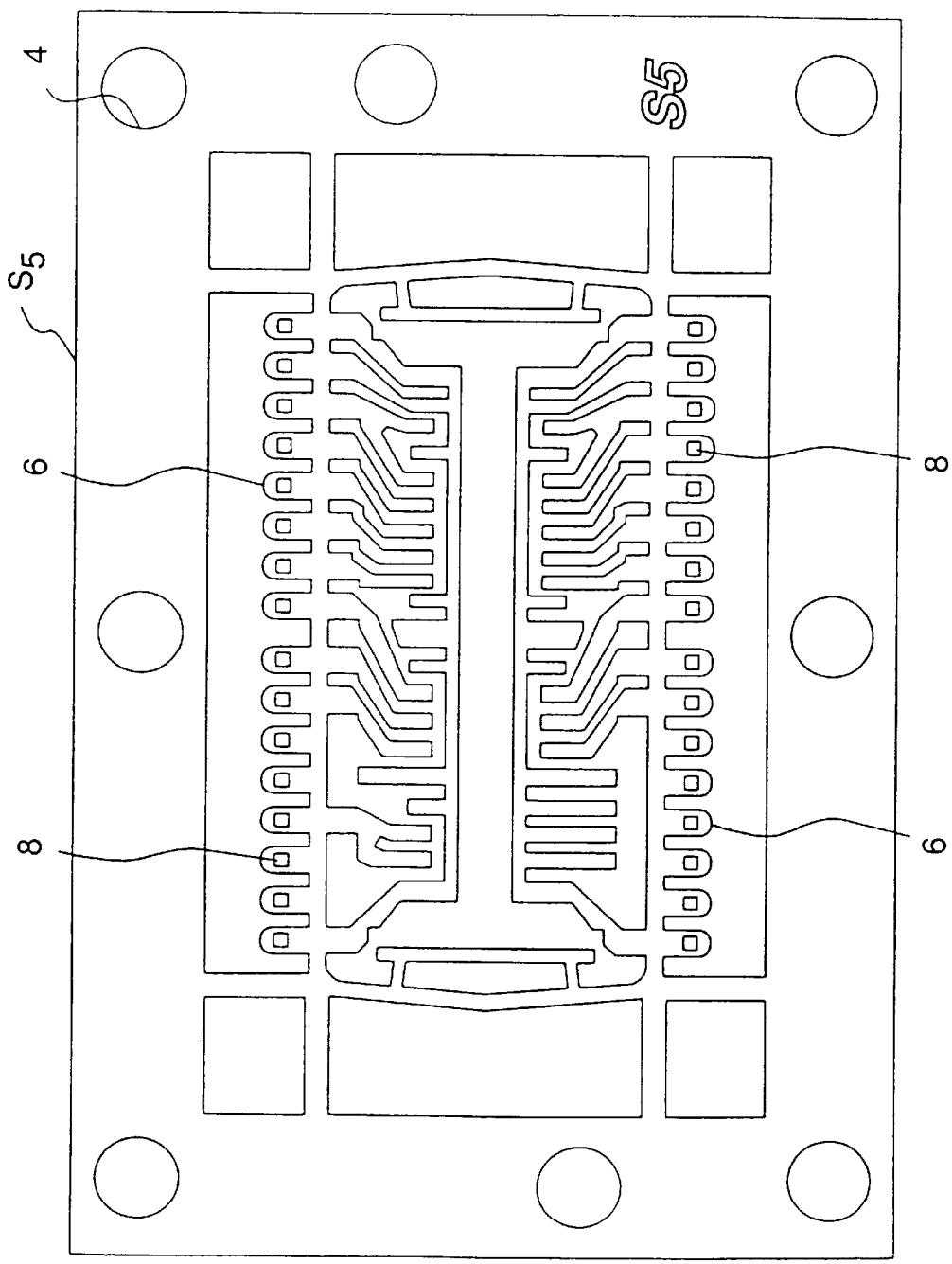
Figure 11:
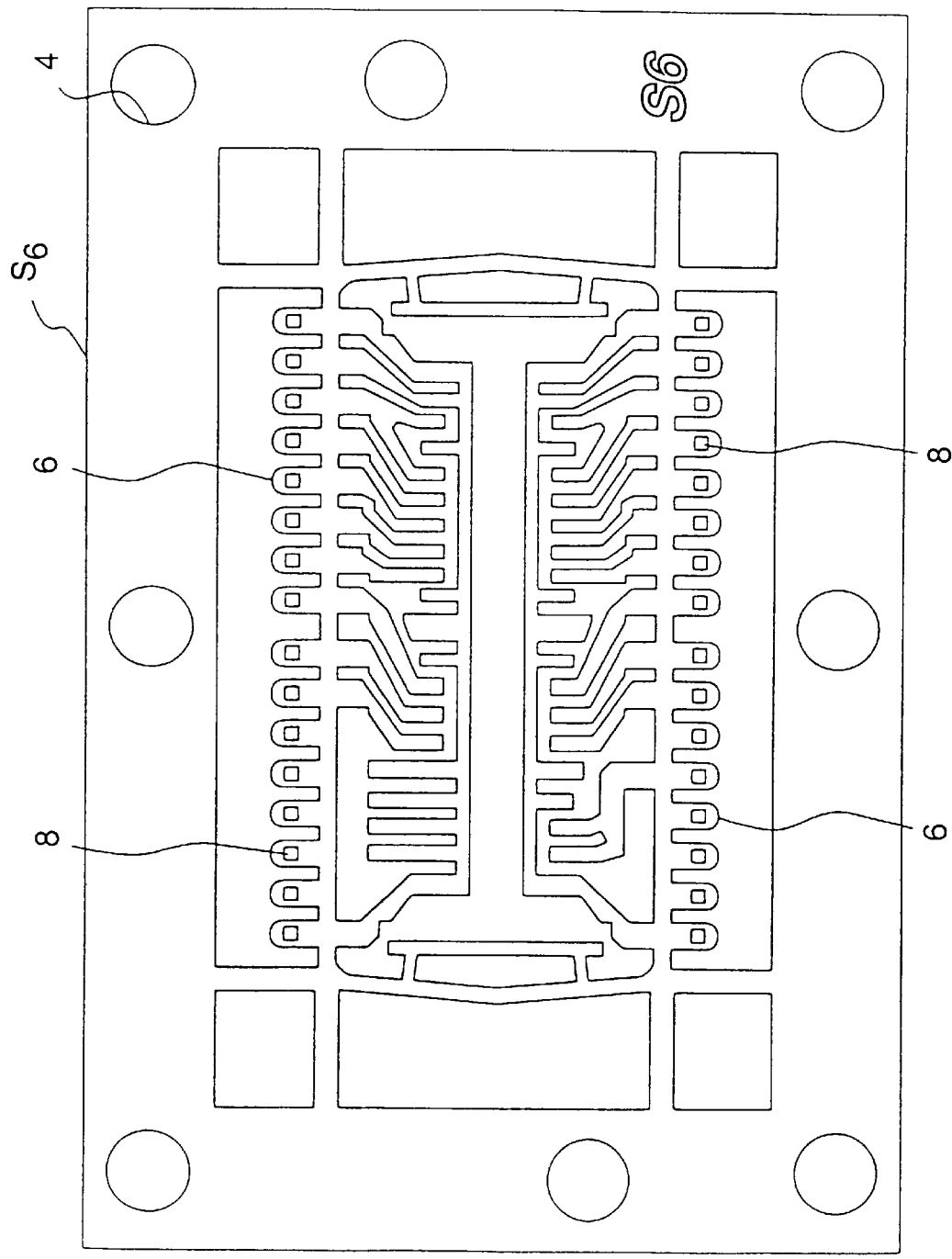
Figure 12:
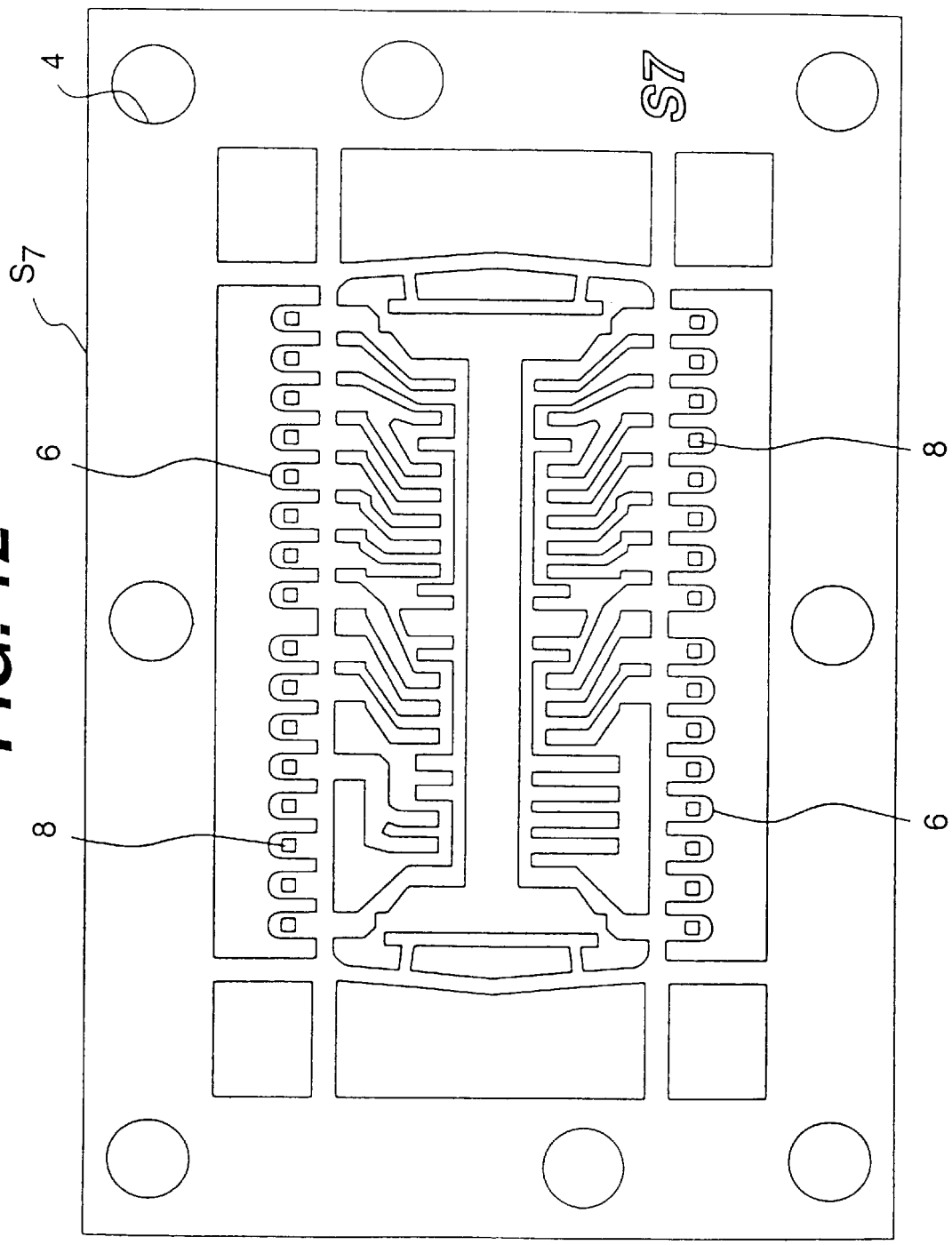
Figure 13:
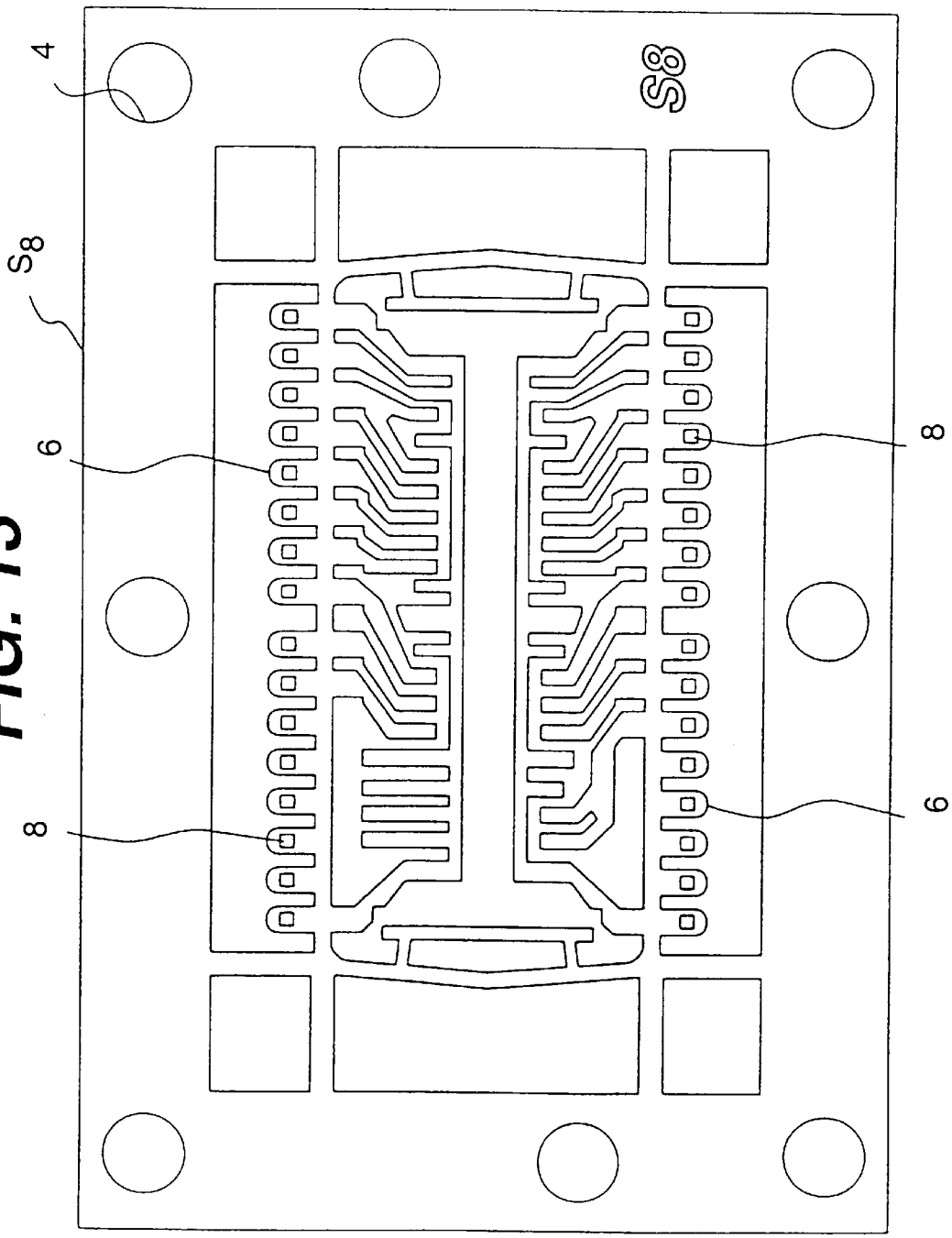
Figure 14:
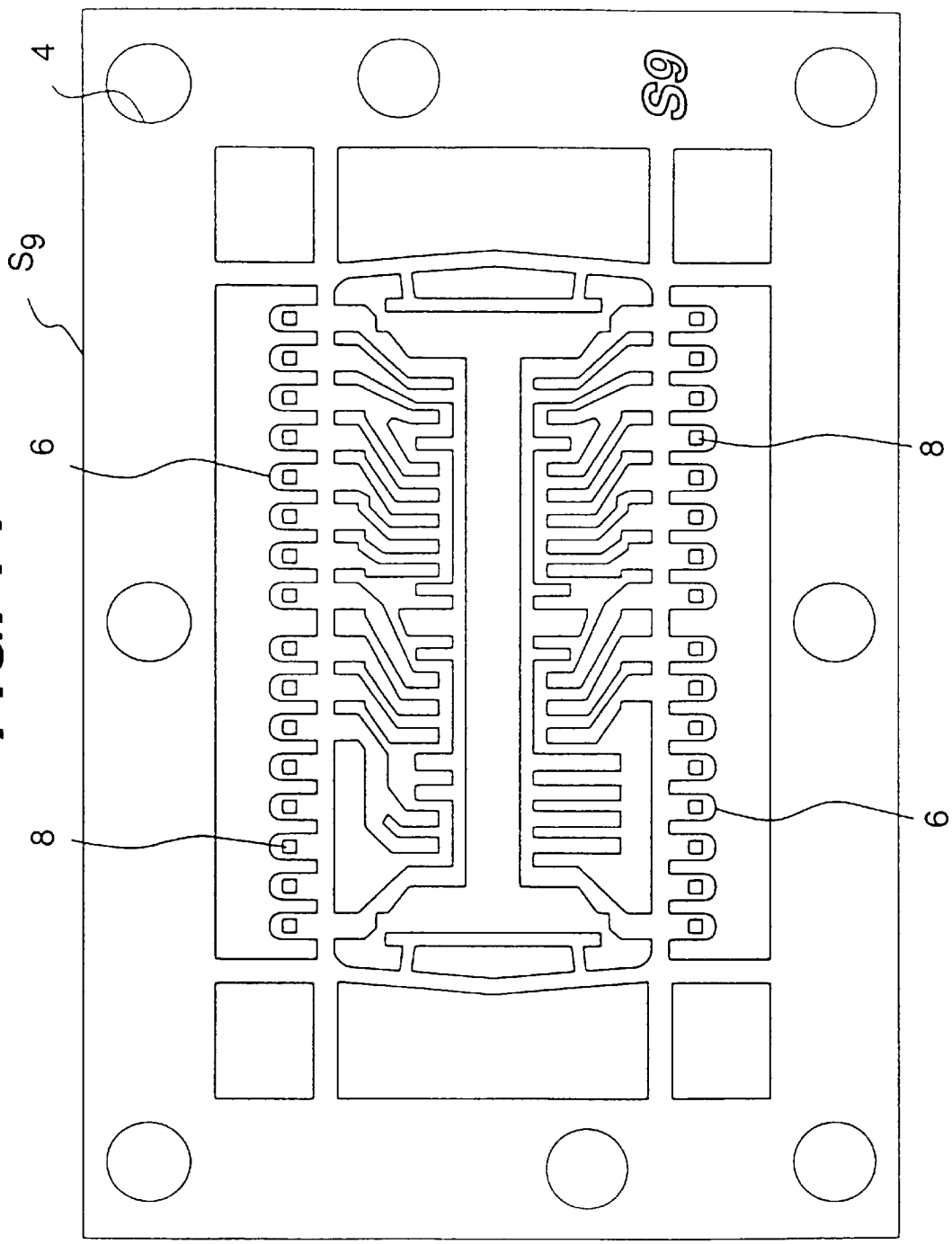

The aforementioned nine lead frames ($S_1$ to $S_9$) are stacked such that the lead frame ($S_1$), as shown in FIG. 6, is arranged in the lowermost layer of the package 2A whereas the eight lead frames ($S_2$ to $S_9$), as shown in FIGS. 7 to 14, are arranged upwards sequentially in the order of $S_2$, $S_3$, . . . , and $S_9$. These lead frames ($S_1$ to $S_9$) are made of an electrically conductive material such as 42 alloy or covar and given an average thickness of about 0.1 to 0.125 mm.

Figure 15:
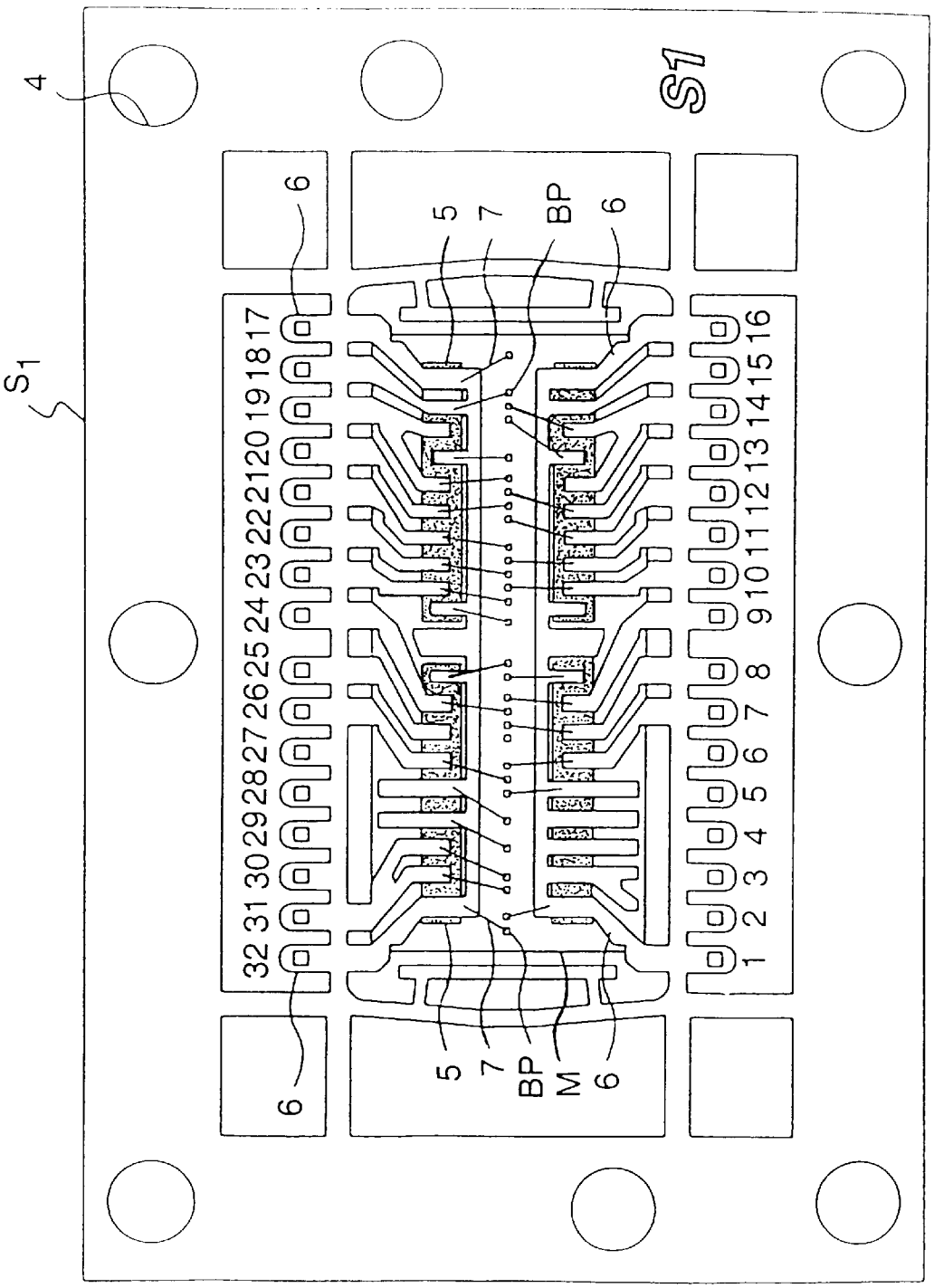
FIG. 15 is a top plan view showing a lead frame mounted with the semiconductor chip.

FIG. 15 is a top plan view showing the lowermost lead frame ($S_1$) mounted with the semiconductor chip ($M_0$). The semiconductor chip ($M_0$) is mounted on the lead frame ($S_1$) by the LOC (Lead On Chip) method using an insulating tape 5. This insulating tape 5 is inserted between the principal face of the semiconductor chip ($M_0$) and the lower face of the lead frame ($S_1$) and is stuck on the lead frame ($S_1$) by the thermocompression bonding method. The semiconductor chip ($M_0$) is stuck on the insulating tape 5 by an adhesive. The insulating tape 5 is quadrisected to weaken the thermal stress which will occur in the interface with the synthetic resin making the package 2A. This insulating tape 5 is made of a polyimide resin or a highly heat-resistant and strong liquid crystal polymer (a glass fiber reinforced highly heat-resistant liquid crystal polymer, known under the trade name of "Vectra E130" of Poly Plastic Inc.), and is given an average thickness of about 0.05 to 0.1 mm.

On the principal face of the semiconductor chip ($M_0$), there are arranged one row of bonding pads (BP) in the long side direction. These bonding pads (BP) and the corresponding leads 6 of the lead frame ($S_1$) are electrically connected by the Au wires 7. The connections between the bonding pads (BP) and the leads 6 are carried out by heating them, by using ultrasonic waves, or by using a well-known wire bonding apparatus employing heat or ultrasonic waves. Although not shown, the semiconductor chips ($M_1$ to $M_8$) are individually mounted on the remaining lead frames ($S_2$ to $S_9$) by the aforementioned method.

FIG. 15 shows an array of the pins (pin 1 to pin 32) of the lead frame ($S_1$). FIG. 15 shows only the used pads, of which the data output pin Dout is the I03 pad shown in FIG. 5 whereas the data input Din is a Din pad and is internally connected to the pin 31. Here will be sequentially described the constructions of the pins 1 to 32. The pin 1 is for Vss; the pin 2 is for NC; the pin 3 is for the data 1 of the second-layer lead frame ($S_2$); the pin 4 is for the data d of the fourth-layer lead frame ($S_4$); the pin 5 is for the data of the sixth-layer lead frame ($S_6$); the pin 6 is for the data 7 of the eighth-layer lead frame ($S_8$); the pin 7 is for a /WE; the pin 8 is for a row address strobe signal /RAS; the pin 9 is for A (address) 11; the pin 10 is for A10; the pin 11 is for A0; the pin 12 is for A2; the pin 14 is for A3; the pin 15 is for Vcc; the pin 16 is also for Vcc; the pin 17 is for Vss; the pin 18 is also for Vss; the pin 19 is for A4; the pin 20 is for A5; the pin 21 is for A6; the pin 22 is for A7; the pin 23 is for A8; the pin 24 is for A9; the pin 25 is the column address strobe signal /PCAS of the ninth-layer lead frame (S9) (for the parity) (whereas the first- to eighth-layer lead frames ($S_1$ to $S_8$) are connected to the CAS pad used by the pin 26; the pin 26 is the chip select signal (or column address strobe signal)/CAS (excepting the ninth-layer lead frame ($S_9$)); the pin 27 is for the parity data 8 of the ninth-layer lead frame ($S_9$); the pin 28 is for the data 6 of the seventh-layer lead frame ($S_7$); the pin 29 is for the data 4 of the fifth-layer lead frame ($S_5$); the pin 30 is for the data 2 of the third-layer lead frame ($S_3$); the pin 31 is for the data 0 of the first-layer lead frame ($S_1$); and the pin 32 is for the Vss.

Figure 16:
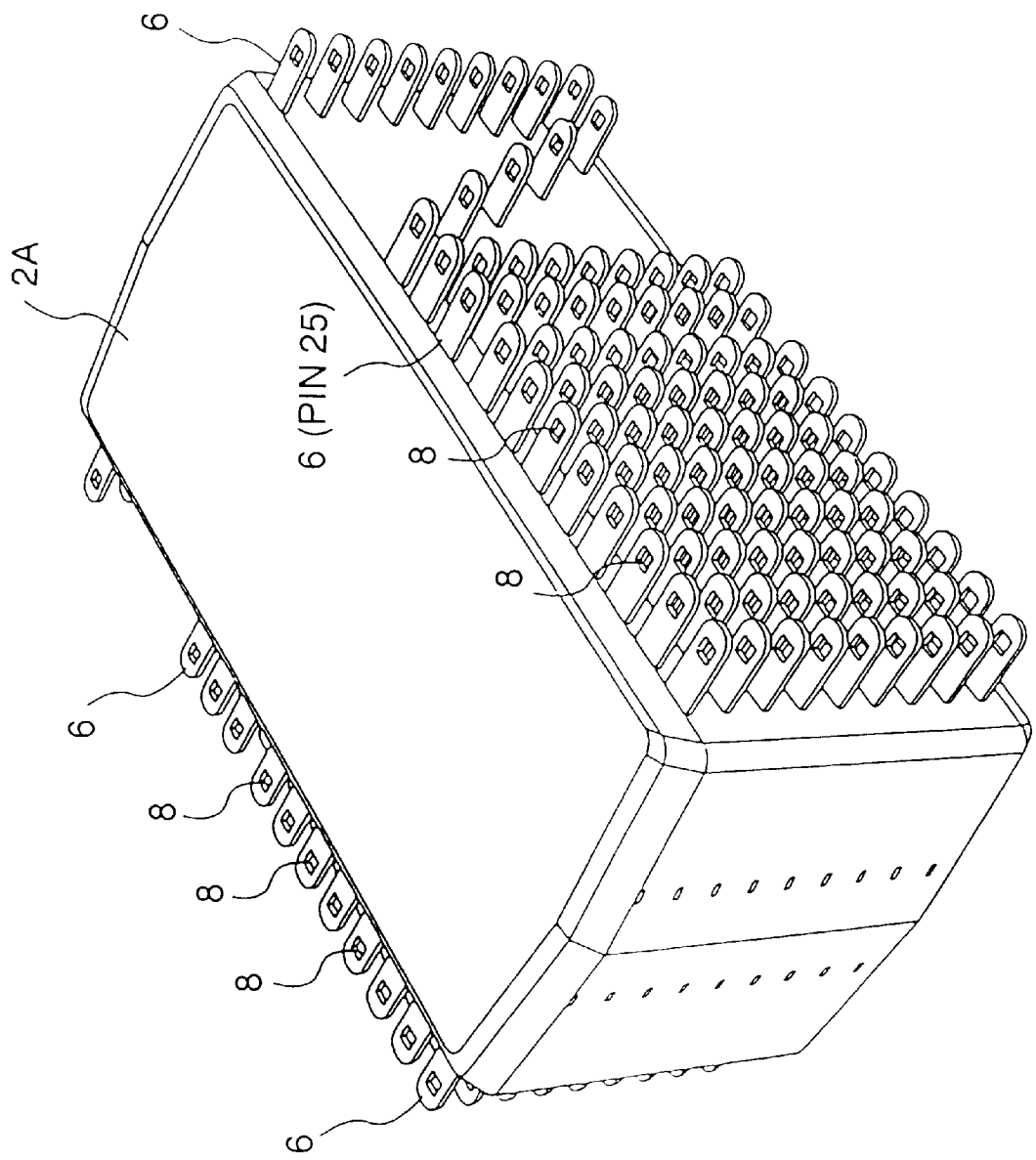
FIG. 16 is a perspective view showing a package.

FIG. 16 is a perspective view showing the package 2A having the aforementioned internal structure. From the two long side faces of the package 2A, as shown, there are horizontally led out the leads 6 of the aforementioned nine lead frames ($S_1$ to $S_9$). Of these leads 6, the leads 6 constructing the power supply (and GND) pin, the address signal pin and the control signal pin are commonly arranged for all the lead frames ($S_1$ to $S_9$) so that they are vertically overlapped at the side faces of the package 2A. Here, the /CAS of the control signal is arranged commonly for the lead frames ($S_1$ to $S_8$) excepting the uppermost lead frame ($S_9$). On the other hand, the leads 6 constructing the data pins are so led out one by one (bit by bit) from the individual lead frames ($S_1$ to $S_9$) that they may not overlap one another, because the lead arrangement are different for the lead frames ($S_1$ to $S_9$).

Figure 17:
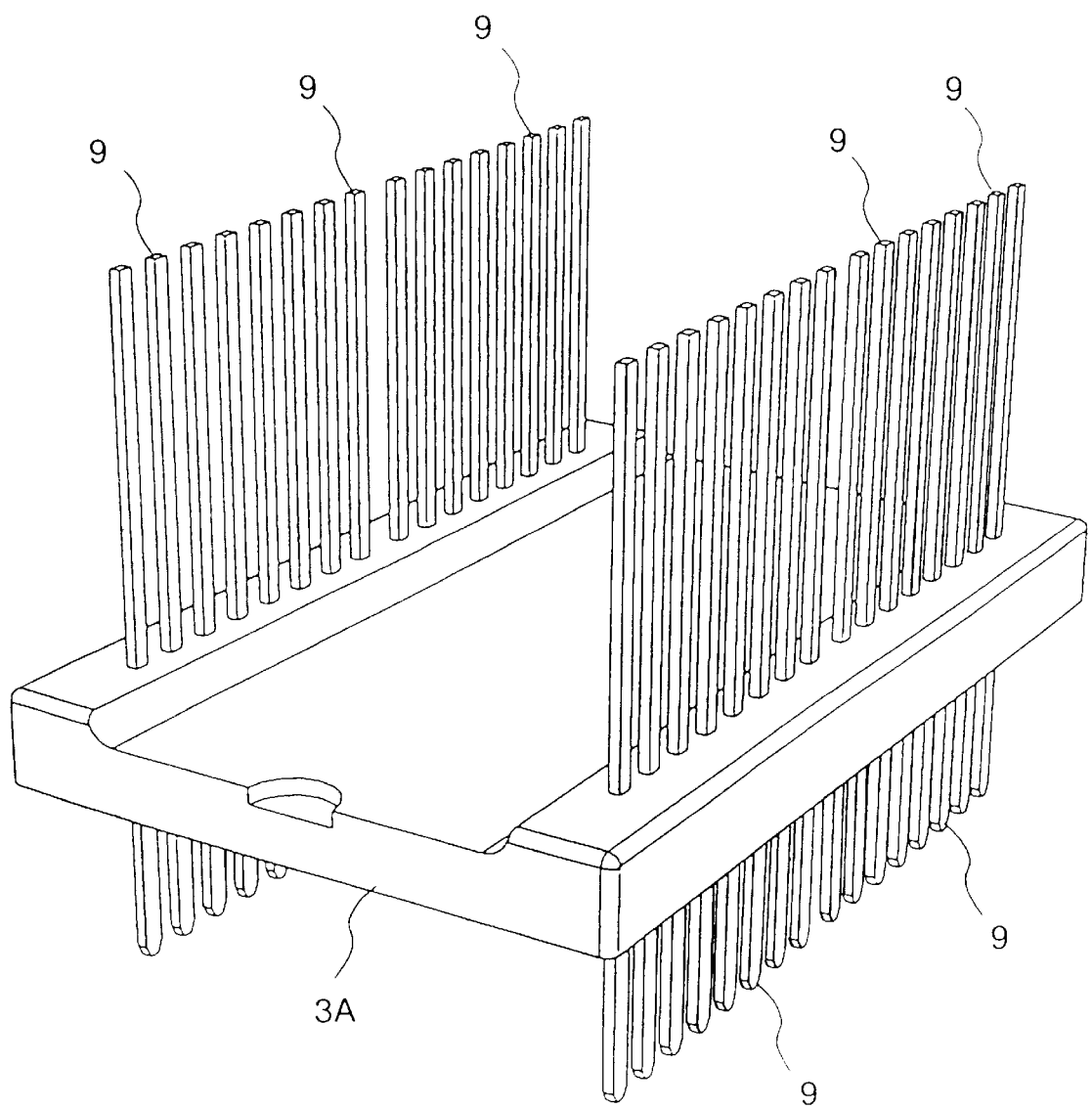
FIG. 17 is a perspective view showing a mother socket for mounting the package.

FIG. 17 is a perspective view showing the mother socket 3A for mounting the aforementioned package 2A. In the mother socket 3A, as shown, a plurality of module leads 9 extending vertically are arranged row by row along their two long side faces. The arrangement of the module leads 9 corresponds to that of the leads 6 of the lead frames ($S_1$ to $S_9$). The individual lower portions of the module leads 9 are extended through the mother socket 3A to the back of the same to construct the external terminals for packaging the DRAM module 1A in the printed circuit board of the SIMM.

In order to mount the package 2A on the aforementioned mother socket 3A, what is required is to insert the module leads 9 of the mother socket 3A into the openings 8 of the corresponding leads 6 of the package 2A and to fix them by a known means such as soldering, brazing or welding to connect and fix them. When the two are to be connected by soldering, the surfaces of the leads 6 and the surfaces of the module leads 9 are plated with solder, and the module leads 9 are inserted into the openings 8 of the leads 6. After this, the solder is melted in a heating furnace. If, at this time, either the leads 6 or the module leads 9 are plated with a metal such as palladium (Pd) for blocking the solder flow, it is possible to reduce a danger that the leads 6 or the module leads 9 might be shorted through the molten solder.

In a conventional memory module which is constructed by stacking several layers of LSI packages (e.g., TSOP) where only one semiconductor chip is encapsulated, the size reduction in the stack direction is limited by not only the thickness of the resin making the package but also the gaps between the packages so as to promote the heat radiation. In the DRAM module 1A of the present embodiment, on the other hand, the semiconductor chips ($M_0$ to $M_8$) are encapsulated altogether into the package 2A so that the exterior size (or height) in the vertical direction can be reduced far more than that of the aforementioned conventional memory module.

In the DRAM module 1A of the present embodiment, moreover, the use of the lead frames ($S_1$ to $S_9$) of the aforementioned structure restricts the planar size of the package 2A to a value slightly larger than the size of one of the semiconductor chips ($M_0$ to $M_8$) encapsulated therein. Because of the necessity that the data pins (or leads 6) of the lead frames ($S_1$ to $S_9$) are dispersedly arranged without any vertical overlap of the package 2A, however, the number of the leads 6 is larger by about four for each row than that of the ordinary DRAM lead frames so that the size of the package 2A of the long side is accordingly enlarged. However, the increase in the long side size is very small because the pitch of the leads 6 is extremely restricted.

Although the numerous semiconductor chips ($M_0$ to $M_8$) are encapsulated into the DRAM module 1A of the present embodiment, the heat resistance of the package 2A is very low. This is partly because the resin in the gaps of the semiconductor chips ($M_0$ to $M_8$) is remarkably thin. On the other hand, the leads 6, horizontally led from the side faces of the package 2A, are connected to intersect with the vertically extending module leads 9 of the mother socket 3A so that the heat at the central portion of the package 2A can be quickly dissipated to the outside through the leads 6 and the module leads 9.

Moreover, since the numerous leads 6, led out from the side faces of the package 2A, are formed to constitute a leaf spring structure, the DRAM module 1A of the present embodiment is given a structure in which the vertically extending stress of the resin in the gaps between the lead frames ($S_1$ to $S_9$) in the package 2A is absorbed and relaxed through the deformation of the leads 6. As a result, interface separation between the resin and the lead frames ($S_1$ to $S_9$) and cracks of the resin are suppressed to improve the reliability of the package 2A.

Moreover, since the arrangements of the data pins are changed for the individual lead frames ($S_1$ to $S_9$), the DRAM module 1A of the present embodiment can connect the lead frames ($S_1$ to $S_9$) directly. In other words, there is separately required no printed circuit board which is intended to connect the lead frames ($S_1$ to $S_9$), so that the external size of the DRAM module 1A can be reduced.

Incidentally, in the foregoing description, the leads 6 constructing the data pins are led out one by one from the individual lead frames ($S_1$ to $S_9$), but the dummy leads may be additionally led out. This is exemplified by the lead 6 (for the pin 25), as in the ninth lead from this lefthand side of the aforementioned package 2, as shown in FIG. 16. The pin 25 is the PCAS of the lead frame ($S_9$) of the ninth layer (uppermost layer) and is intrinsically led from only the ninth-layer lead frame ($S_9$). As shown in FIG. 16, however, one lead 6 is led out from the same portion of each of the lower lead frames ($S_1$ to $S_8$) so that totally eight leads are led out. These eight leads 6 are the dummy leads which are not electrically connected to any of the semiconductor chips ($M_0$ to $M_8$).

The heat dissipation paths of the package 2A are increased by leading out those dummy leads from the package 2A and connecting them with the module leads 9 of the mother socket 3, so that the heat resistance of the same can be further reduced. Moreover, the number of the leads 6 to be connected with the module leads 9 of the mother socket 3A can be increased to improve the junction strength between the leads 6 and the module leads 9.

Here will be described a method for manufacturing the DRAM module 1A of the present embodiment.

Usually, the LSI package such as the TSOP is molded by the insert molding method in which the lead frames are sandwiched between a top force or mold member and a bottom force or mold member and in which the resin is injected into their gaps. When, however, the numerous lead frames ($S_1$ to $S_9$) are stacked, packaged and encapsulated as in the package 2A of the DRAM module 1A of the present embodiment, it is difficult to part the package 2A from the mold after the molding operation if a conventional mold composed of top and bottom forces is used.

Figure 18:
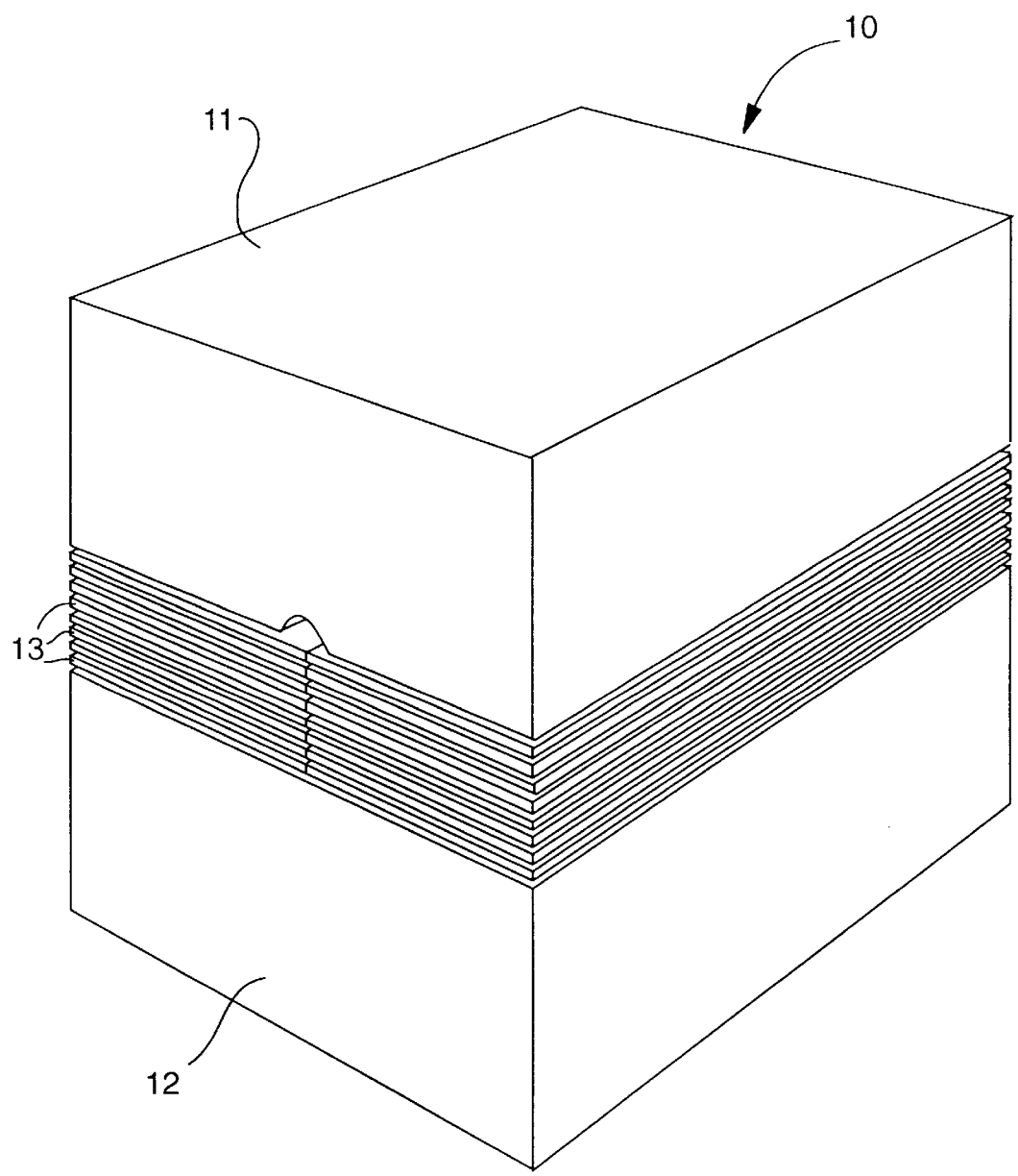
FIG. 18 is a perspective view showing an insert mold used for molding the package.
Figure 19:
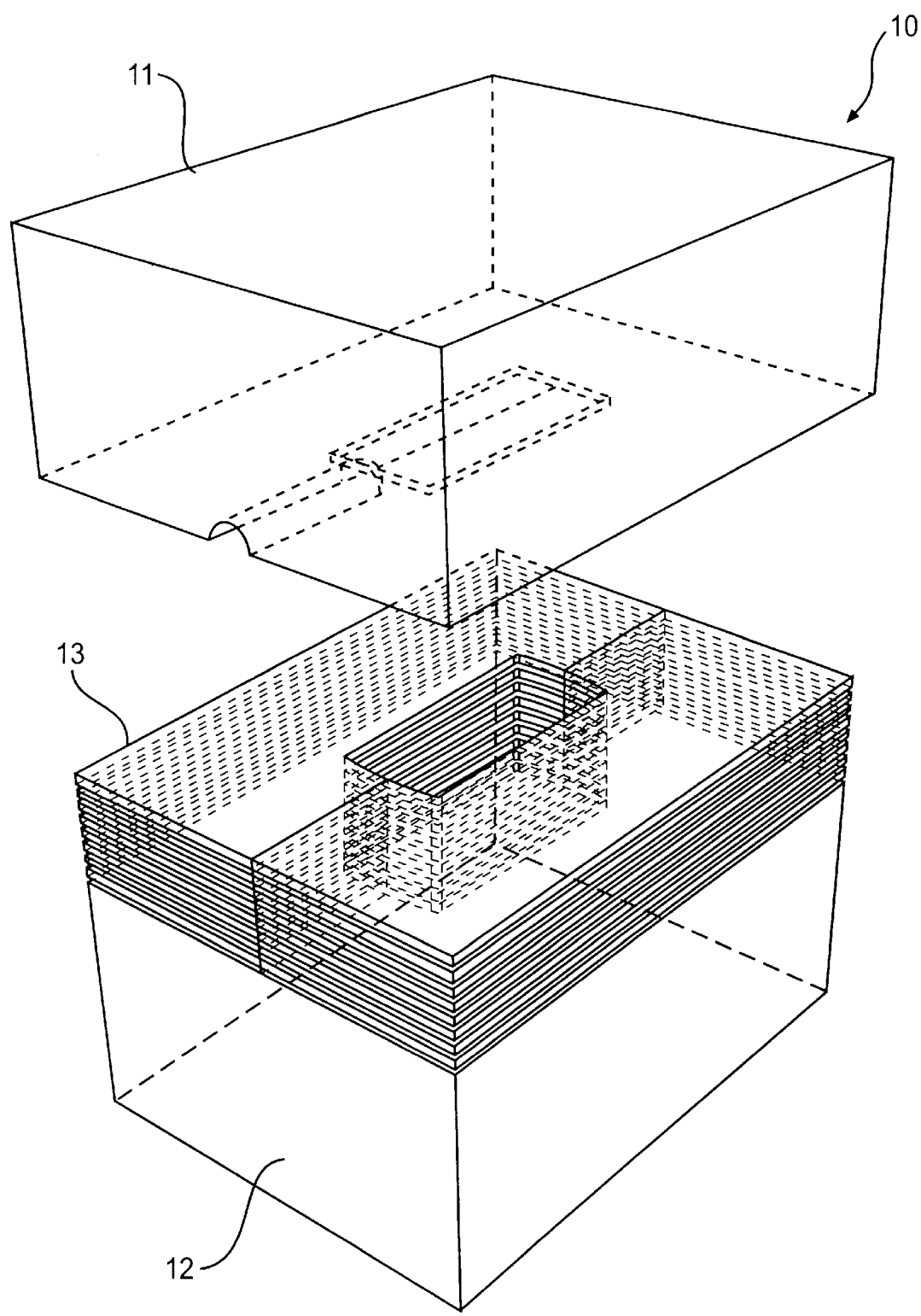
FIG. 19 is a perspective view showing a state that the top force of the insert mold is lifted.
Figure 20:
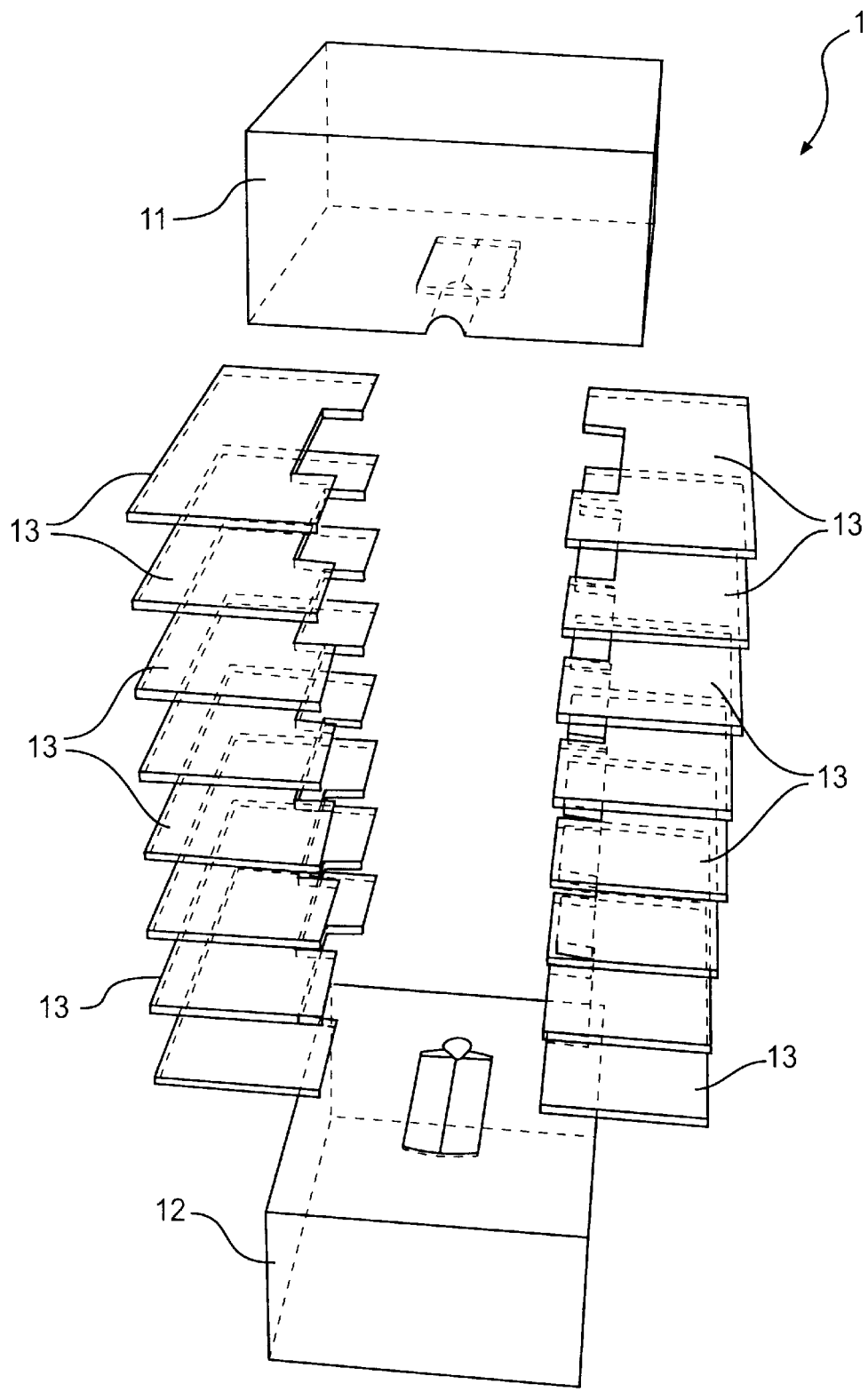
FIG. 20 is an exploded perspective showing the insert mold.
Figure 21A:
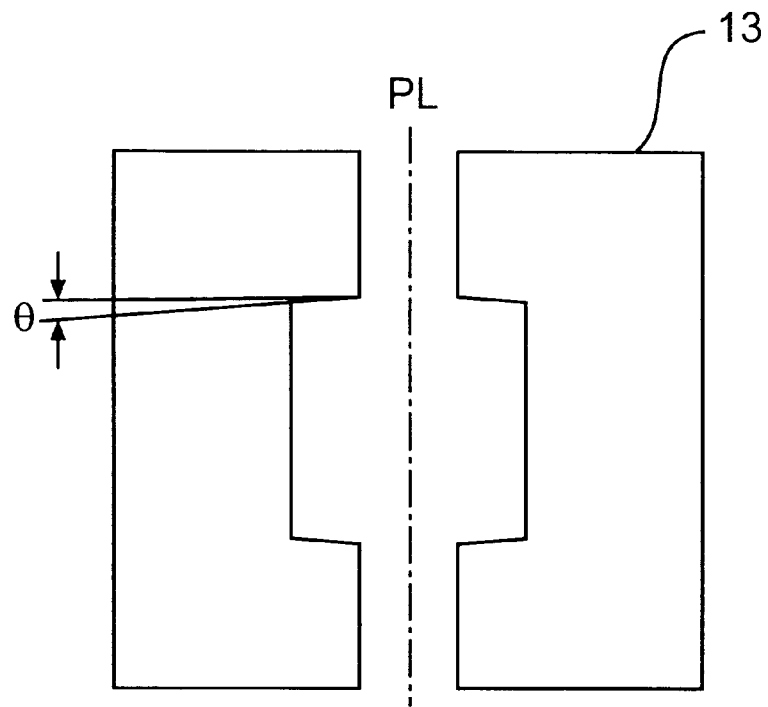
FIG. 21(a) is a top plan view of a movable plate of the insert mold and FIG. 21(b) is a side elevation thereof.
Figure 21B:

In the present embodiment, therefore, the insert mold, as shown in FIGS. 18 to 20, is used to mold the package 2A. FIG. 18 is a perspective view showing the insert mold; FIG. 19 is a perspective view showing the state that the top force or mold member of the insert mold is lifted up; FIG. 20 is an exploded perspective view showing the insert mold; and FIG. 21(a) is a top plan view showing the moving or inserted plates of the insert mold and FIG. 21(b) is a side elevation.

As shown, an insert mold 10 is constructed of a top force or mold member 11, a bottom force or mold member 12 and a plurality of movable plates (of spacer type) 13. One movable plate 13 is composed of two sheets which are inserted in a set into the gap between the stacked (and chip-bonded) lead frames (S). When the nine lead frames ($S_1$ to $S_9$) are to be encapsulated into the package 2A of the present embodiment, eight movable plates 13 are required. As shown in FIG. 21, each of the movable plates 13 is horizontally halved along the parting line (PL) and is so set with a parting angle ($\theta$) of about 4 degrees on its four sides perpendicular to the parting line (PL) as to facilitate the parting of the package 2A.

By using the movable plates 13 to be inserted into the gaps between the lead frames ($S_1$ to $S_9$), the numerous lead frames ($S_1$ to $S_9$) can be highly accurately arranged three-dimensionally in the predetermined positions of the insert mold 10 without any special structural reinforcement. After the molding operation, moreover, the package 2A can be easily parted merely by dividing or separating the top and bottom forces 11 and 12 vertically and by halving the individual movable plates 13 horizontally. As a result, the yield and the throughput of the molding step can be improved.

The movable plates 13 have a thickness equal to the sum of the thickness of the semiconductor chip (M), the thickness of the insulating tape 4, the loop height of the wire 7 of the semiconductor chip (M) and the thickness of the resin in the gaps between the semiconductor chips (M). For example, the movable plates 13 have a thickness of 0.68 mm if the thickness of the semiconductor chip (M) is 0.28 mm, if the thickness of the insulating tape 5 is 0.1 mm, if the loop height of the wire 7 is 0.15 mm and if the thickness of the resin in the gaps between the semiconductor chips (M) is 0.15 mm.

For the thickness of 0.1 mm of the lead frame (S), moreover, the thicknesses of the upper and lower end portions of the package 2A are calculated by setting the thickness of the upper end portion, including the semiconductor chip (M), at 0.58 mm (the thickness of the insulating tape 5+the thickness of the semiconductor chip (M)+the thickness of the resin=0.1 mm+0.28 mm+0.15 mm) and the thickness of the lower end portion of only the wire 7, not including the semiconductor chip (M), at 0.35 mm (the loop height of the wire 7+the thickness of the resin=0.15 mm+0.2 mm). Then, the external size of the package 2A, in the vertical direction, is the thickness (0.58 mm) of the upper end portion of the package 2A+[the thickness (0.1 mm) of the lead frame (S)×9]+[the thickness (0.68 mm) of the moving part 13×8]+the thickness (0.35 mm) of the lower end portion of the package 2A.

The aforementioned size (7.27 mm) of the package 2A is smaller by about 27% than that (1.1 mm×9=9.9 mm) of the case in which nine TSOPs having a thickness of 1.1 mm are stacked. When the TSOPs are actually stacked, moreover, a gap of about 1 mm has to be provided between the individual TSOPs, considering the heat radiation, so that the size is (1.1 mm×9)+(1 mm×8)=about 18 mm. In other words, the external size of the package 2A, in the vertical direction, of the present embodiment is about 40% of that of the module having the stacked TSOPs. By thus molding the package 2A by the aforementioned mold 10 equipped with the aforementioned movable plates 13, the thickness of the resin in the gaps between the semiconductor chips ($M_0$ to $M_8$) can be minimized to suppress the temperature rise at the center portion of the package 2A.

In the DRAM module 1A of the present embodiment, the external size of the package 2A can be further reduced by reducing the loop height of the wire 7, the thickness of the insulating tape 5, the thickness of the semiconductor chip (M) and the thickness of the resin in the gaps of the semiconductor chips (M).

When the loop height of the wire 7 is reduced from 0.15 mm to 0.12 mm, the thickness of the insulating tape 5 from 0.1 mm to 0.05 mm, the thickness of the semiconductor chip (M) from 0.28 mm to 0.1 mm, for example, the thickness of each layer of the lead frame (S) is 0.57 mm for the thickness of 0.1 mm of the lead frame (S). Moreover, when the connection between the semiconductor chip (M) and the lead frame (S) is changed from the wire bonding type to a bump electrode type, the loop height of the wire 7 need not be considered. Then, the thickness of one lead frame (S) can be made as thin as 0.45 mm if the height of the bump is at 0.03 mm.

When each lead frame (S) is thus drastically thinned, the back face of the semiconductor chip (M) may be partially or wholly coated with a thin insulating resin film so as to prevent any short circuit between the back face of the overlying semiconductor chip (M) and the wire 7 of the underlying semiconductor chip (M). In order to prevent this, the back face of the semiconductor chip (M) may be coated with an insulating resin film. When the upper and lower lead frames (S) are very close to each other, the crosstalk noise between the lead frames (S) may be a problem. In this case, the back face of the semiconductor chip (M) may have a shielding layer of Au foil or Al foil.

Figure 22:
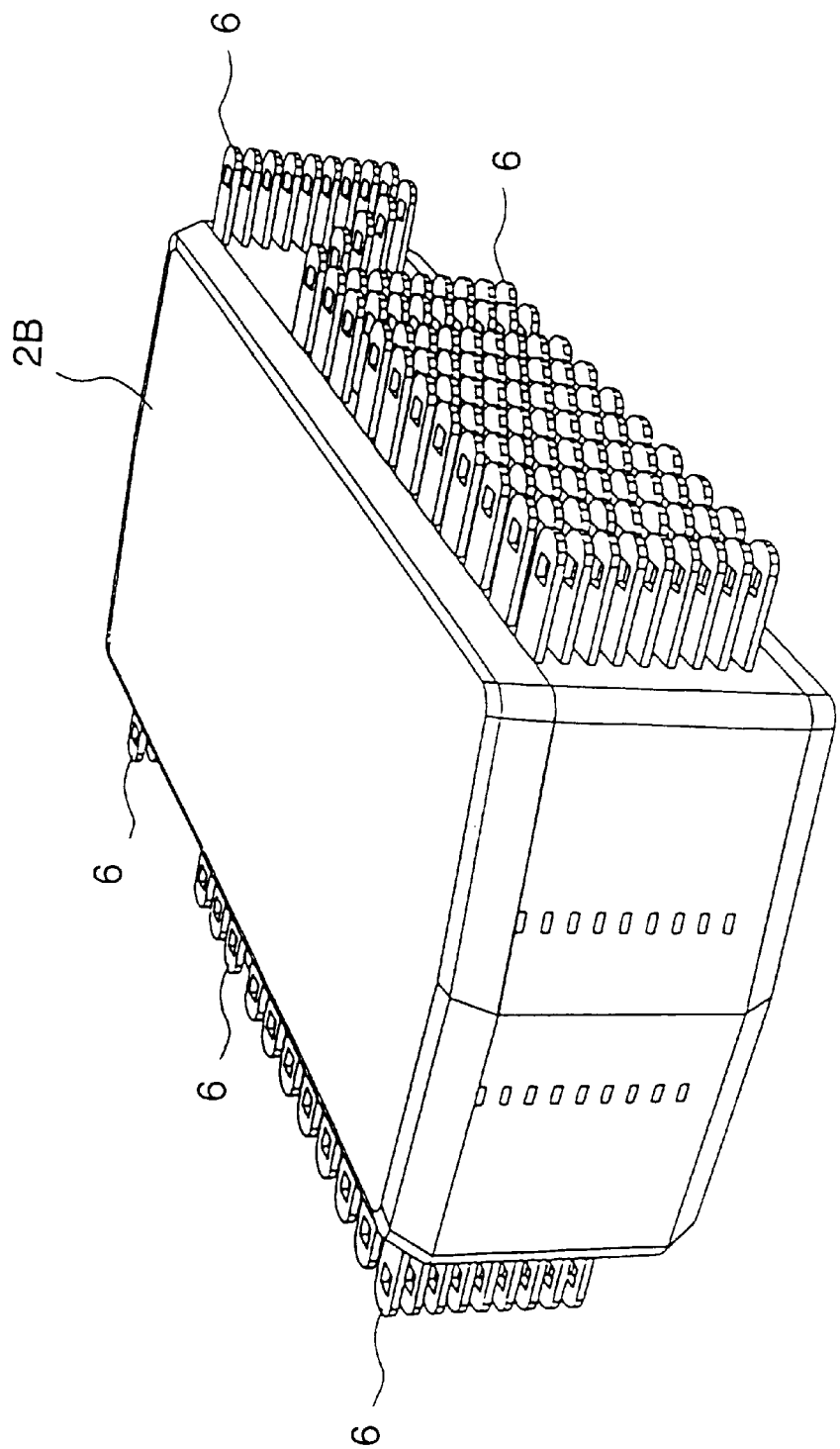
FIG. 22 is a perspective view showing another embodiment of the package.
Figure 23:
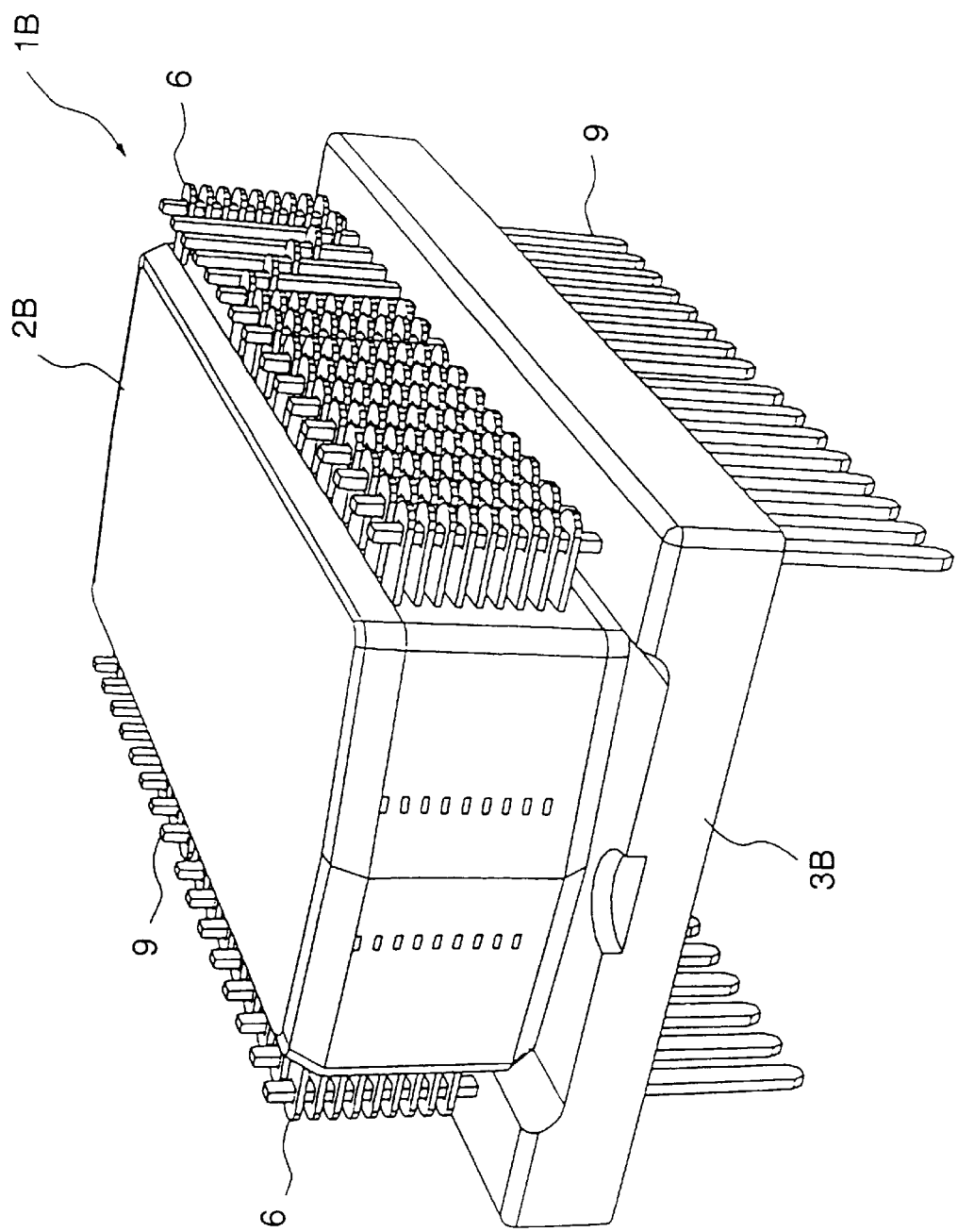
FIG. 23 is a perspective view showing another embodiment of the DRAM module.
Figure 24:
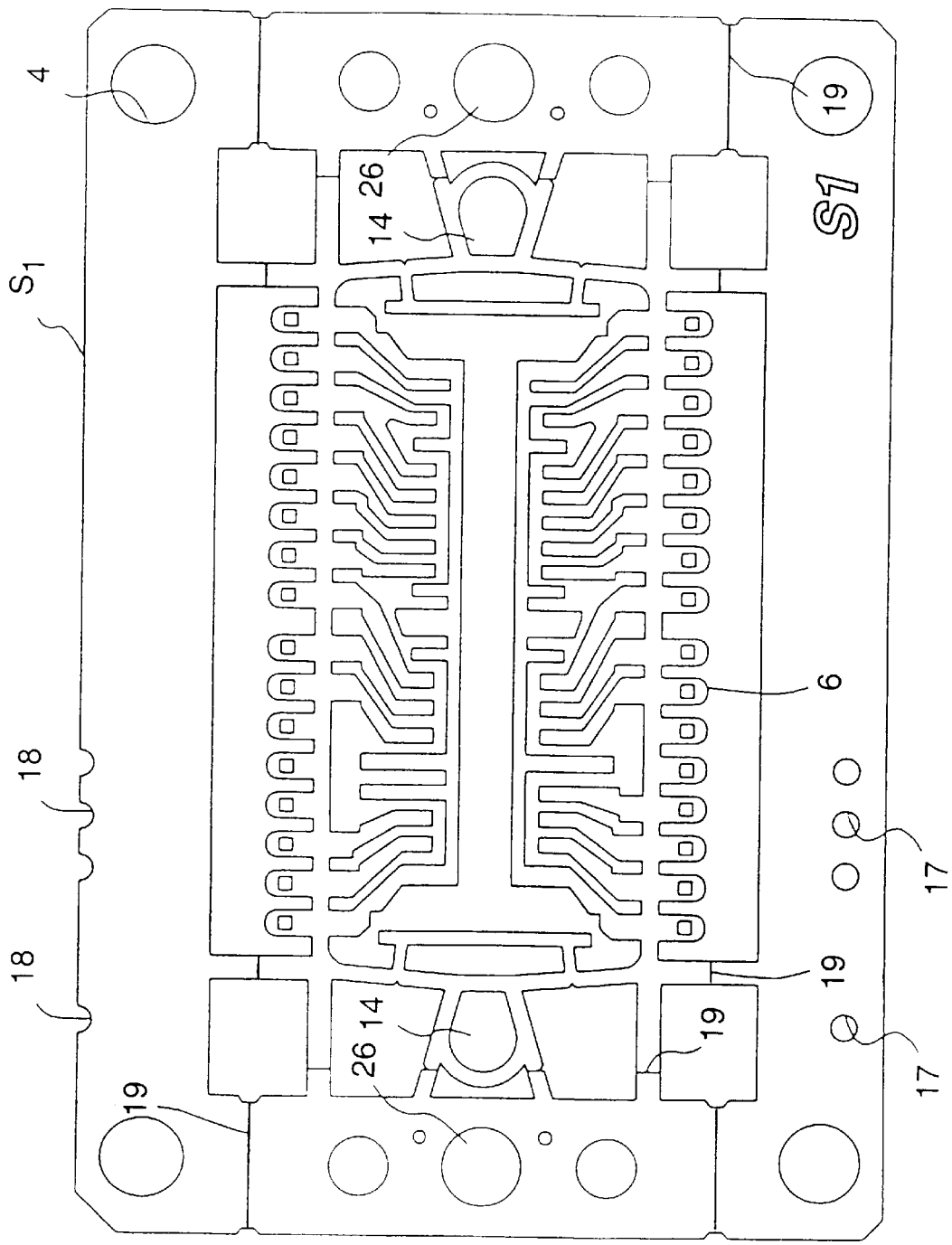
FIGS. 24 to 32 are top plan views showing another embodiment of the lead frames.
Figure 25:
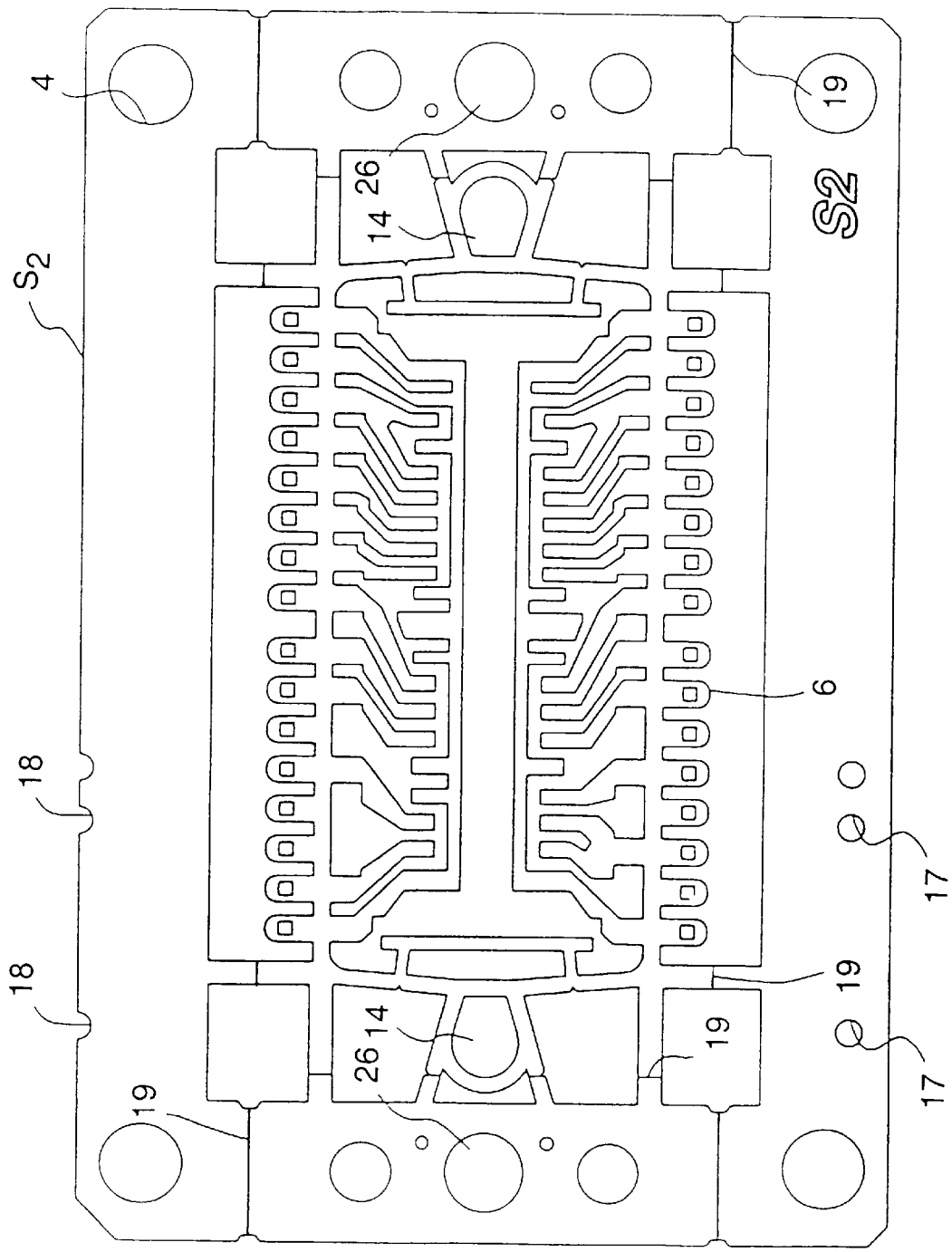
Figure 26:
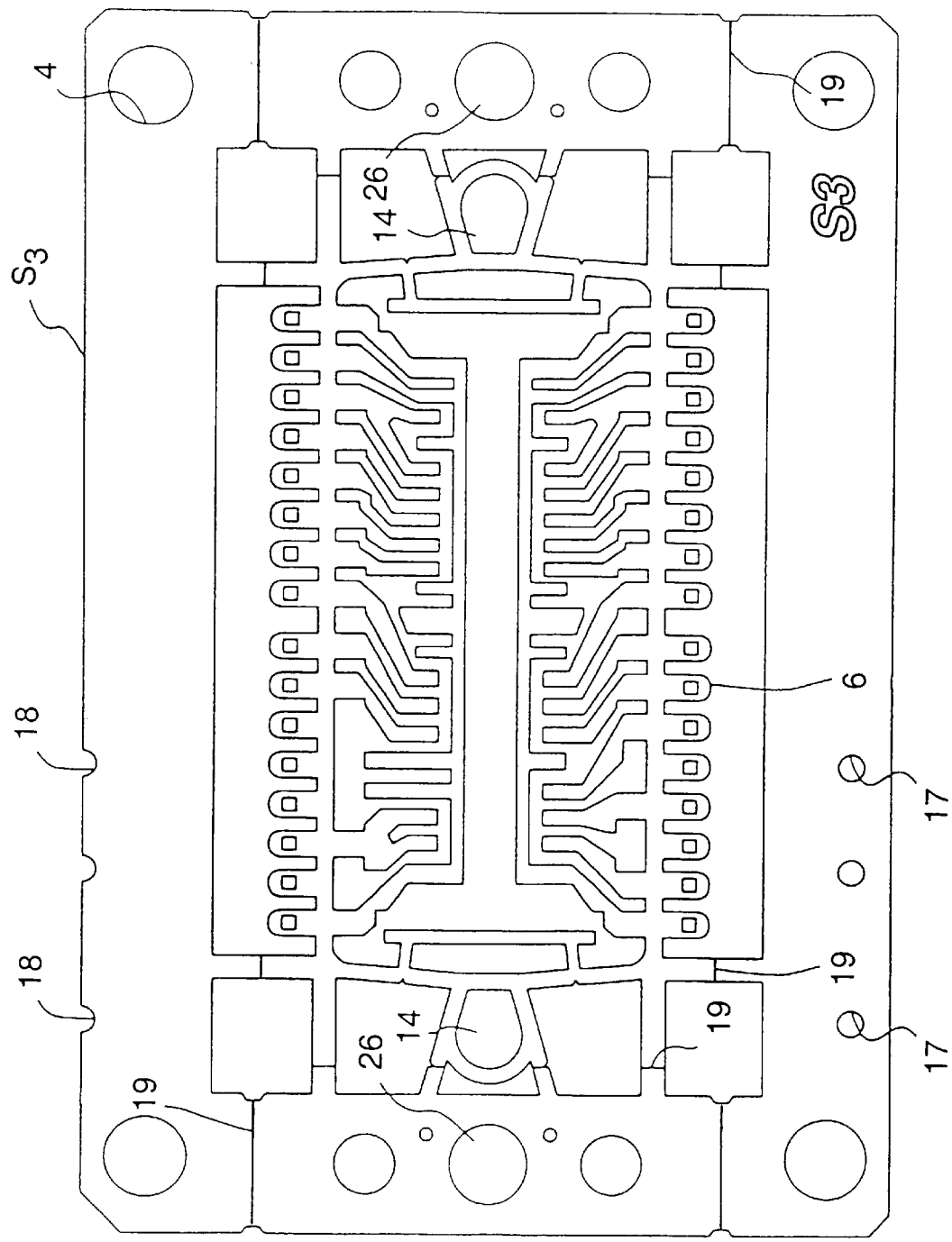
Figure 27:
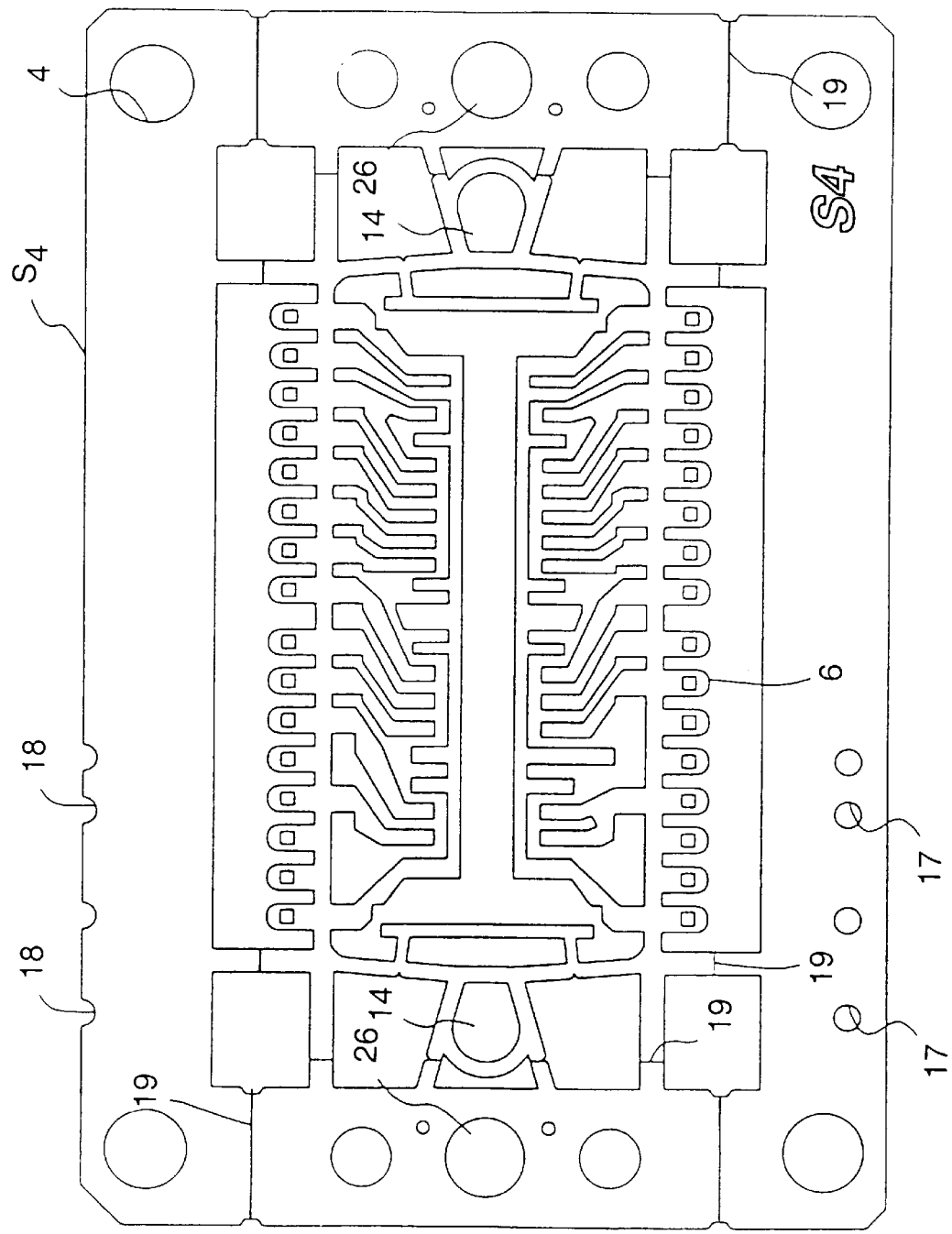
Figure 28:
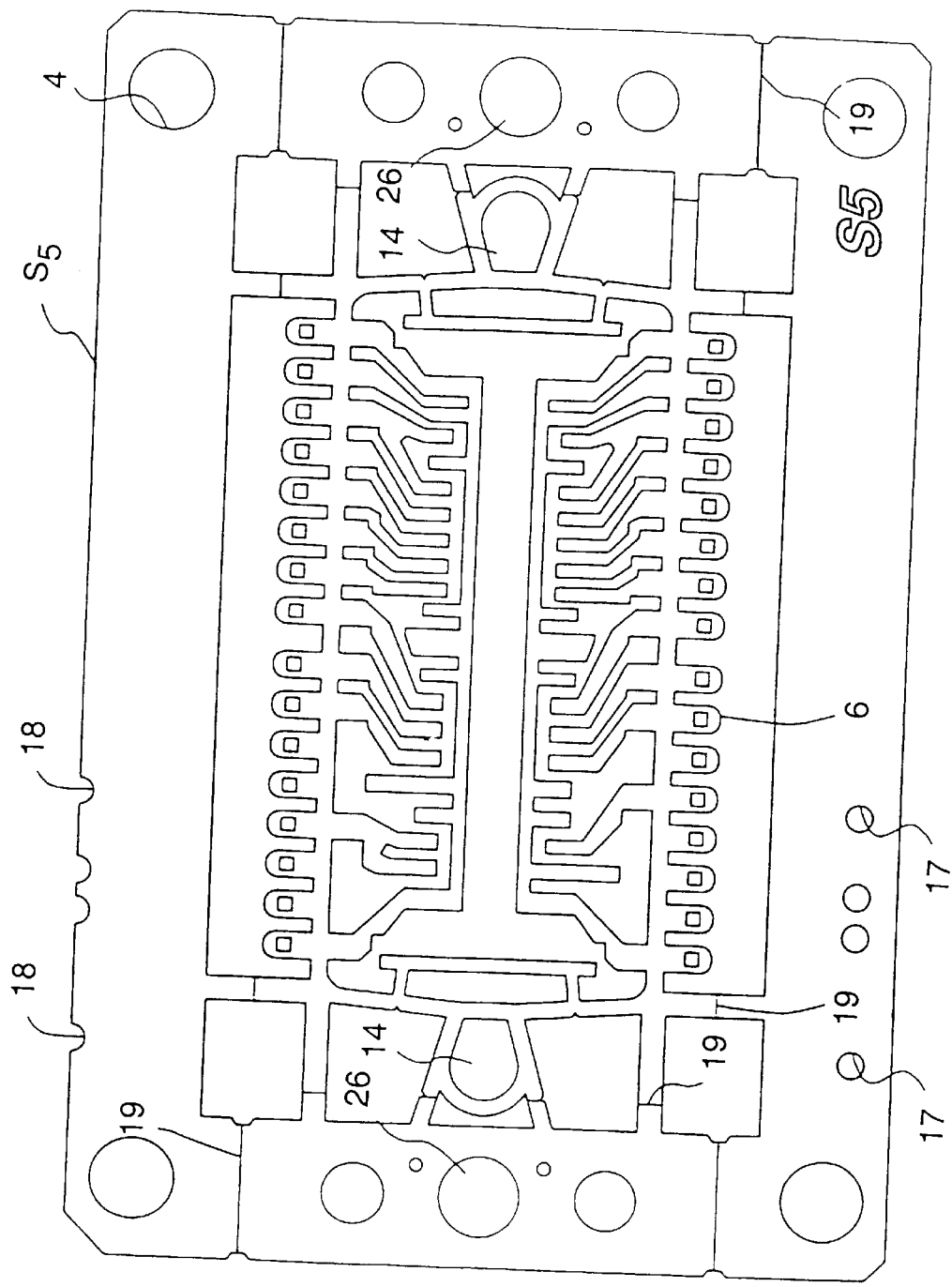
Figure 29:
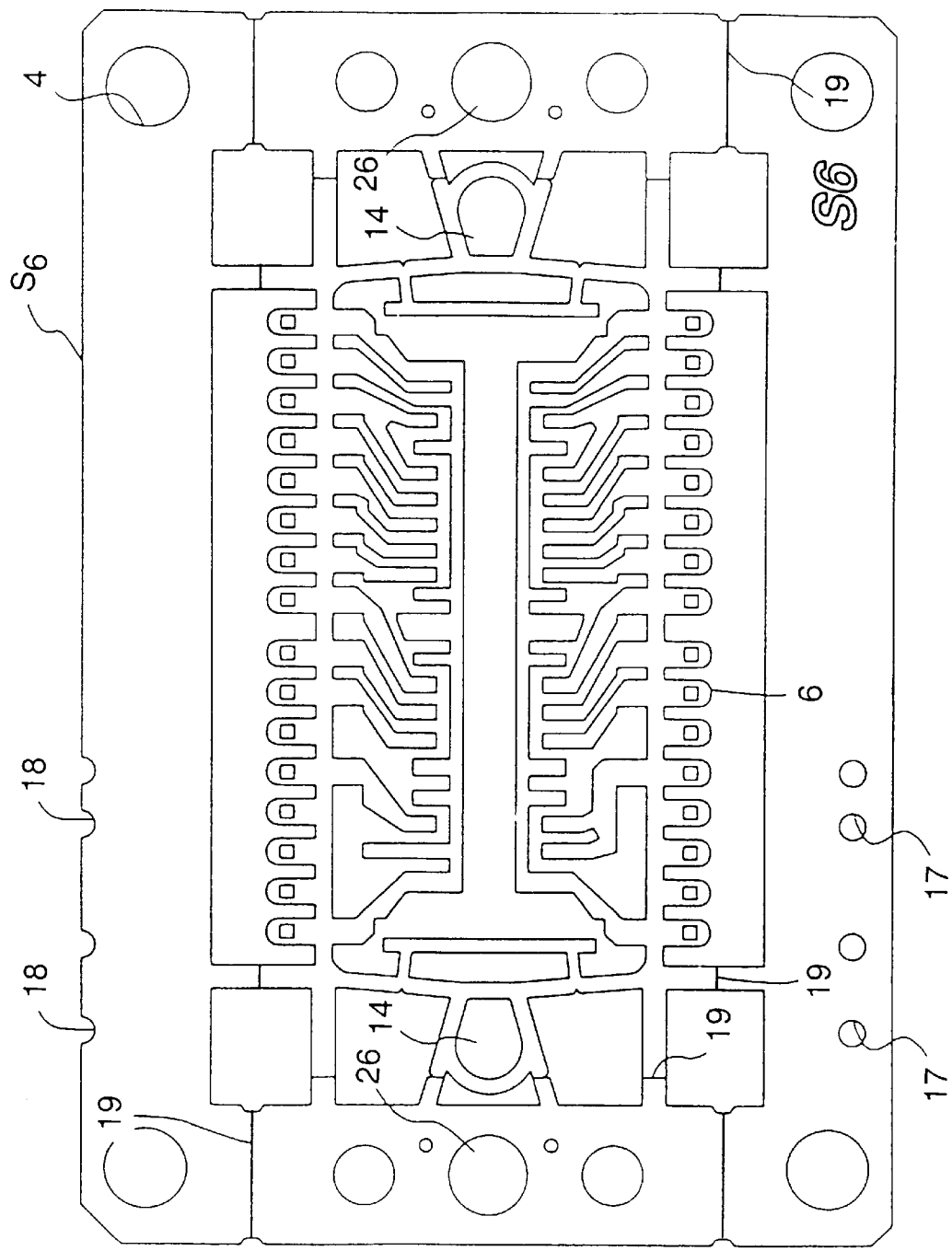
Figure 30:
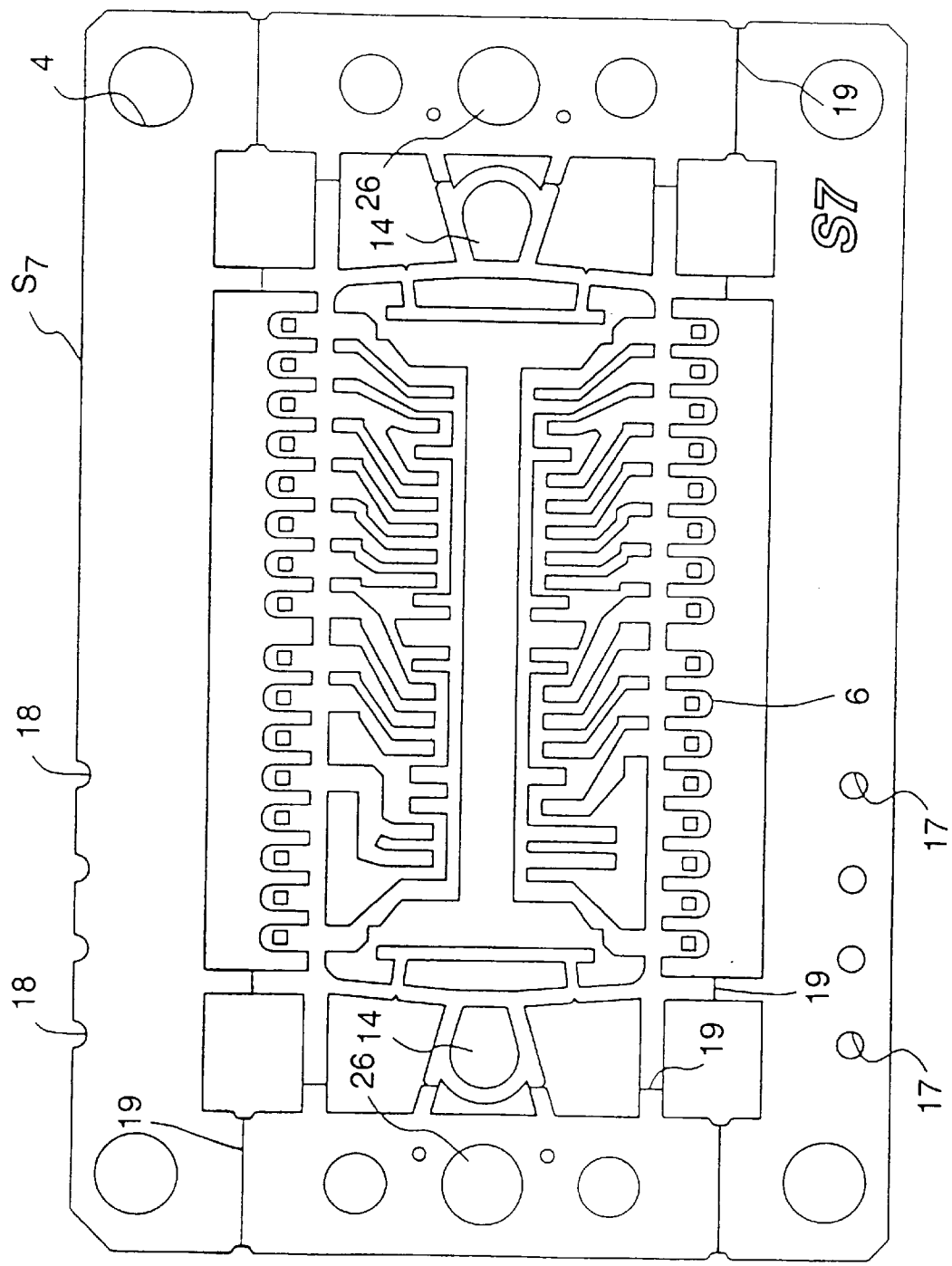
Figure 31:
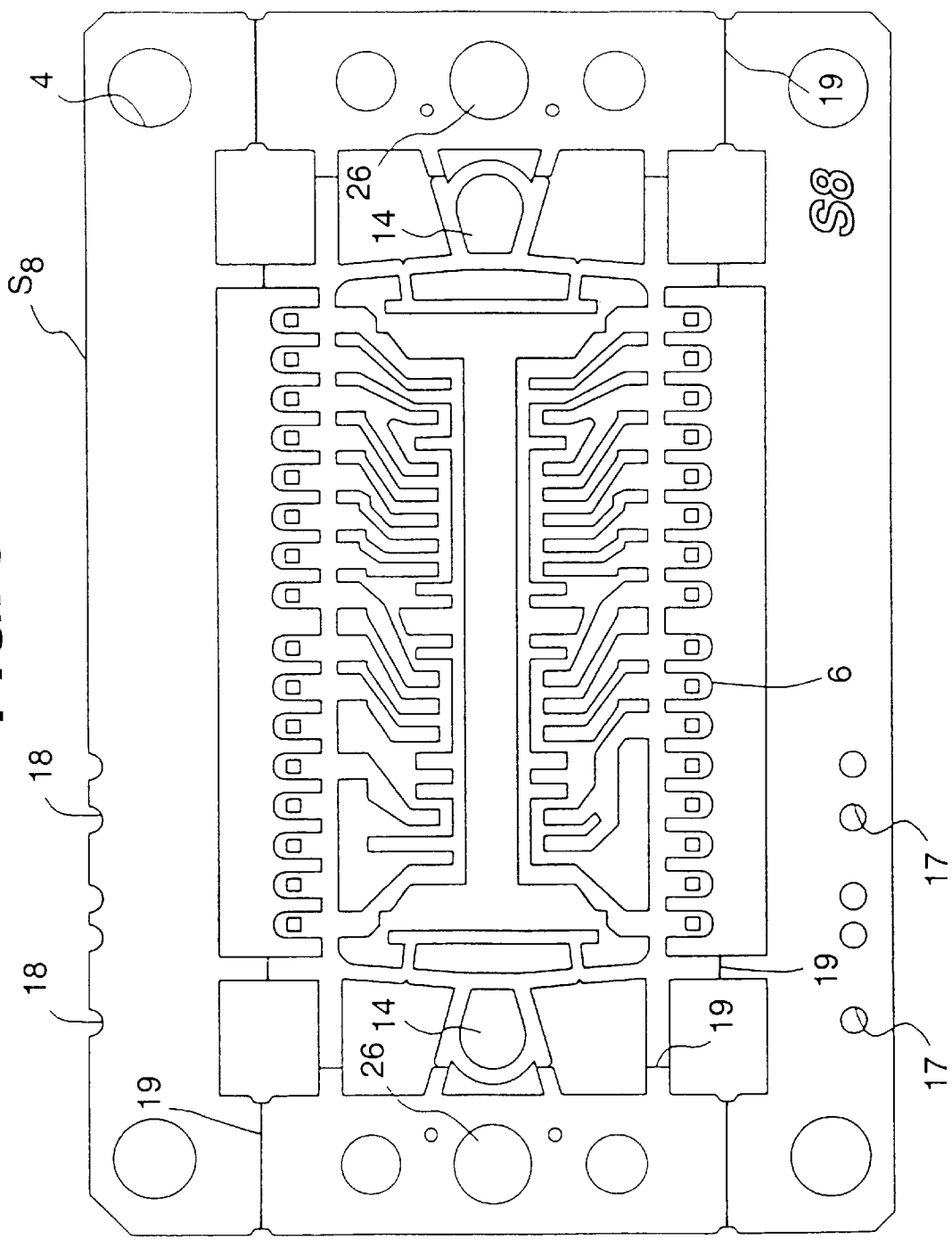
Figure 32:
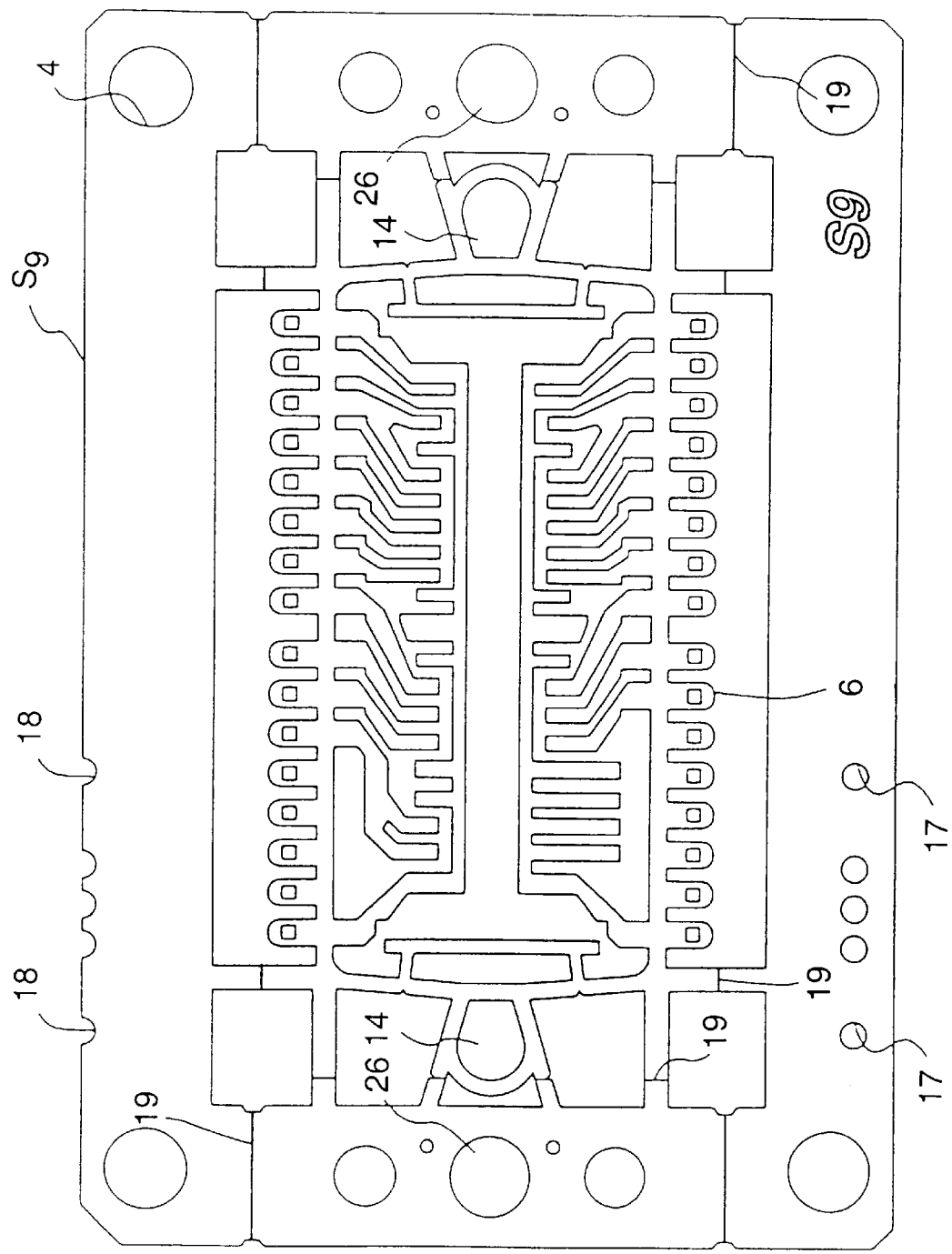

FIG. 22 is a perspective view showing the package 2B having each lead frame (S) thinned by the aforementioned method, and FIG. 23 is a perspective view showing a very small-size DRAM module 1B having the package 2B mounted on the mother socket 3B. The size of this DRAM module 1B, in the height direction, is far more reduced than that of the aforementioned DRAM module 1A shown in FIGS. 1 to 3.

Here will be described the lead frame structure which is improved to raise the yield and throughput of the package 2A at the molding step.

When the aforementioned lead frames ($S_1$ to $S_9$) are set in the aforementioned insert mold 10 and encapsulated altogether, the resin is difficult to flow into the narrow gaps between the stacked lead frames ($S_1$ to $S_9$) produces voids (or clearances) in the resin in the gaps if the epoxy resin used has a high viscosity.

In order to prevent this, there are used the lead frames ($S_1$ to $S_9$), as shown in FIGS. 24 to 32. These lead frames ($S_1$ to $S_9$) have individually designed lead patterns (or pin arrangements), like the foregoing lead frames ($S_1$ to $S_9$) shown in FIGS. 6 to 14, but have a pair of molding gate holes 14 in the outer sides of the two opposed short sides of the square region (or package region) to be encapsulated with the resin. When the lead frames ($S_1$ to $S_9$) having the molding gate holes 14 are used, Similar gate holes are also made in the corresponding portions of to the aforementioned insert mold 10.

Figure 33:
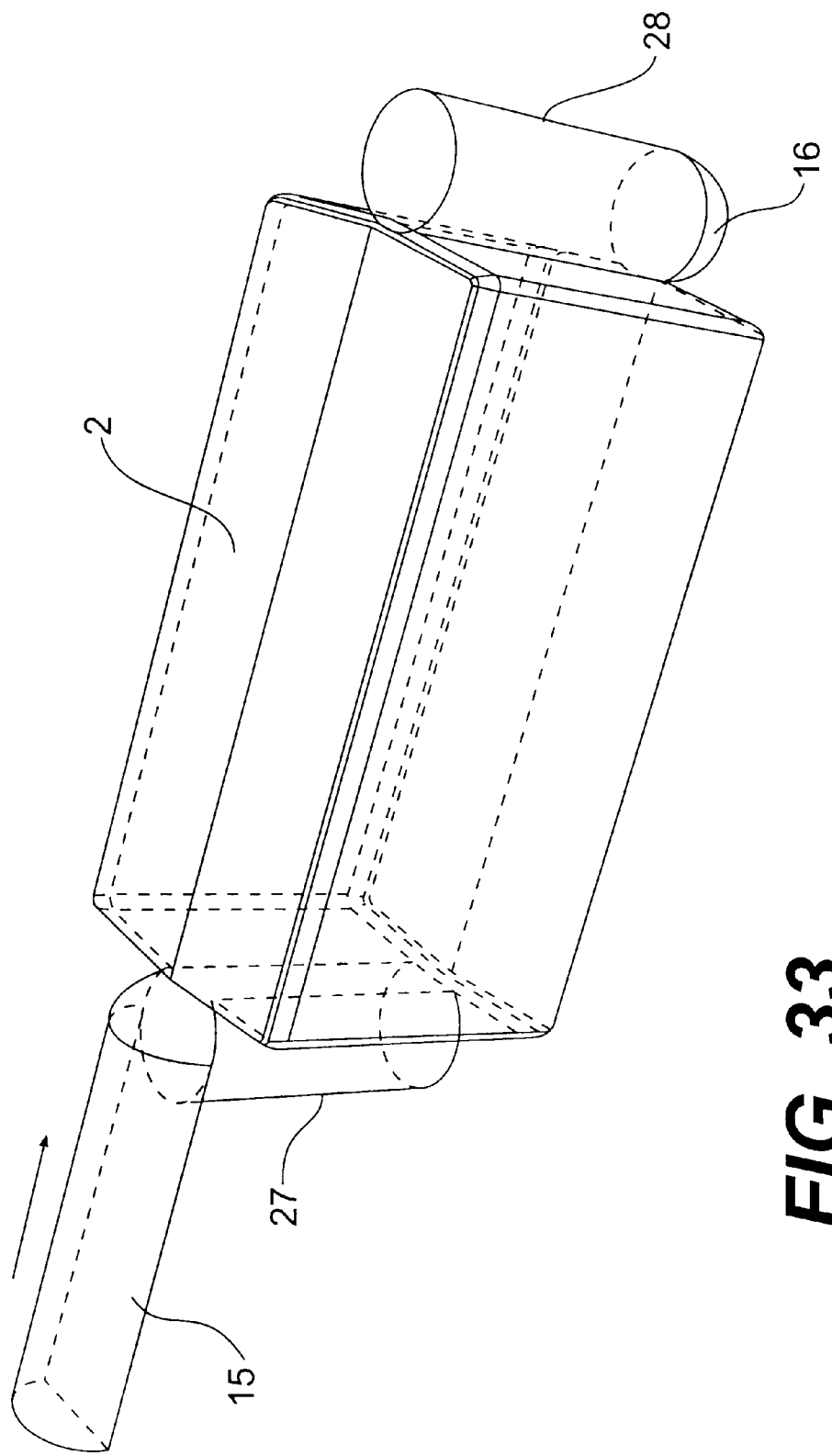
FIG. 33 is a perspective view showing a gate line extending vertically through the inside of the insert mold.

When the lead frames ($S_1$ to $S_9$) having the molding gate holes 14 are stacked and set in the insert mold 10, a pair of cylindrical gate lines 27 and 28 extending vertically through the insert mold 10 are formed, as shown in FIG. 33. As a result, when the molten resin is injected from one gate 15, formed in the top force 11, it flows through one gate line 27 and the cavity is quickly filled with the molten resin. Moreover, the nonuniform resin components including the voids in the insert mold 10 will flow out through the other gate line 28 to a gate 16 formed in the bottom force 12.

By thus using the lead frames ($S_1$ to $S_9$) having the aforementioned molding gate holes 14, the narrow gaps between the stacked lead frames ($S_1$ to $S_9$) can be fully charged with the resin. As a result, the problem of voids in the gaps can be solved to improve the yield of the step of molding the package 2A.

According to a second feature of the lead frames ($S_1$ to $S_9$) shown in FIGS. 24 to 32, index holes 17 of different patterns are formed in the lead frames in the long side direction. As a result, the layer identification number (the pattern of the index holes 17) of the lead frame (S) can be automatically read at the mass production time to easily judge whether or not the lead frames ($S_1$ to $S_9$) are stacked in the correct order, so that the yield and throughput of the packaging step of the package 2A can be improved.

In the lead frames ($S_1$ to $S_9$) shown in FIGS. 24 to 32, on the other hand, there are further formed at an edge of the frame portion of the each lead frame (S), in the lower side direction, index holes or notches 18 which are different for each of the lead frames (S). Thanks to the index holes 18 thus positioned, their layer identification numbers can be easily read out from the side. As a result, even after the lead frames ($S_1$ to $S_9$) are set in the insert mold 10, it can be easily judged whether or not the lead frames ($S_1$ to $S_9$) are stacked in the correct order.

According to a third feature of the lead frames ($S_1$ to $S_9$) shown in FIGS. 24 to 32, on the other hand, center holes 26 are formed along the parting line of each lead frame (S). By inserting pins or the like into those center holes 26 to fix the lead frames ($S_1$ to $S_9$) in the top force 11 and/or the bottom force 12, the movement of the package 2A is restricted when the movable plates 13 are extracted so that the parting operation of the movable plates 13 can be carried out within a short time period. It is also possible to prevent the deformation of the leads 6 when the movable plates 13 are extracted.

Figure 34:
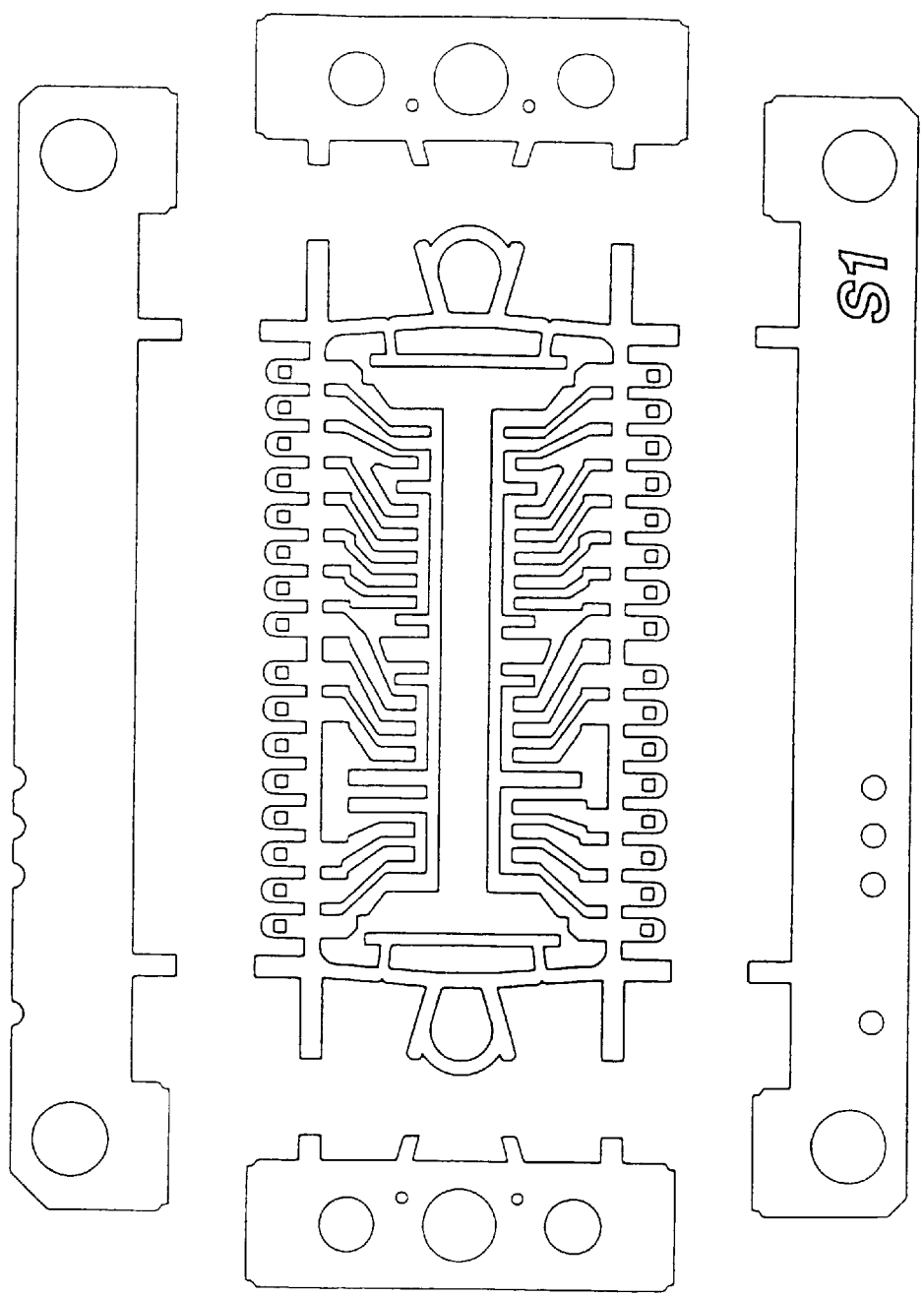
FIG. 34 is a top plan view showing the exploded state of the lead frame.

According to a fourth feature of the lead frames ($S_1$ to $S_9$) shown in FIGS. 24 to 32, on the other hand, half etch lines 19 are formed partially in the frame supporting the leads 6. These half etch lines 19 are formed simultaneously as the conductive material (or hoop material) for the lead frames are etched to form the pattern of the leads 6, so that they are formed of narrow grooves made half as deep as the thickness of the lead frames (S). When the lead frames (S) are folded along the half etch lines 19, the individual portions of the lead frame (S) can be easily cut off, as shown in FIG. 34. As a result, unnecessary parts of the lead frame ($S_1$ to $S_9$) exposed to the outside of the package 2A, can be removed. Moreover, when the unnecessary parts of the lead frames ($S_1$ to $S_9$) are removed, the leads 6 are less deformed undesirably.

Figure 35:
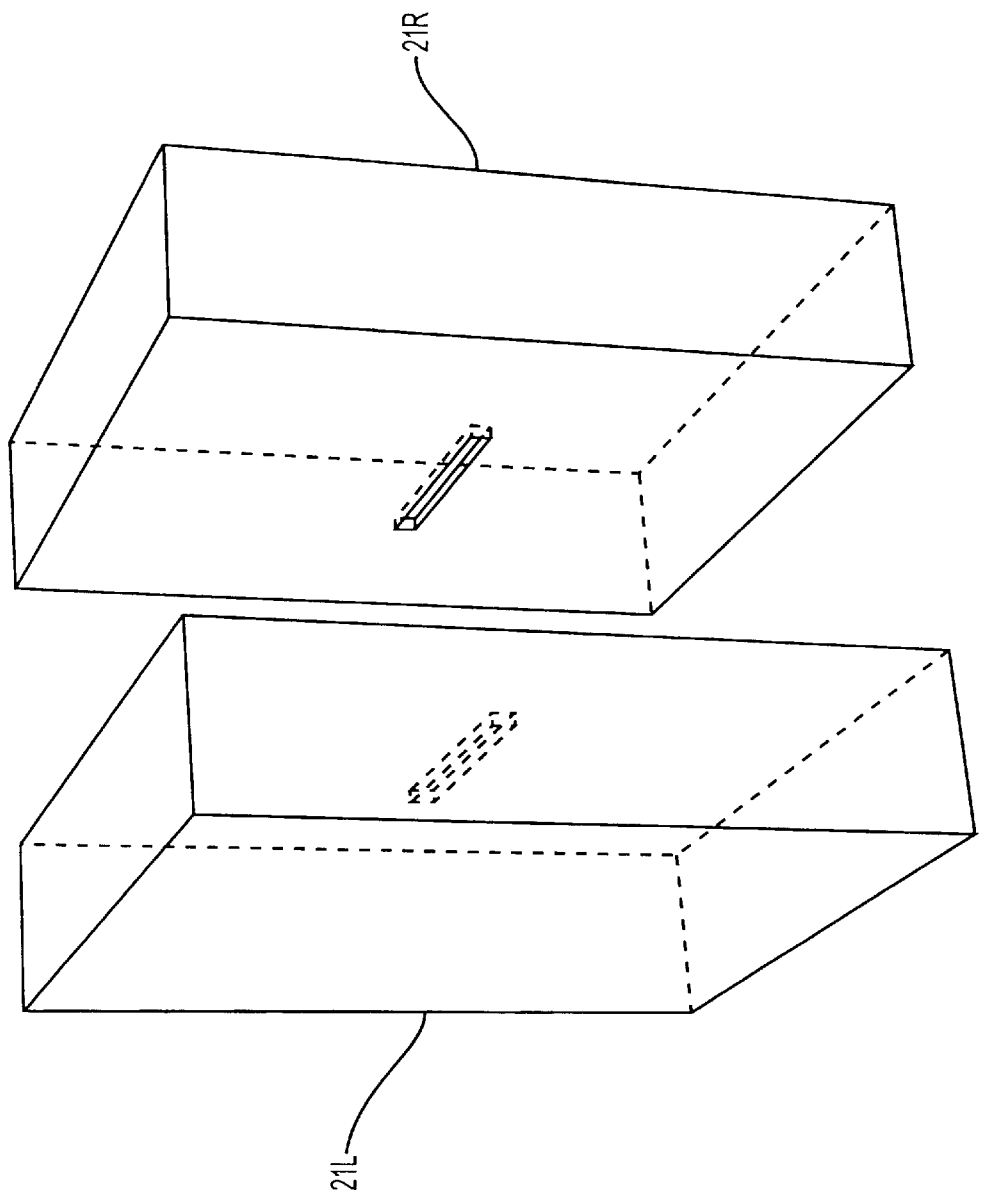
FIG. 35 is a perspective view showing a pair of movable plates of the mold used for manufacturing the mother socket.
Figure 36:
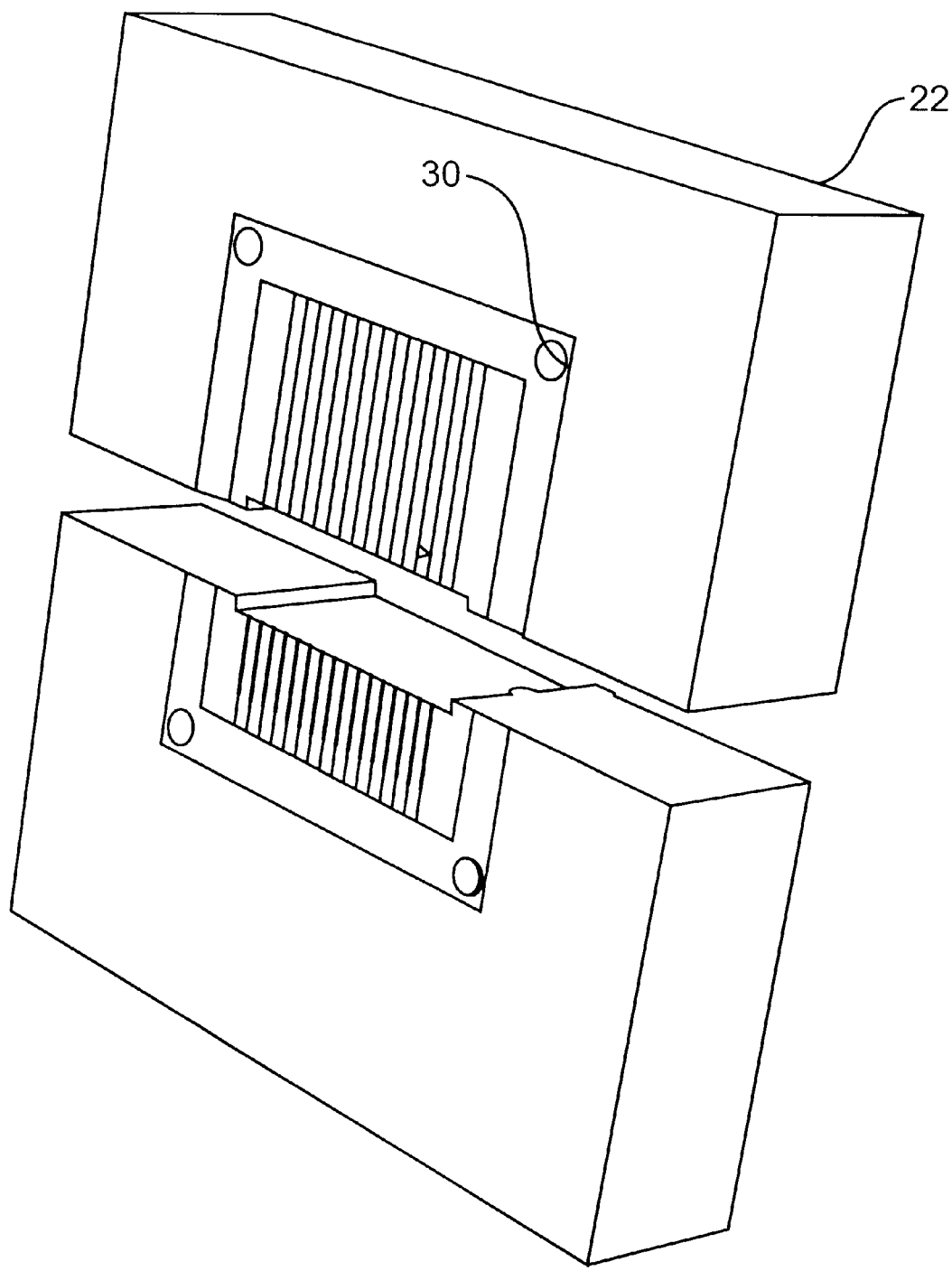
FIG. 36 is a perspective view showing a pair of center parts of the mold used for manufacturing the mother socket.
Figure 37:
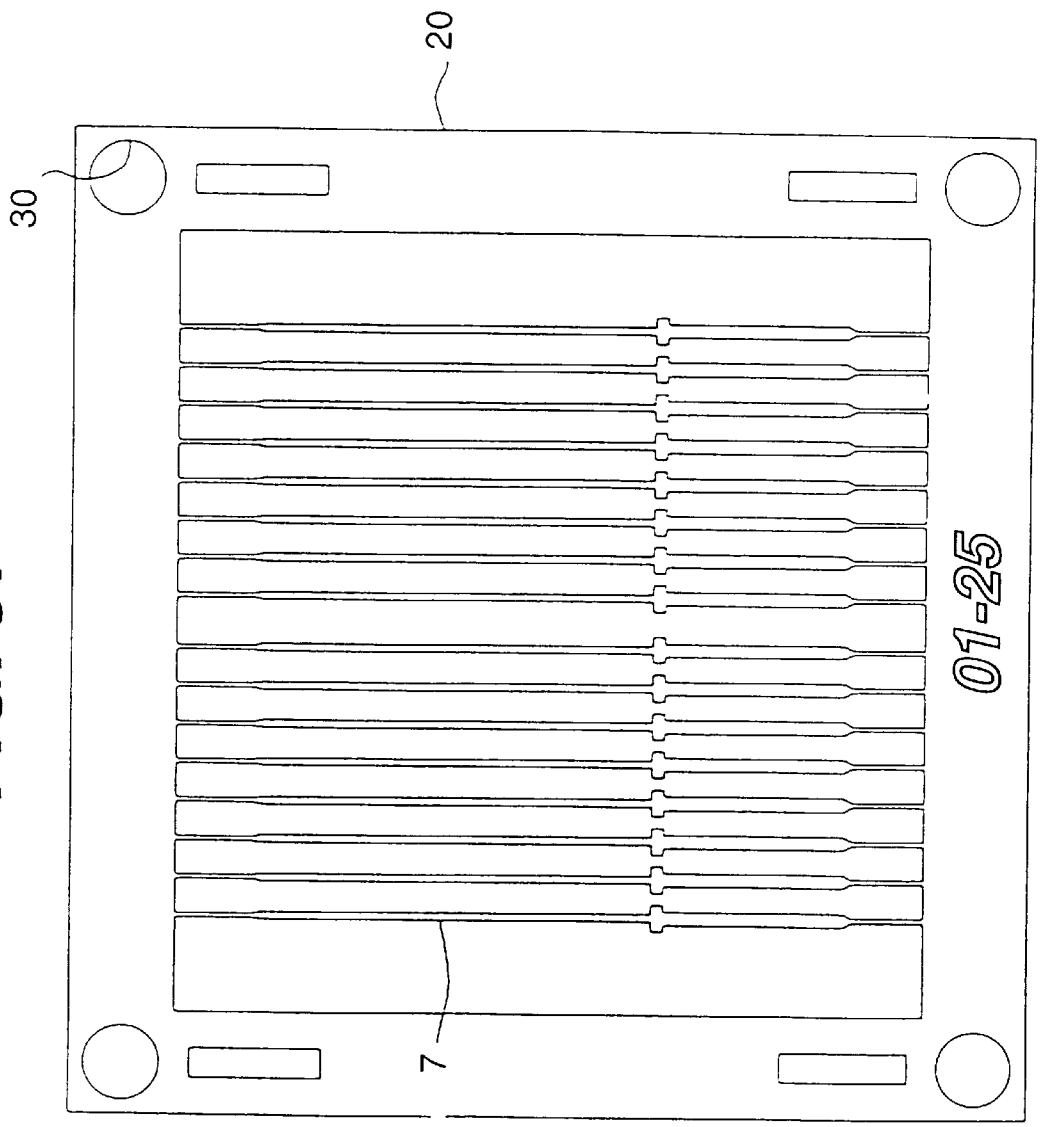
FIGS. 37 to 39 are top plan views showing lead frames used for manufacturing the mother socket.

Here will be described a mold for manufacturing the mother socket 3A, as shown in FIG. 17, in a high dimensional accuracy. This mold is constructed of a pair of lefthand and righthand horizontally movable plates 21L and 21R, as shown in FIG. 35, and a vertically movable center part 22, as shown in FIG. 36. By using this mold, the mother socket 3A can be manufactured in a high dimensional accuracy by preparing two mother socket lead frames 20, as shown in FIG. 37. One lead frame 20 is set between the movable plate 21L and the center part 22 whereas the other is set between a movable plate 21R and the center part 22. The insert molding is carried out by inserting the guide pins 30 of the center part 22 into the openings formed in the outer periphery of the mother socket lead frame 20.

Figure 38:
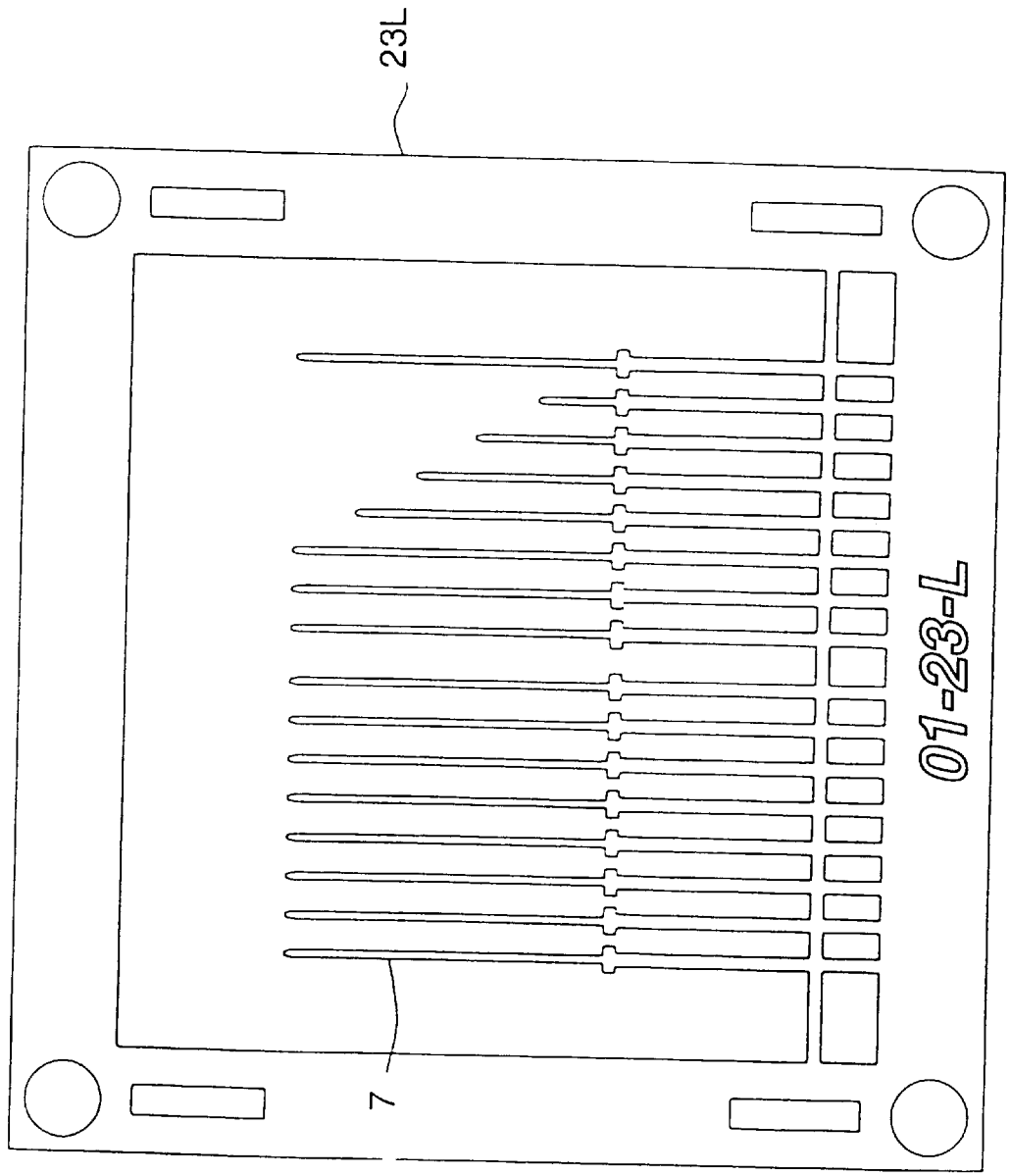
Figure 39:
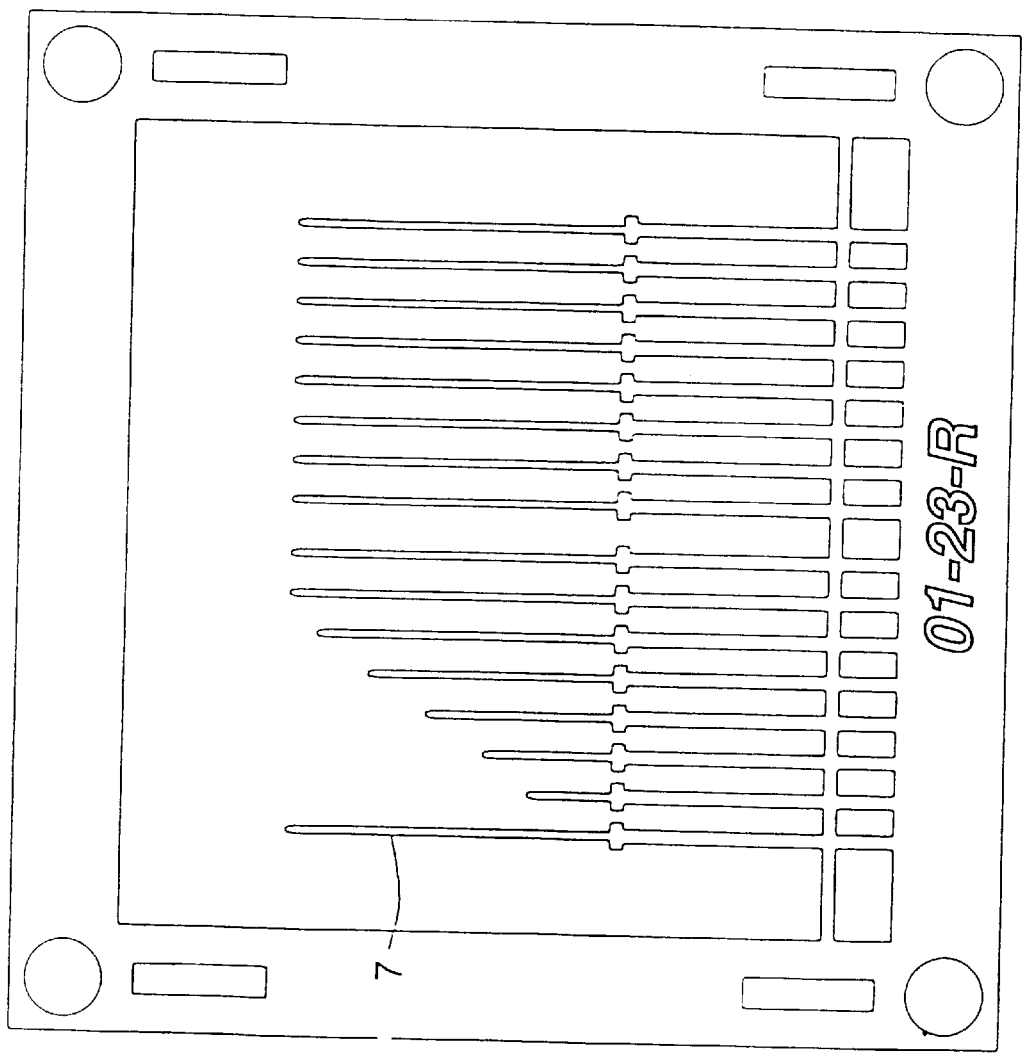

This mother socket lead frame 20 is made of the same 42 alloy or covar as that of the aforementioned lead frames ($S_1$ to $S_9$) and is given an average thickness of about 0.15 mm. The same epoxy resin or heat resistant liquid crystal polymer as that for the package 2A is used for the body of the mother socket 3. In place of two mother socket lead frames 20, as shown in FIG. 37, the module leads 9, cut to a necessary length and connected with the data pins of the package 2A, may be used in a combination as a mother socket lead frame 23L (for the lefthand part), as shown in FIG. 38, and a mother socket lead frame 23R (for the righthand part), as shown in FIG. 39.

In order to mount the package 2A on the mother socket 3A, the module leads 9 of the mother socket 3A are inserted into the openings 8 of the leads 6 of the package 2A, and they are then connected together by using a well-known solder dip apparatus. After this solder dipping, unnecessary solder may be easily removed by a high-speed centrifugal separation so that the module leads 9 and the leads 6 can be connected with a high throughput. Alternatively, the module leads 9 and the leads 6 can also be connected by a reflow soldering method using a solder paste, as will be described hereinafter.

When a large number of semiconductor chips (M) are encapsulated into one package 2A as in the DRAM module 1A of the present embodiment, the thermal expansions of the package 2A may be anisotropic in the vertical and horizontal directions because the epoxy resin has a relatively large coefficient of thermal expansion of about 10 ppm/° C. If this anisotropy occurs, the connection portions between the leads 6 of the package 2A and the module leads 9 of the mother socket 3 are subjected to a thermal stress to cause the open defects between the leads 6 and the module leads 9.

When this defect may occur, the module leads 9 of the mother socket 3A are made of a conductive material such as a copper alloy or phosphor bronze having a coefficient of thermal expansion approximate to that of the epoxy resin in place of the material having a low thermal expansion such as 42 alloy or covar. When a conductive material having a coefficient of thermal expansion approximate to that of the epoxy resin, is used the module leads 9 can follow the vertical expansion of the package 2A, so that the thermal stress applied to the connection portions between the leads 6 and the module leads 9 can be reduced to lower the degree of occurrence of the open defect. Moreover, the copper alloy is so thermally conductive as to have a high heat radiation, so that it can be used as the material not only for the module leads 9 but also the lead frame (S) to lower the thermal resistance of the DRAM module 1A.

In the aforementioned lead frames ($S_1$ to $S_9$), as shown in FIGS. 6 to 16 and FIGS. 24 to 32, all their leads 6 are electrically conductive through the metal tie bars. This makes it impossible to perform the testing, screening and aging for confirming whether or not all the semiconductor chips (M), mounted on the lead frame (S) and wire-bonded, are normally operative, immediately before the molding step.

Figure 40:
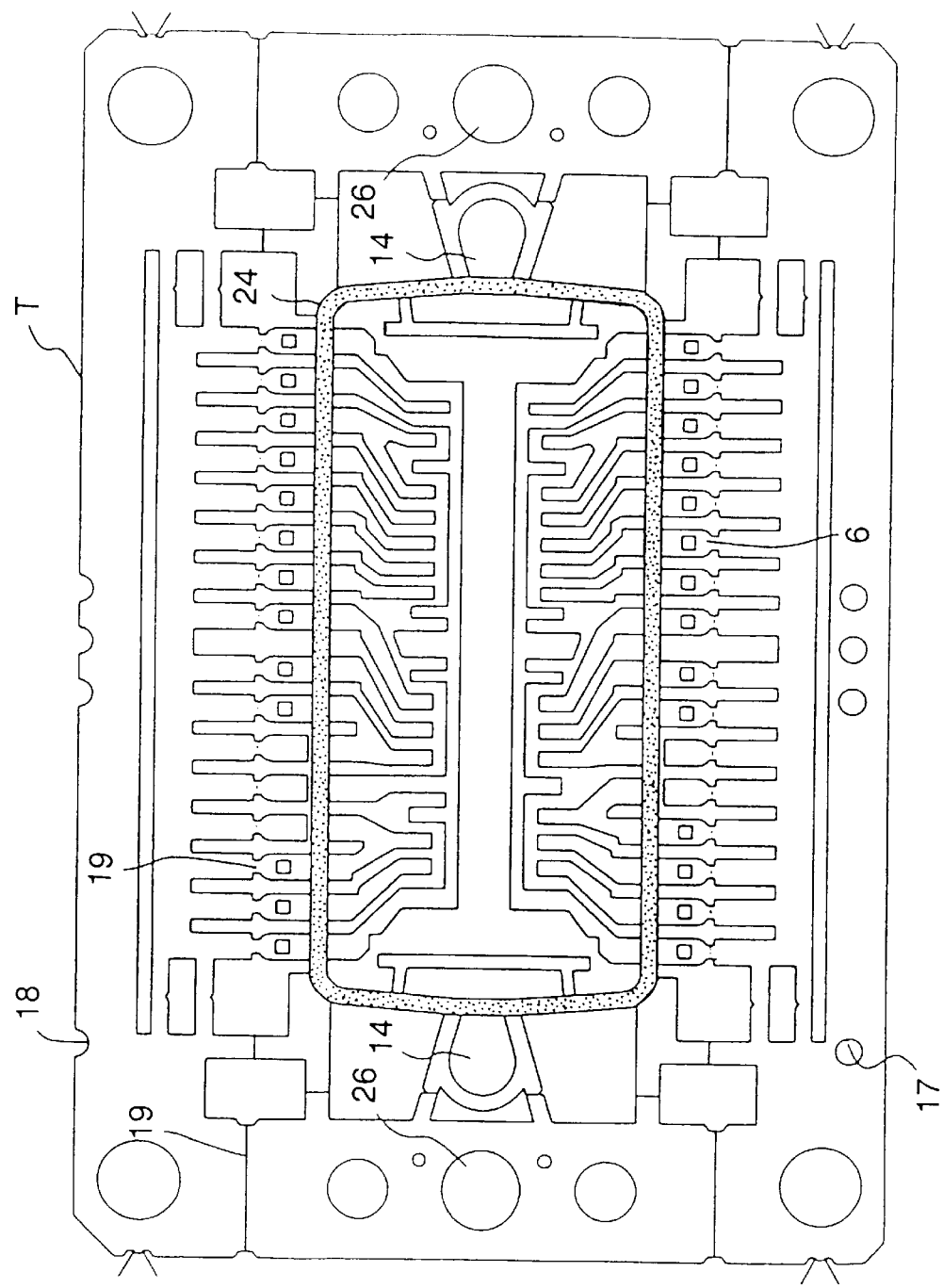
FIGS. 40 to 49 are top plan views showing another embodiment of the lead frames.
Figure 41:
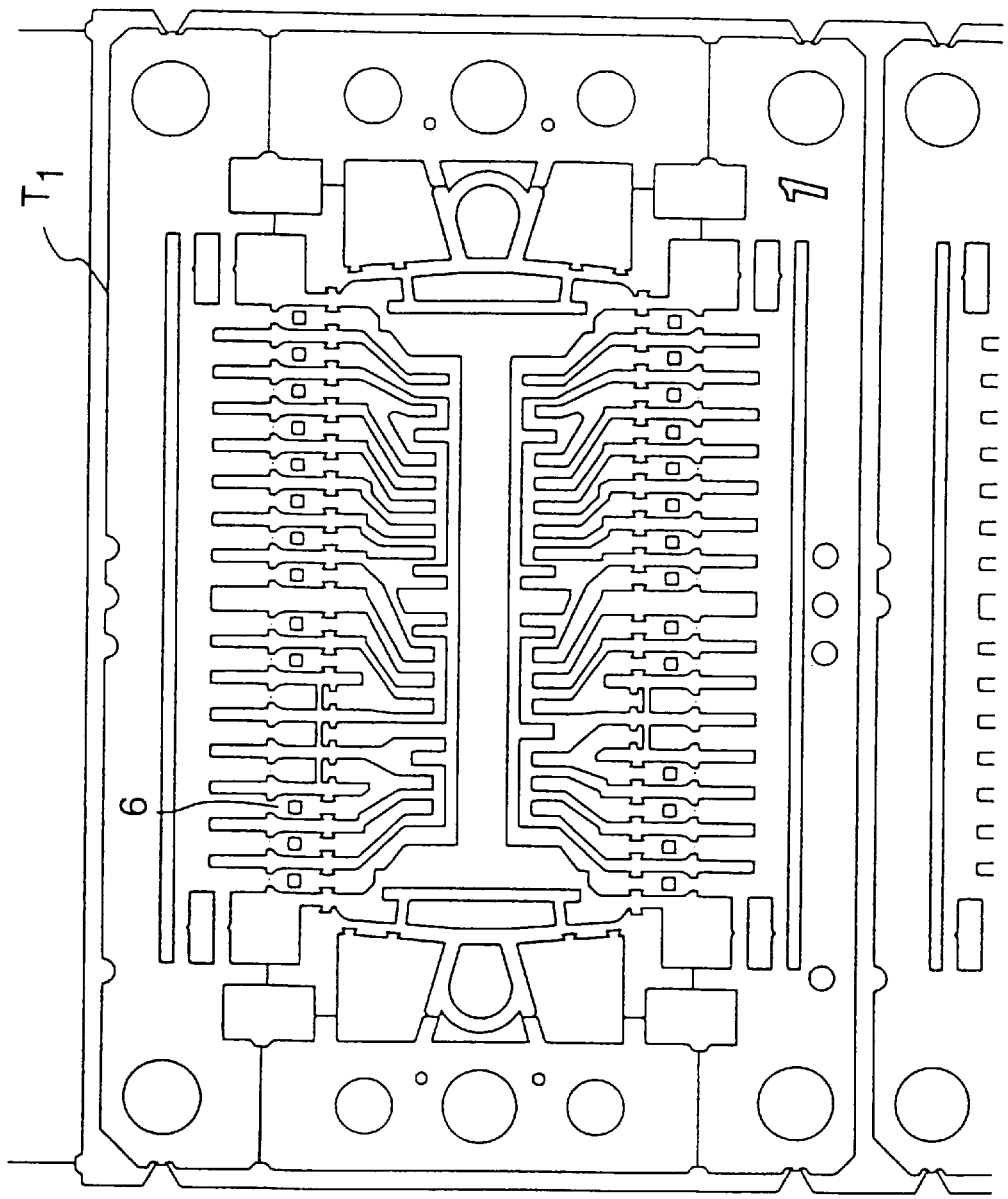
Figure 42:
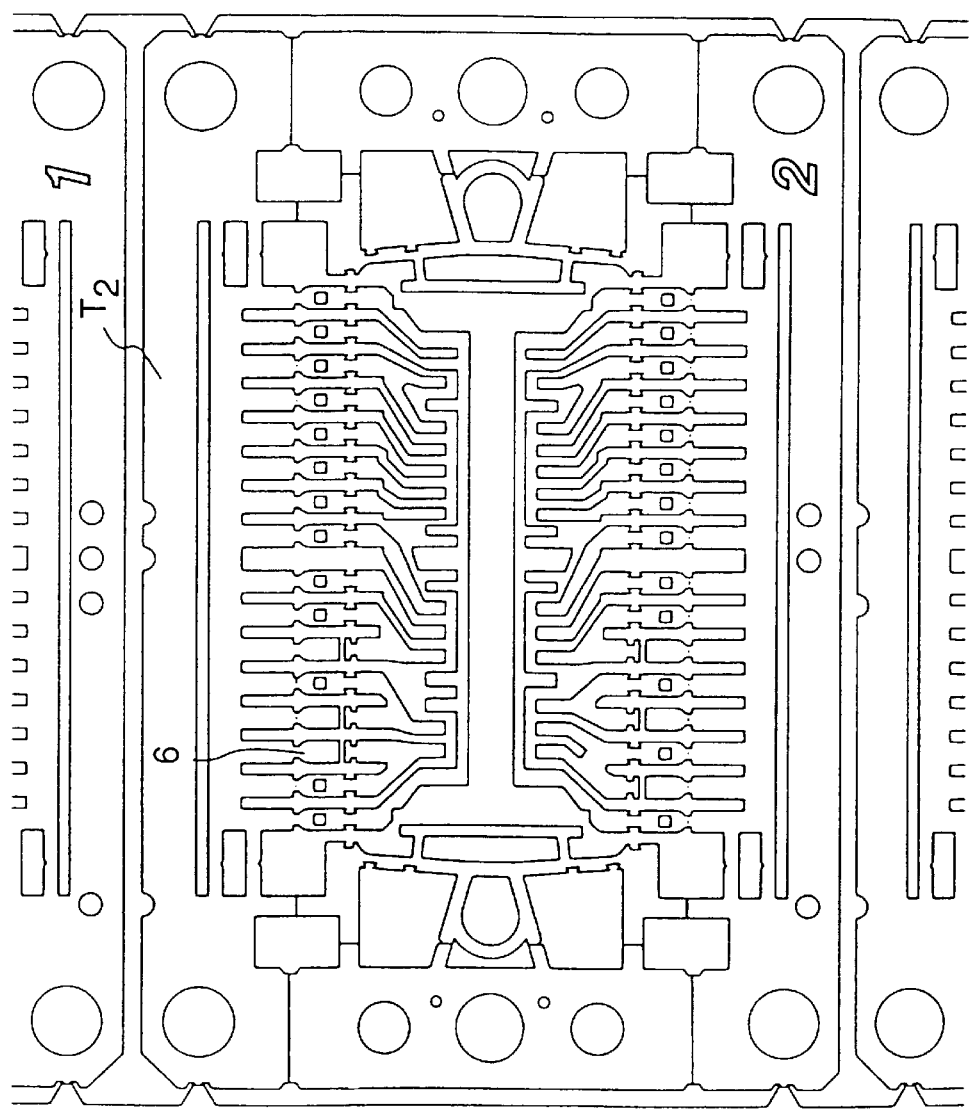
Figure 43:
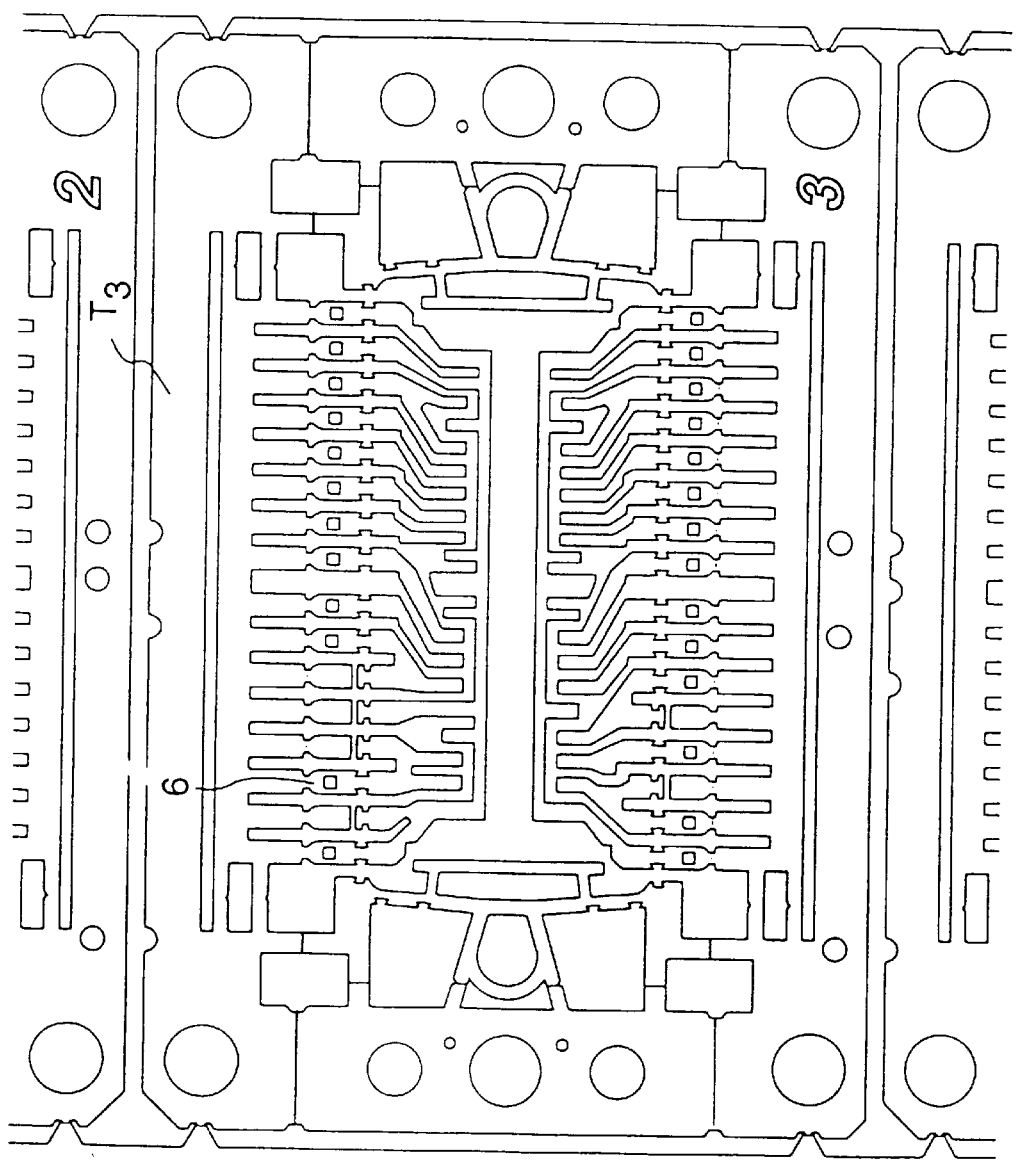
Figure 44:
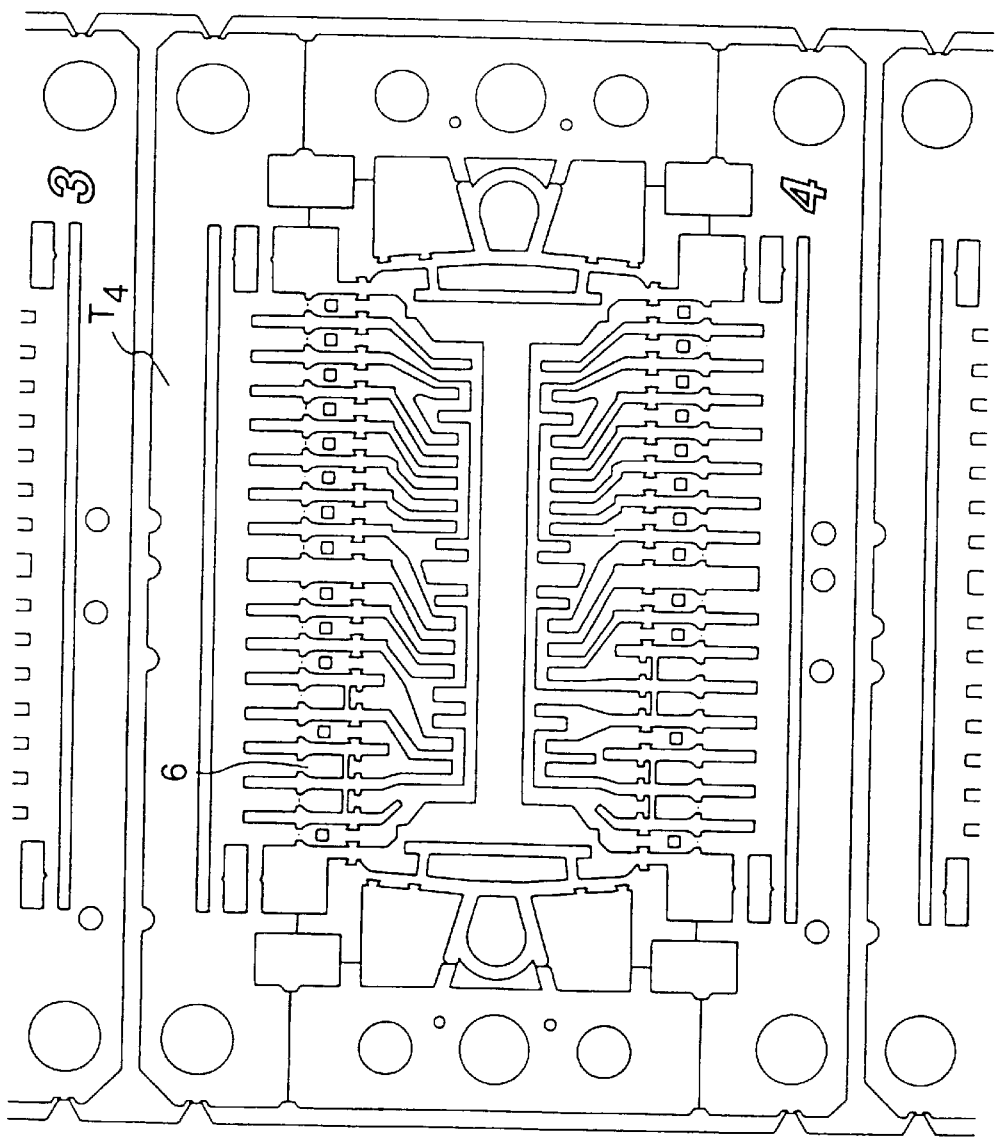
Figure 45:
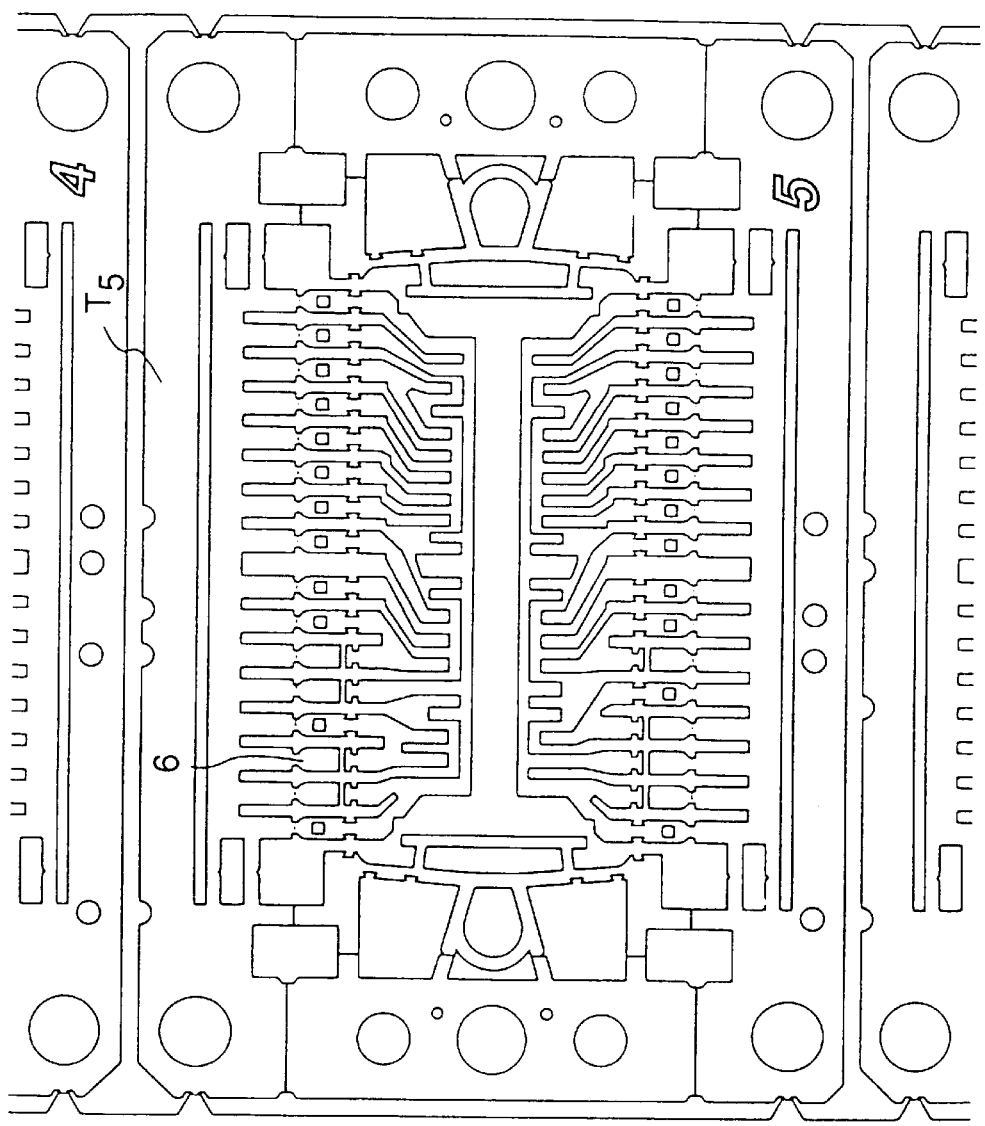
Figure 46:
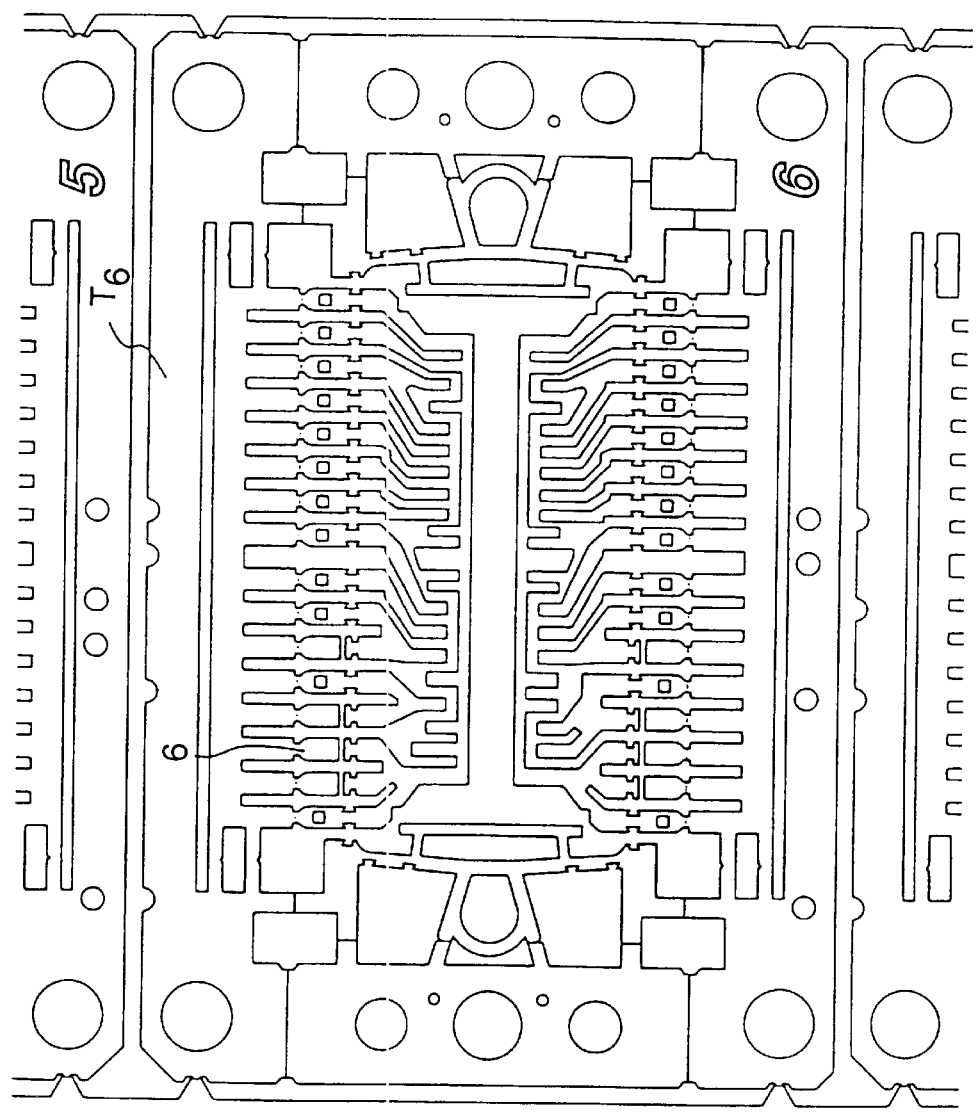
Figure 47:
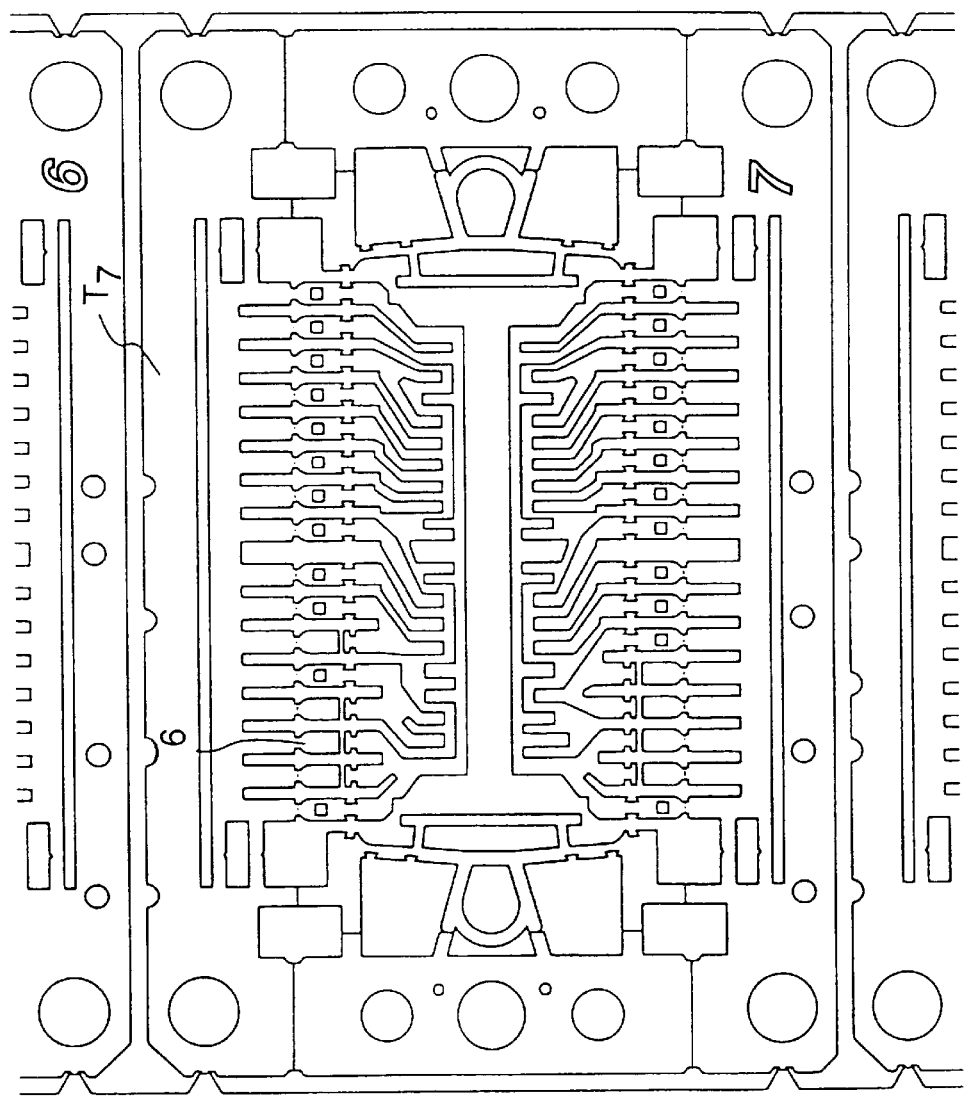
Figure 48:
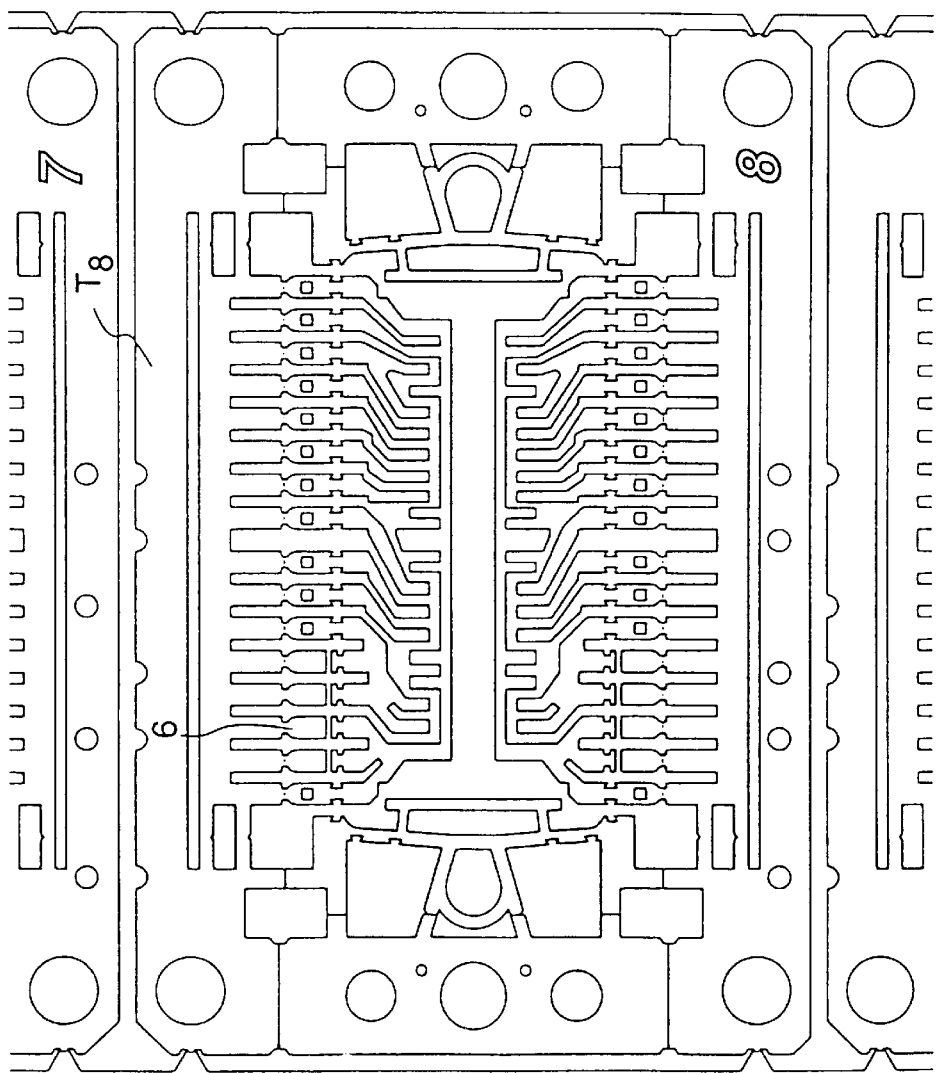
Figure 49:
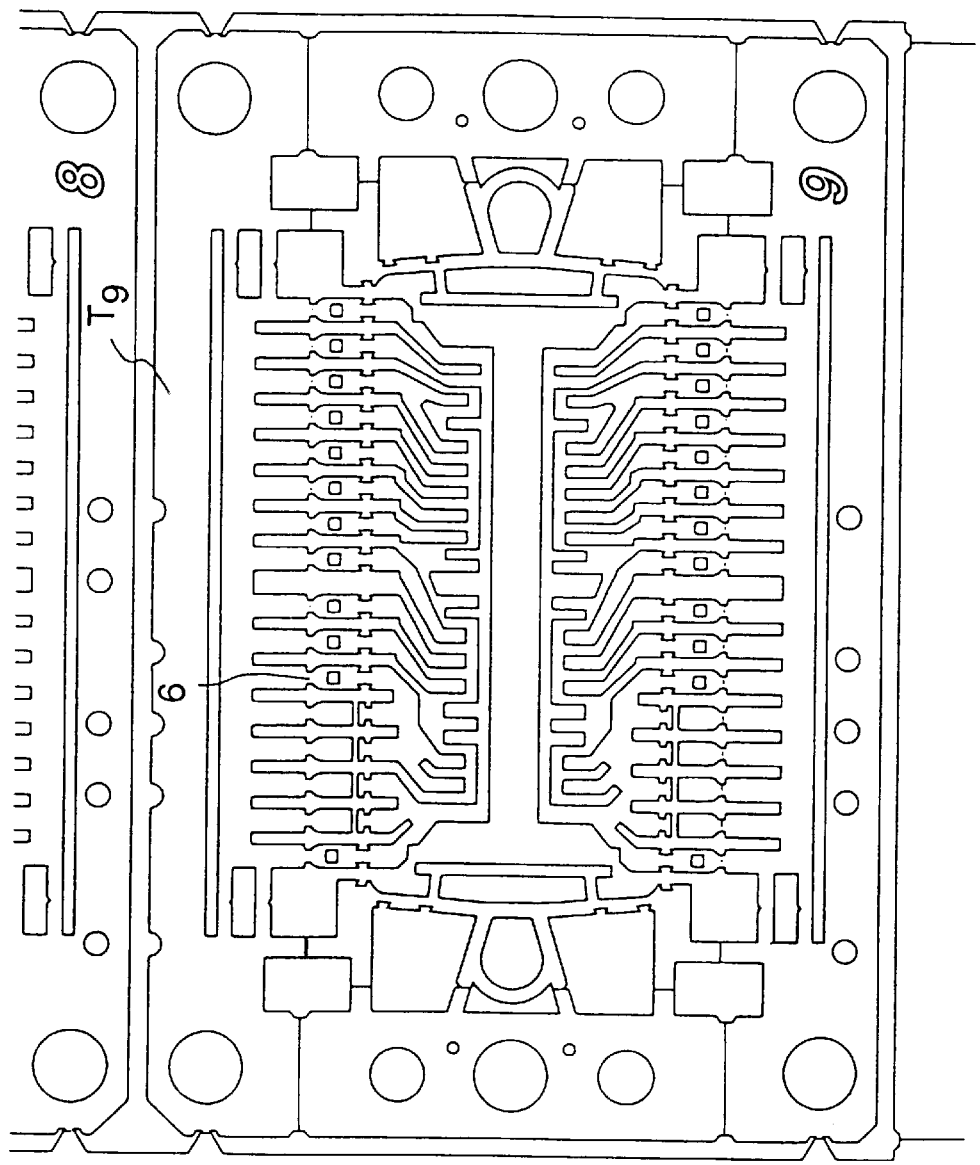
Figure 50:
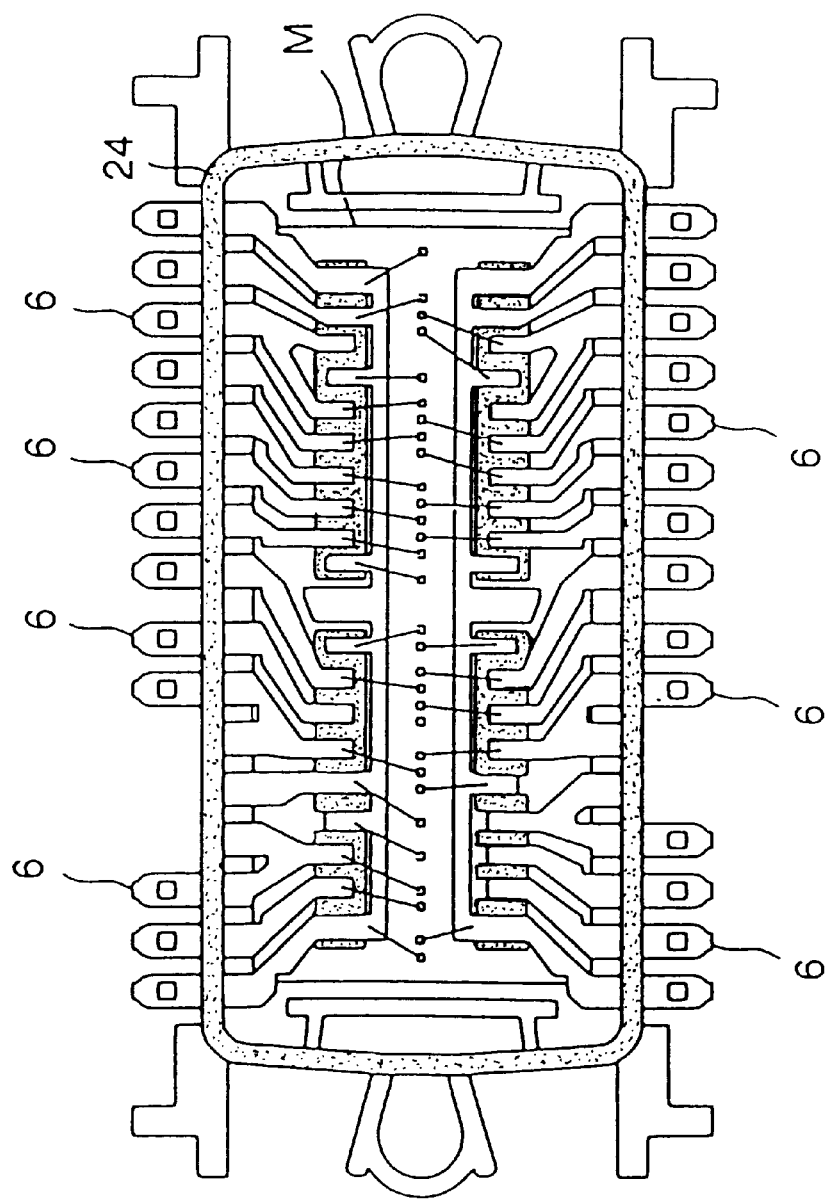
FIG. 50 is a top plan view of the lead frame and shows a state that the outer metal portion holding the leads is separated.

In order to eliminate this difficulty, the tape dam type lead frames (T) having an insulating tape 24 bonded on the mold line, as shown in FIG. 40, is used. The insulating tape 24 is made of a polyimide resin or a high heat-resistant liquid crystal polymer like the aforementioned insulating tape 4 of the lead frame (S). The insulating tape 24 can be formed not only by a bonding method for bonding it to the lead frame (T) with an adhesive but also by an injection molding method of a resin.

Nine tape dam type lead frames ($T_1$ to $T_9$) used for manufacturing the DRAM module 1A of the present embodiment are shown in FIGS. 41 to 49. Incidentally, the insulating tape is not shown in FIGS. 41 to 49.

These lead frames ($T_1$ to $T_9$) can bring their individual leads 6 into electrically floating states by cutting the metal portions holding the leads after the semiconductor chips ($M_0$ to $M_8$) are mounted and wire-bonded, as shown in FIG. 40, so that the semiconductor chips ($M_0$ to $M_8$) can be tested, screened and aged immediately before the molding step. In these lead frames ($T_1$ to $T_9$), the half etch lines 19 are also formed in the corresponding portions, so that the metal portions holding the leads 6 may be easily cut off. Incidentally, the tie bar cutting step can be omitted if those lead frames ($T_1$ to $T_9$) are used.

It is important that the sizes of the lead frames ($S_1$ to $S_9$ and $T_1$ to $T_9$) used in the DRAM module 1A of the present embodiment should be highly accurately the same. If this dimensional accuracy is poor, a high mechanical stress may be applied to the connection portions between the module leads 9 of the mother socket 3A and the leads 6 of the package 2A to deteriorate the connection reliability.

Figure 51:
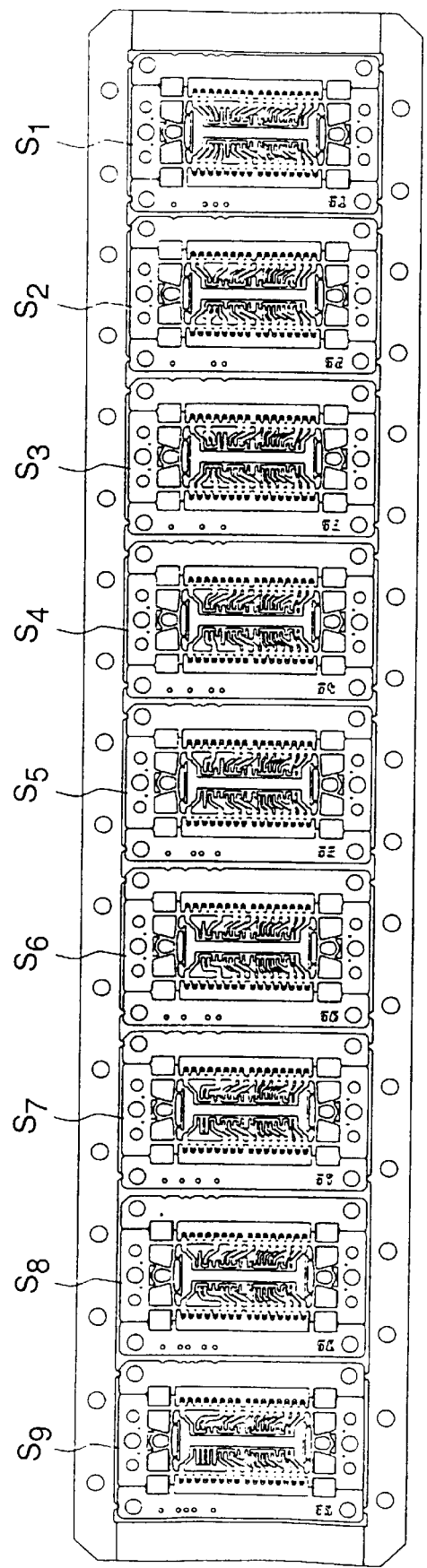
FIG. 51 is a top plan view showing the entirety of one lead frame assembly composed of the nine lead frames shown in FIGS. 24 to 32.

In the present embodiment, therefore, the aforementioned nine lead frames ($S_1$ to $S_9$ or $T_1$ to $T_9$) are subjected altogether as a set, when manufactured, to a photo-etching process at a step. FIG. 51 presents an overall top plan view showing the nine lead frames ($S_1$ to $S_9$), as shown in FIGS. 24 to 32, are prepared as one set.

By molding the package 2A using the aforementioned lead frame set, the openings 8 of the leads 6, vertically overlapped in the side of the package 2A, can be highly accurately aligned to reduce the mechanical stress which is applied to the connection portions between the module leads 9 and the leads 6.

The DRAM module 1A of the present embodiment can be prepared by encapsulating the nine semiconductor chips ($M_0$ to $M_8$) altogether into the package 2A. Despite this example, however, ten or more semiconductor chips (M) could be encapsulated altogether. However, as the number of the semiconductor chips (M) encapsulated increases to enlarge the vertical size of the package 2A, the module leads 9 of the mother socket 3A are accordingly elongated to raise a problem in deformation.

Figure 52:
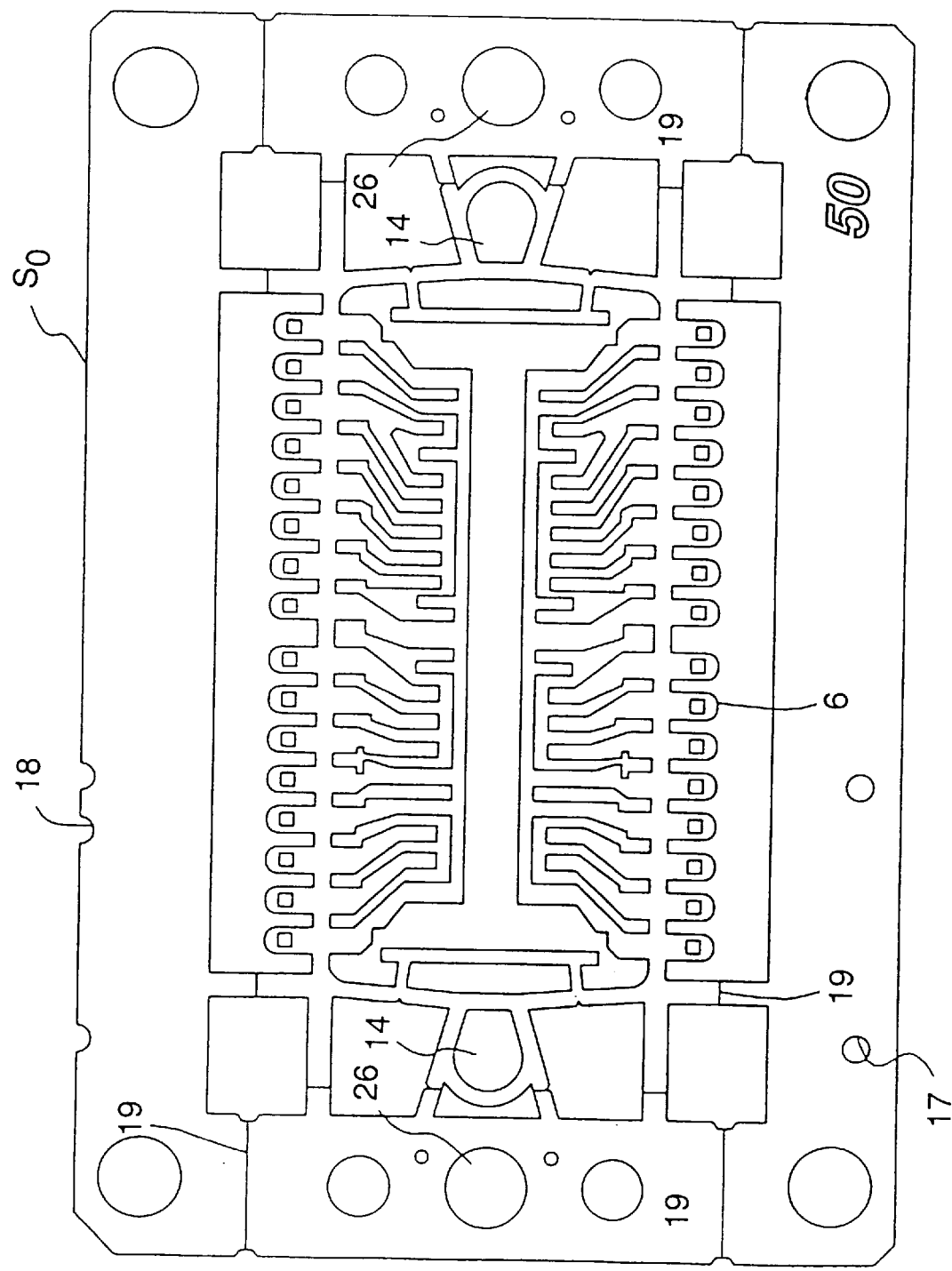
FIGS. 52 and 53 are top plan views showing dummy lead frames.
Figure 53:
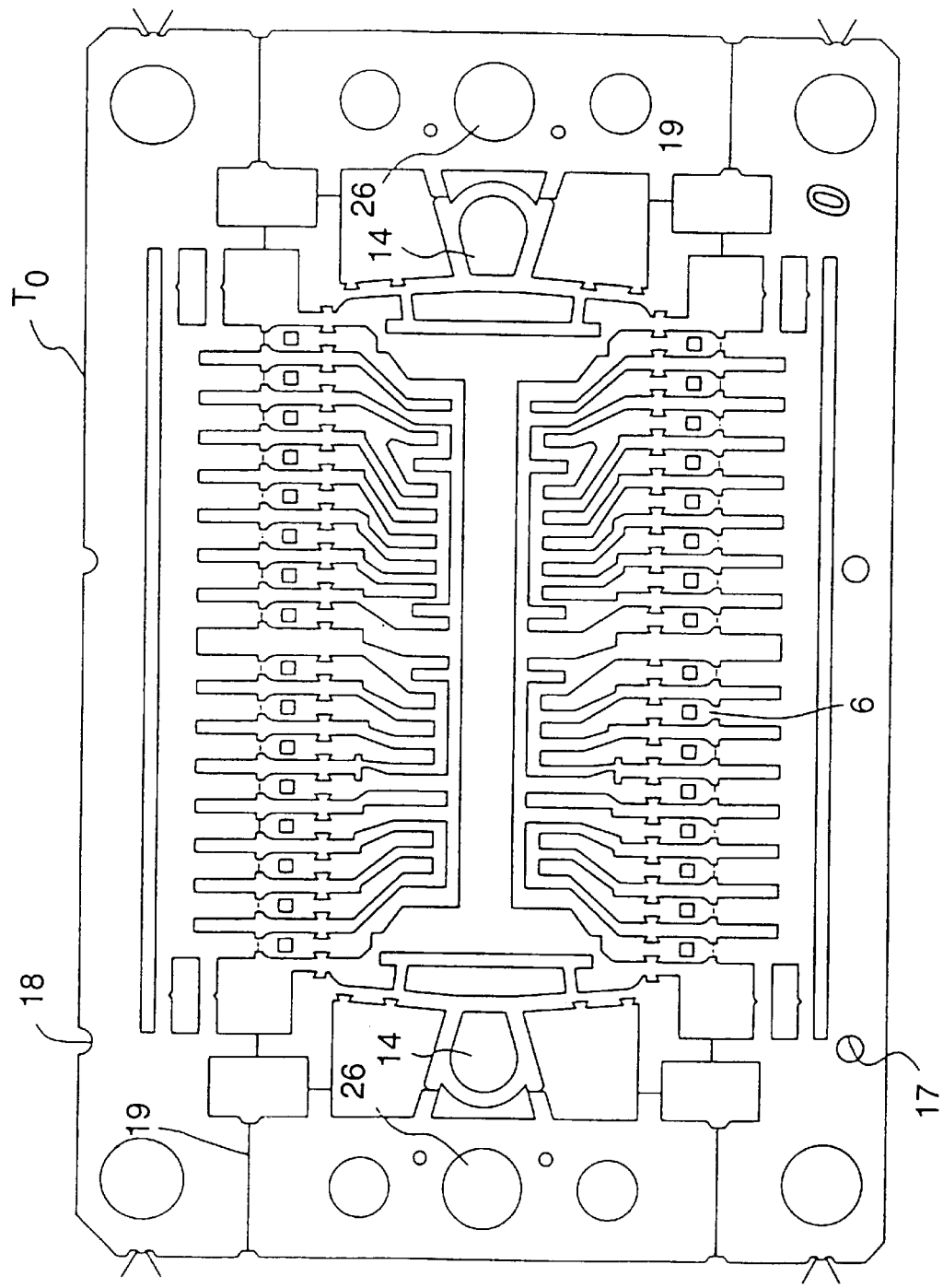

In order to solve this problem, a dummy lead frame, which is not electrically connected with the semiconductor chip (M) and in which all the pins are in electrically floating states, is arranged between the layers of the lead frames ($S_1$ to $S_9$ or $T_1$ to $T_9$) or at the uppermost layer and encapsulated altogether. Examples of dummy lead frame are shown in FIGS. 52 and 53. The lead frame ($S_0$) of FIG. 52 is of the metal tie bar type and is used in a combination with the lead frames of FIGS. 24 to 32. On the other hand, the lead frame ($T_0$) of FIG. 53 is of the tape dam type and is used in a combination with the lead frames ($T_1$ to $T_9$) of FIGS. 41 to 49.

By connecting the leads 6 of the dummy lead frame ($S_0$ or $T_0$) with the module leads 9, the number of the leads 6 connected with the module leads 9 increases to make the module leads 9 hard to deform. Moreover, the heat dissipation paths for the package 2A are increased to lower the heat resistance.

Here will be described an embodiment in which the present invention is applied to the DRAM module having a multi-bit construction of large data width.

In order to realize the DRAM module of multi-bit construction such as ×36 bits, the following several methods are conceivable.

(1) A DRAM module having a construction of [4194304 words×9 bits] is prepared by using nine DRAM chips of 4 Mbits having a construction of [4194304 words×1 bit], and four DRAM modules are packaged in the printed circuit board of SIMM.

(2) Four DRAM modules having a construction of [4194304 words×8 bits] by combining eight DRAM chips of 4 Mbits having the construction of [4194304 words×1 bit] and four SOJs packaging DRAM chips of 4 Mbits having the construction of [4194304 words×1 bit] are packaged in the printed circuit board of SIMM.

(3) Four DRAM modules having the construction of [4194304 words×8 bits] by combining eight DRAM chips of 4 Mbits having the construction of [4194304 words×1 bit] and one SOJ packaging a DRAM chip of 16 Mbits having the construction of [4194304 words×4 bits] especially for the parity, in which four CASes and two RASes are independent, are mounted on the printed circuit board of SIMM.

According to these methods, a DRAM module having the construction of [16777216 words×36 bits] can be realized by preparing the DRAM module 1A of the construction of ×9 bits of the foregoing Embodiment with stacked nine DRAMs of 16 Mbits having a construction of [16777216 words×1 bit] and by mounting the DRAM module 1A on the printed circuit board of SIMM.

According to the aforementioned methods, however, the mounting density drops because the numerous DRAM modules have to be mounted on the printed circuit board of SIMM. At this time, when the DRAM module having the construction of [4194304 words×36 bits] is realized, only one DRAM module mounted on the printed circuit board of SIMM is needed to improve the mounting density drastically, if the DRAM module of the construction of ×36 bits can be prepared by stacking nine DRAM chips of 16 Mbits having the construction of [4194304 words×4 bits] in one LSI package.

In the DRAM module having the multi-bit construction, on the other hand, many data lines cause the data input/output pins to be concentrated in the same direction, if the semiconductor chips are simply stacked, so that the lead frames become difficult to lay out. In the case of the DRAM module having the construction of ×36 bits, for example, the pins are led out in dual in-line to form 18 pins×2 rows, but the data region for the lead frames is much enlarged if the line/space of the pins are considered. However, the corresponding bonding pad region of the semiconductor chip, i.e., the region having the four bonding pads (BP) IO0 to IO3, as shown in FIG. 5, is very small. As a result, the wiring of the leads is so much elongated that the size of the lead frames and accordingly the LSI package therefor are increased.

Figure 54:
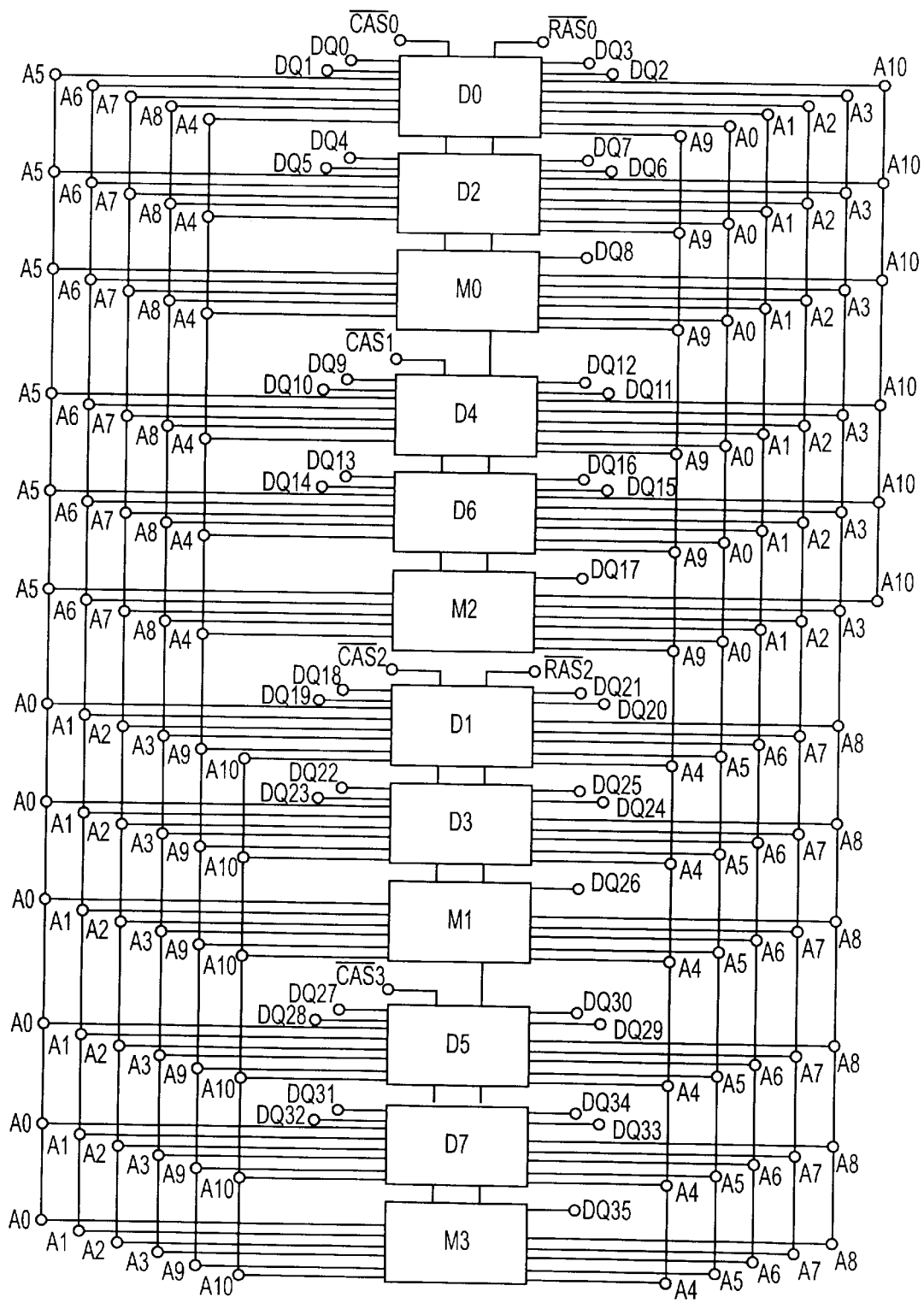
FIG. 54 is an equivalent circuit diagram of the DRAM module.

The method for realizing a small-size/high-performance DRAM module of multi-bit construction while solving the above-specified problems will be described in the following, taking as an example a method for realizing a DRAM module of a construction of ×36 bits equivalently, as shown in FIG. 54, by stacking twelve DRAM chips having the construction of [4194304 words×4 bits].

In FIG. 54, the eight semiconductor chips ($D_0$ to $D_7$) of the twelve semiconductor chips are DRAM chips of 16 Mbits having the construction of [4194304 words×4 bits], and the remaining four semiconductor chips ($M_0$ to $M_3$) are DRAM chips of 4 Mbits having the construction of [4194304 words×1 bit]. Incidentally, the description will be simplified by using only one bit of the DRAM chip of 16 Mbits having the construction of [4194304 words×4 bits] in place of the DRAM chip ($M_0$ to $M_3$) of 4 Mbits having the construction of [4194304 words×1 bit] shown in FIG. 54. This can be easily modified to the layout of the DRAM chip ($M_0$ to $M_3$) of 4 Mbits having the construction of [4194304 words×1 bit].

First of all, the present embodiment is given a dual in-line structure in which the pins are arranged in two rows on one side, when twelve DRAM chips of 16 Mbits having the construction of [4194304 words×4 bits] are used. In the present embodiment, moreover, when the lead frames mounted with the semiconductor chips are stacked and packaged, some of them are inverted by 180 degrees in a horizontal plane such that the pads of the semiconductor chips mounted on the inverted lead frames and the pads of the semiconductor chips mounted on the non-inverted lead frames are opposed to each other with respect to an axis of inversion. In the present embodiment, still moreover, the twelve semiconductor chips are divided into two packages each composed of six semiconductor chips, and these two packages are stacked and mounted on the mother socket.

Figure 55:
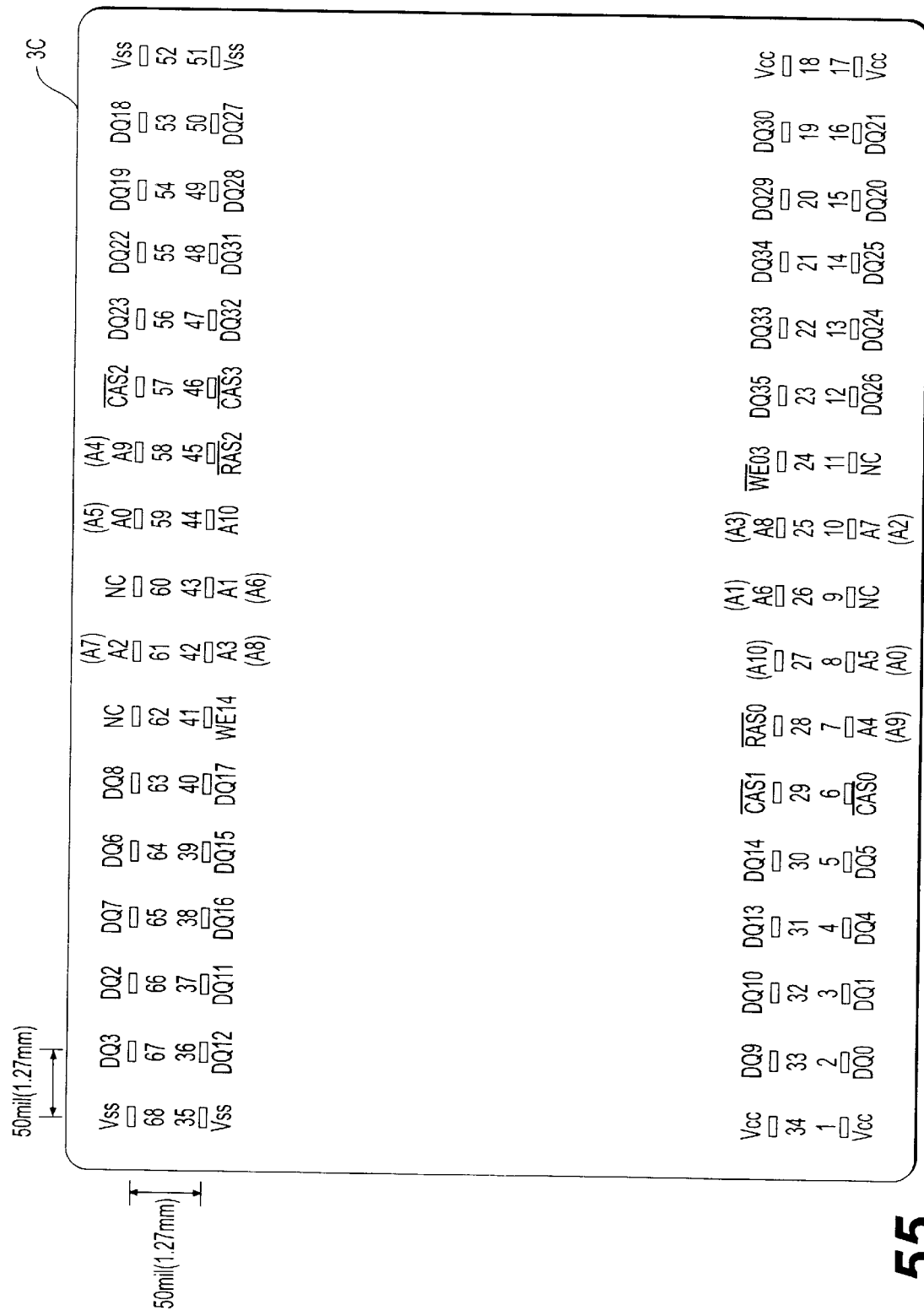
FIG. 55 is a top plan view showing a pin array of the mother socket adapted to a dual in-line structure.

FIG. 55 is a top plan view showing the pin (or the module leads 9) array (the portion to be connected with the printed circuit board of SIMM is viewed from above) of the mother socket 3C corresponding to the aforementioned dual in-line structure.

This pin array is a sixty eight pin structure of 17 pins×4 rows, and the pin 9 and the pin 60 are given an NC or pin-less structure. The pin pitch is 50 mil (or 1.27 mm) in both the long and short side directions of the mother socket 3B. The Vcc is applied to the pins 1, 17, 18 and 34, and the Vss is applied to the pins 35, 51, 52 and 68, so that the reduction of the impedance at the power supply time is realized by the parallel connections. The correspondences of the address pins are different between the inverted chips and the non-inverted chips, but the ten bits (A0 to A9) to be shared between the X-address and the Y-address are given the one-to-one correspondence. An address pin A10 is different in its arrangement for the inverted chips and the noninverted chips, so that it can be adaptable to the designations of refresh addresses and the X-address/Y-address. In the actual use, the address pin (A10) of the inverted chips and the address pin A10 of the non-inverted chips are connected by external or internal wires.

The pin 7 is for the A4 (or A9); the pin 8 is for the A5 (A0); the pin 10 is for the A7 (A2); the pin 11 is for the NC; the pin 25 is for the A8 (A3); the pin 26 is for the A6 (A1); the pin 27 is for the (A10) having no correspondence to the non-inverted chips; the pin 42 is for the A3 (A8); the pin 43 is for the A1 (A6); the pin 44 is for the A10 having no correspondence to the inverted chips; the pin 58 is for the A9 (A4); the pin 59 is for the A0 (A5); the pin 61 is for the A2 (A7); and the pin 62 is for the NC (the parenthesized pins are inverted chips). A /WE is the pin 41 for the non-inverted chips and the pin 24 for the inverted chips. As shown in FIG. 54, the /RAS0, the /RAS2, the /CAS0, the /CAS1, the /CAS2 and the /CAS3 are the pin 28, the pin 45, the pin 6, the pin 29, the pin 57 and the pin 46, respectively. The remaining pins are data pins (DQ0 to DQ35).

The layouts of twelve lead frames ($L_1$ to $L_{12}$), as made to correspond to the pin arrangement of the aforementioned dual in-line structure, are shown in FIGS. 56 to 67. In these Figures, moreover, there are shown the contours of the package 2C, the semiconductor chips (M), the bonding pads (BP), the wires 7 and the later-described decoupling capacitors 31. However, the illustration of the insulating tape (5) sandwiched between the semiconductor chips (M) and the lead frames (L) is omitted.

Figure 56:
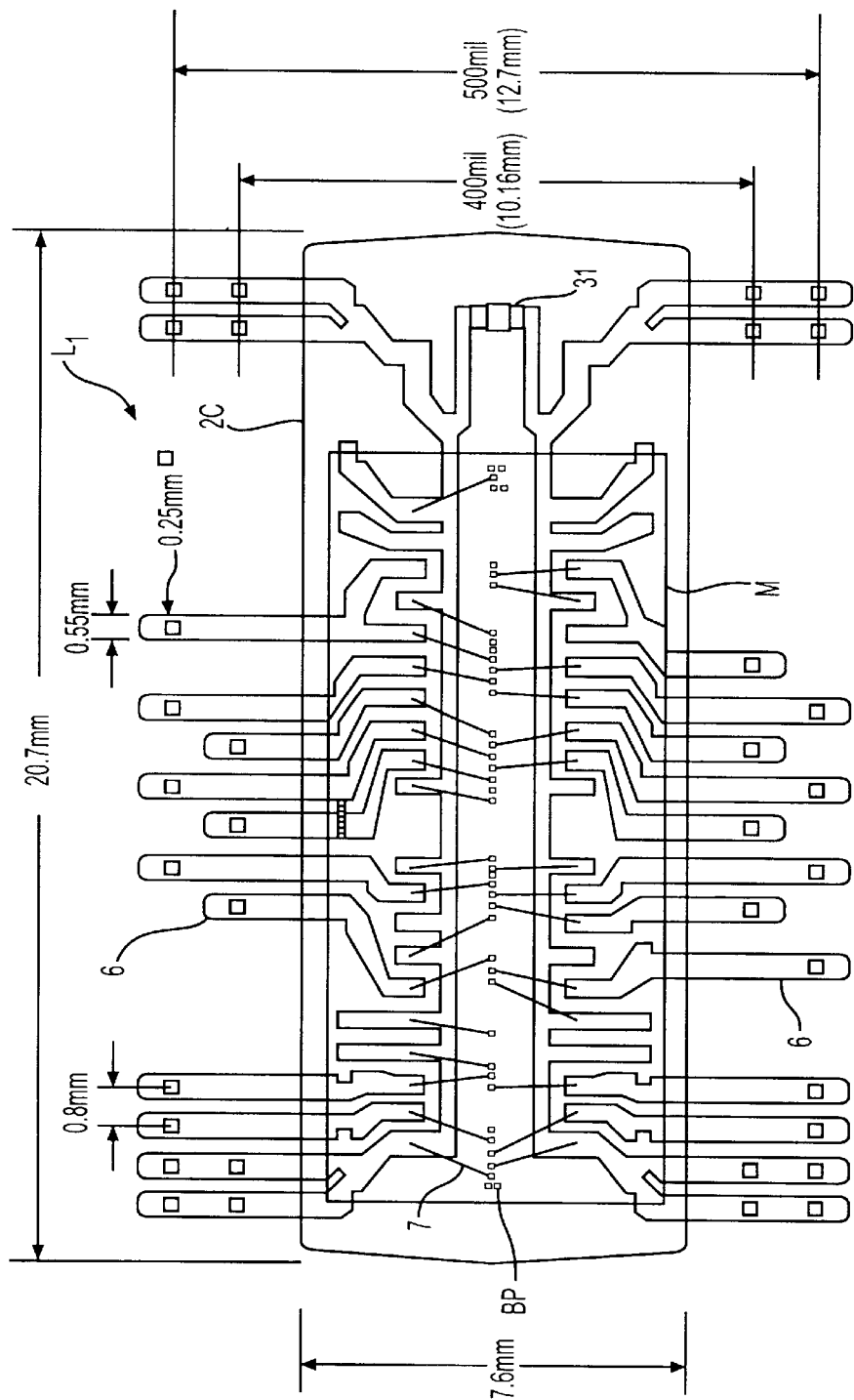
FIGS. 56 to 67 are top plan views showing another example of lead frames.

As shown in FIG. 56, the external size of the package 2C is 7.6 mm (the shorter side)×20.7 mm (the long side). There are two kinds of long and short leads 6 of the lead frame (L), each of which has the openings 8 for inserting the module leads 9 of the mother socket 3C thereinto. The pitches of the leads 6 led out from one side of the package 2C, and the leads 6 led from the other side are 400 mil (10.16 mm) for the short outer leads 6 and 500 mil (12.7 mm) for the long outer leads 6 around the openings 8. These pitches correspond to the pitches of the two rows of pins of the mother socket 3C, as shown in FIG. 55. The individual leads 6 have a width of 0.55 mm, and the openings 8 have a diameter of 0.25×0.25 mm, but the leads 6 have a pitch of 0.8 mm smaller than the pin pitch (50 mil (1.27 mm) of the mother socket 3C.

Figure 57:
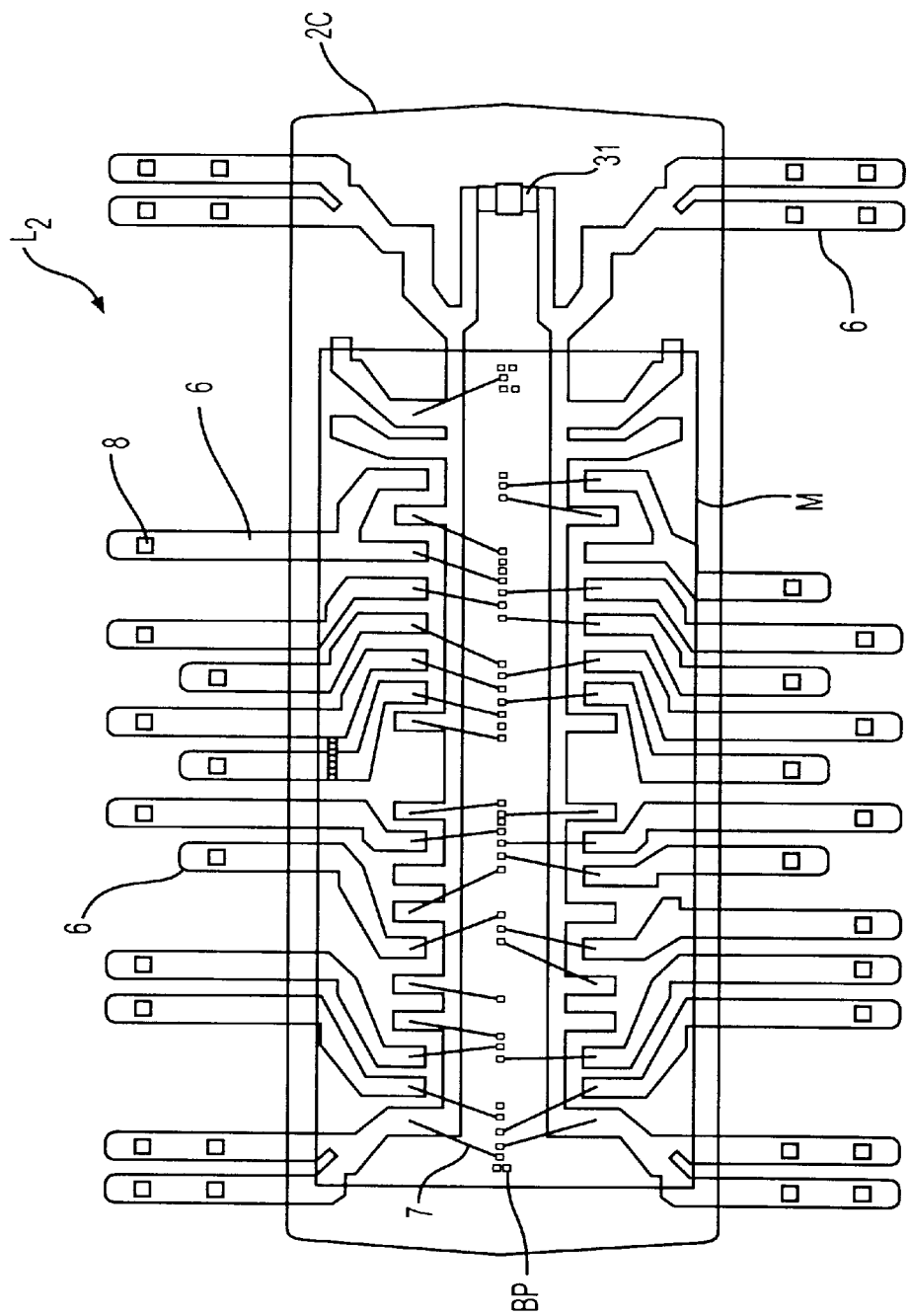
Figure 58:
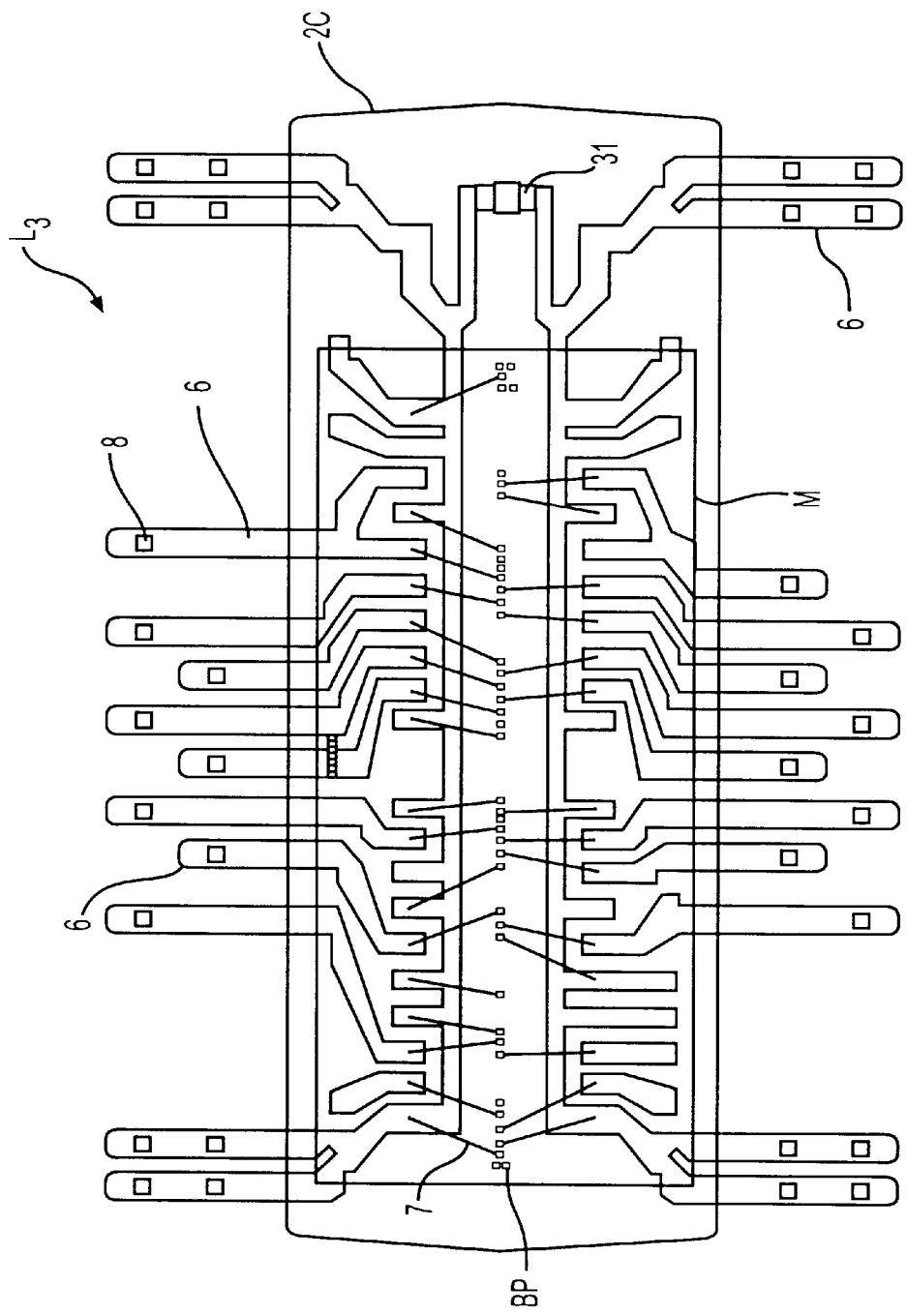
Figure 59:
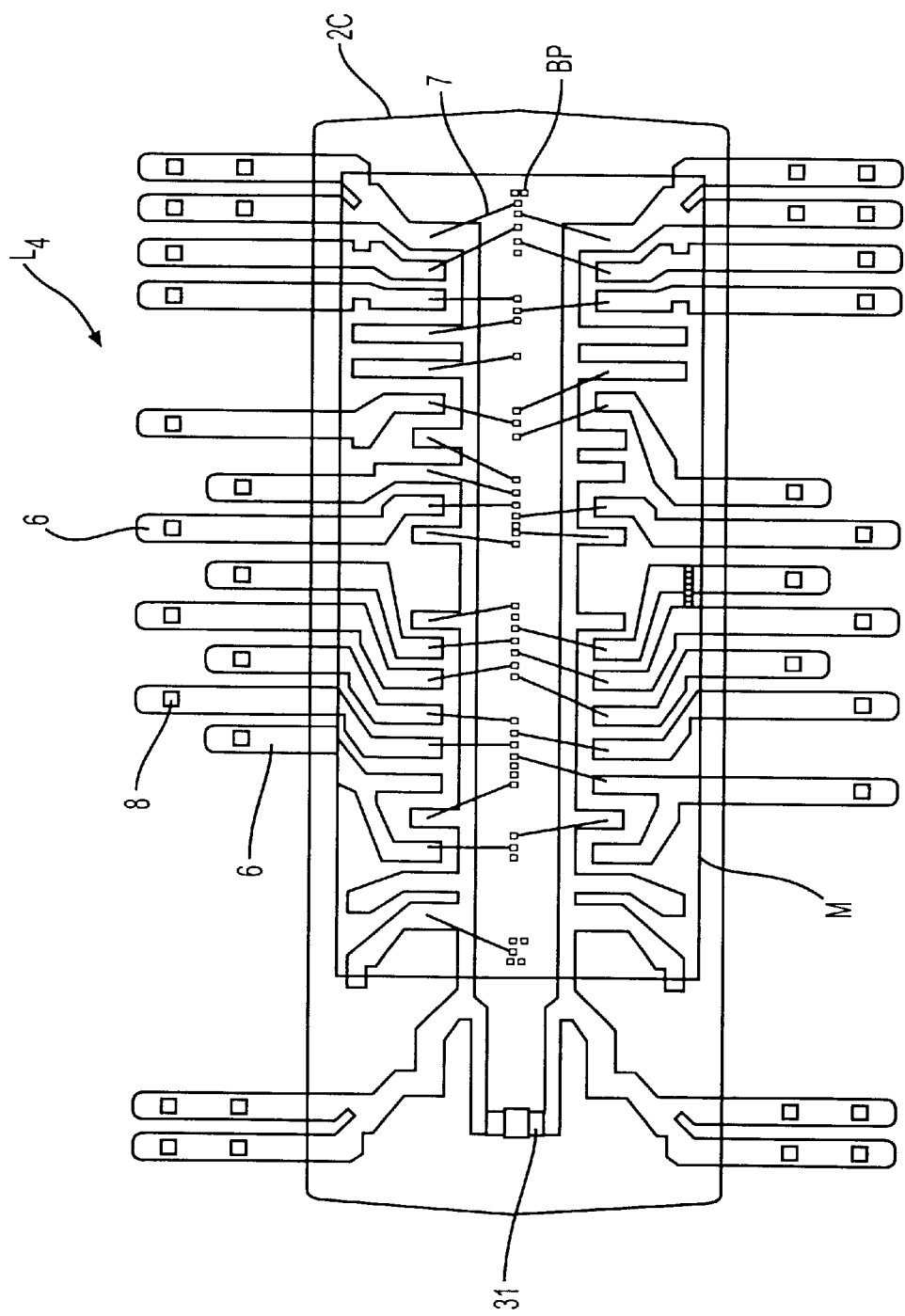
Figure 60:
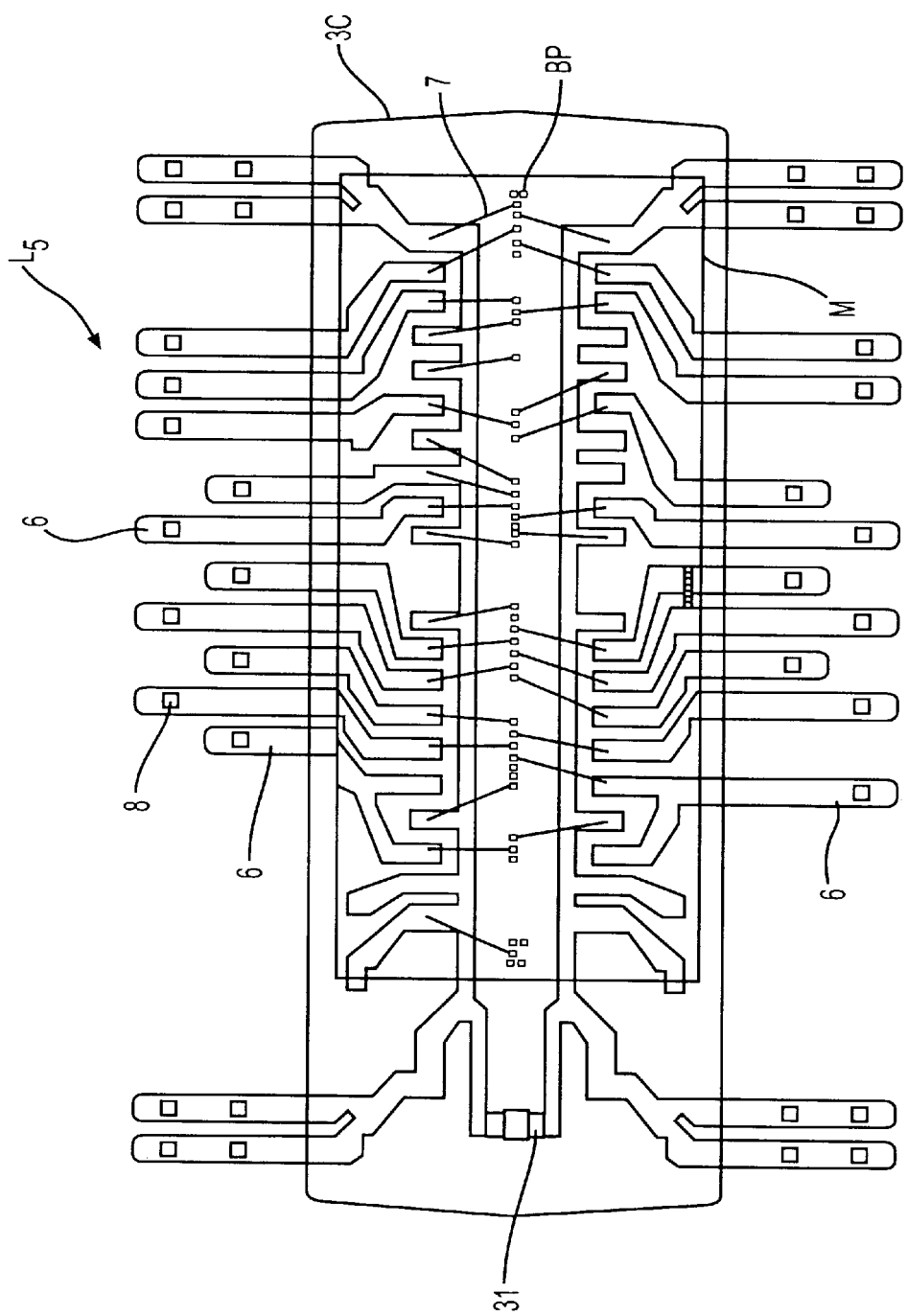
Figure 61:
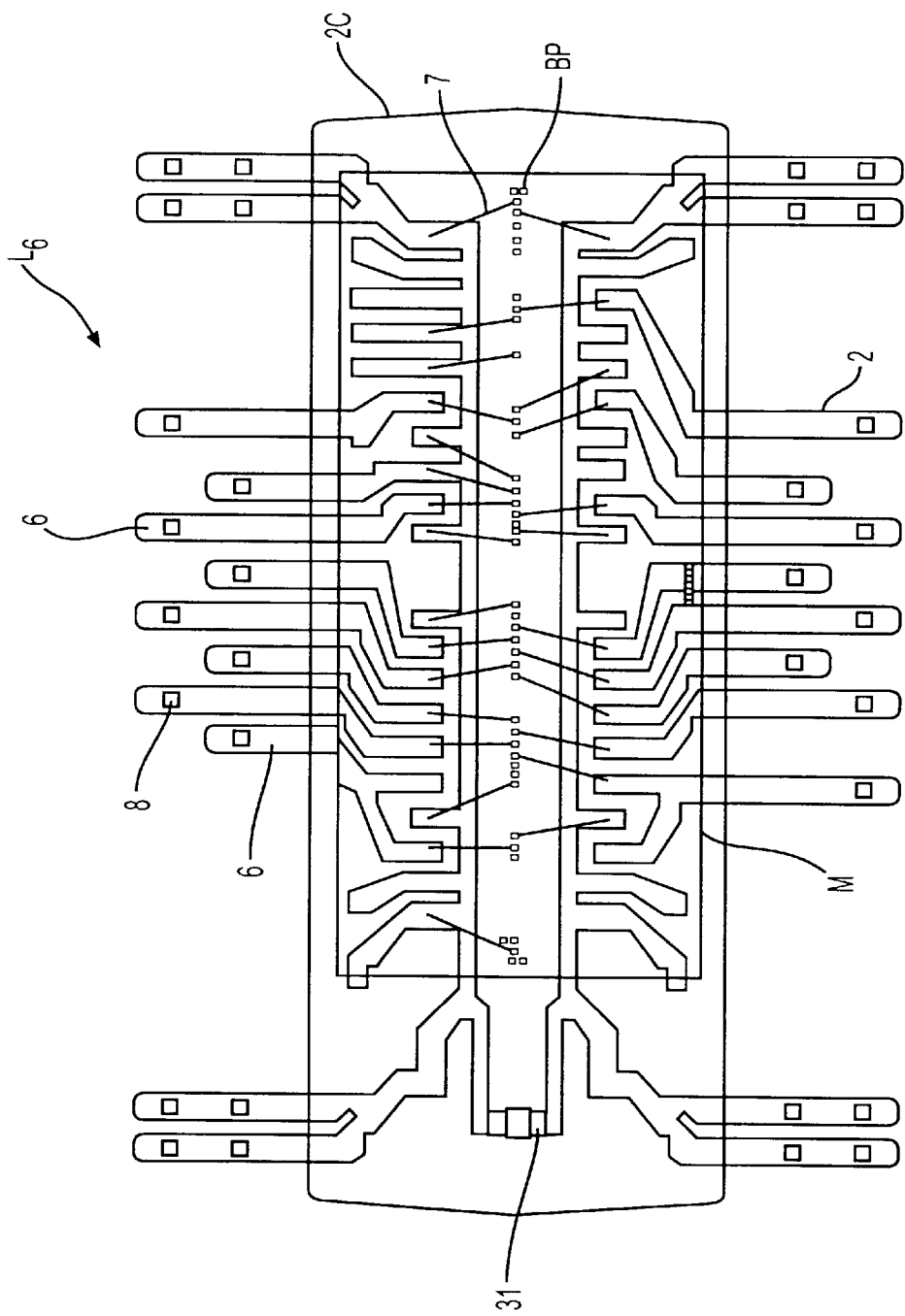
Figure 62:
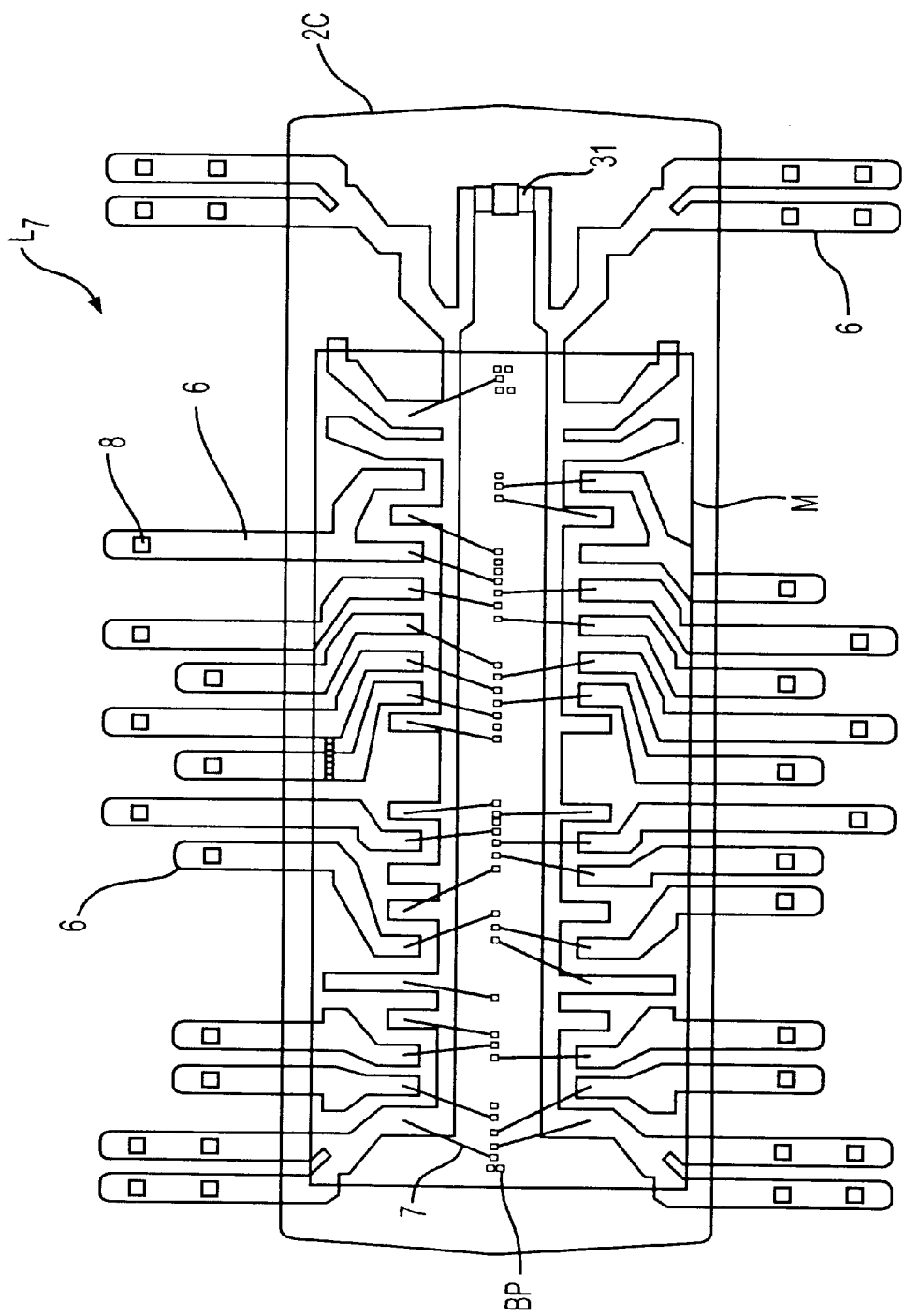
Figure 63:
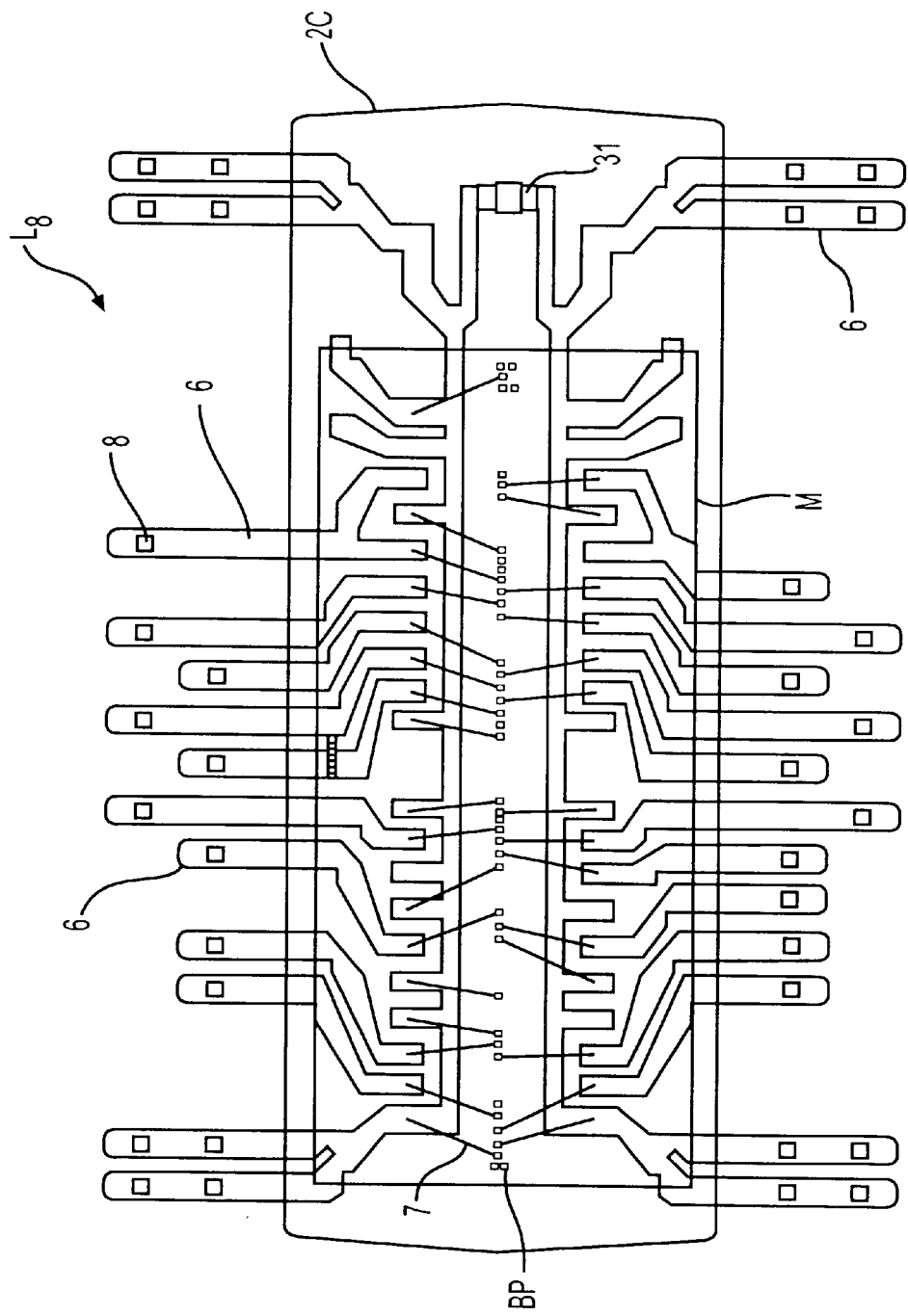
Figure 64:
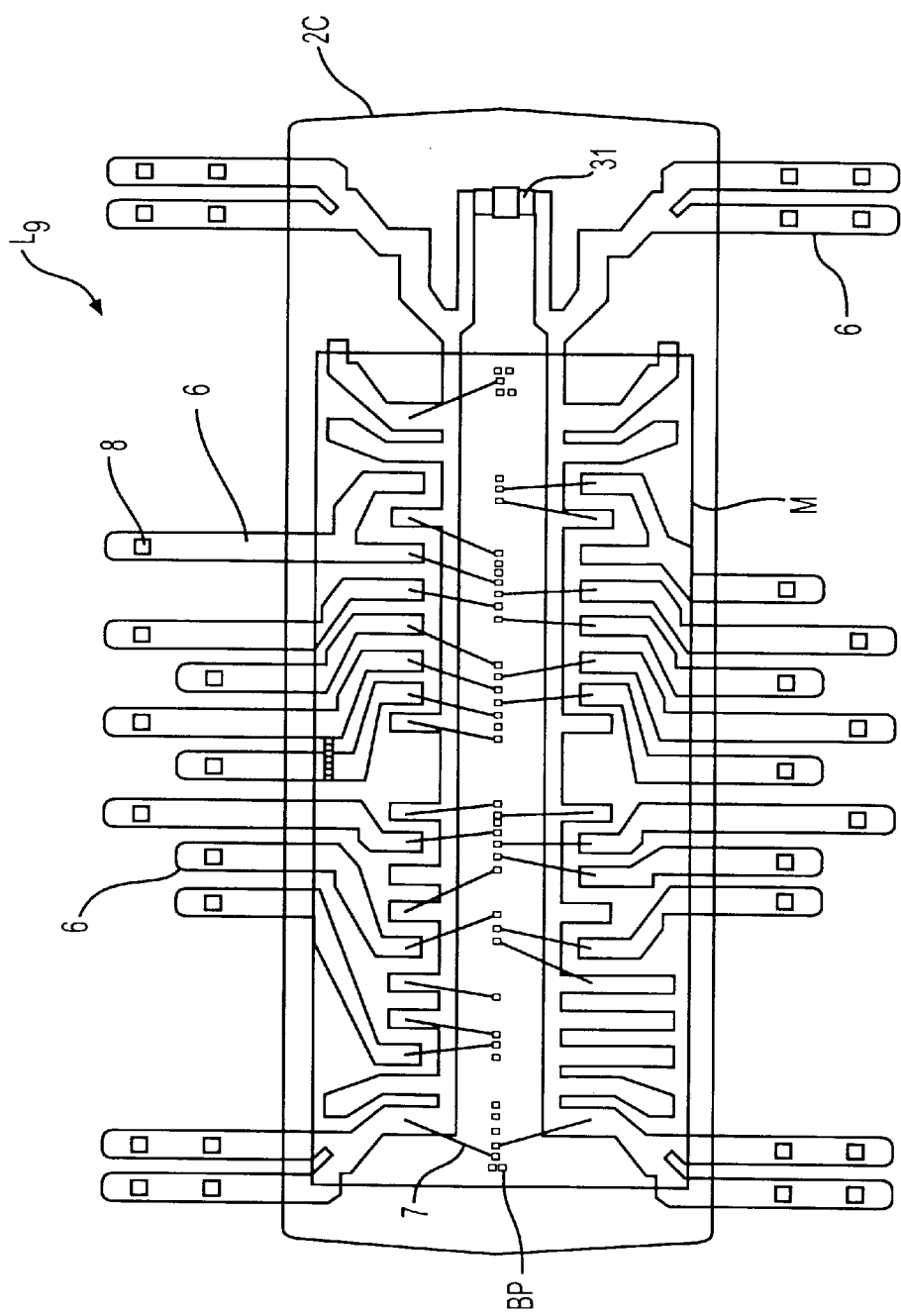
Figure 65:
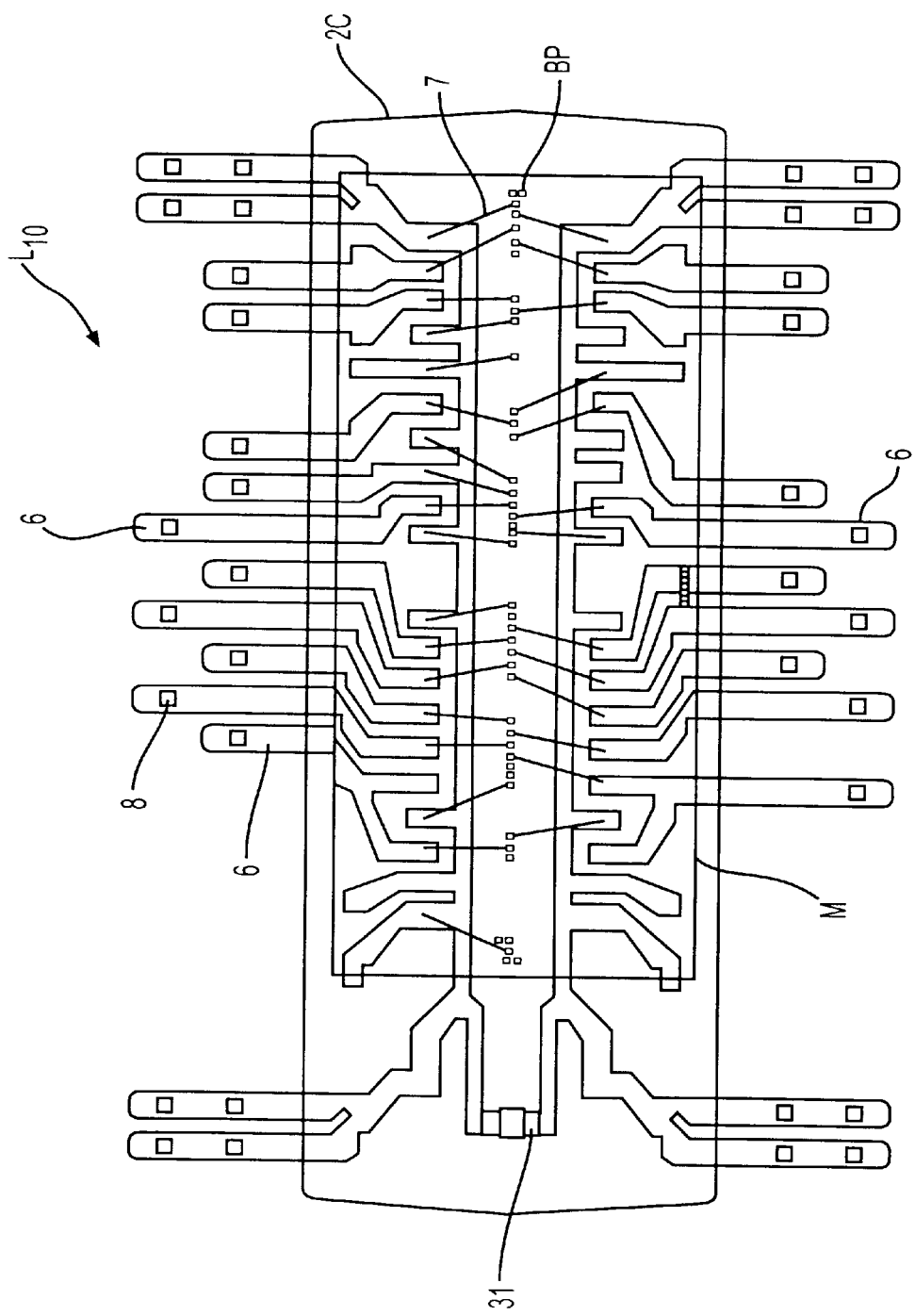
Figure 66:
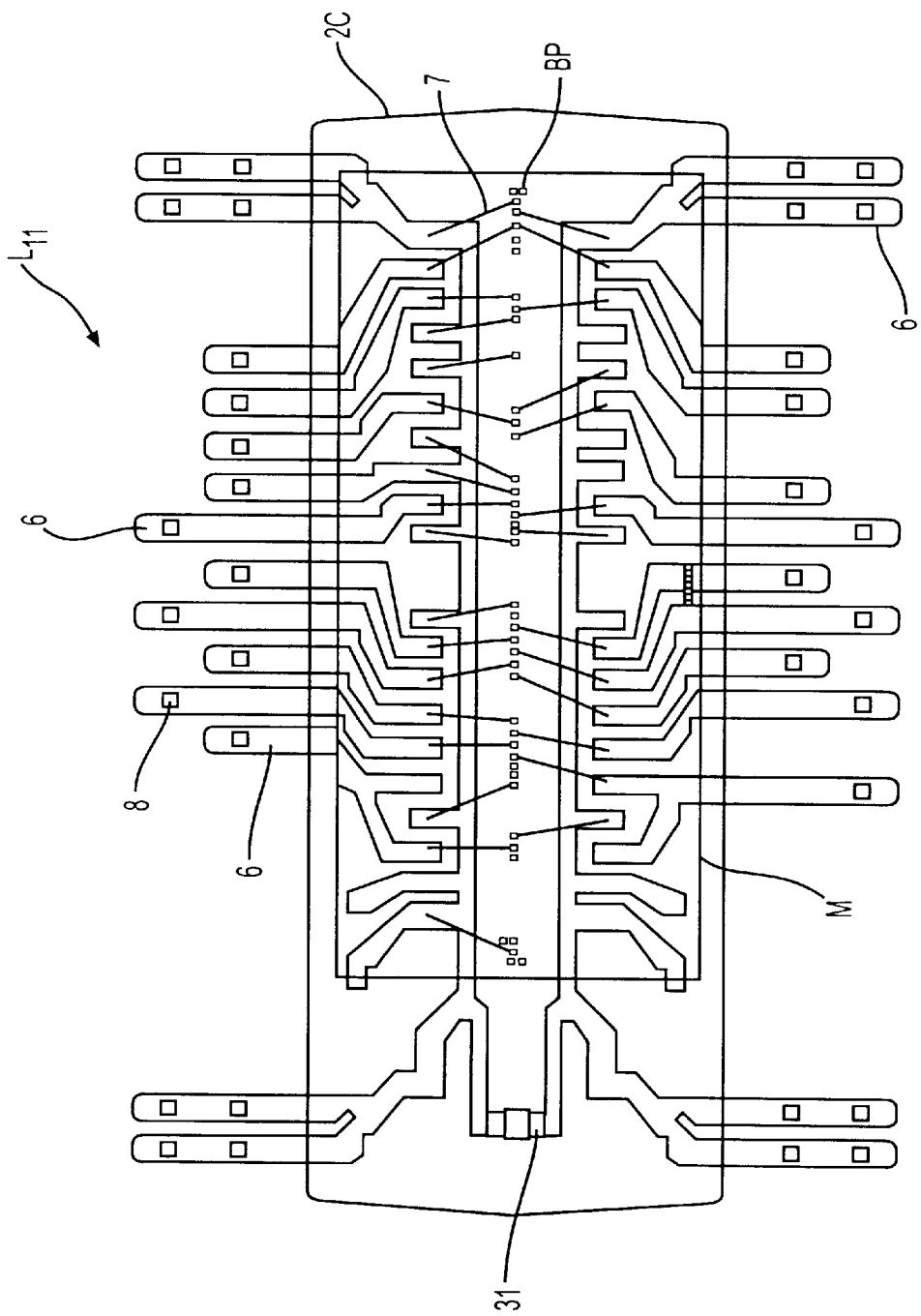
Figure 67:
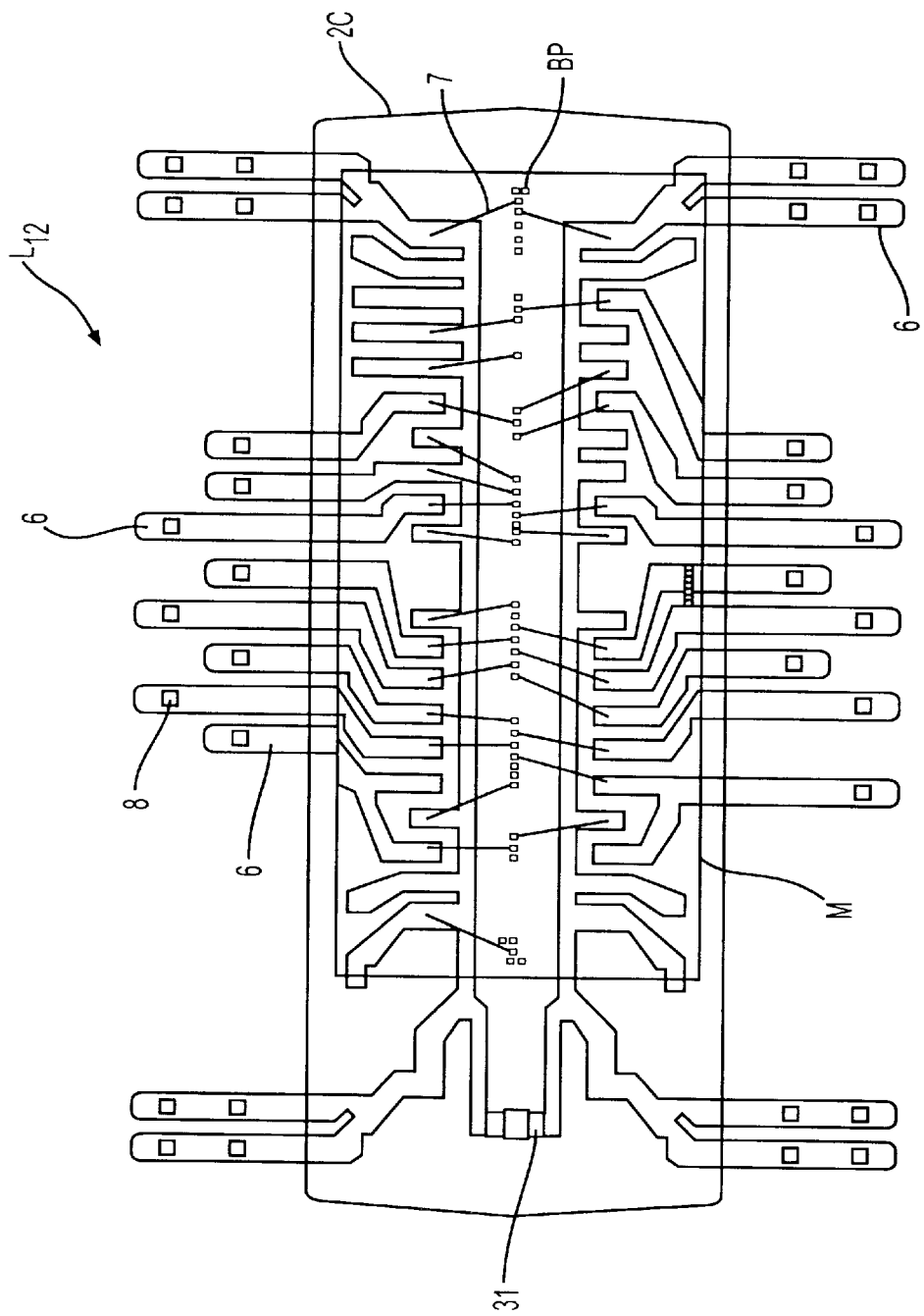

Of the twelve lead frames ($L_1$ to $L_{12}$), the three lead frames ($L_1$ to $L_3$) shown in FIGS. 56 to 58 and the three lead frames ($L_4$ to $L_6$) shown in FIGS. 59 to 61, and the three lead frames ($L_7$ to $L_9$) shown in FIGS. 62 to 64 and the three lead frames ($L_{10}$ to $L_{12}$) shown in FIGS. 65 to 67 are individually arranged and inverted by 180 degrees from each other in a horizontal plane with respect to the axis of inversion or the center line, in the long side direction of the package 2C.

With this arrangement, the bonding pads (BP) of the semiconductor chip (M) mounted on the inverted lead frame (L), and the pad bonding pads (BP) of the semiconductor chip (M) mounted on the non-inverted lead frame (L) are arranged in the opposite directions with respect to the axis of inversion. As a result, the data pins of the lead frames ($L_1$ to $L_{12}$) can be prevented from being concentrated in one direction, so that the wiring of the leads 6 can be facilitated to reduce the size of the lead frames ($L_1$ to $L_{12}$).

Of the aforementioned twelve lead frames ($L_1$ to $L_{12}$), on the other hand, the inverted lead frames (L) and the non-inverted lead frames (L) are symmetric in the pattern of the leads 6 with respect to the axis of inversion. Specifically, the lead frame ($L_1$) and the lead frame ($L_4$), the lead frame ($L_2$) and the lead frame ($L_5$), the lead frame ($L_3$) and the lead frame ($L_6$), the lead frame ($L_7$) and the lead frame ($L_{10}$), the lead frame ($L_8$) and the lead frame ($L_{11}$), and the leads 6 and the other leads 6 are arranged such that one is inverted from the other.

Thus, the twelve kinds of lead frames ($L_1$ to $L_{12}$) can be reduced, when designed, to one half (six kinds) so that the cost of manufacturing the lead frames ($L_1$ to $L_{12}$) can be lowered. Moreover, the aging kinds can be reduced to lower the manufacture cost for the DRAM module.

As shown in FIGS. 56 to 67, on the other hand, the semiconductor chips ($D_0$ to $D_7$ and $M_0$ to $M_3$) mounted on the twelve lead frames ($L_1$ to $L_{12}$) are arranged to have their center offset from the center of the package 2C toward the data pins (to the right of the drawings) of the lead frame (L1). This offset is about 1.6 mm.

With this arrangement, the lead frames ($L_1$ to $L_{12}$) can have a sufficiently wide layout area even if they have many data pins. As a result, the leads 6 can be easily wired to design the lead frames ($L_1$ to $L_{12}$) in a small size.

If the semiconductor chips (M) are offset toward the data pins, there is established a vacant region in the package 2C, on the side opposed to the data pins. In the present embodiment, therefore, one end of the bus bar lead or the power supply (GND) pin of the lead frames ($L_1$ to $L_{12}$) is extended into the vacant region to mount the aforementioned decoupling capacitor 31. This decoupling capacitor 31 has a planar size of about 1 mm×0.5 mm and a thickness of about 0.5 mm.

By mounting the decoupling capacitor 31 on the lead frames ($L_1$ to $L_{12}$), the power supply impedance of when the semiconductor chip (M) is operated can be reduced to operate the DRAM module stably even if supplied with a high current. Incidentally, as a method for reducing the power supply impedance at the power supply time, the method for mounting the aforementioned decoupling capacitor 31 on one end of each of the lead frames ($L_1$ to $L_{12}$) may be replaced by another method for mounting the decoupling capacitor 31 in the vicinity of or within the mother socket 3C, or means for extending the one-side ends of the bus bar leads to the outside of the package 2C and mounting the decoupling capacitor 31 on the extension. If this decoupling capacitor 31 has a large external size, it may be mounted on only a portion of the lead frame (L).

If the semiconductor chip (M) is offset toward the data pins, as described above, the flow of the resin may become nonuniform, when the package 2C is molded, to produce a structural stress in the package 2C. If the aforementioned decoupling capacitor 31 is then disposed in the vacant region formed on the side opposed to the data pins, the resin flow can be uniform to reduce the structural stress in the molded package 2C. Unless the decoupling capacitor 31 is arranged in the vacant region by extending the bus bar leads, the aforementioned disadvantages are avoided by arranging dummy chips. If the decoupling capacitor is mounted not in the vacant region of the package 2C but in the small-size dummy chip, it is possible to reduce both the aforementioned structural stress and the power supply impedance of when power is supplied.

If the number of semiconductor chips (M) packaged in the package 2C is large, a plurality of signal pins at equal levels may be formed, or the chip identifying signals cannot be produced by the restriction upon the structural design and upon the bonding pads of the semiconductor chips (M). In this case, dummy lead frames may be inserted into the gaps of the layers of the lead frames ($L_1$ to $L_1$) to effect the wiring connection in the package 2C through the dummy lead frames. If the dummy lead frames are used, the number of the leads 6 led out from the package 2C is increased to improve the junction strength between the module leads 9 of the mother socket 3C and the leads 6. Moreover, the heat dissipation paths of the package 2C can be increased to further reduce the heat resistance.

Figure 68:
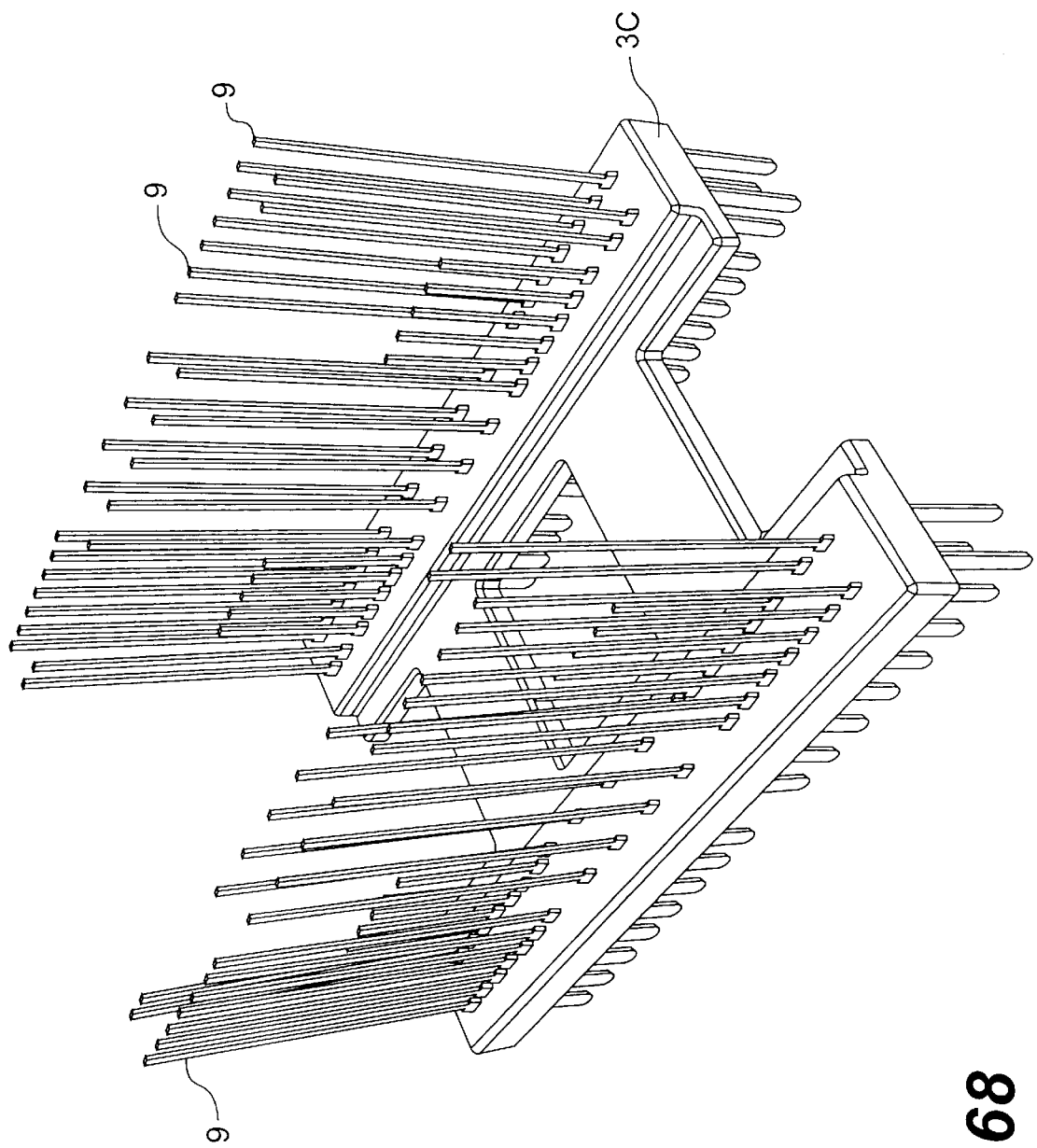
FIG. 68 is a perspective view showing the mother socket of the dual in-line structure.
Figure 69:
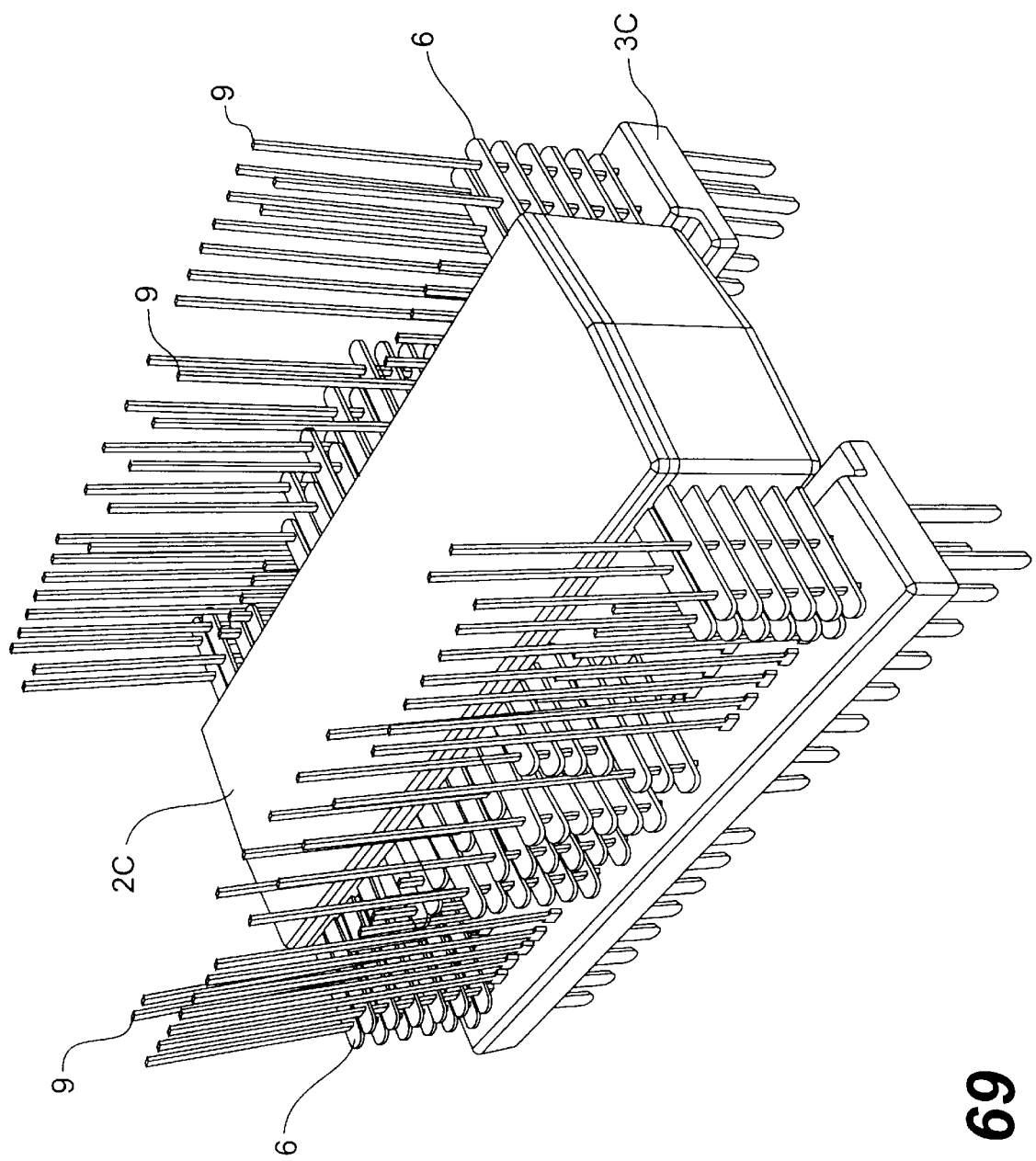
FIG. 69 is a perspective view showing a state that one stage of package is mounted on the mother socket.
Figure 70:
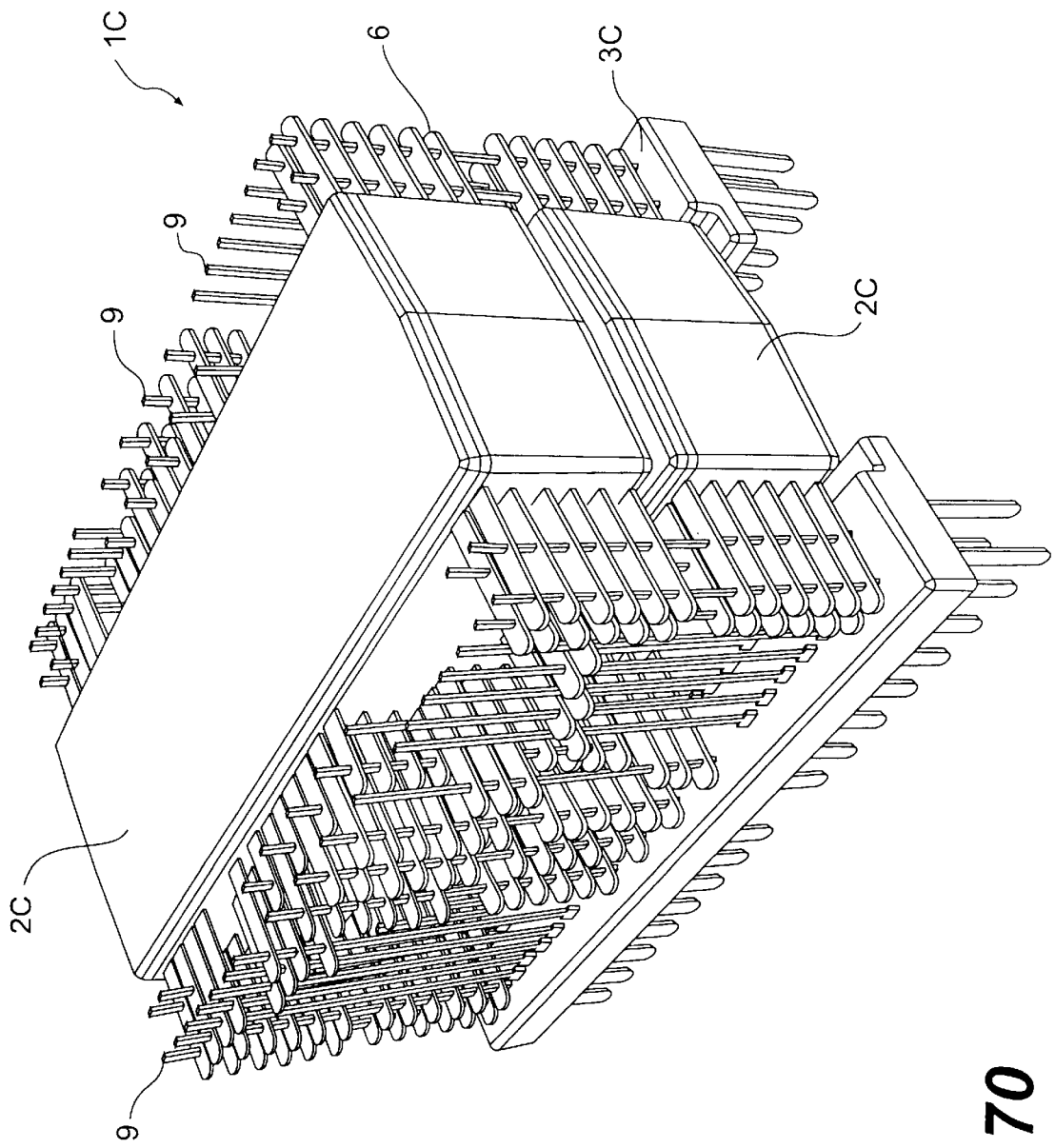
FIG. 70 is a perspective view showing another embodiment of the DRAM module.

FIG. 68 is a perspective view showing the mother socket 3C of the aforementioned dual in-line structure. FIG. 69 is a perspective view showing a state that the package 2C is mounted in one stage on the mother socket 3C. FIG. 70 is a perspective view showing a DRAM module 1C having the construction of [4194304 words×36 bits] made by stacking two packages 2C on the mother socket 3.

In the vicinity of the center of the mother socket 3C, as shown in FIG. 68, there are formed openings for mounting the later-described radiation fins. The six lead frames ($L_7$ to $L_{12}$) are encapsulated into the package 2C shown in FIG. 69, and the remaining fix lead frames ($L_1$ to $L_6$) are encapsulated into the upper package 2C shown in FIG. 70. The connection between the mother socket 3C and the package 2C may be carried out similarly to the connection of the DRAM module 1A of the foregoing embodiment.

Figure 71:
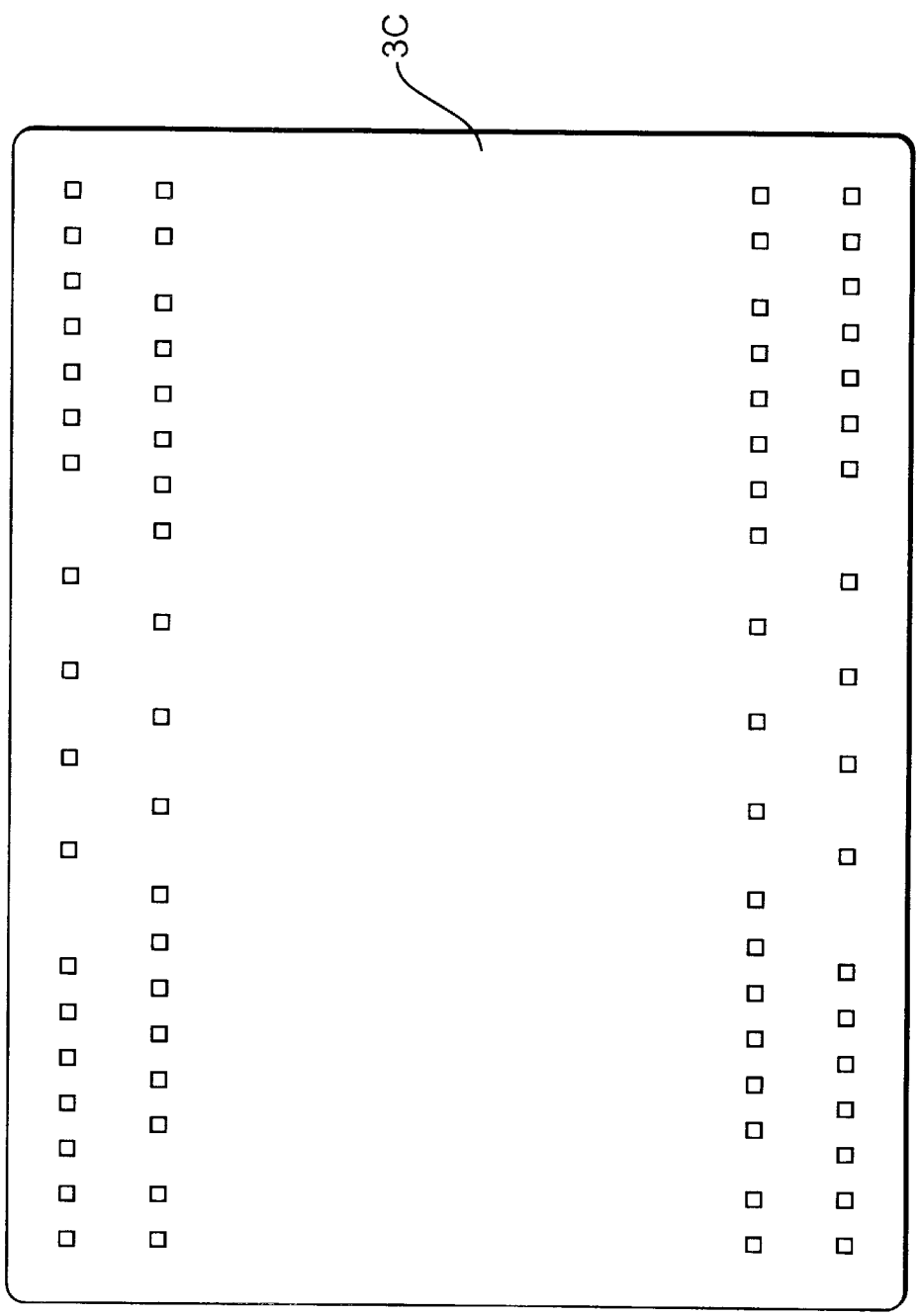
FIG. 71 is a top plan view showing a pin array on the top face of the mother socket.

The two rows of data pins and CAS pins (i.e., the pins 19 to 23, the pins 29 to 33, the pins 36 to 40 and the pins 46 to 50, as shown in FIG. 64), inside of the mother socket 3C and opposed to each other, are connected with only the lower package 2C. The back side of the mother socket 3C has the pin array shown in FIG. 55, but the upper side has the pin array shown in FIG. 71.

Figure 72:
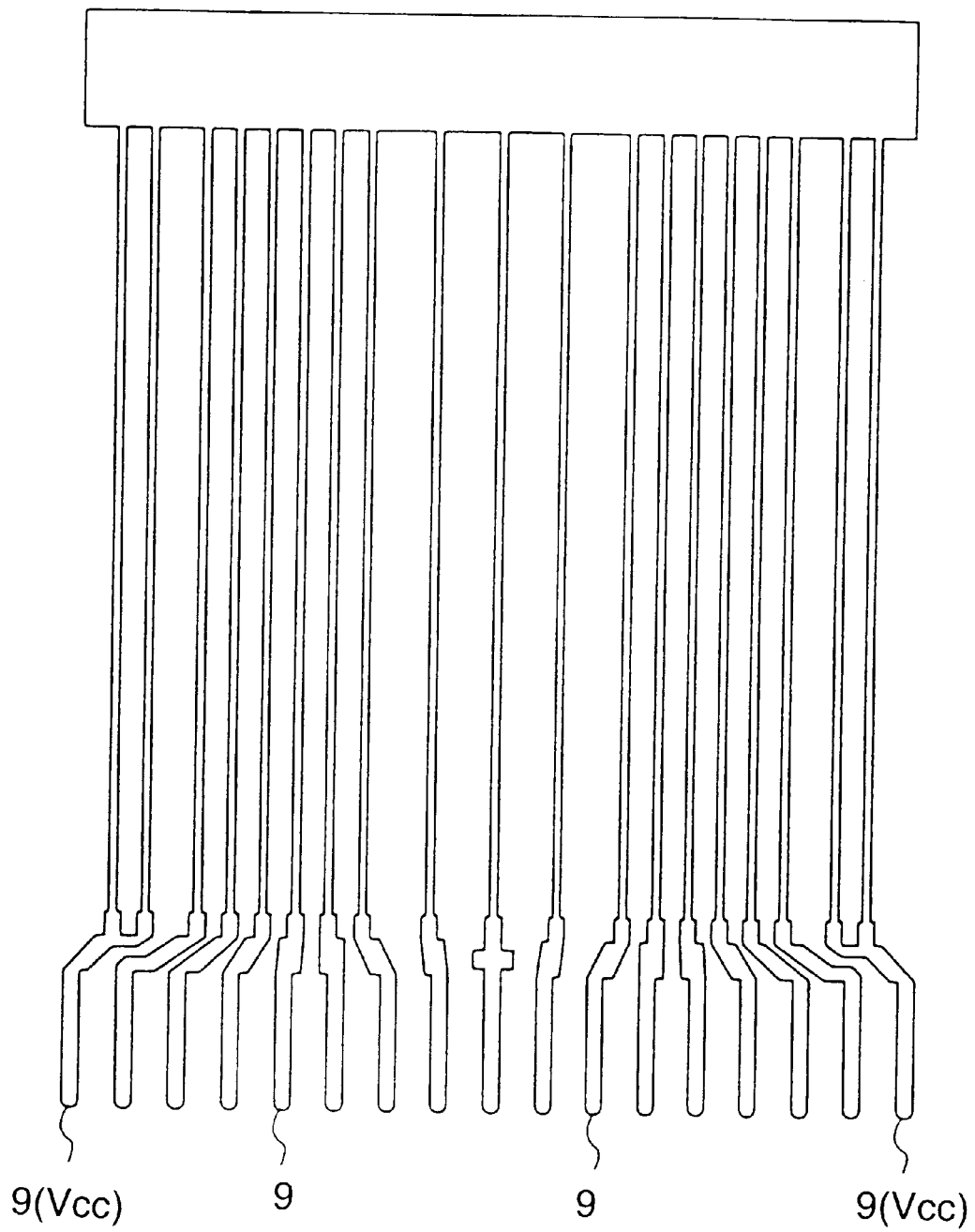
FIGS. 72 and 73 are top plan views showing another embodiment of the mother socket lead frame.
Figure 73:
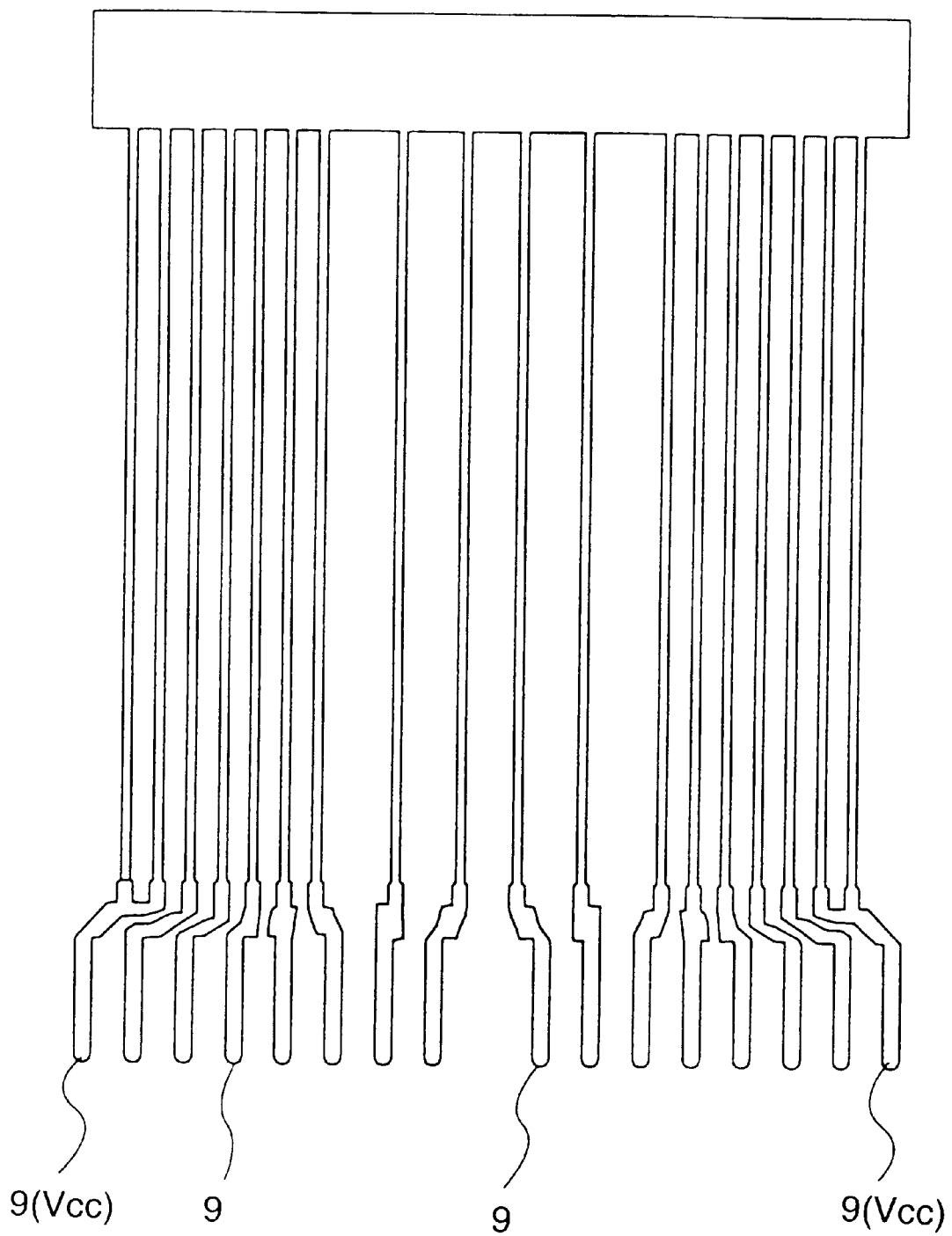

For changing the pin arrays between the back side and the top side of the mother socket 3C, there are used the mother socket lead frames shown in FIG. 72 and the mother socket lead frames shown in FIG. 73. FIG. 72 shows the lead frame for the two inner opposed rows, and FIG. 73 shows the lead frame for the two outer opposed rows. The module leads 9 of the lead frames have the power pins (Vcc) at their two ends. These power pins (Vcc) are branched into two at their upper portions to increase the number of pins, so that the power supply impedances of the lead frames ($L_1$ to $L_6$ and $L_7$ to $L_{12}$) in the package 2C may be reduced.

The data pins and the CAS pins of each package 2C are so staggered at their inner (=0.8 mm pitch) rows and outer (=0.8 mm pitch) rows that the outer pitches can be alternately arranged at a half (=0.4 mm pitch) pitch thereby to effect high density mounting. This is because the data pins and the CAS pins of the lower package 2C are terminated at the lower package 2C but do not extend to the upper package 2C. The data pins and CAS pins of the upper package 2C are connected through the leads 6 of a pitch of 500 mil with the module leads 9 of the outer rows of the mother socket 3C.

Figure 74:
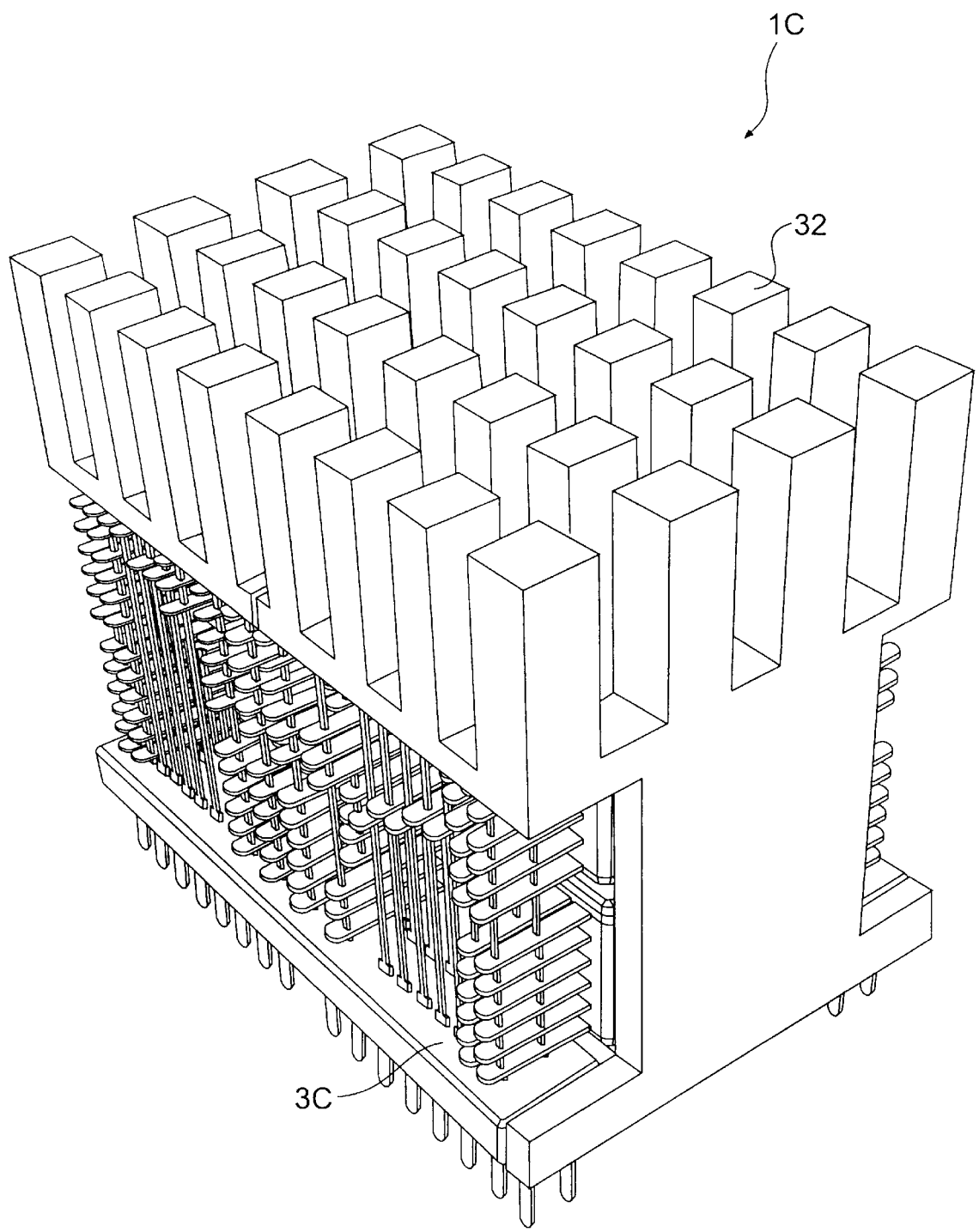
FIG. 74 is a perspective view showing an embodiment in which radiation fins are attached to the DRAM module.
Figure 75:
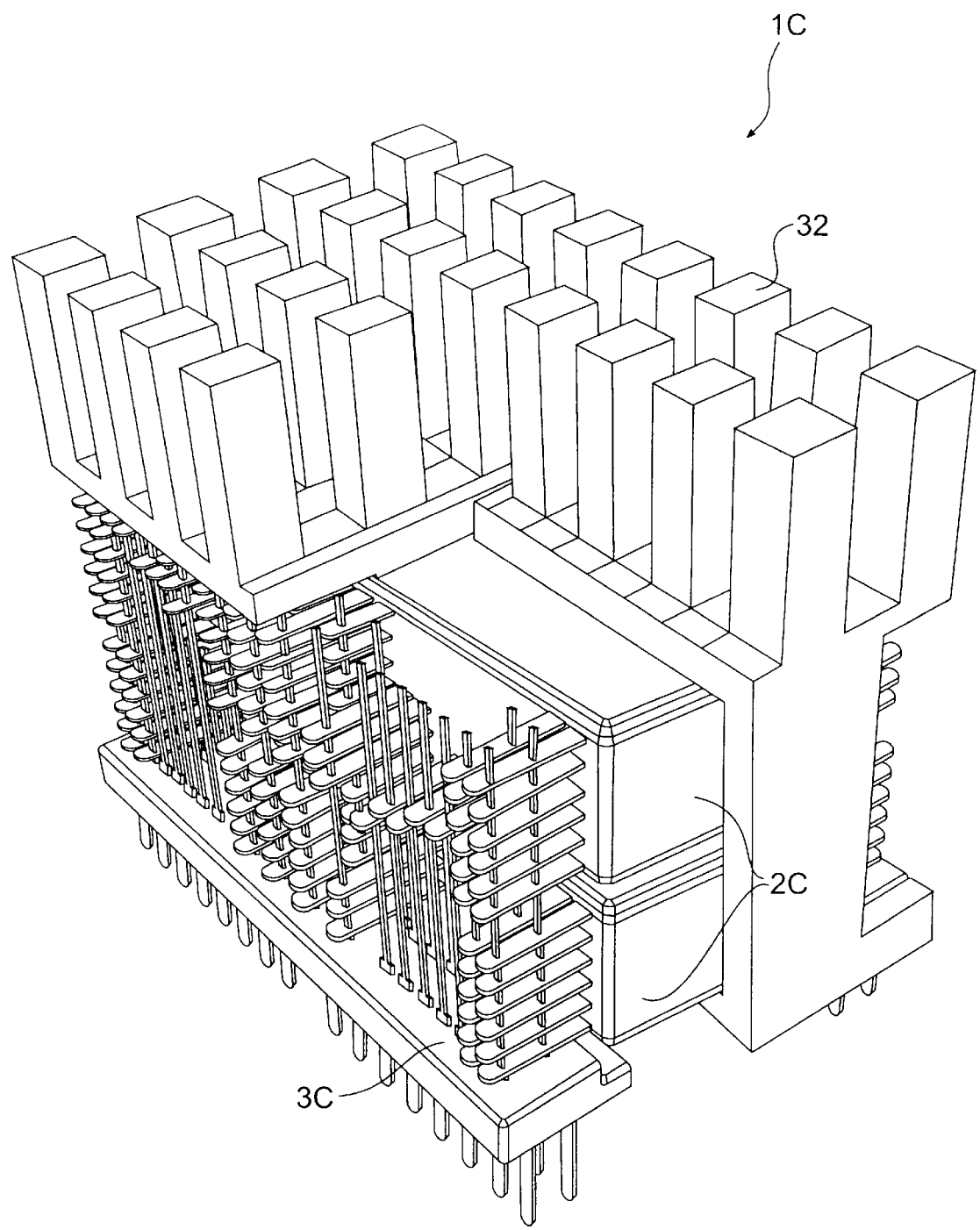
FIG. 75 is a perspective view showing the state in which the radiation fins are partially cut.
Figure 76:
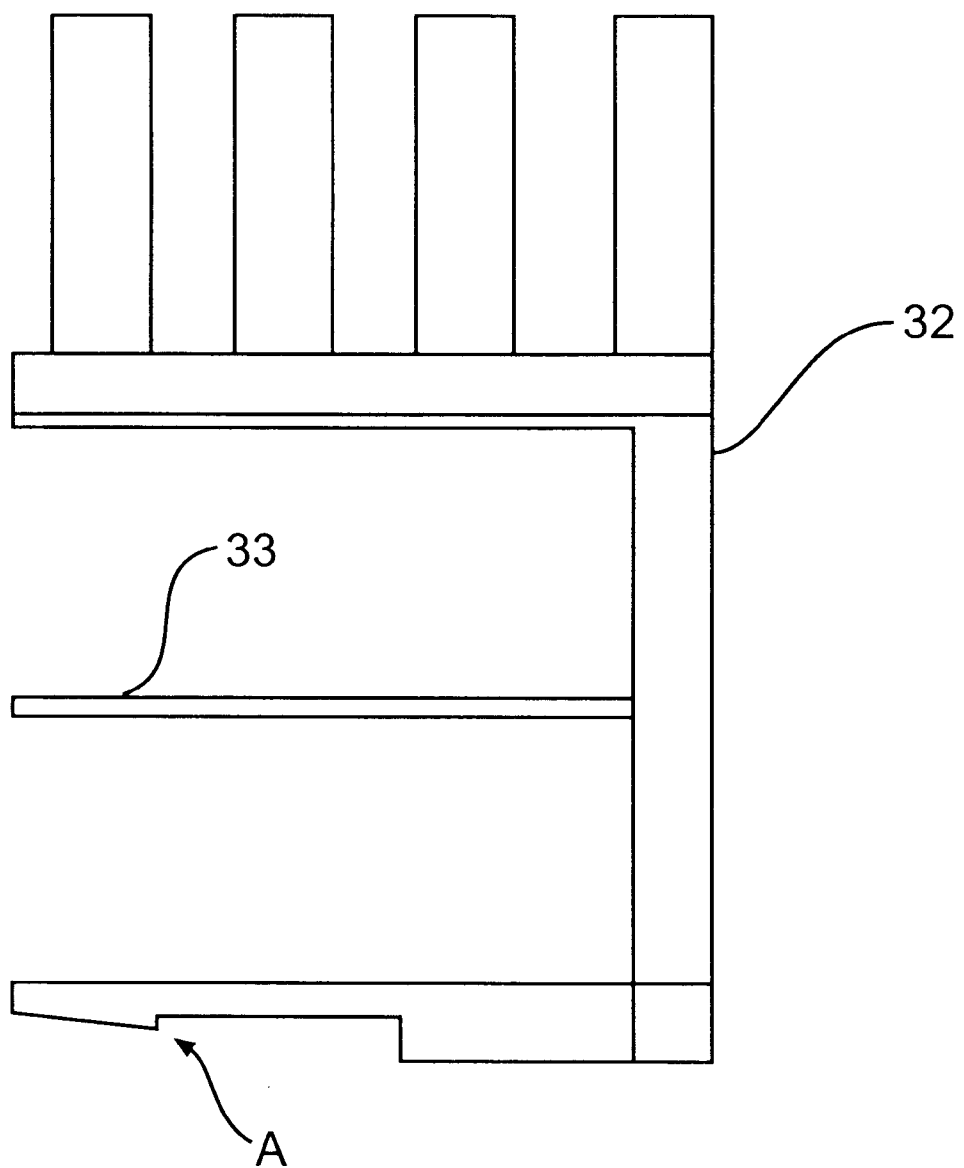
FIG. 76 is a side elevation showing the radiation fins.
Figure 77:
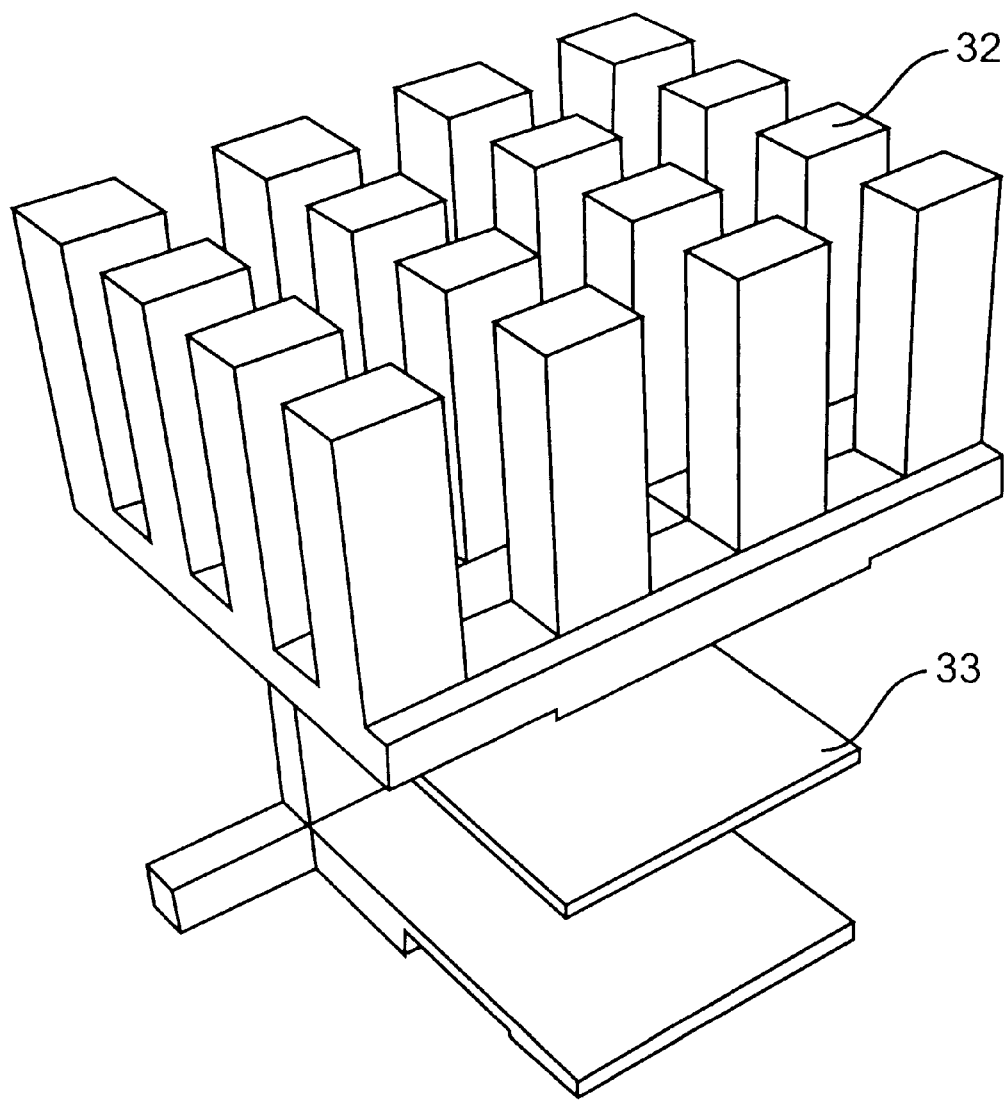
FIG. 77 is a perspective view showing the radiation fins.

FIG. 74 is a perspective view showing an embodiment in which radiation fins 32 are mounted around the two-stage stacked package 2C so as to further reduce the heat resistance of the DRAM module 1C having the aforementioned construction of [4194304 words×36 bits]. FIG. 75 shows the same example but cuts one quarter of the radiation fins 32 so as to show the internal state more easily. FIG. 76 is a side elevation of the radiation fin 32, and FIG. 77 is a perspective view of the radiation fin 32. Reference numeral 33 designates a heat conduction plate to be inserted into the gaps between the two-stage stacked packages 2C.

As shown in FIG. 75, the radiation fins 32 are so halved in the long side direction of the package 2C that they may be in contact with the two packages 2C and the mother socket 3C with wide areas. The bottom faces (indicated by arrow A in FIG. 76) of the radiation fins 32 contact with the mother socket 3C are formed into a lance shape so as to prevent the mother socket 3C from coming out.

Figure 78:
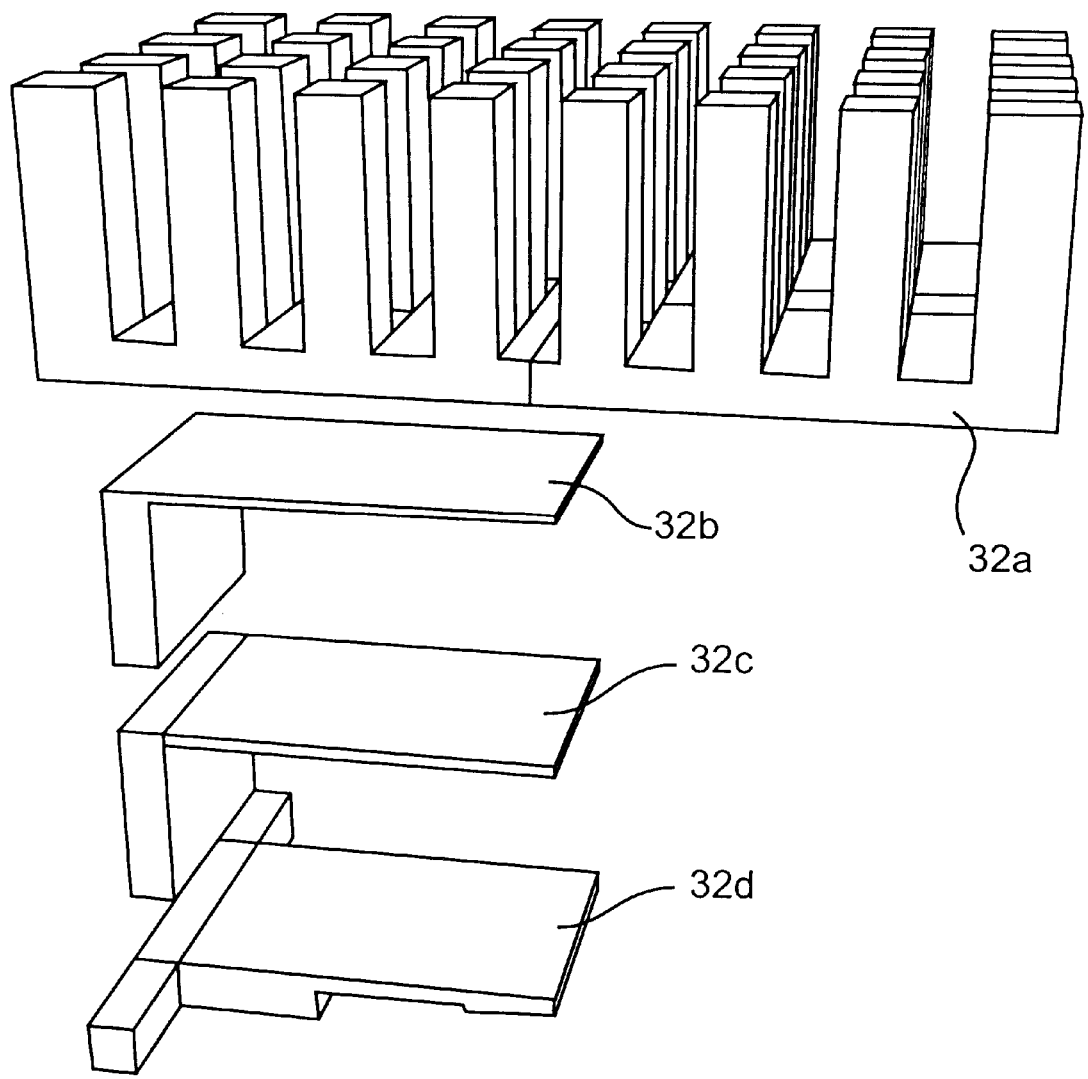
FIG. 78 is a perspective view showing another embodiment of the radiation fins.

When the radiation fins 32 are mounted around the package 2C, they are inserted laterally into the two-stage stacked packages 2C, and their interfaces are filled up with a heat transfer medium such as silicone grease or silicone rubber. After this, the module leads 9 of the mother socket 3C and the leads 6 of the packages 2C are connected by soldering. The method of mounting the radiation fins 32 may be replaced by a method of stacking vertically divided radiation fins 32a to 32d on the package 2C, as shown in FIG. 78. When the radiation fins 32 are inserted sideward, they can be attached after the module leads 9 and the leads 6 have been connected. When the quardrisected radiation fins 32a to 32d are stacked, the uppermost radiation fin 32a may be attached at the final step of the assembling process.

The present embodiment has been described, taking the case that the present invention is applied to the DRAM module having the construction of [4194304 words ×36 bits]. Despite of this description, however, the DRAM module having the construction of [8388608 words ×36 bits], as shown in FIG. 79, can be easily realized by stacking four two packages 2C of the present embodiment, two at the lower stage and two at the higher stage, and by separating the RAS pins for the packages 2C such that the pins 11 and pins 62, as shown in FIG. 55, may be for the RAS3 and the RAS1, respectively.

In the mother socket 3C of the present embodiment, on the other hand, the module leads 7 of the data pins and the CAS pins in the opposed inner rows are shortened and connected with only the lower package 2C. However, if the leads 6 of the package 2C have such a large space that the module leads 9 of the mother socket 3C may not be in contact with the unnecessary leads 6, the module leads 9 and the leads 6 can be connected without contact with the unnecessary leads. In other words, the lower package 2C and the upper package 2C can be substituted. In this modification, the leads connected with the upper package 2C and module leads 9 of the CAS pins can be shortened.

Here will be described an embodiment in which the present invention is applied to an SOJ (Small Outline J-leaded package) type DRAM module.

Figure 80:
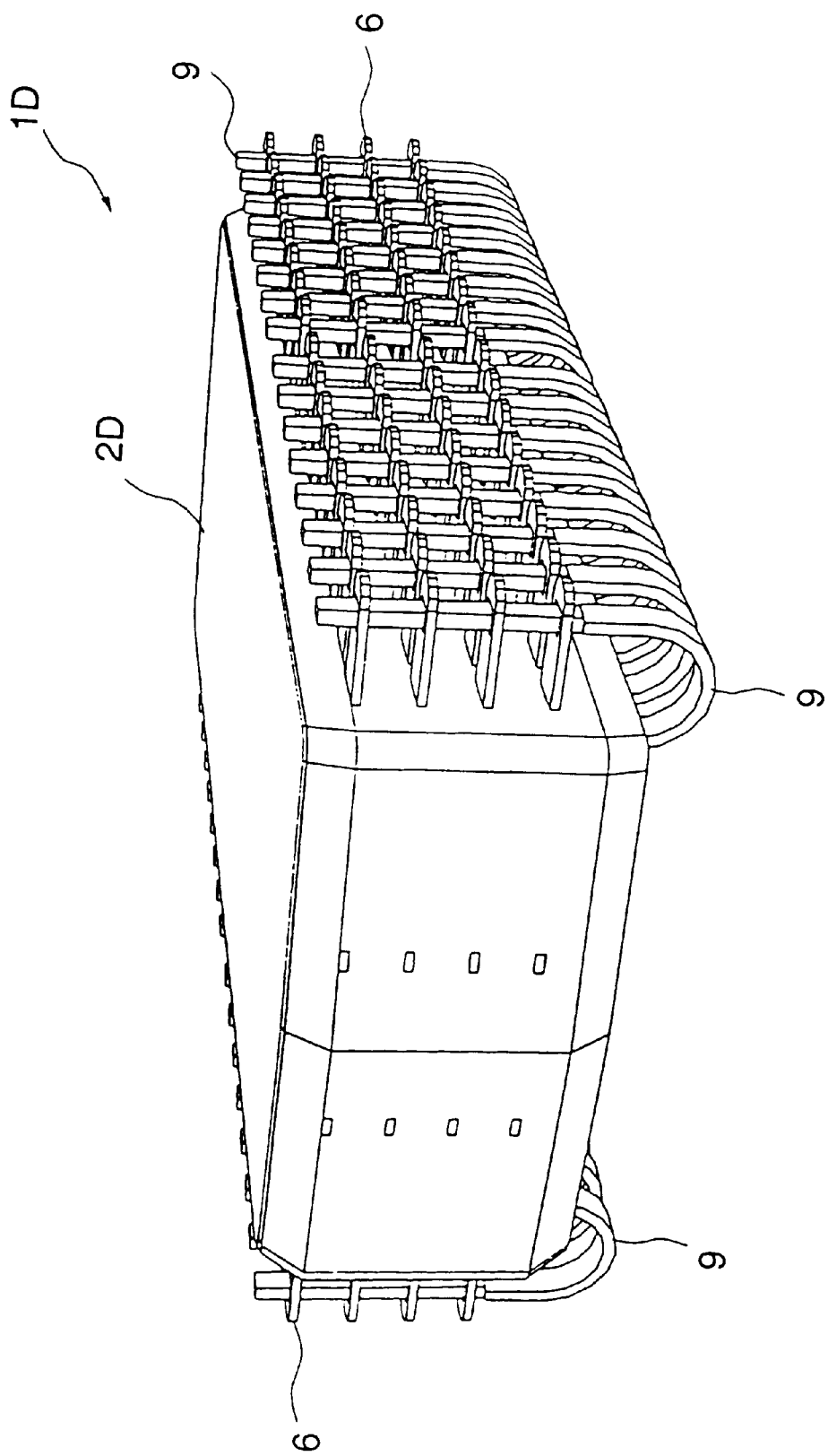
FIG. 80 is a perspective view showing another embodiment of the DRAM module.

FIG. 80 is a perspective view of an SOJ type DRAM according to the present embodiment. This DRAM module ID realizes a DRAM module having a construction of [16777216 words×4 bits] by stacking four DRAM chips of 16 Mbits having a construction of [16777216 words×1 bit] and by encapsulating the stack into a package 2D as a whole.

Figure 81:
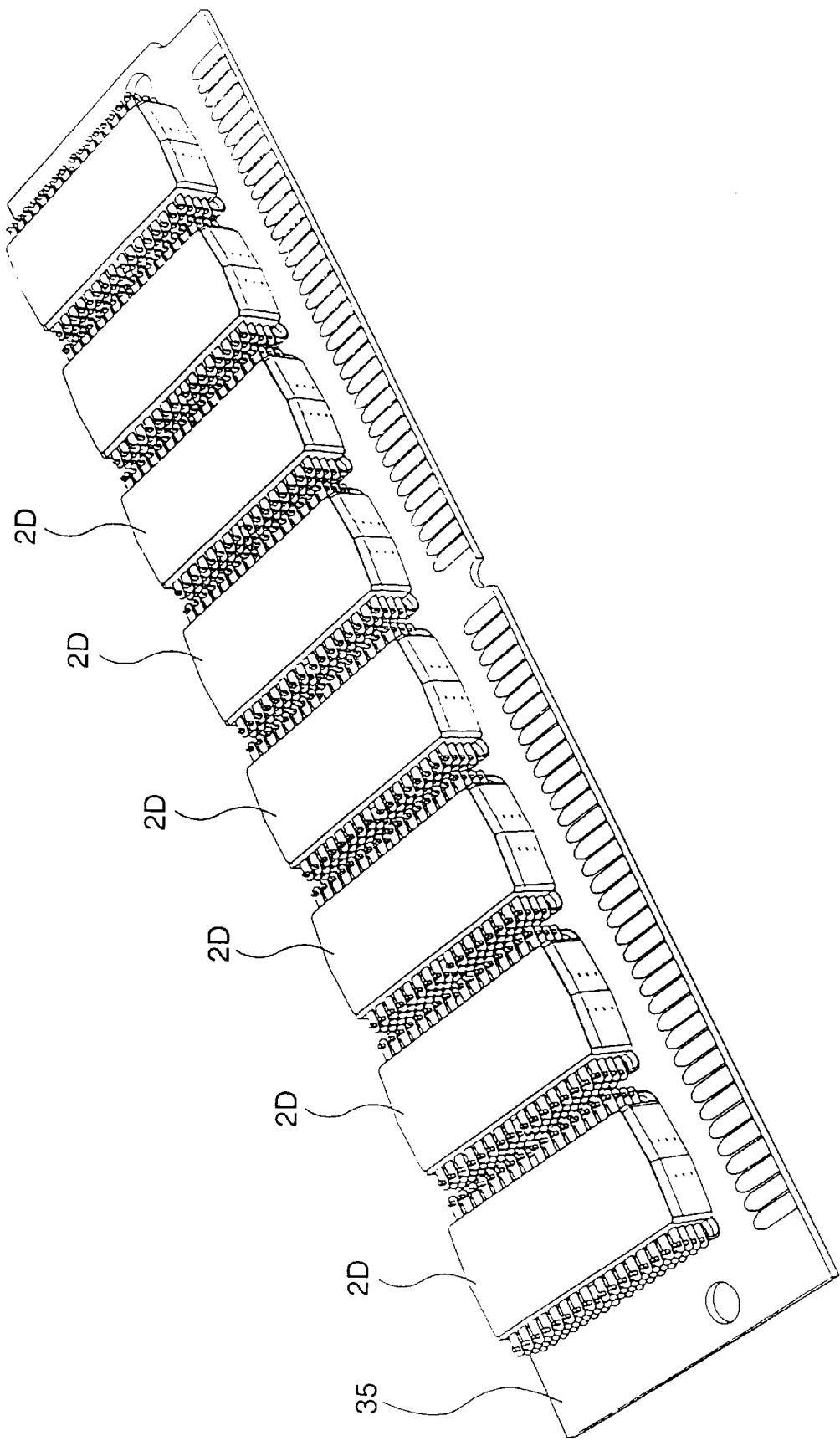
FIG. 81 is a perspective view showing the state in which the DRAM module is packaged over the printed circuit board of the SIMM.

In this DRAM module 1D, as shown, the lower end portions of the module leads 9 cross-connected to the leads 6 of the package 2D are bent in the shape of letter "J", so that they can be connected directly to the printed circuit board. In this DRAM module 1D, therefore, the package 2D can be mounted on the surface of a printed circuit board 35 of the SIMM, as shown in FIG. 81, by the same method as that of an ordinary SOJ. In short, this DRAM module 1D has no mother socket for mounting the package 2D, so that it can reduce the number of parts, realizing both the low cost and the reduction in the external size.

Figure 82:
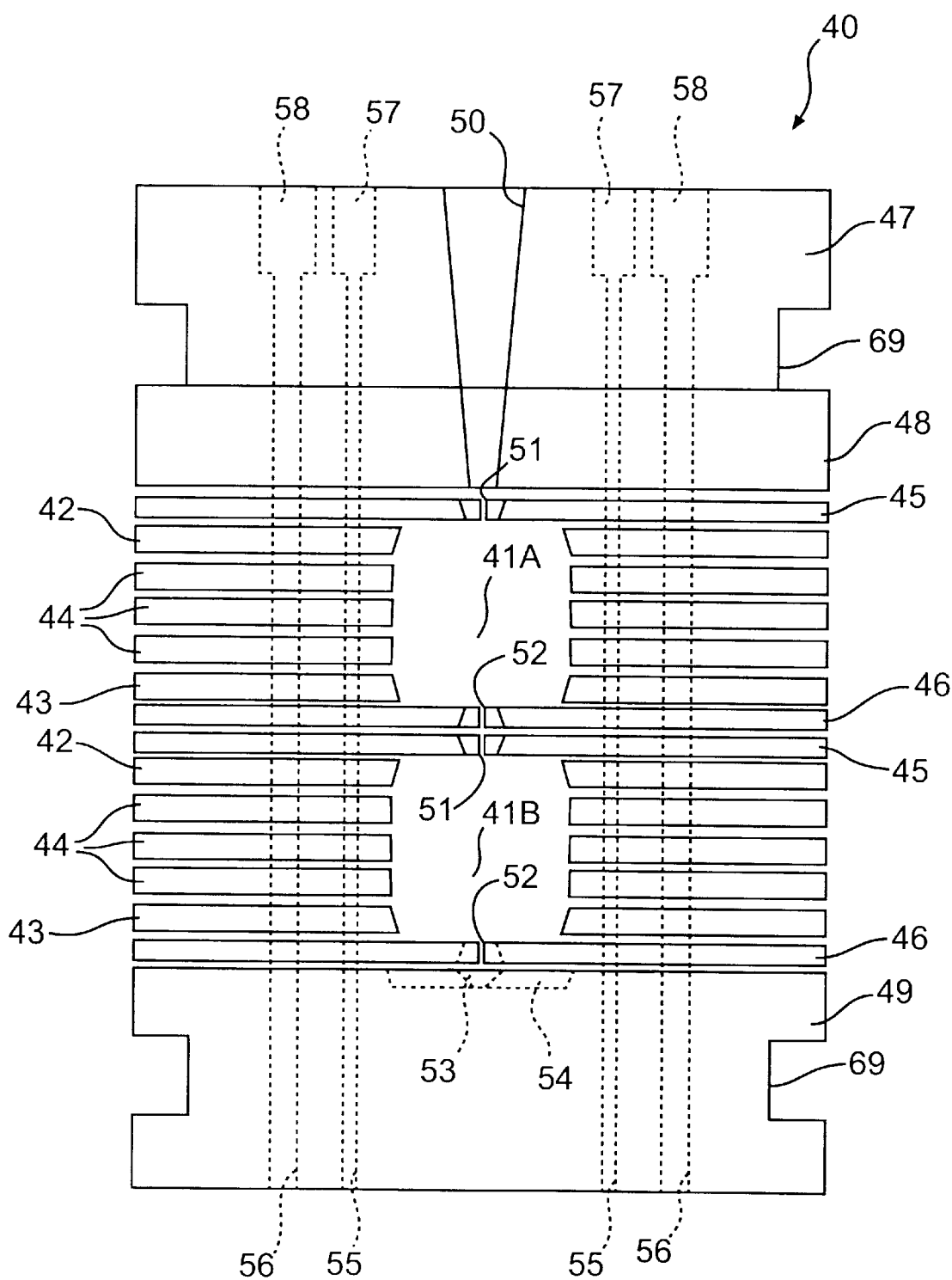
FIG. 82 is a diagram showing the construction of another embodiment of the insert mold used for molding the package.

The package 2D can be molded by using the insert mode 10, as shown in FIGS. 18 to 21, but the present embodiment uses a stacking type insert mold 40, as shown in FIG. 82.

As shown, this insert mold 40 has two cavities 41A and 41B which are arranged in a vertical direction. Each of these cavities 41A and 41B is constructed of movable plates 42, 43 and 44. The movable plate 42 forms the uppermost portion of the package 2D, and the movable plate 43 forms the lowermost portion. The movable plates 44 hold the interlayer distance of the semiconductor chips at a constant and control the distance between the bottom face of the upper semiconductor chip and the wires of the lower semiconductor chip, so that it corresponds to the movable plates 13 of the insert mold 10, as shown in FIGS. 18 to 21. All of these movable plates 42, 43 and 44 have a structure in which they are halved in a horizontal direction. Four semiconductor chips are encapsulated into the package 2D of the present embodiment, so that three movable plate 44 are required for each of the cavities 41A and 41B.

The individual cavities 41A and 41B are topped with movable plates 45 and bottomed by movable plates 46. These movable plates 45 and 46 are halved in the horizontal direction like the movable plates 42, 43 and 44. The movable plate 45 of the upper cavity 41A is overlaid by top forces or mold members 47 and 48, and the movable plate 46 of the lower cavity 41B is underlaid by a bottom force or mold member 49. The top force 47 and the bottom force 49 have key ways 69 in their side faces.

A vertically tapered gate hole 50 is formed in the top forces 47 and 48, and a gate hole 51 is formed just below the gate hole 50 in the movable plate 45. The continuous region, formed of the top forces 47, 48 and movable force 45, corresponds to the top force 11 of the aforementioned insert mold 10, and the gate holes 50 and 51 correspond to the structure in which the gate 15 (as shown in FIG. 33) formed in the top force 11 is turned into the vertical position.

A gate hole 52 is formed in the movable part 46, and a gate hole 53 is formed in the bottom force 49. In the bottom force 49, on the other hand, there is formed a dummy cavity 54 for storing the unnecessary resin which is discharged from a gate hole 53. The region, formed of the movable plate 46 and the bottom force 49, corresponds to the bottom force 12 of the aforementioned insert mold 10. The reason why the top force and the bottom force are constructed of a composite mold having a plurality of parts is to make the parting operation efficient after the molding operation and to reduce the parting damage of the package 2D.

Guide pin holes 55 and 56 are formed in each of the aforementioned top forces 47 48, movable plates 42, 43, 44, 45 and 46 and bottom force 49. At the molding time, a guide pin 57 is inserted into the guide pin hole 55, and a guide pin 58 is inserted into the guide pin hole 56.

Figure 83A:
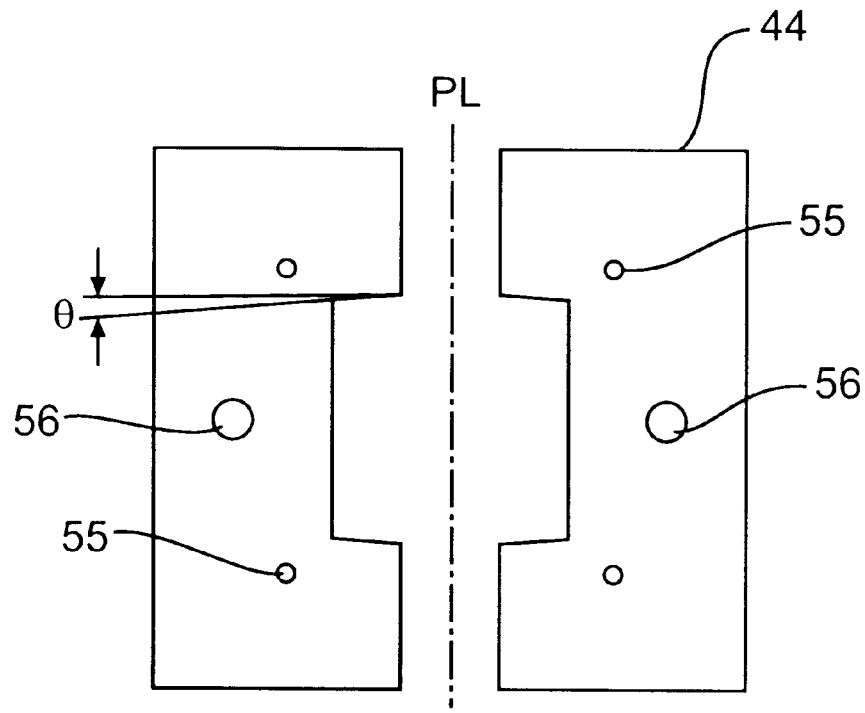
FIG. 83(a) is a top plan view of the movable plate.
Figure 83B:
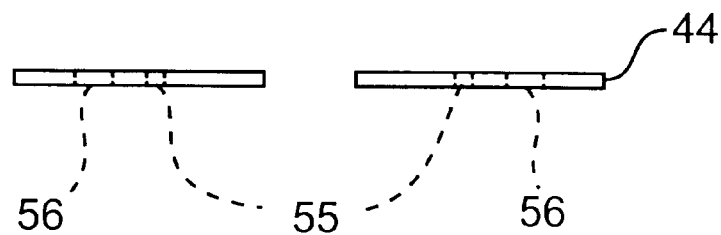
FIG. 83(b) is a side elevation thereof.

As shown FIGS. 83(a) and 83(b), the movable plates 44 (like the movable plates 42, 43, 45 and 46) are halved horizontally along the parting line (PL). A parting angle (θ) of about 4 degrees, for example, is provided in the movable plates 44, perpendicular to the parting line (PL), to facilitate the parting of the package 2D. The movable plate 44 correspond to the movable plates 13 of FIG. 21, and having additional guide pin holes 55 and 56.

Figure 84A:
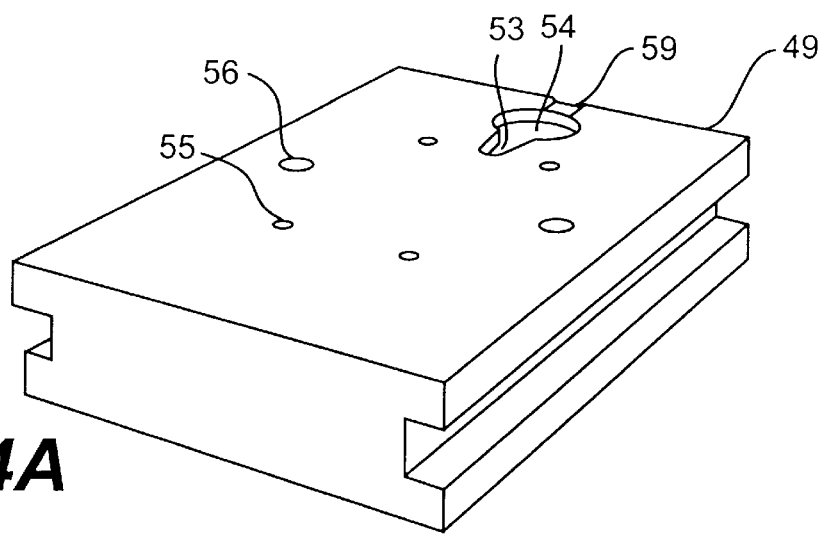
FIG. 84(a) is a perspective view of a bottom force.
Figure 84B:
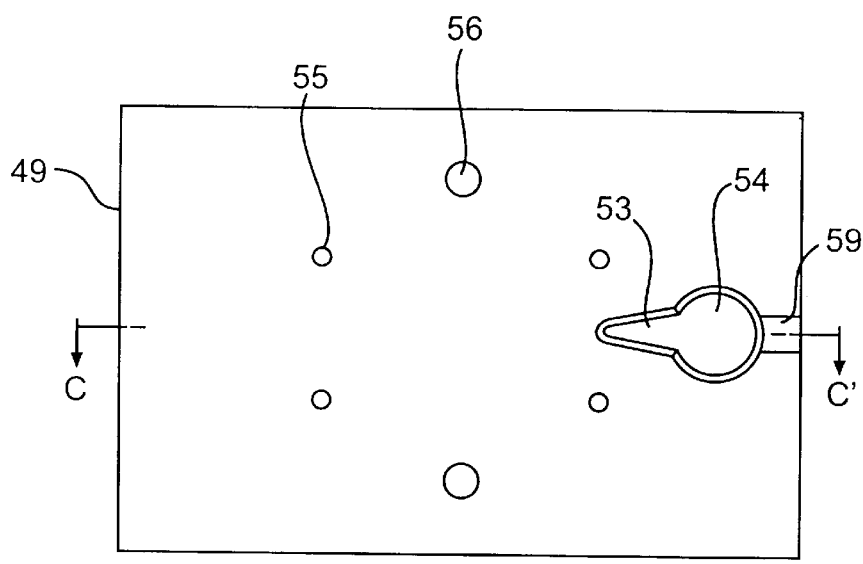
FIG. 84(b) is a top plan view thereof and FIG. 84(c) is a section thereof.
Figure 84C:
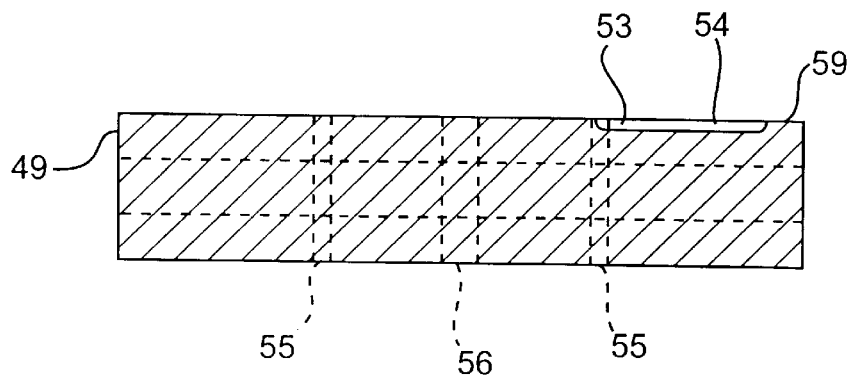

FIG. 84(a) is a perspective view of the bottom force 48; FIG. 84(b) is a top plan view of the bottom force 49; and FIG. 84(c) is a section of the bottom force 49, taken along line C—C' of FIG. 84(b). Both the gate hole 53 and the dummy cavity 54 of the bottom force 49 are given a parting angle for facilitating the parting of the resin. As shown, a shallow groove (or air vent) 59 is formed in one end of the dummy cavity 54 to vent the unnecessary air out of the dummy cavity 54. Although not shown, moreover, an ejector pin structure, adopted in an ordinary mold, may be formed to further facilitate the parting of the resin out of the dummy cavity 54.

Figure 85:
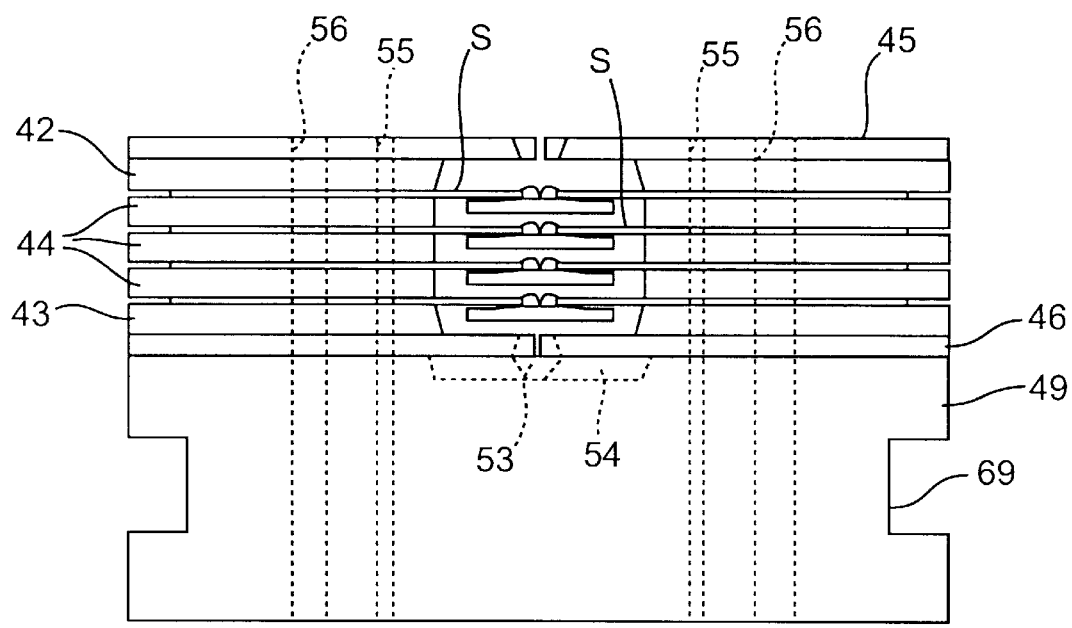
FIGS. 85 and 86 are diagrams showing the construction of the insert mold and show the method of molding the package.
Figure 86:
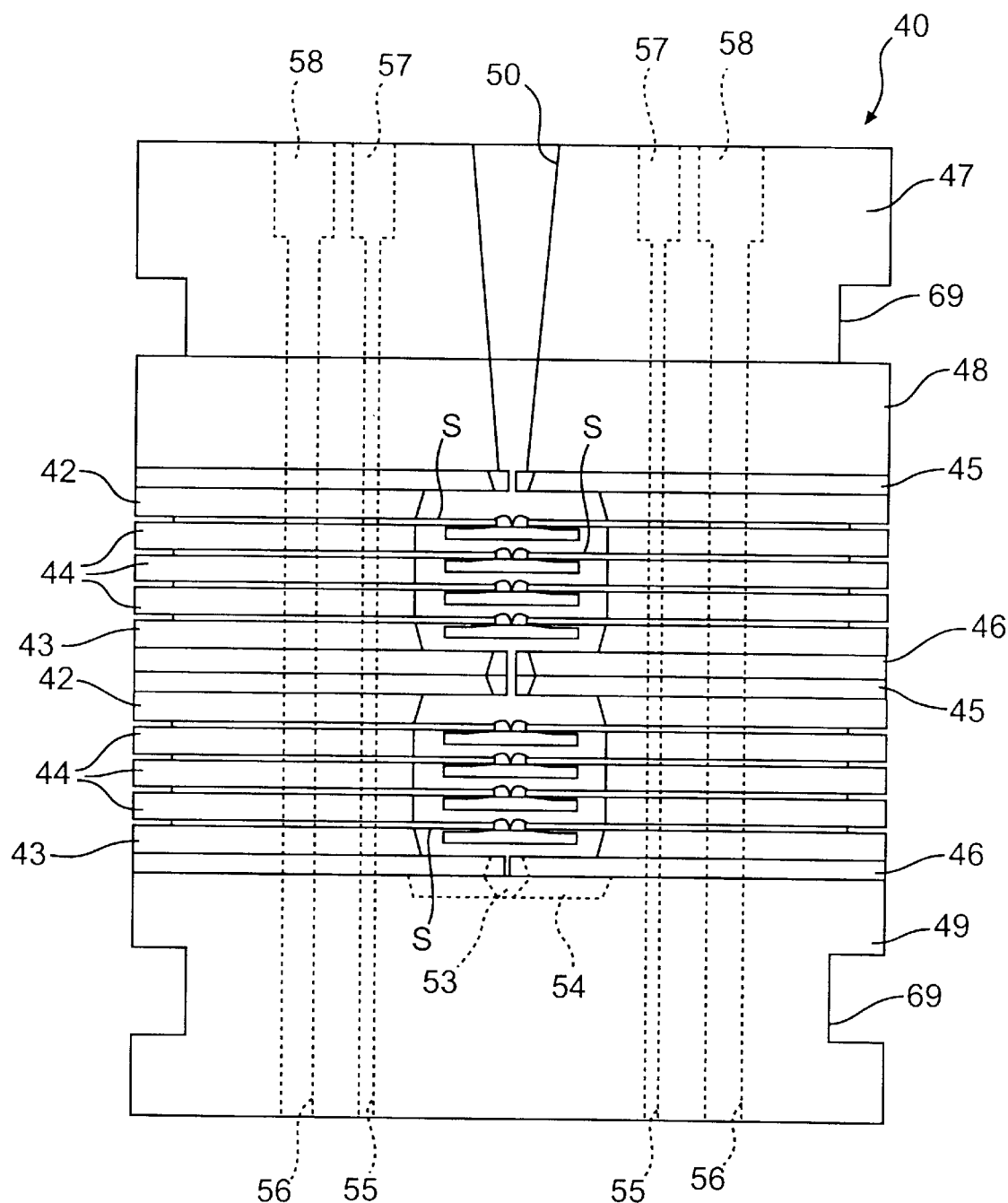

In order to mold the package 2D by using the aforementioned insert mold 40, the movable plates 46 and 43 of the lower cavity 41B are stacked over the bottom force 49, as shown in FIG. 85. After this, the lead frames (S) and the movable plates 44, having been subjected to the chip bonding and wire bonding process, are alternately stacked and the movable plates 42 and 45 are laid thereon. By repeating the aforementioned operation, as shown in FIG. 86, the lead frames (S) are stacked over the upper cavity 41A, and the top forces 48 and 47 are stacked thereover. After this, the guide pins 57 and 58 are inserted downward through the guide pin holes 55 and 56. Those guide pins 57 and 58 are further inserted through the openings 4 of the lead frames (S).

The positioning of the lead frames (S) in the stack direction (in the vertical direction) is carried out by the movable plates 42 to 46. On the other hand, the positioning in a horizontal plane is carried out by inserting the guide pins 57 and 58 through from the uppermost top force 47 to the lowermost bottom force 49. The guide pins 57 and 58 restricts the translation and free rotation of the top force 48 and 47, the movable plates 42 to 46, the bottom force 49 and the lead frames (S) in a horizontal plane so that the positions of the lead frames (S) in the stack direction is uniquely determined.

Figure 87:
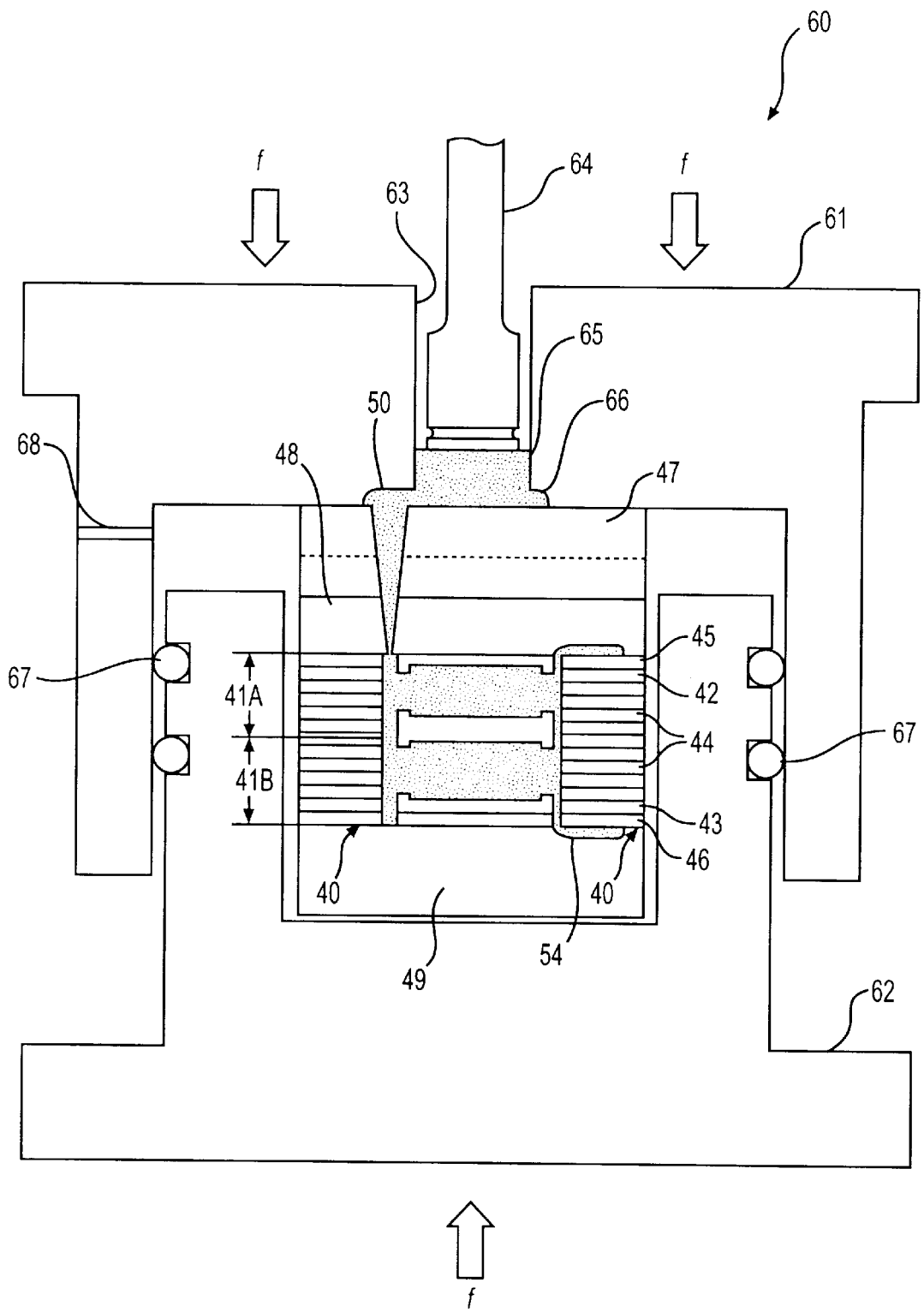
FIG. 87 is a diagram showing the entire construction of a molding apparatus.

FIG. 87 is a diagram showing the entire construction of a molding apparatus which is provided with the aforementioned insert mold 40. The best feature of this mold apparatus 60 is that almost all the mold clamping force (f) is applied in series from the uppermost portion (the top force 47 and 48) to the lowermost portion (the bottom force 49), so that its loss is very little. In the insert mold 40, on the other hand, the gate hole 50 for injecting the resin is oriented in the vertical direction, so that the mold clamping force (f) can be utilized very effectively unlike conventional molds in which the gate and the runner are arranged in the horizontal plane. Especially, the aforementioned insert mold 40 has a planar size of several tens cm$^2$, far smaller than several hundreds cm$^2$ of conventional molds, and has a small pressure receiving area, so that a very high mold clamping force (f) per unit area can be achieved.

As a result, the aforementioned insert mold 40 can omit the area for concentrating the mold clamping force of a narrow dam shape in the vicinity of the cavity interface, which has been essential for the mold of the prior art, so that the mold can be flattened with a high accuracy and is free from any deterioration due to the deformation of the aforementioned dam-shaped region.

As shown in FIG. 87, the molding apparatus 60 is constructed of a fixed mold 61 and a movable mold 62. Of these, the fixed mold 61 is a temperature-controlled mold for pressing the insert mold 40 from above and is equipped with a transfer mold pot 63 and a plunger 64. A molding resin or mini tablet 65 is poured into the pot 63 and is then heated and melted until it is injected by the plunger 64 into the cavities 41A and 41B of the insert mold 40.

A cull 66 is formed in the cavity of the fixed mold 61 for facilitating the parting of the resin after molding. Specifically, when the fixed mold 61 and the movable mold 62 are parted after the molding operation, the plunger 64 is moved down in synchronism with the mold opening, if the resin of the cull 66 sticks on the fixed mold 61. As a result, the plunger 64 acts as an ejector to facilitate the parting of the resin.

The fixed mold 61 and the movable mold 62 can slide vertically through O-rings 67 for preventing the air leakage. As a result, even if the number of semiconductor chips to be packaged varies to change the height of the insert mold 40, this change can be followed with a vertically wide stroke. Thus, this molding apparatus 60 can be continuously worked even if the insert molds 40 to be used have different sizes.

The application of the load to the insert mold 40 is effected by raising the movable mold 62 till a preset clamping force is generated. The unnecessary air, discharged as the plunger 64 moves down, is discharged out through an evacuation hole 68 after the mini tablet 65 is put into the pot 63 and the plunger 64 is then inserted into the pot 63. If no evacuation is required, the hole 68 may be vented to the atmosphere.

If the aforementioned molding apparatus 60 is used, the top force 48 may have the same dummy cavity 54 which is formed in the bottom force 49 of the insert mold 40. By forming the dummy cavities individually in the bottom force 49 and the top force 48, the resin, including air, can be promptly discharged.

Figure 88:
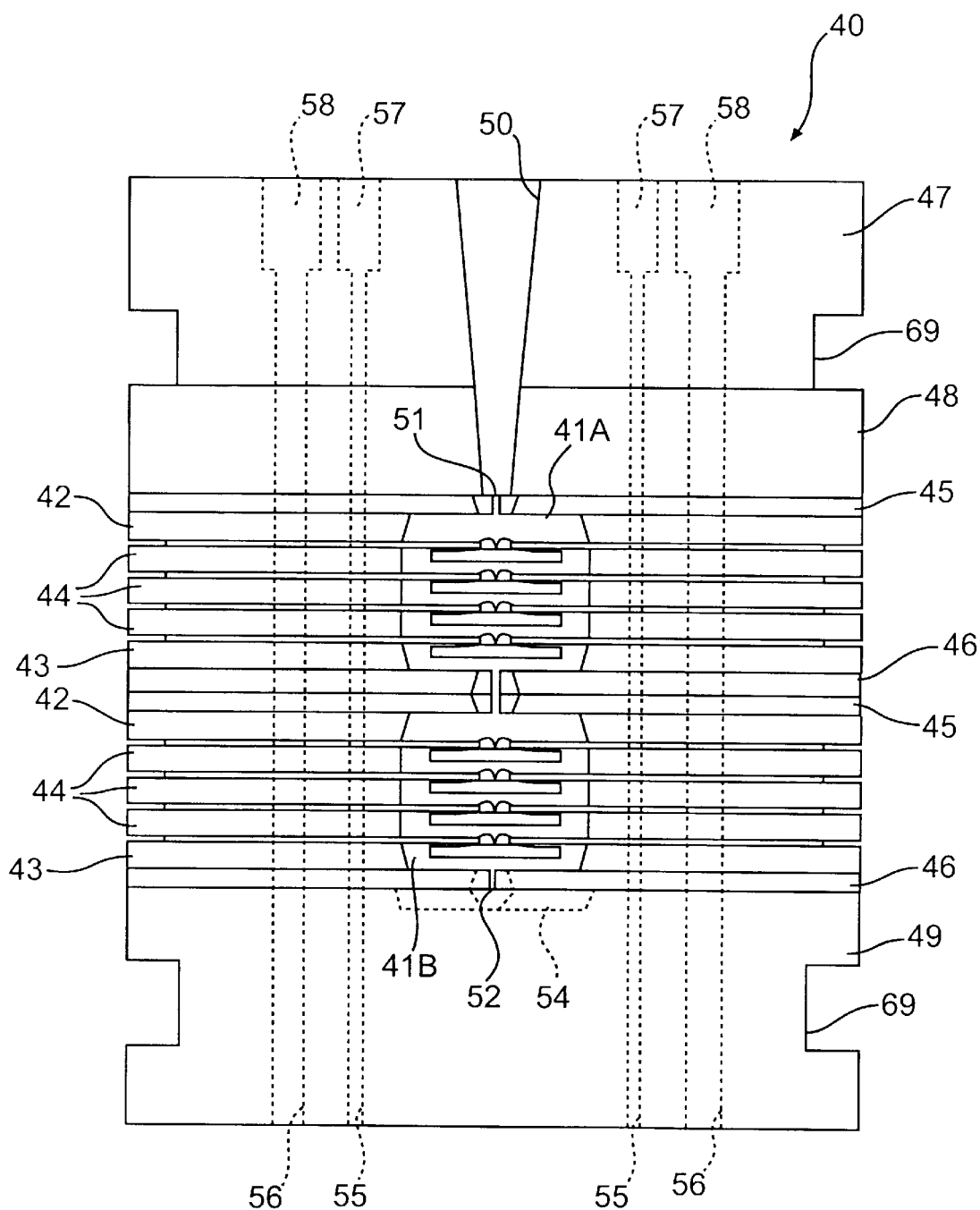
FIG. 88 is a diagram of the construction of the insert mold and shows the method of molding the package.
Figure 89:
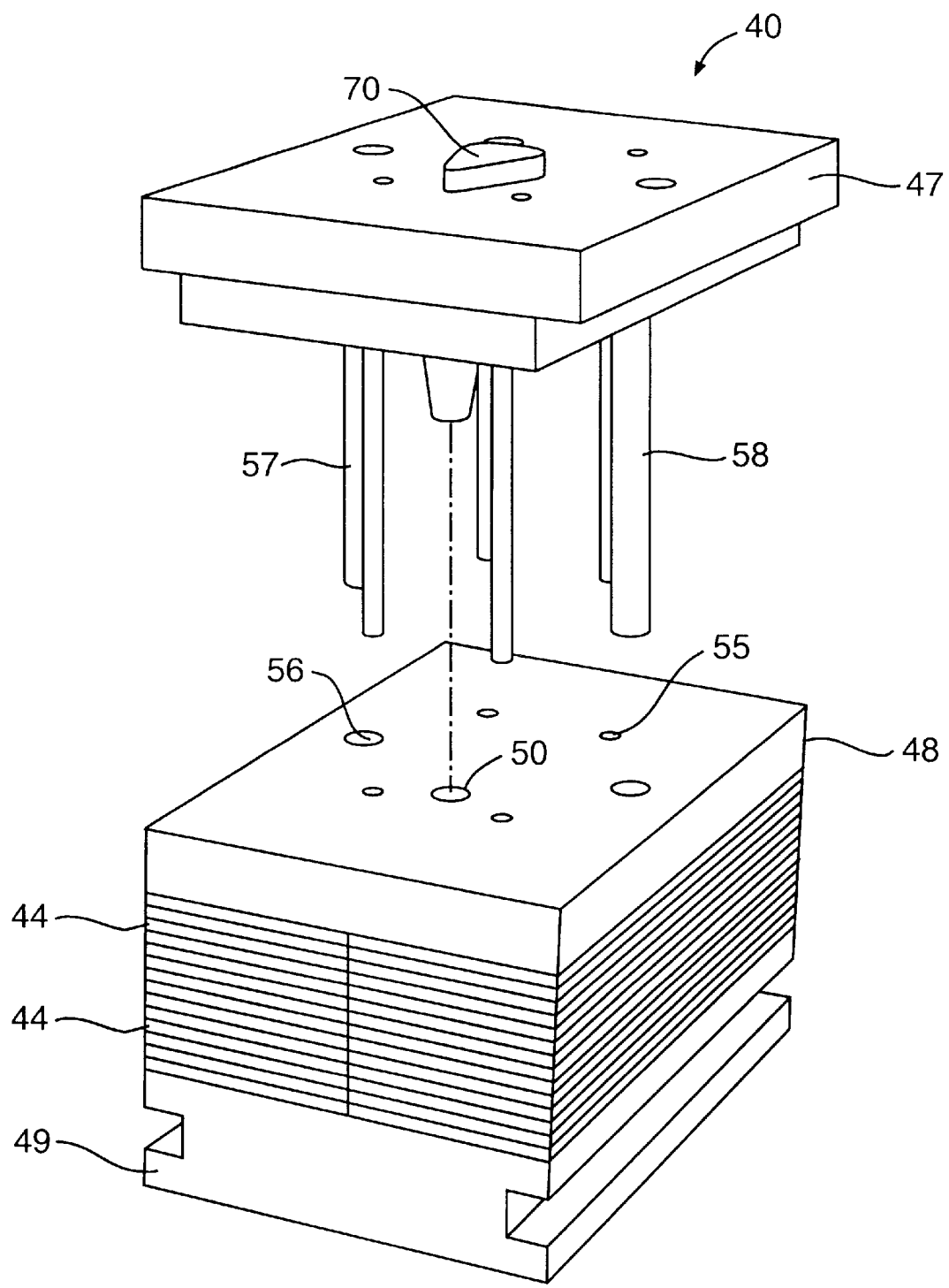
FIG. 89 is a perspective view of the insert mold and shows the method of molding the package.
Figure 90:
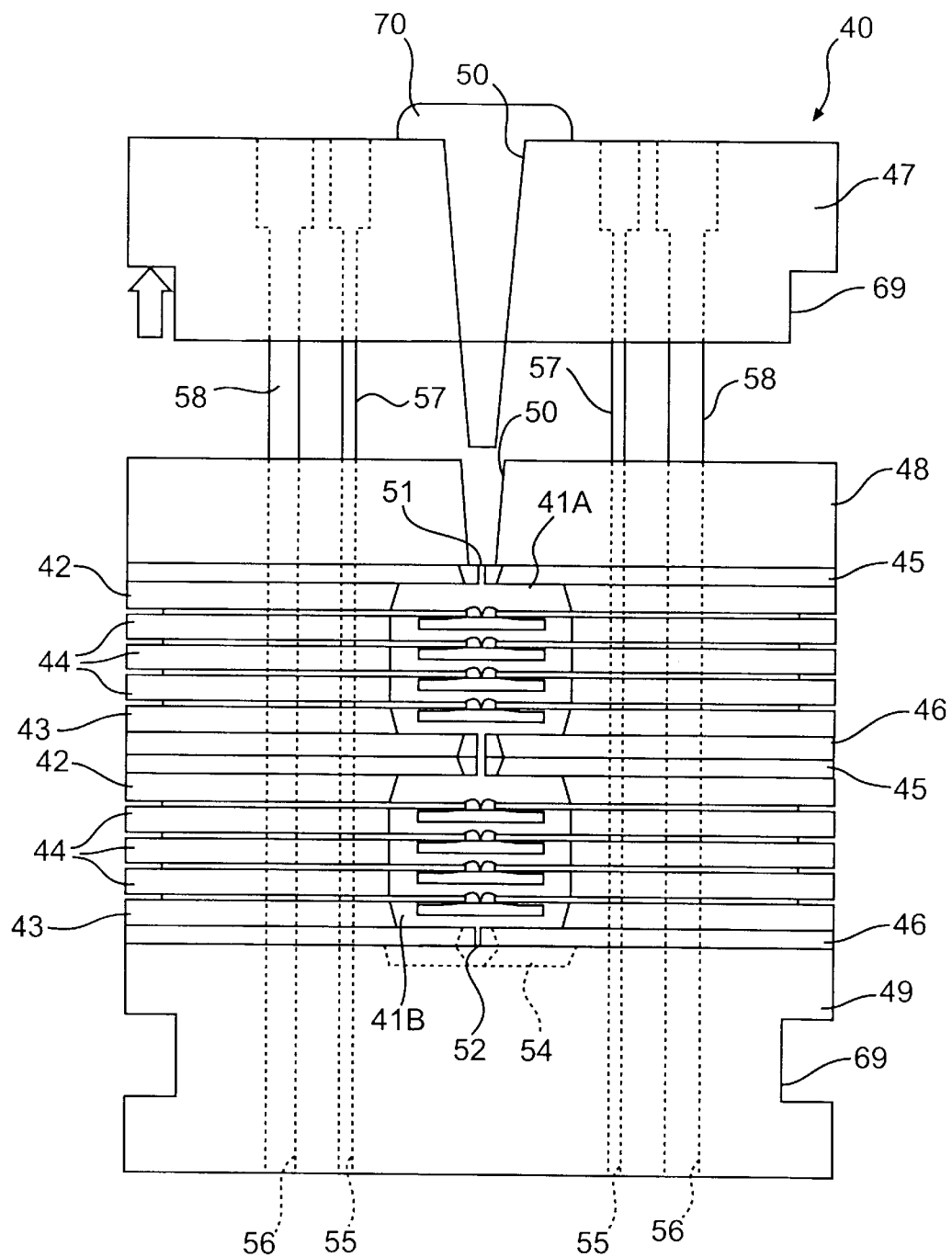
FIG. 90 is a diagram of the construction of the insert mold and shows the method of molding the package.

The fluid resin, melted in the pot 63, is injected by the plunger 64 to flow in the upper cavity 41A through the vertically tapered gate hole 50 in the top forces 47 and 48 and through the gate hole 51 of the movable plate 45 until it flows into the lower cavity 41B through the gate hole 52 of the movable plate 46 and the gate hole 51 of the movable plate 45. As shown in FIG. 88, the head part of the fluid resin passes through the gate hole 52 of the bottom force 46 in the bottom of the cavity 41B until the molding operation is completed when the head part reaches the dummy cavity 54 of the bottom force 49.

In order to part the package 2D from the cavities 41A and 41B after the molding operation, the uppermost top force 47 of the insert mold 40 is lifted up by making use of the key grooves 69. At this time, the top force 47 acts as the ejector so that the resin in the gate hole 50 is cut at the bottom (the interface between the top force 48 and the movable plate 45) of the gate hole, in which the stress is concentrated to the highest. On the upper face of the top force 47, there is left the resin 70 which is molded at the cull 66 of the molding apparatus 60. This resin 70 can be easily parted either by pushing the resin in the gate hole 50 upward or by applying the angular moment around the gate hole 50 to the interface between the top force 47 and the resin 70.

When the top force 47 is lifted to a sufficient height, the guide pins 57 and 58 are also lifted together. If the top force is divided into two, as designated by 47 and 48, the force necessary to extract the guide pins 57 and 58 is received by the top force 48, so that the cavities 41A and 41B are not subjected to a strong force. As a result, the package 2D in the cavities 41A and 41B receives no strong mechanical stress. The guide pins 57 and 58 may be left inserted in the top force 47. Then, the top forces 47 and 48 can be promptly assembled in the next shot.

Since the top force of the insert mold 40 is thus divided into two parts 47 and 48, the resin in the gate hole 50 can be easily cut, and the mechanical damage on the package 2D at the mold opening time can be reduced. If the top force 47 and the top force 48 are integrated, on the other hand, the resin in the gate hole 50 is hard to part because no ejector structure is present inside. When the guide pins 57 and 58 are extracted, a strong force is applied to the cavities 41A and 41B, and the package 2D may be mechanically damaged.

The movable plates 42 to 46 forming the cavities 41A and 41B can be easily halved by inserting the pins into the guide pin holes 56 (or 56) and by pulling them in the horizontal direction. When the package 2D sticks to either of the righthand and lefthand movable plates 42 to 46, it can be easily parted by inserting the pins into the openings 4 of the lead frame (s) on the parted side and by pulling them in the horizontal direction.

In the insert mold 40 thus far described, the top force 48 and the movable plate 45 in contact with the former may be integrated, or the top force 48, the movable plate 45 and the movable plate 42 in contact with the former may be integrated so as to reduce the number of parts. This integration can be made for the bottom force 75, too.

The movable plates 42, 43 and 44 may be made of not only an ordinary molding material such as SKD12 or MAS1C but also a synthetic region or paper impregnated with a synthetic resin. If a less expensive synthetic resin or paper than ordinary molding materials is used, it is possible to reduce the cost for manufacturing the movable plates 42, 43 and 44. The movable plates 42, 43 and 44, made of synthetic resin or resin-impregnated paper, are inferior in durability to the metallic parts but they may be replaced by new resin after each molding operation because they can be pulverized after use and re-used many times. At an ordinary molding step, the cavities of the mold have to be periodically cleaned to remove the resin residue. When the movable plates 42, 43 and 44 are replaced with new ones after each molding step, the cavities are always kept clean to require no cleaning operation so that the throughput of the molding step is improved.

Figure 91A:
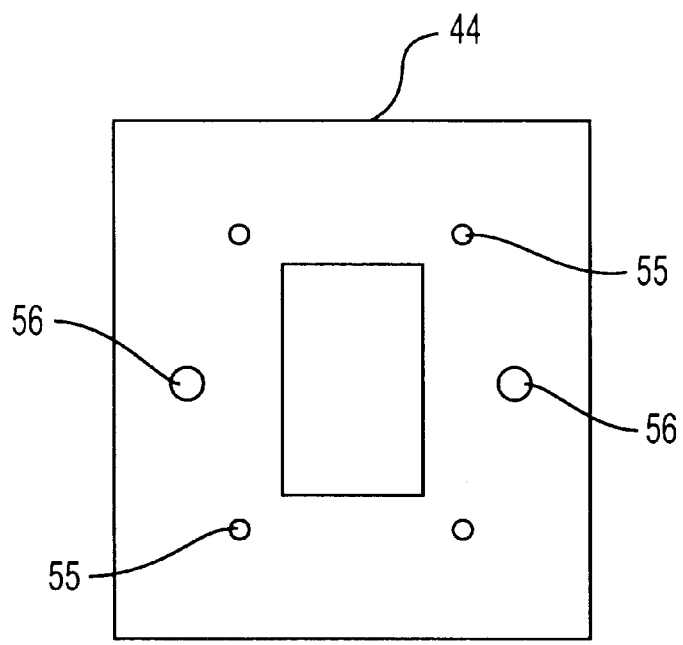
FIG. 91(a) is a top plan view showing another embodiment of the moving part.
Figure 91B:
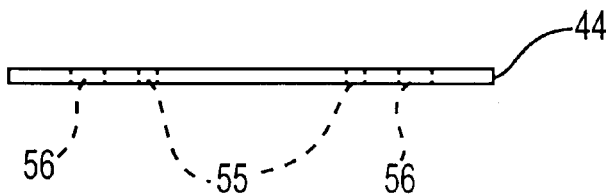
FIG. 91(b) is a side elevation thereof.

When the movable plates 42, 43 and 44 are replaced with new ones after each molding step of the package 2D, the horizontal half structure may be replaced by the horizontally integral structure, as shown in FIG. 91. In this modification, the package 2D is parted by breaking the movable plates 42, 43 and 44. Since these movable plates 42, 43 and 44 are very thin, they can be easily broken by bending them if they are made of synthetic resin or resin-impregnated paper.

Figure 92:
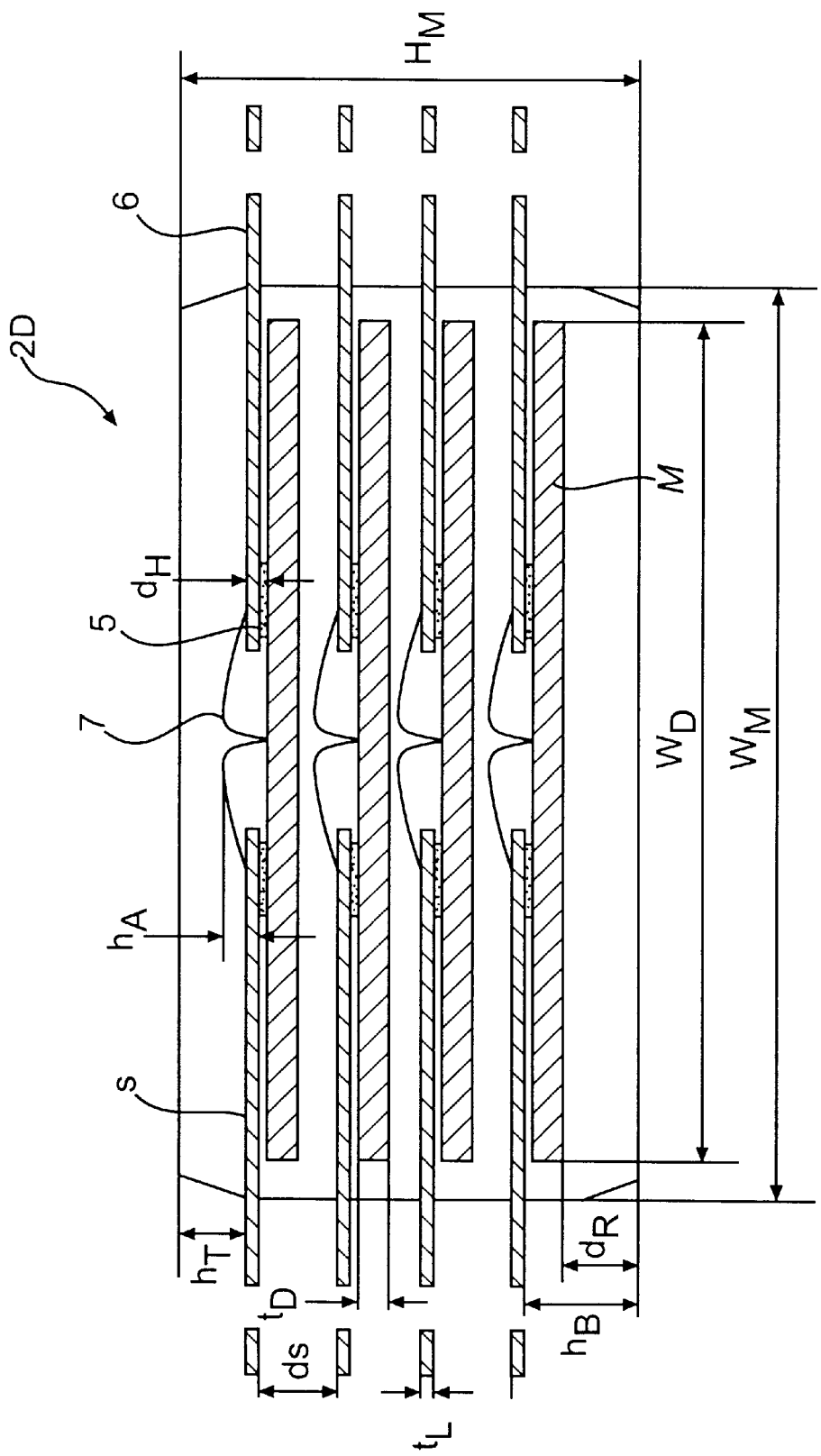
FIG. 92 is a section of the package.

FIG. 92 is a section (taken in the direction of the short side of the package 2D) showing the package 2D in which the four semiconductor chips are encapsulated by the aforementioned method. In FIG. 92, there are shown the dimensions of the individual portions of the package 2D.

Here: symbol hA designates the loop height of the wire, measured from the top face of the lead frame (s); tL the thickness of the lead frame (s); and hT the thickness of the resin from the top face of the uppermost lead frame (s) to the top face of the package 2D and corresponding to the thickness of the movable plate 42. Symbol dH designates the thickness of the insulating tape 5, and dS designates the height from the top face of the lower lead frame (s) to the bottom face of the upper lead frame (s) and correspond to the thickness of the aforementioned movable plate 44. Symbol tD designates the thickness of the semiconductor chip (M), and hB designates the thickness of the resin from the bottom face of the package 2D to the bottom face of the lowermost lead frame (s) and correspond to the thickness of the aforementioned movable plate 43. Symbol dR designates the thickness of the resin from the bottom face of the package 2D to the bottom face of the lowermost semiconductor chip (M); WD the width of the short side of the semiconductor chip (M); and WM the width of the short side of the package 2D.

At this time, the thickness (HM) of the package 2D is expressed by the following formula:

$$HM = hT + (4 \times tL) + (3 \times dS) + hB \quad (1)$$

Here are the following restricting conditions:
(a) Assuming that the wire 7 may not exceed the top face of the package 2D, $$hT \geq hA \quad (2)$$

(b) Assuming that the wire 7 is not in contact with the bottom face of the upper semiconductor chip (M), the thickness dS of the movable plate 44 is given by $$dS \geq dH + tD + hA \quad (3)$$

(c) Assuming that the bottom face of the lowermost semiconductor chip (M) does not exceed the bottom face of the package 2D:

$$hB \geq dH + tD + dR \quad (4)$$

$$dR \geq 0 \quad (5)$$

(d) Assuming that the width of the semiconductor chip (M) does not exceed the width of the package 2D, $$WM \geq wD \quad (6)$$

From formulas (1) to (5), therefore, the thickness (HM) of the package 2D is expressed by the following formula:

$$HM \geq hA + (4 \times tL) + 3 \times (dH + tD + hA) + dH + tD = 4 \times (tL + dH + tD + hA) \quad (7)$$

From this formula, the minimum (HMmin) of the thickness of the package 2D is calculated by substituting the minimum values (hA=0.1 mm, dH=0.05 mm, tD=0.2 mm and tL=0.8 mm) that can be achieved by current techniques, into Formula (7):

$$HMmin = 1.72 \quad (8)$$

If dR=0.1 mm and hT=hA+0.1 mm are considered, the thickness (HM) of the package 2D is 1.92 mm, i.e., less than 2 mm.

Figure 93:
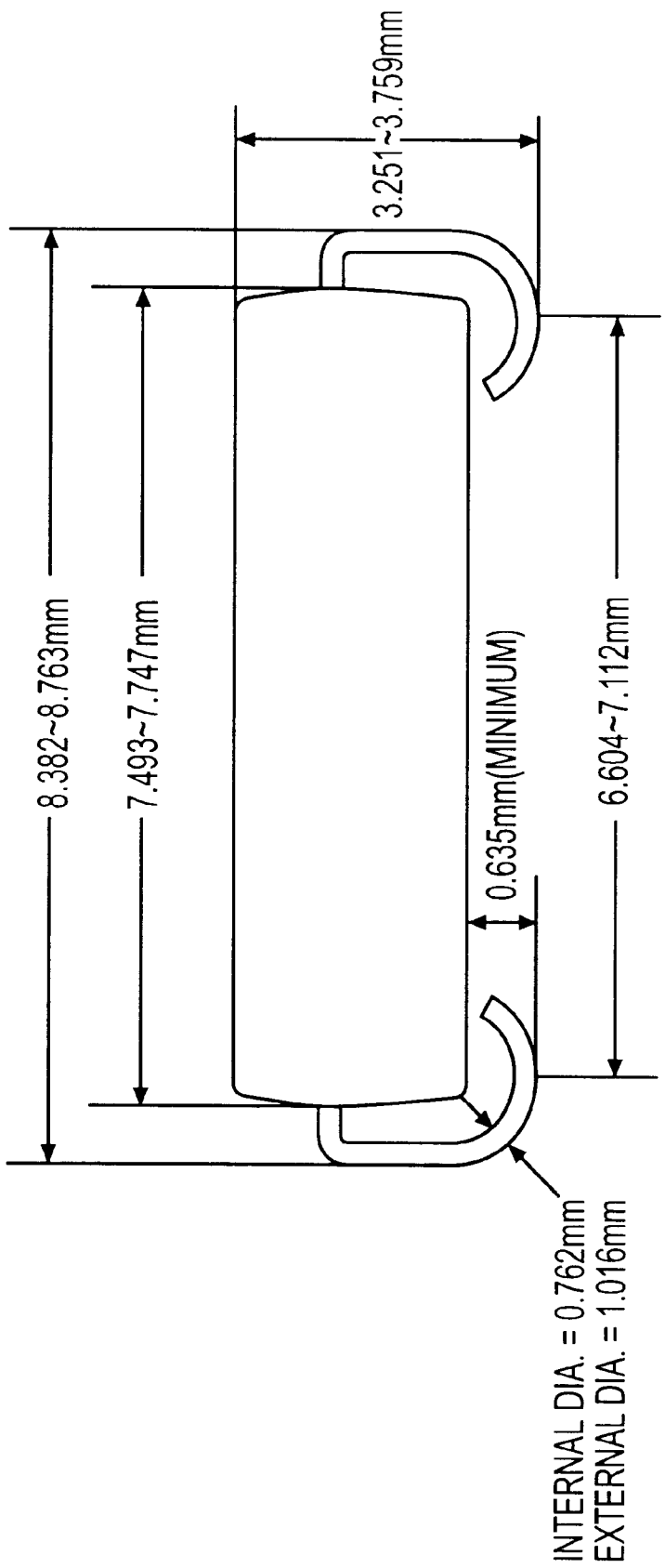
FIG. 93 is an explanatory diagram showing the EIAJ standard of 300 mil-SOJ.

The standards for the dimensions of the individual portions of 300 mil-SOJ, determined by the EIAJ (the Electronic Industries Association of Japan) are shown in FIG. 93. As shown, the standards of the package thickness (HM) of the SOJ are HM≦3.124 mm. Hence, the package 2D of the present embodiment can clear the EIAJ standards of the SOJ sufficiently.

The dimensions of the individual portions for manufacturing the package 2D of the present embodiment massively according to the present technique are: hA=0.13 mm; tL=0.125 mm; hT=0.25 mm; dH=0.08 mm; dS=0.54 mm; tD=0.28 mm; and hB=0.46 mm. If these values are substituted into the foregoing formula (7), the following value is found:

$$HM = 2.83 \text{ mm} \quad (9)$$

In short, the package 2D of the present embodiment can clear the EIAJ standards (HM üa 3.124 mm) sufficiently even at a mass production level.

The foregoing example is the case in which the four DRAM chips ($M_0$ to $M_3$) are encapsulated as a whole. Generally, the following formula (10) can be obtained by extending the foregoing formula (1):

$$HM = hT + (N \times tL) + \{(N-1) \times dS\} + hB \quad (10)$$

Figure 94:
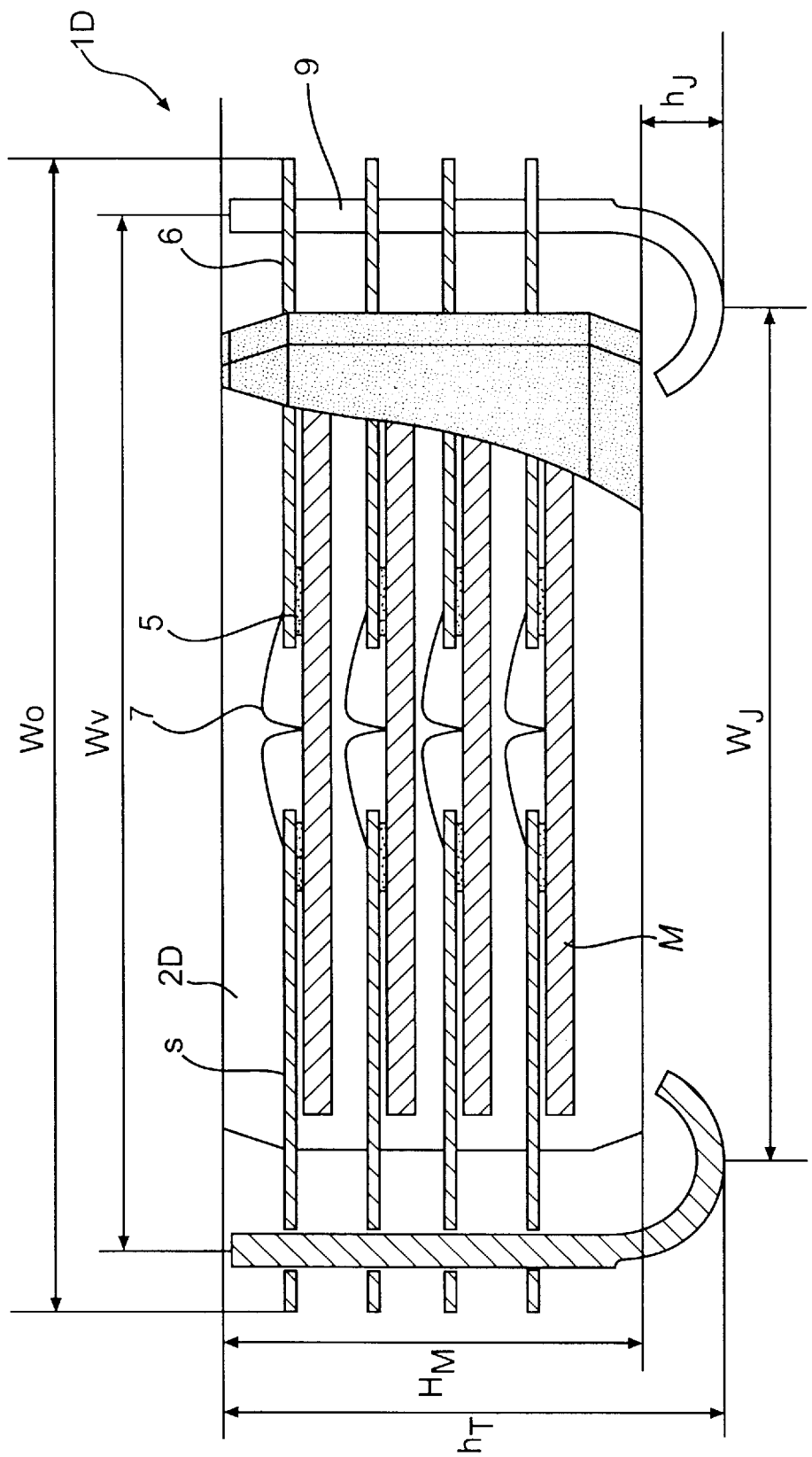
FIG. 94 is a partially broken section showing the DRAM module.

FIG. 94 is a partially exploded section (viewed from the short side of the package 2D) showing a portion of the DRAM module 1D in which the module leads (J leads) 9 are connected to the leads 6 of the package 2D. In FIG. 94, there are shown the dimensions of the individual portions of the DRAM module 1D.

Here: symbol WJ designates the pitch of the lower end portions of the module leads (J leads) 9 and 9 confronting each other with the package 2D therebetween; WV the pitch of the center portions of the same; WO the pitch of the outer end portions of the leads 6 and 6 confronting each other with the package 2D therebetween; hj the gap between the bottom portions of the package 2D and the lower end portions of the module lead (J leads) 9; RV the diameter of the module leads (J leads) 9; and hT the distance (the entire height of the DRAM module 1D) from the top face of the package 2D to the lower end portion of the module leads (J leads) 9.

According to the EIAJ standards of the aforementioned 300 mil-SOJ, as shown in FIG. 93, the following relations hold:

$$3.251 \leq hT \leq 3.759 \quad (11)$$

$$hJ \geq 0.635 \tag{12}$$

$$8.382 \leq WO \leq 8.763 \tag{13}$$

$$6.604 \leq WJ \leq 7.112 \tag{14}$$

From the structural restriction, the relation between the pitch (WO) of the outer end portions of the leads 6 and the width (WM) of the short side of the package 2D is $$WO \geq WM + (2 \times RV) \tag{15}$$

If, at this time, the thickness (HM) of the package 2D is the value (2.83 mm) of the foregoing Formula (9), the DRAM module 1D satisfies the aforementioned relations (11) and (12).

$$hT \geq HM + hj = 2.83 + 0.635 = 3.465$$

When WO=8.7, WM=7.5, RV=0.4 and WV=8.2, therefore, it is possible to provide the DRAM module 1D conforming to the EIAJ standards of 300 mil-SOJ.

The module leads (J leads) 9 of the aforementioned DRAM module 1D may be constructed of an ordinary lead frame, in which the lead pattern is formed by pressing or etching a hoop material, but can be made of a wire having a circular section.

When the module leads 9 are wires, connection of the wires (or module leads 9) and the leads 6 are carried out by a method which is different from the foregoing one. Specifically, the wires and the leads 6 are soldered in a self-alignment manner by inserting the wires into the openings 8 of the leads 6 and by thermally treating the wires to melt the solder plating on the surface. The heat treatment of the wires is carried out by blowing hot nitrogen gas to the older plating in the atmosphere of an inert gas, for example, by irradiating the wires with a light beam or a laser beam, or by heating the wires in a reflow furnace shielded from the atmosphere.

When the lead inserting holes 8, formed in the leads 6 of the package 2D, have a square of 0.42 mm×0.42 mm, the wires used are made of a metal such as phosphor copper, beryllium copper or covar having a diameter of 0.32 mm and are plated with solder of 45 microns composed of 90% of Sn and 10% of Pb or 10% of Sn and 90% of Pb and having a higher melting point than that of an eutectic solder (having a composition of 60% of Sn and 40% of Pb) to have an external diameter of 0.41 mm. By not using eutectic solder melting at a temperature of about 180° C. but by using a high-melting point solder melting at 200° C. or higher, the solder at the connecting portions between the leads 6 and the module leads 9 can be prevented from being melted again when the module leads 9 are reflow-soldered to the printed circuit board of the SIMM by using the eutectic solder having a low melting point.

If the solder at the connecting portions between the module leads 9 and the leads 6 is melted, the connecting portions are offset to shift the package 2D downward by a certain external force or by the weight of the package 2D, and the solder at the connecting portions flows to the connecting portions of the underlying leads 6 by the gravity, so that the cracks or the solder-recrystallized regions having a nonuniform composition are formed in the connecting portions to deteriorate the connection reliability of the solder seriously. This is because the fillet shape of the solder cannot be controlled, if the amount of solder at the connecting portions changes, so that the propagation of the cracks in the solder is accelerated by the increased solder stress due to the heat cycle thereby to drop the reliability. Especially if the amount of solder is high, the stress of the thermal expansion or contraction of the solder due to the heat cycle is increased to accelerate the propagation of the solder cracks due to the increase in the plastic deformation.

When, however, the module leads 9 and the leads 6, plated with the high-melting point solder, are soldered at a reflow temperature of 200° C. or higher and when the temperature of the reflow furnace for packaging the DRAM module on the printed circuit board of the SIMM is lower than the melting point (e.g., 200° C. or lower) of the high-melting point solder, only the low-melting point solder at the connecting portions between the module leads 9 and the printed circuit board melts in the vicinity of the module leads 9, so that the high-melting point solder at the connecting portions can be prevented from being melted to hold the shape of the DRAM module 1D.

The aforementioned self-alignment solder connecting method is easier in the control of the amount of solder at the connecting portions than the solder dip method. This is because the solder, applied to the surface of the module leads 9 at the intermediate portions between the upper leads 6 and the lower leads 6, is supplied substantially equally to the upper and lower leads 6. In other words, the amount of solder is liable to change in the conventional solder dip method in accordance with the surface state of the metal of the wires, whereas the solder is always supplied at a controlled constant rate in accordance with the self-alignment solder connecting method.

According to the self-alignment solder connecting method, the amount of solder applied to the wires (or module leads 9) is less than that of the jet type solder dip method of the prior art thereby to provide an advantage that solder bridge is hard to occur between the leads 6 and 6 adjoining in the horizontal direction. Especially in the structure in which the numerous leads 6 and the module leads 9 are cross-connected in the matrix shape as in the DRAM module of the present invention, the surface area is enlarged based upon the same principle as that of the solder sucking wires, so that the solder removability is far worse than that of the structure in which the solder can be removed in one direction as in the QFP (Quad Flat Package) leads formed in the gull-wind shape, and it is very difficult to remove the excess solder. In short, according to the aforementioned self-alignment solder connecting method, the solder bridge defect of the DRAM module of the present invention can be remarkably effectively prevented. If metal burrs are produced on the leads 6 at the press step or at the tie bar cutting step, the burrs catch the molten solder to provide nuclei of the solder bridge, and thereby to sharply increase the degree of occurrence of bridges. Hence, the self-alignment solder connecting method producing little excess solder is effective, from this point, in improving the yield of the solder connecting step.

Figure 95:
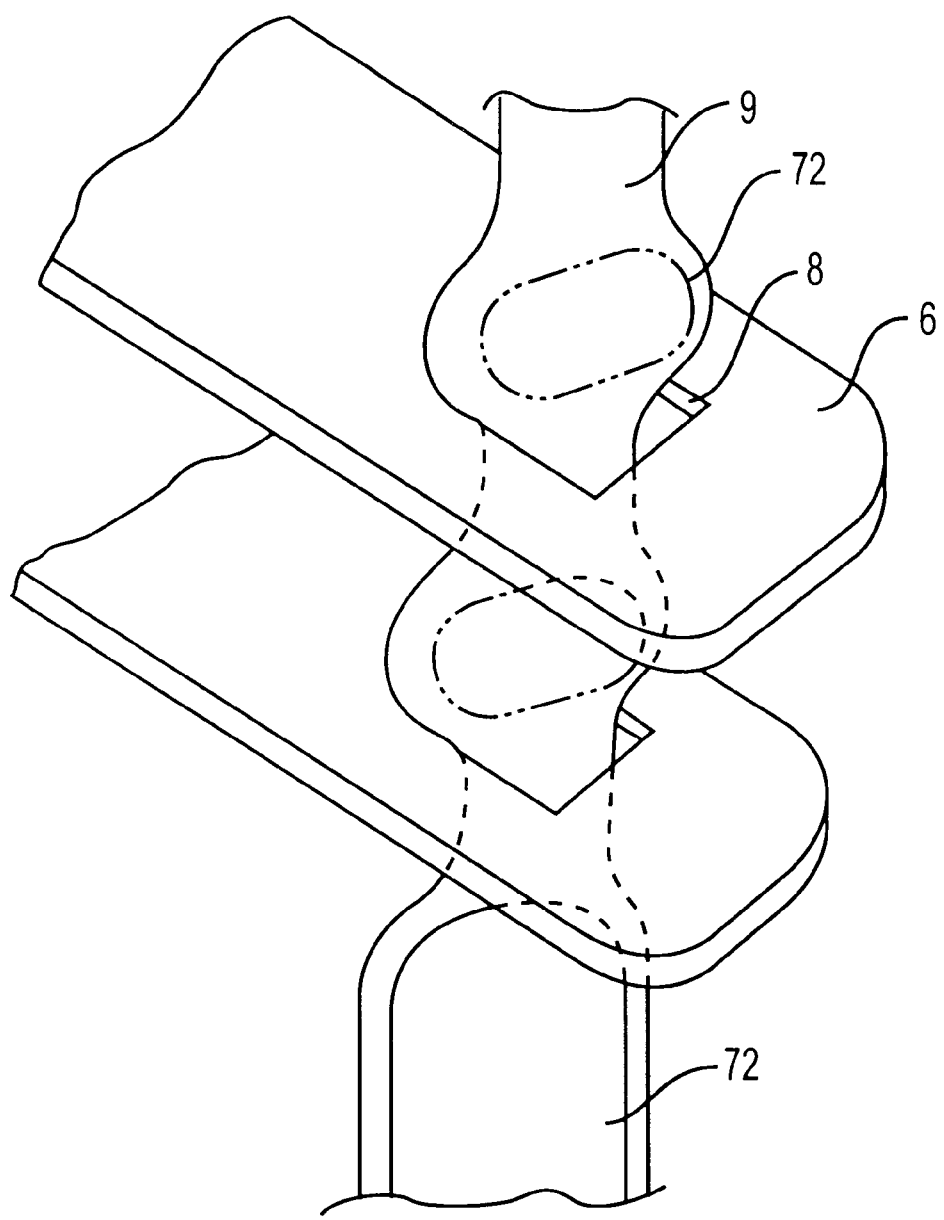
FIGS. 95 and 96 perspective views showing other embodiments of the module lead.

If the diameter of the module leads 9 is made smaller than that of the openings 8 of the leads 6, the work of inserting the module leads 9 into the openings 8 can be promptly carried out. In this case, however, the mere insertions of the module leads 9 into the openings 8 will cause the displacement of the module leads 9 due to an external force such as the weight of the package 2D before the solder reflow. As this counter-measure, the module leads 9 may be partially pressed to form wide flattened portions 72, as shown in FIG. 95, to enlarge the widths of the module leads 9 partially thereby to prevent the displacement or the come-off. Alternatively, the module leads 9 may be pressed to enlarge their partial width to a value as large as that of the openings 8 so that the module leads 9 may be press-fitted in the openings 8 by a "caulking" method.

Figure 96:
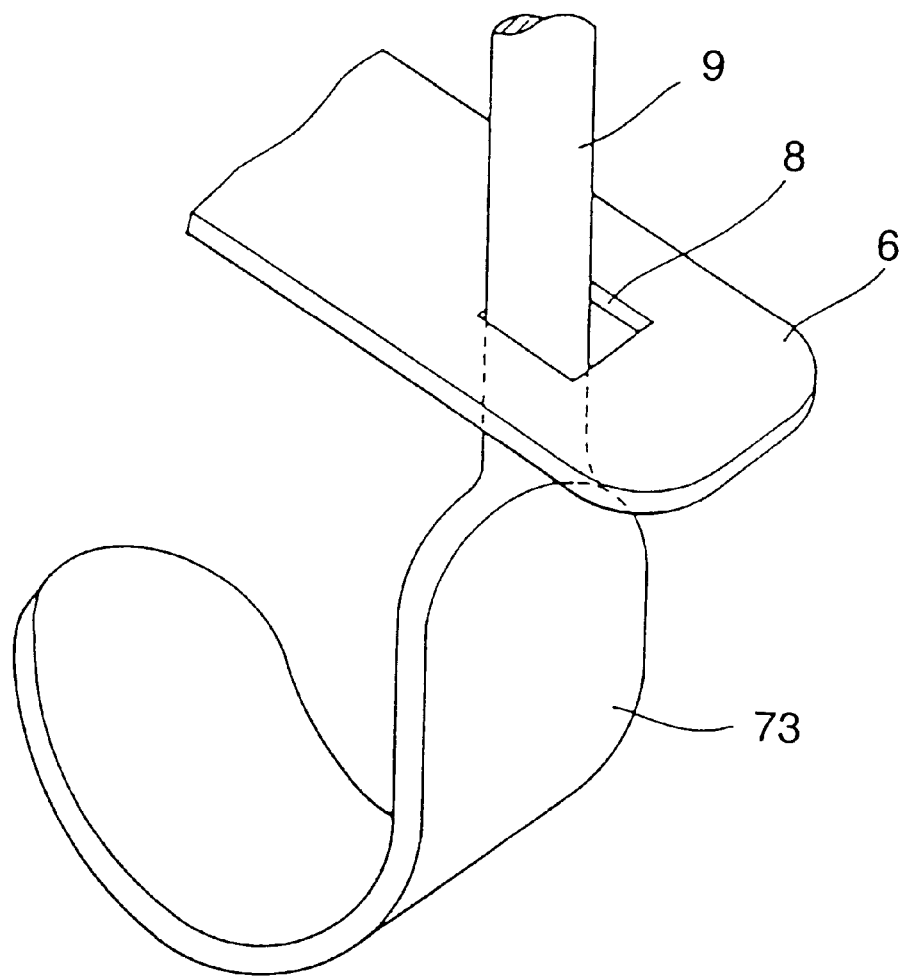

An example, in which the aforementioned method of forming the flattened portions 72 partially on the module leads 9 is applied to the lower end portions (J-bend portions) of the module leads 9, is shown in FIG. 96. In this example, the width of a flattened portion 73 can be freely changed. Another method is that the J-bend of the module lead 9 can be easily formed. When the flattened portion 73 is formed by a press method, the strength of the J-bend portion is raised as a result of hardening the metal to provide another advantage that the module lead 9 is hard to deform.

Figure 97A:
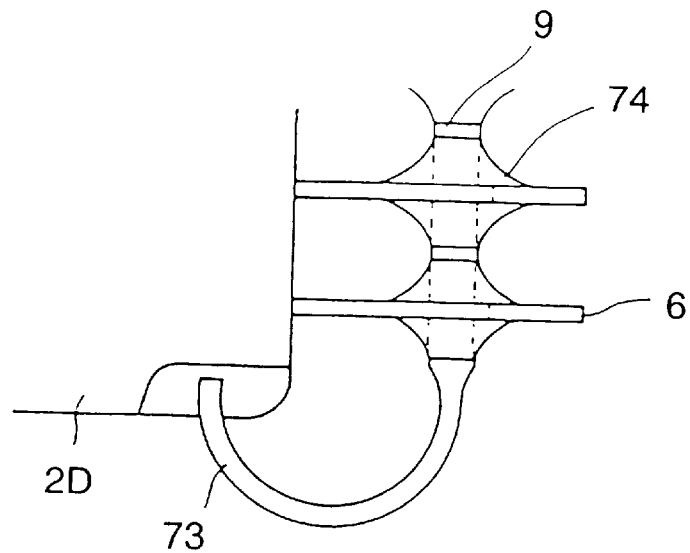
FIG. 97(a) is a side elevation showing a pattern of a solder fillet and FIG. 97(b) a perspective view thereof.
Figure 97B:
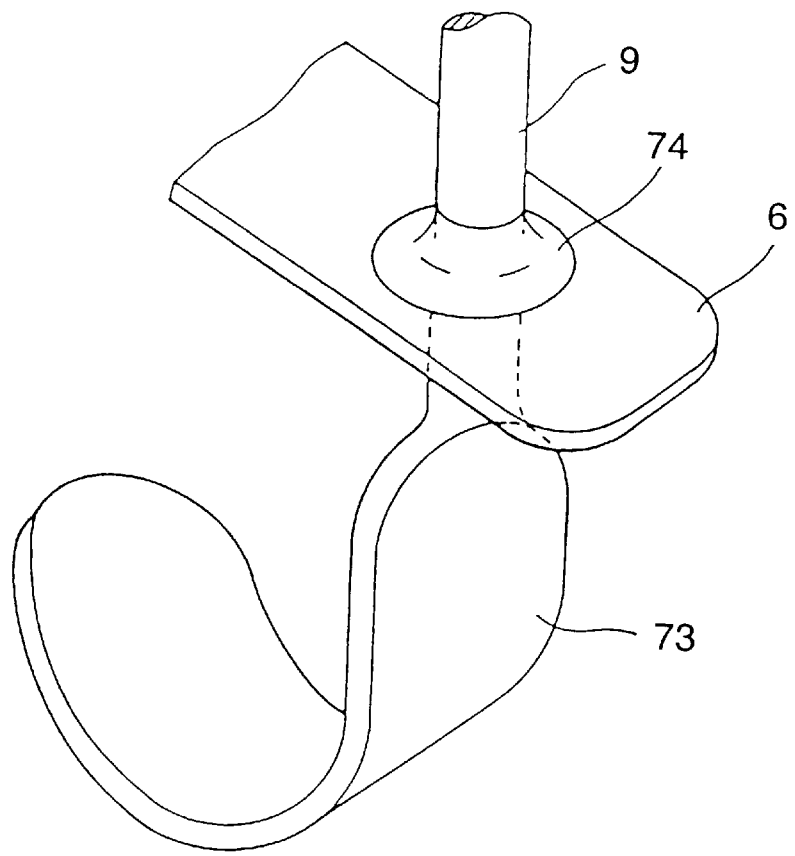

FIGS. 97(a) and 97(b) show the pattern of a solder fillet 74 when the module lead 9 is a wire plated with solder and has a J-bend molded lower end portion. The pattern and size of the solder fillet 74 can be controlled by the plating specifications of the lead 6. When the lead 6 is plated with Au, the solder wettability of the surface of the lead 6 is improved to enlarge the extension of the solder fillet 74 over the lead 6. When the lead 6 is plated with Pd (palladium), on the other hand, the wettability (extension) of the solder is reduced, so that the solder fillet 74 can be formed with a smaller amount of solder.

By plating the lead frame before it is chip-bonded with Au or Sn/Ni in advance, the leads 6 and the module leads 9 can be connected by the solder reflow without cover-plating the leads 6 after the chip bonding, wire bonding and the stack molding. This is because the Au plating or Sn/Ni plating provides a strong oxidation resistant coating to make the surfaces of the leads 6 suited for the solder reflow. By omitting the cover-plating, the plating cost can be reduced and countermeasures against penetration of the plating liquid into the resin, and the ion contamination can be taken.

Depending upon the shape of the openings 8 of the leads 6, the aforementioned circular wires can be replaced by wires having a square section. Unlike the circular wires, however, the square wires raises a problem that the leads 6 and the module leads 9 are difficult to connect when the section is rotated by an axial torsion.

Generally speaking, the circular section is advantageous with respect to the torsion of the wires. For the torsional rigidity of the connecting portion (J-bend portion) to the printed circuit board, however, the square column section is more advantageous. When the square wires are used, therefore, their free rotation is prevented by making the openings 8 of the leads 6 square, to prevent the rotation of the J-bend portions of the module leads 9. As a result, even if the temperature in the furnace rises excessively at the reflow step when the DRAM module is mounted on the printed circuit board, the rotation of the J-bend portions of the module leads 9 can be prevented to prevent defective mounting such as the displacement of the module leads 9 in advance.

Figure 98A:
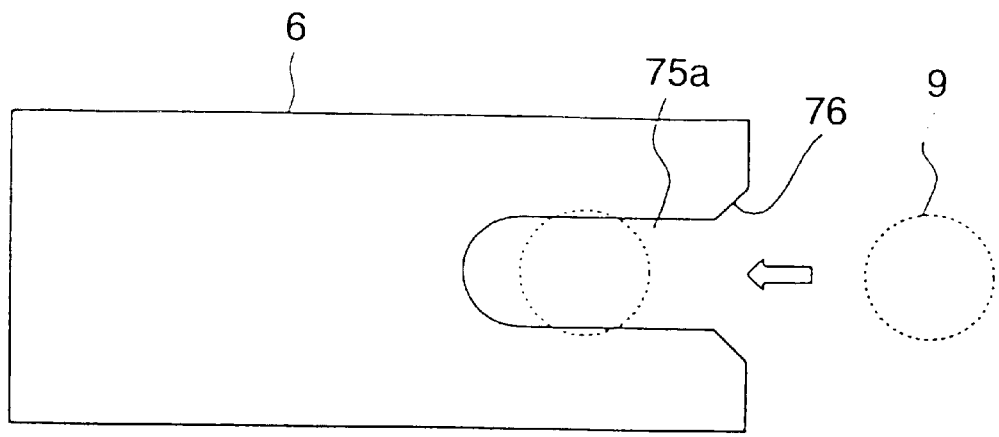
FIGS. 98(a) to 98(c) are top plan views showing other embodiments of the leads.
Figure 98B:
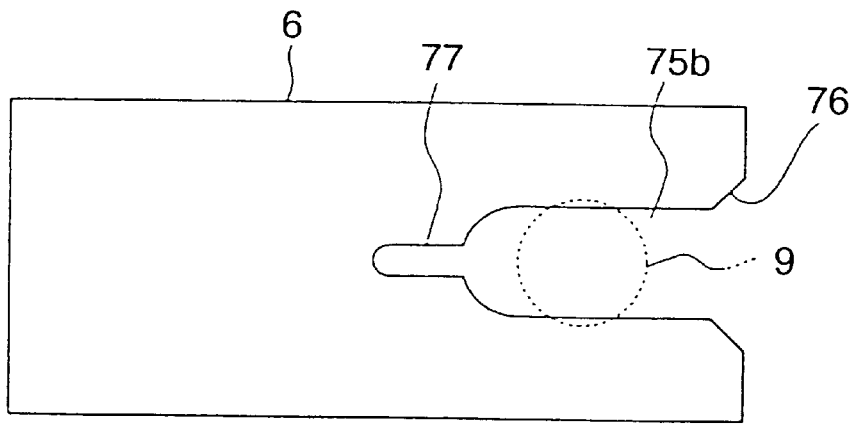
Figure 98C:
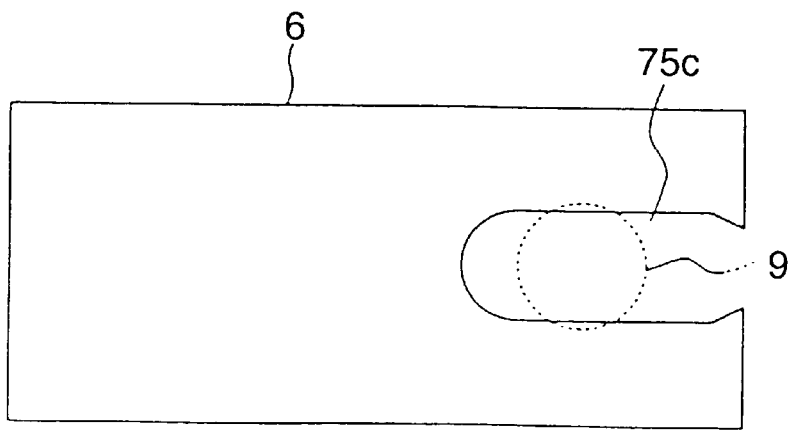

In order to improve the workability at the time of inserting the module leads 9 of circular wires into the openings 8 of the leads 6, there can be used the leads 6 in which are formed grooves 75a to 75c, as shown at FIGS. 98(a) to 98(c). As shown FIG. 98(a), the groove 75a is opened at its one end so that the module lead 9, shown by broken line, is horizontally press-fitted in the groove 75a. The open end of the groove 75a has tapered guides 76 for facilitating the insertion of the module lead 9. In order to prevent the inserted module lead 9 from coming out, the internal diameter of the groove 75a is made slightly smaller than that of the module lead 9. The groove 75b, as shown FIG. 98(b), has a thin slit 77 on the side opposed to the open end. Thanks to this slit 77, the lead 6 has an enhanced elastic force to reduce the fitting resistance to the module lead 9 inserted into the groove 75b. The groove 75c, as shown in FIG. 98(c), is made diametrically smaller at its open end than at the remaining portions so that the inserted module lead 9 can be reliably prevented from coming out.

When the leads 6 having the aforementioned grooves 75a to 75c are used, they are enabled to fix the module leads 9 merely by press-fitting the module leads 9 so that they can be connected without any solder. As a result, the solder reflow step can be omitted to reduce the number of steps for the assembly. It is further possible to prevent the open defect between the module leads 9 and the leads 6, as might be caused by solder cracks. When the solder reflow method is additionally used, the connections are retained by the thermocompression bonding effect even if the solder is opened by any cause (e.g., solder cracks), so that the double reliabilities are achieved for the open defects of the module leads 9 and the leads 6.

Figure 99A:
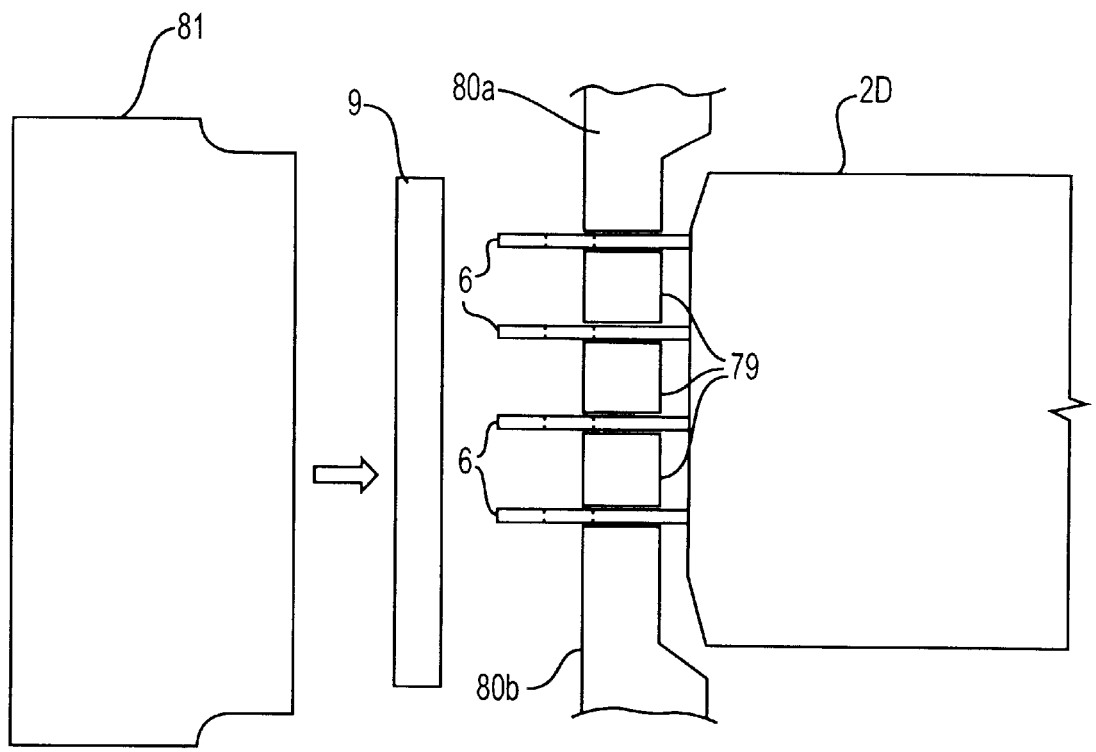
FIG. 99(a) is a side elevation showing a method of connecting the module leads and the leads as a whole and FIG. 99(b) is a top plan view thereof.
Figure 99B:
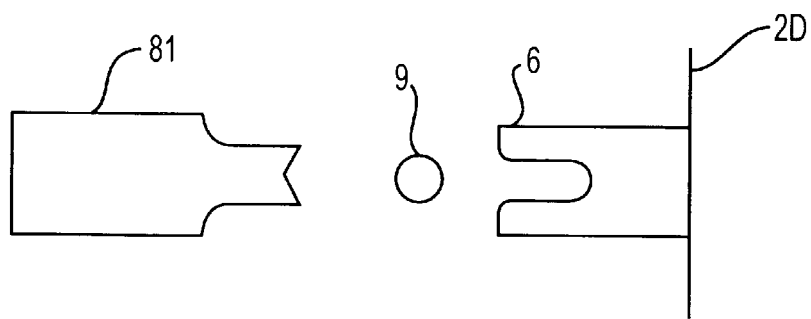

When the module leads 9 are to be inserted as a whole into the numerous leads 9 stacked vertically of the package 2D as in the DRAM module 1D of the present embodiment, as shown in FIG. 99(a) square columns 79 having a size substantially equal to the inter-layer space of the individual leads 6 are inserted at first into the spaces of the leads 6, and pressure jigs 80a and 80b are pushed onto the leads 6 vertically in the two directions, to fix the leads 6. After this, the module leads 9 are press-fitted as a whole into the grooves 75a (or 75b or 75c) of the leads 6 by using a press-fit jig 81. By this press-fitting method, the leads 6 and the module leads 9 can be cross-connected for a short time period. It is also possible to reduce the mechanical damage which is received by the leads 6 and the package 2D when the module leads 9 are to be press-fitted. It is further possible to prevent the fall or deformation of the leads 6 at the press-fitting time.

Figure 100:
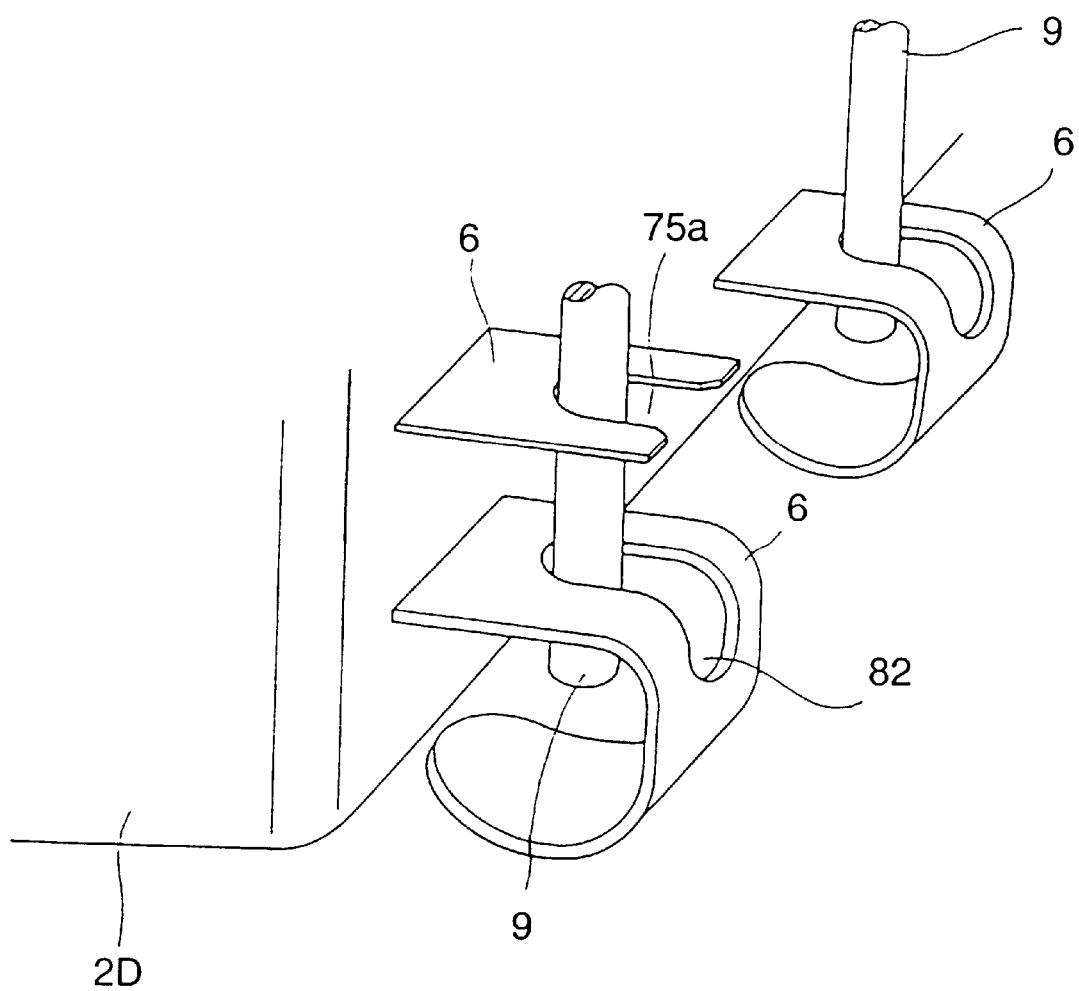
FIGS. 100 and 101 are perspective views showing other embodiments of the lead.

The J-Bend portions at the module leads 9 may be replaced by the J-bend portions which are formed at the portions of the leads 6. In FIG. 100, there is shown an example, in which the J-bend portion is formed only in the lowermost one of the leads 6 stacked vertically of the package. The lowermost lead frame to be used in this example has a lead pattern different from those of the overlying lead frames. Alternatively, the cut shape of the leads 6 of the lowermost lead frame may be changed. In the example shown in FIG. 100, the grooves 75a are formed in the leads 6 of the upper lead frames, and openings 82 are formed in the leads 6 of the lowermost lead frame.

Figure 101:
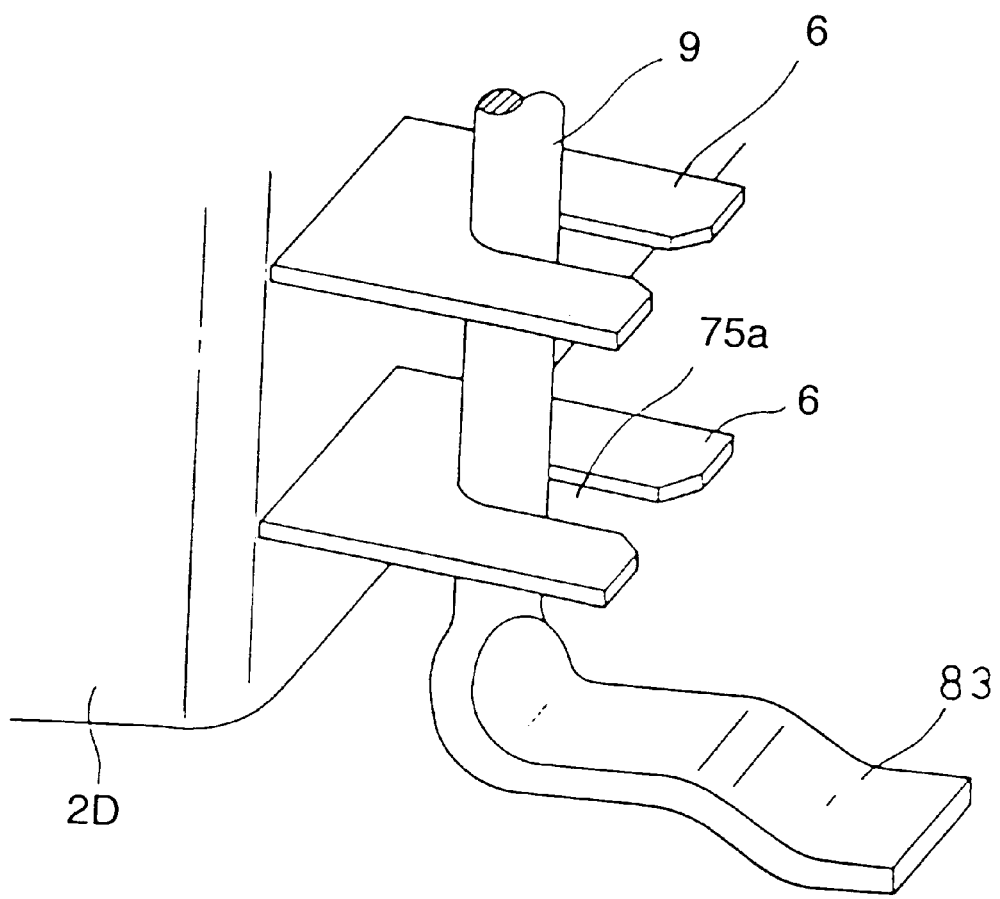

Although the J-bend portions may be formed in the module leads 9 and the leads 6 to provide the SOJ type package, an SO type flat package can be provided. In FIG. 101, there is shown, as an application of the flattened portion 73 of FIG. 96, an example in which a flat lead 83 is formed by pressing the lower end of the module lead 9. This structure is advantageous not only in that the flat lead 83 can be easily bent with excellent workability but also in that only the flat lead 83 is locally heated by the pulse heater method or the optical beam soldering method so that it can be packaged over the printed circuit board. This is because the leading end of the flat lead 83 is apart from the package 2D more than the leading end of the lead 6 of the upper layer so that the flat lead 83 can be exclusively heated without contact with the upper lead 6.

Figure 102:
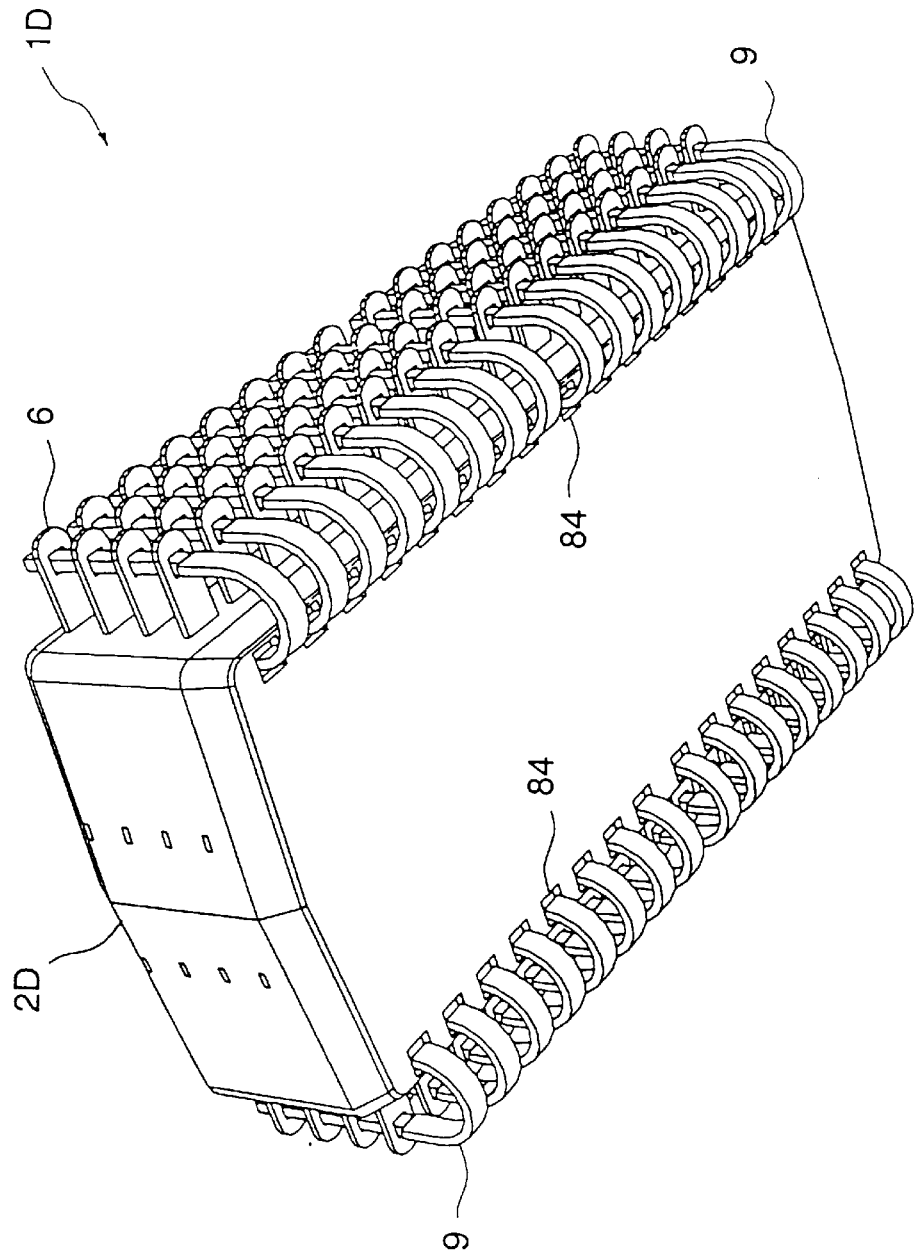
FIG. 102 is a perspective view showing a state that recesses are formed in the bottom face of the package.

For preventing a disadvantage that the pitches of the module leads 9 are made irregular when the high-melting solder at the connecting portions between leads 6 and the module leads 9 is melted again or when an external force is applied to those connection portions, it is effective to form recesses 84 in the bottom face of the package 2D, as shown in FIG. 102.

Figure 103:
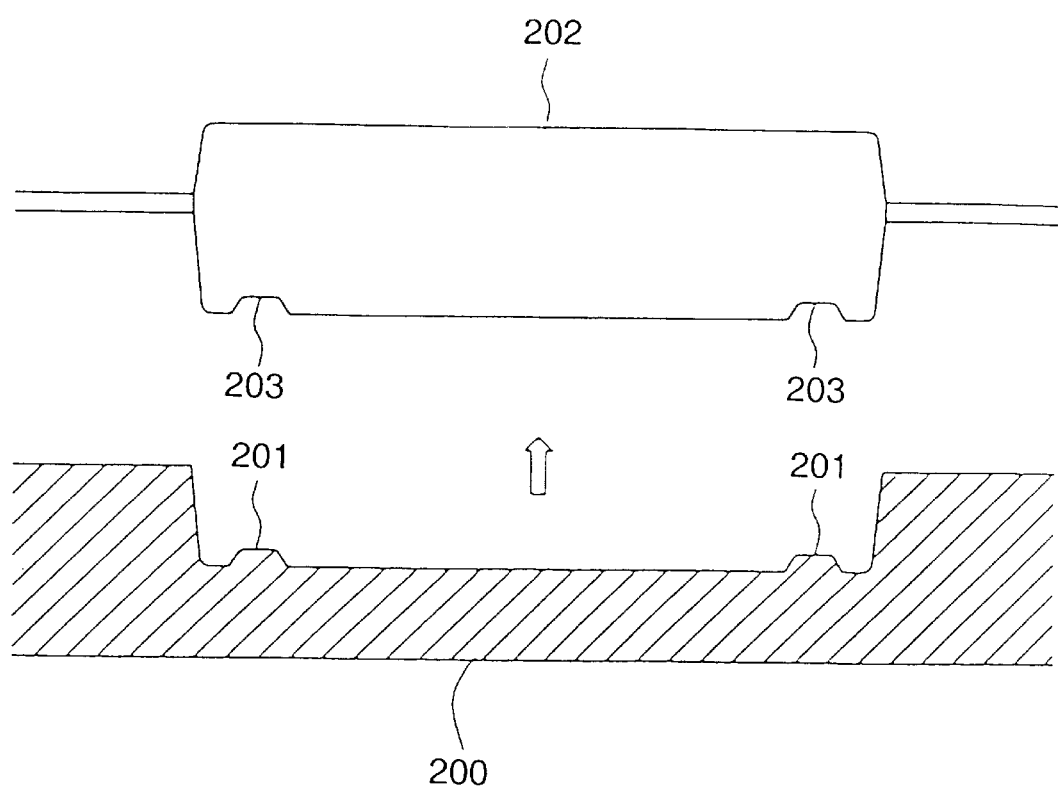
FIG. 103 is an explanatory view showing a method of forming the recesses in the bottom face of the single-layer passage of the prior art.

In the case of a single-layered package having one semiconductor chip encapsulated as in the ordinary SOJ, a mold having ridges 201 on the top face of a bottom force 200 is used to form recesses 203 in the bottom face of a package 202, as shown in FIG. 103, and the parting operation is carried out by pulling up the package 202 normal to the top face of the bottom force 200. As a result, the recesses 203 are formed apart from the side faces of the package 202.

Figure 104:
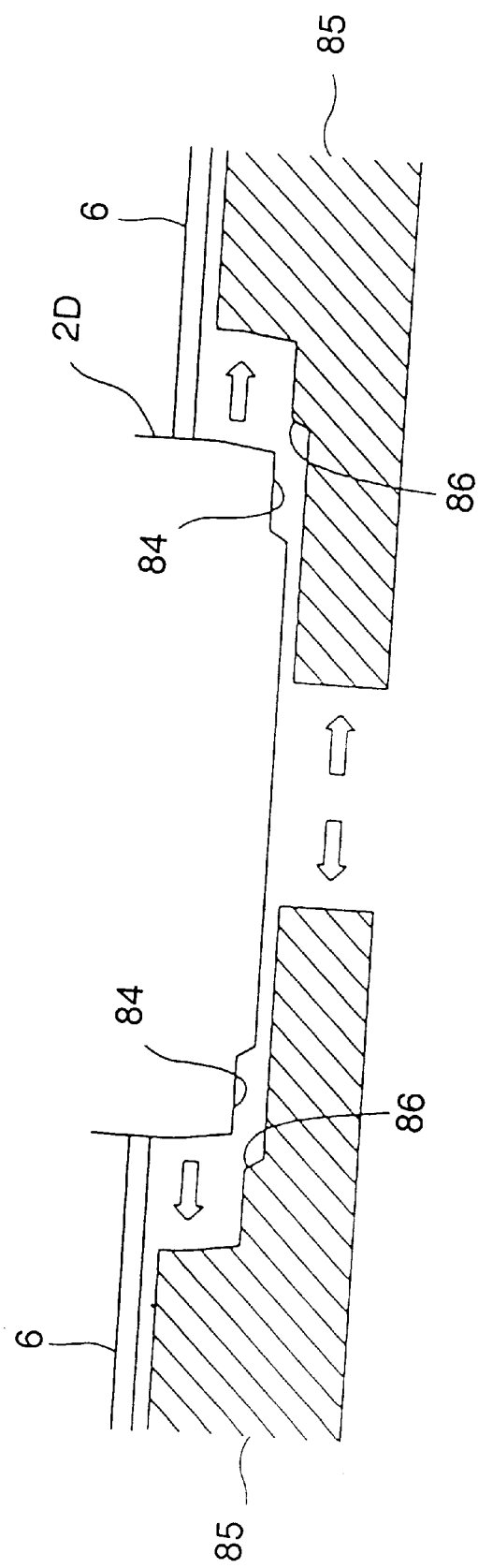
FIGS. 104 and 105 are sections showing other embodiments of the movable plate.

In the present embodiment, on the other hand, the moving parts to be used are of the horizontally halved type. In order to form the recesses 84 in the bottom face of the package 2D, there is used a movable plate 85 having a sectional construction, as shown in FIG. 104. This movable plate 85 corresponds to the modified movable plate 43 of the aforementioned insert mold 40, in which step portions 86 corresponding to the recesses 84 are formed in the leading end of the movable plate 43. As shown in FIG. 104, the movable plate 85 is halved in parallel with the bottom face of the package 2D so that the recesses 84 are formed to reach the side faces of the package 2D.

The aforementioned movable plate 85 can be used not only when the package 2D of the present embodiment is to be molded but also in case the single-layered package of the prior art of the SOJ or the like is to be molded.

Figure 105:
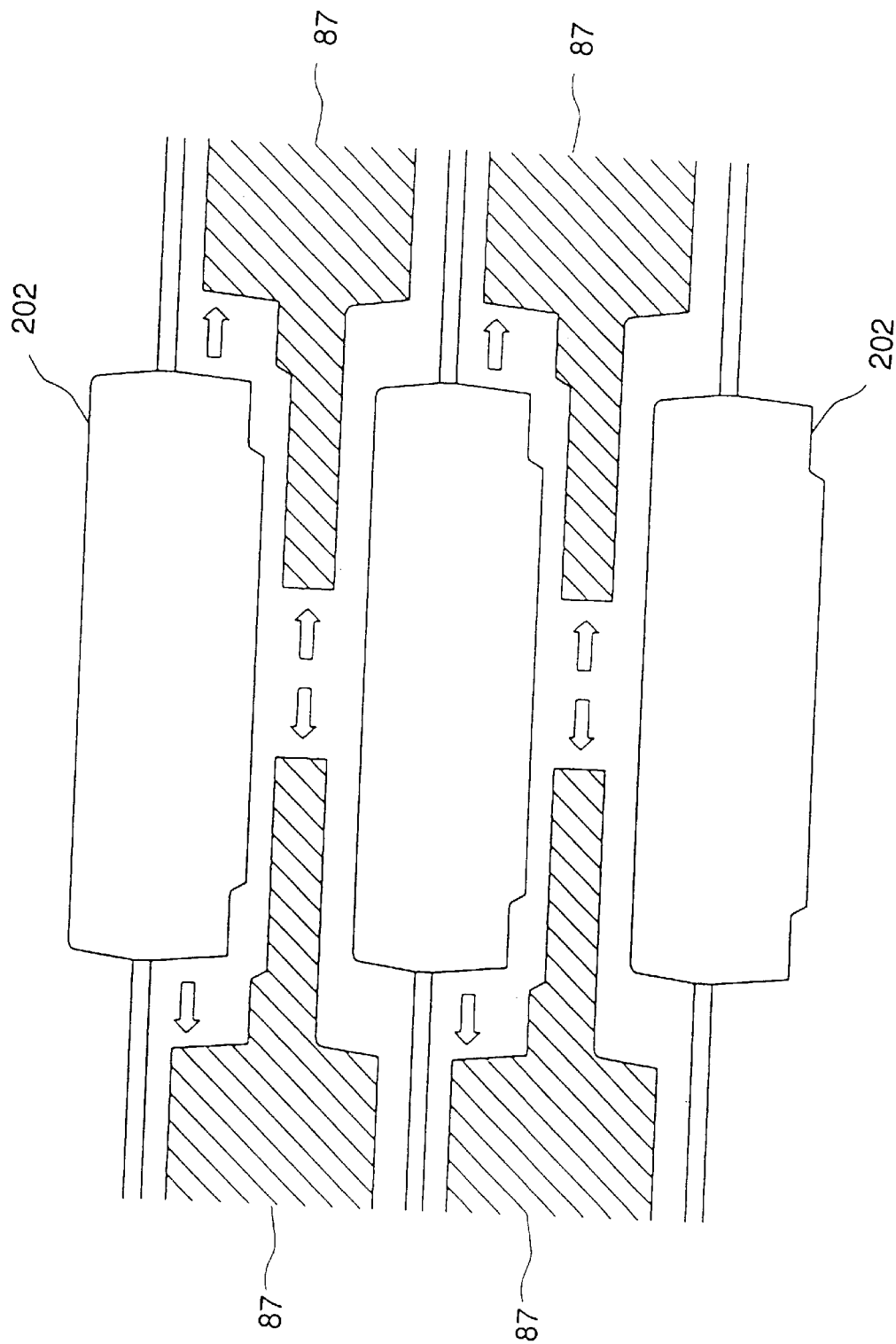

The design of a movable plate 87, as shown in FIG. 105, is changed from the aforementioned movable plate 85 to that for the SOJ such that its top face forms the bottom face of the upper package 202 whereas its bottom face forms the top face of the lower package 202. By using this movable plate 87, a number of single-layered packages of the prior art of the SOJ can be vertically stacked to improve the throughput of the molding step drastically. According to this molding method of stacking the numerous packages 202 vertically, the distance of the gates connecting the cavities can be remarkably shortened as compared with the conventional molding method of arranging the numerous packages 202 horizontally, so that the useless amount of the resin residing in the gates can be reduced to acquire more packages 202 from the mini-tablet of the same size.

The aforementioned movable plates 85 and movable plates 87 can be modified in various manners according to the molding efficiency, the frictional force at the parting time and the gate cutting procedure.

Figure 106A:
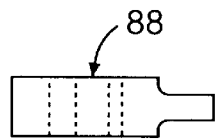
FIGS. 106(a) to 106(c) are side elevations showing other embodiments of the movable plate.
Figure 106B:
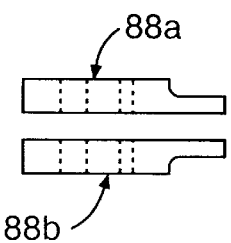

A movable plate 88, as shown in FIG. 106(a), has molding patterns on both its upper and lower faces. Movable plates 88a and 88b, as shown in FIG. 106(b), are vertically halved from the aforementioned movable plates 88 and have the molding patters individually on the upper face of the movable plates 88a and the lower face of the movable plate 88b. Movable plates 88a to 88c, as shown in FIG. 88(c), are trisected from the aforementioned movable plate 88. Each of these movable plates 88 and 88a to 88c is composed of a pair of righthand and lefthand portions, although only one side is shown.

Figure 106C:
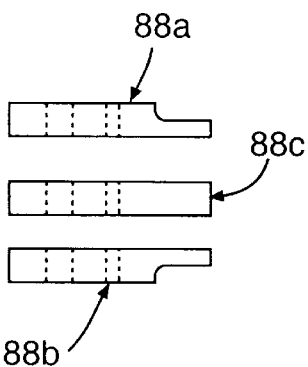
Figure 106D:
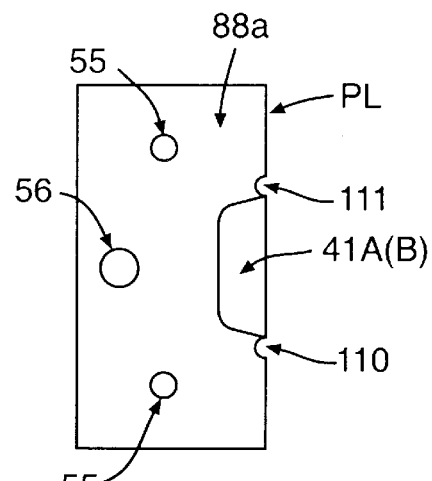
FIGS. 106(d) and 106(e) are top plan views showing the movable plate of FIG. 106(b)
Figure 106E:
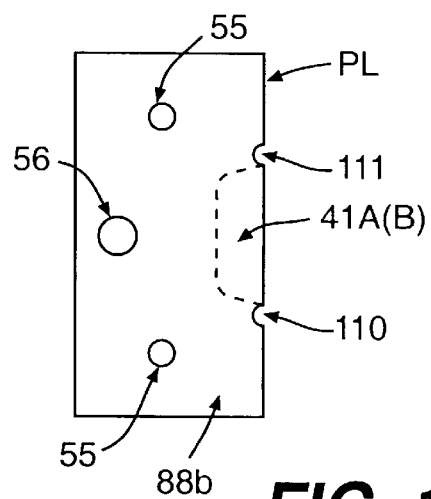

FIG. 106(d) is a top plan view showing the movable plate 88a and FIG. 106(e) a top plan view showing the movable plate 88b. Each of the movable plates 88a and 88b has: the guide pin holes 55 and 56 into which are inserted the guide pins for positioning the lead frame; a gate hole 110 for allowing the resin to flow in the stack direction; and a resin flow dummy gate hole 111 having an air vent function to retain the homogeneity of the resin.

Figure 106F:
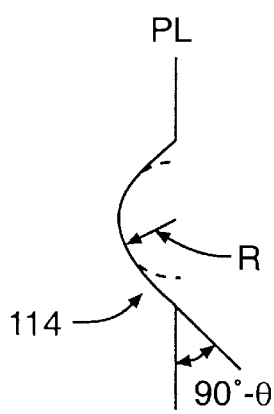
FIG. 106(f) is an enlarged top plan view showing a gate hold of the movable plate.

As shown in FIG. 106(f), the gate holes 110 and 111 are given a predetermined parting angle (θ) with respect to the parting line PL. This parting angle (θ) is set to 0<θ<30 degrees. It has been confirmed by our experiment with the parting angle (θ) set to 15 degrees that the parting property and the space factor for the thermoset resin were excellent. For the parting angle (θ) exceeding 30 degrees, the gate region is widened to drop the space factor. For the parting angle (θ) at 0, on the other hand, the parting property is so poor that the resin is liable to reside in the gate holes 110 and 111. With this resin residue, the sectional shape of the gate changes at the next molding step to fluctuate the molding conditions so that a uniform molding cannot be expected.

The gate holes 110 and 111 may be basically shaped into such a circle as has a radius R and contacts with the parting line PL at an angle of (90 degrees−θ). At this time, the center of the circle need not always be positioned on the parting line PL. If, on the other hand, the radius R is enlarged to position the circle center outside of the parting line PL, a portion of the arc takes the parting angle (θ) so that it can be common with the connection portion of (90 degrees−θ).

The gate hole 110 and the gate hole 111 need not have equal sizes. Since the gate hole 110 is a resin inlet port, the shearing heat rises to increase the fluidicity of the resin if the diameter of the gate hole 110 is decreased. If the gate hole 111 acting as the dummy gate is radially enlarged, on the other hand, the resistance of the air is reduced to facilitate the discharge of the unnecessary air out of the cavity.

The package come into contact with the upper and lower faces of the movable plate 88 so that the frictional force at the parting time increases. The package comes into contact with only one face of each of the movable plates 88a and 88b, halved from the movable plate 88, so that the frictional force at the parting time can decrease to facilitate the parting of the package. Moreover, the movable plate 88 finds it difficult to cut the resin in the gate holes 110 and 111, connected to the upper and lower packages, at the parting time, but the movable plates 88a and 88b can improve the parting workability because the resin in the gate holes 110 and 111 can be cracked and cut at their interface.

Each of the aforementioned movable plates 88a and 88b is composed of a pair of righthand and lefthand components. If, therefore, the guide pin holes 55 and 56 and the gate holes 110 and 111 are symmetrically arranged in the righthand and lefthand movable plates, these movable plates can be interchanged to improve the workability at the time of stacking a plurality of pairs of movable plates 88a and 88b vertically.

In order to keep the total thickness of the plurality of pairs of movable plates 88a and 88b stacked vertically, however, it is rather advisable that no interchangeability is given to the righthand and lefthand movable plates. This is because the mold clamping forces is not equal at the righthand and lefthand movable plates unless the total thickness of the lefthand stacked movable plates and the total thickness of the righthand stacked movable plates are equalized highly accurately at the mold preparing time. In other words, even if the vertically stacking order is interchanged between the lefthand movable plates and the righthand movable plates, the total stacking thickness is not changed to keep the mold clamping force constant. If, however, the righthand and lefthand movable plates are made interchangeable so that the righthand and lefthand side movable plates at the mold preparing time are interchanged and stacked, a dispersion arises in the height of the righthand and lefthand movable plates. This dispersion statistically takes the product of the dispersion in the thickness of one movable plate and the root of the number of stacked layers.

This will be described when four packages 2D are to be vertically taken in the present embodiment in which the four semiconductor chips are stacked by using a mold (including the movable plates) having a tolerance of thickness less than ±5 microns by the polishing treatment of high accuracy.

For the four packages to be taken in this case, totally twenty molds are required to molding one package 2D, because totally five molds are required including the three movable plates to be inserted into the gaps between the four semiconductor chips and the two top and bottom molds. As a result, the statistical height dispersion is the product, i.e., ±22 microns of the tolerance (±5 microns) of the thickness of one mold and the root of the number (=20) of the molds.

If, calculations are made for the thickness of 0.125 microns of the led frame mounted with the semiconductor chip and for the thickness of 0.65 mm of one mold, the total thickness of the stacked molds is (0.125×16)+(0.65×20)=15 mm because the number of lead frames is four for one package 2D and accordingly the total number of 16 for taking the four packages. Hence, a load of 29 Kg is generated per square millimeter if the dispersion (+22 microns) of the height for the total thickness of the stacked molds, that is, the distortion (i.e., 22 microns/15 mm=1.46×10$^{-3}$) is multiplied by the Young's modulus (2×10$^4$ Kg/mm$^2$) of the metal (i.e., iron) making the molds. In other words, the difference between the mold clamping forces to be established at the righthand and lefthand molds reaches as high as 29×800=23.2 tons even if the molds have a pressure receiving area as small as about 40 mm×20 mm=800 mm$^2$. In short, there arises a phenomenon that the mold clamping force of 23 tons or more is applied to one of the righthand and lefthand molds whereas no load is applied to the other. From the discussion thus far made, no interchangeability should be given to the righthand and lefthand molds. Without this interchangeability, substantially equal mold clamping forces can be applied to the righthand and lefthand molds.

When a plurality of pairs of movable plates 88a and 88b, as shown in FIG. 106(b), are vertically stacked, the resin flows vertically through the gate holes 110. The other dummy gate holes 111 function as the air vent to discharge the air or the nonuniform resin at the leading end of the resin flow to the outside of the cavity. These dummy gate holes 111 are not indispensable but can be eliminated depending upon the manner to design the air vent or if a highly uniform resin is used.

The aforementioned air vent is a gap of about 1/100 to 3/100 mm, as used in the ordinary mold design, and allows the air but not the resin to pass therethrough. On the other hand, the aforementioned dummy gate holes 111 act to introduce the resin uniformly into the cavity by discharging the unnecessary air in the cavity at the initial stage of the molding operation. These dummy gate holes 111 have a larger aperture than that of the aforementioned air vent, as used in the ordinary mold design, so that they can discharge the unnecessary air efficiently out of the cavity.

Figure 107A:
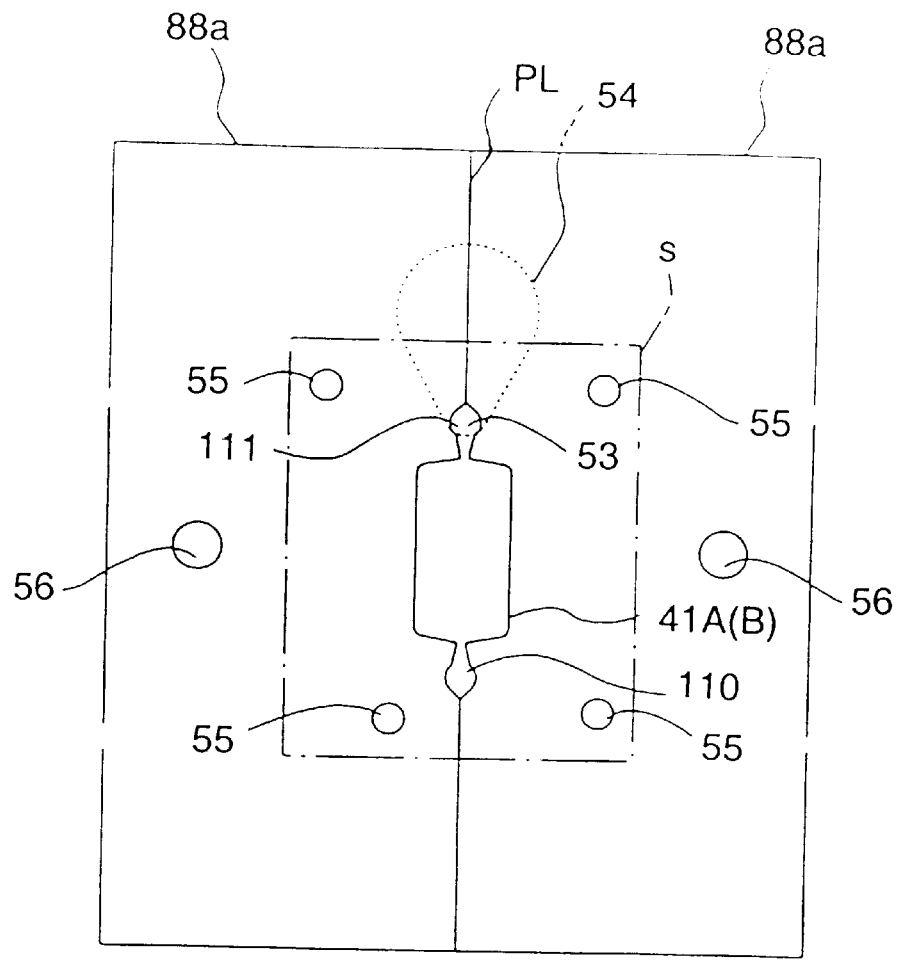
FIG. 107(a) is a top plan view showing the positional relations among the gate holes and the guide pins of the movable plate and the gate holes of the bottom force.

FIG. 107(a) is a top plan view showing the positional relations among the gate holes 110 and 111, the guide pin holes 55 and 56, the gate hole 53 of the bottom force 49, the dummy cavity 54 and the lead frame (S) when the movable plate 88a (in place of the movable plate 43) in the insert mold 40, as shown in FIG. 82. As shown, the gate hole 111 of the movable plate 88a and the gate hole 53 of the bottom force 49 are connected to each other to take the positional relation, as shown. The gate holes 110 and 111 are positioned on the parting line PL. As a matter of fact, what contacts with the bottom force 49 is the movable plate 46, as shown in FIG. 82, but the relative positions are shown by using the movable plate 88a corresponding to the movable plate 43.

Figure 107B:
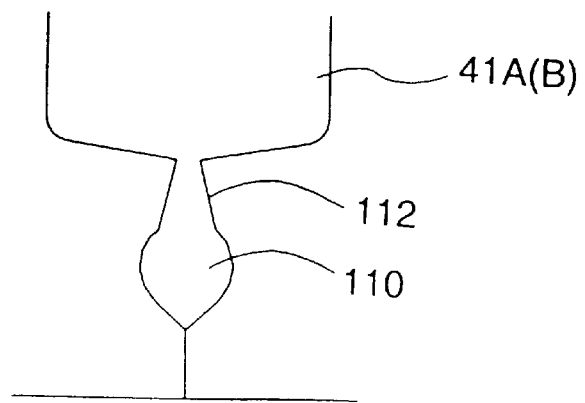
FIG. 107(b) is a top plan view showing a slit gate.
Figure 108A:
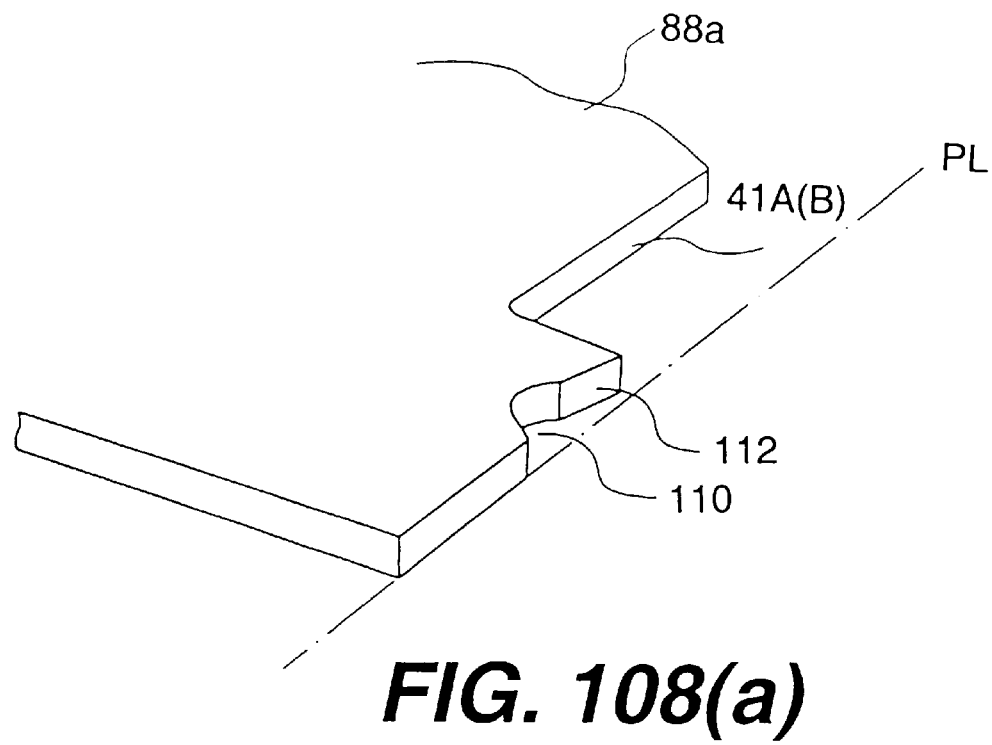
FIG. 108(a) is an enlarged perspective view showing the slit gate and FIG. 108(b) is an enlarged perspective view showing a pin gate.

FIG. 107(b) shows an example, in which the gate hole 110 of the movable plate 88a and the cavity 41A (or 41B) of the insert mold 40 are connected by a slit gate 112 so as to improve the flow of the resin into the gaps between the semiconductor chip layers. FIG. 108(a) is an enlarged perspective view of the slit gate 112. By forming a similar slit gate 112 in the movable plates 44 and 42 to be stacked over the movable plate 88a, the individual slit gates 112 of the movable plates 88a, 44 and 42 are also connected in the stack direction so that gate lines like the gate lines 27 and 28 of the insert mold 10, as shown in FIG. 33, are formed in the insert mold 40. The slit gate can take a wide opening area to the cavity 41A (or 41B) to reduce the flow resistance to the resin.

Figure 108B:
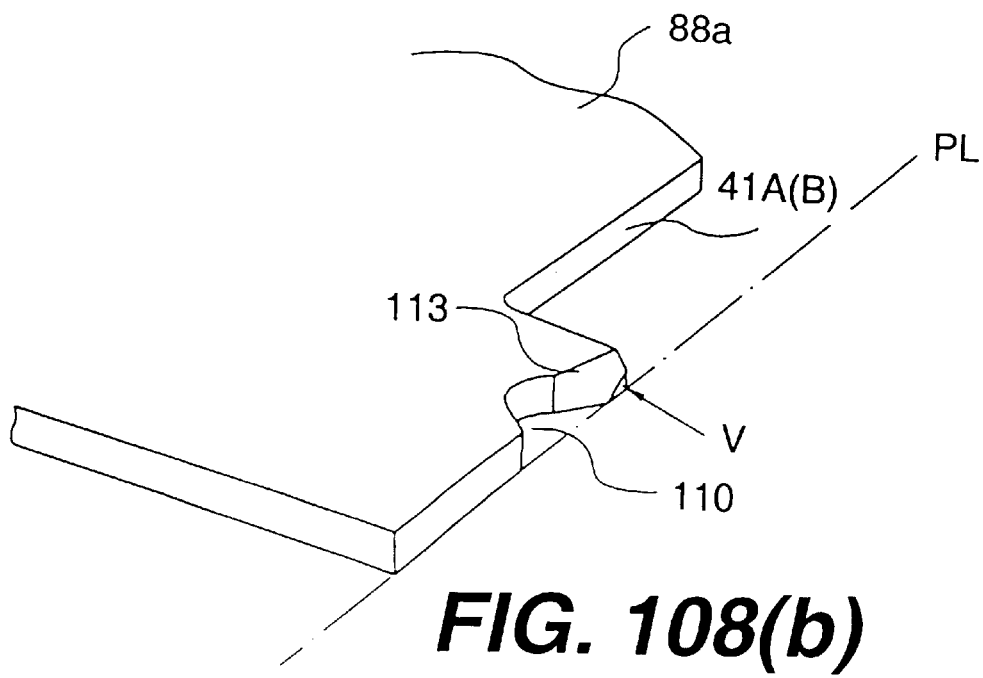

The aforementioned slit gate 112 may be replaced by a pin gate 113, as shown in FIG. 108(b). The vertical face (V) of the pin gate 113 is located on the parting line PL so that the resin flows into the cavity 41A (or 41B) through the region which is cut obliquely shown by an arrow. The feature of this pin gate 113 is that the gate lines 27 and 28 can be removed more easily than the aforementioned slit gate 112 and the flow resistance to the resin in the horizontal direction at the molding time can be widely controlled. Depending upon the molding condition, the slit gate 112 and the pin gate 113 may be used separately for the gate hole 110 and the gate hole 111.

The aforementioned gate holes 110 and 111 may be moved into the cavity. In this case, the gate holes 110 and 111 have to be formed in such positions that the gate cut faces may exert no influence upon the surface view of the package and the semiconductor chips.

Figure 109A:
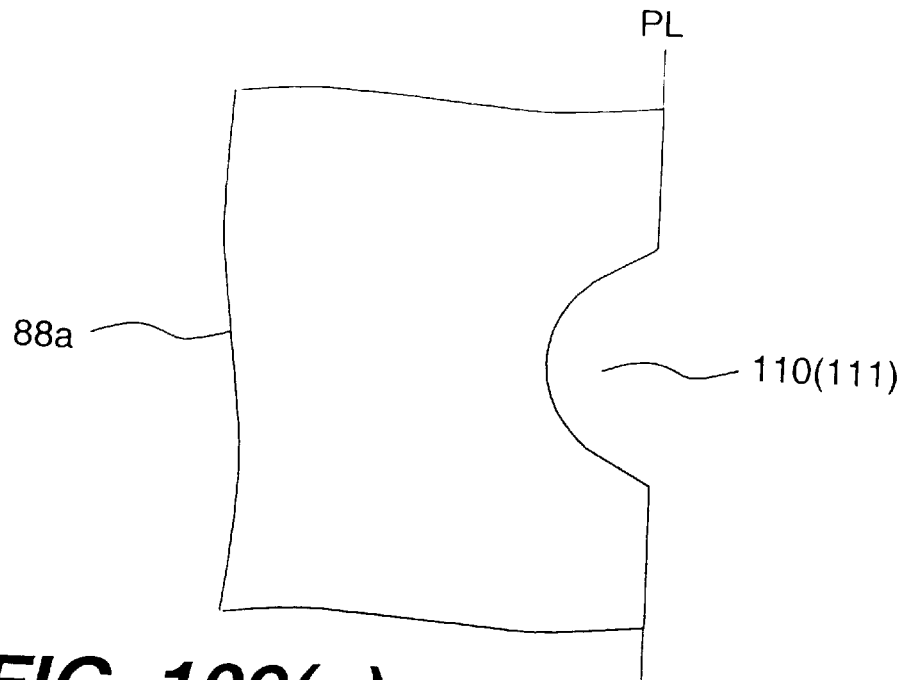
FIG. 109(a) presents a top plan view showing the gate hole and FIG. 109(b) is a section showing a modification of the gate hole of FIG. 109(a), taken along line X—X' of FIG. 109(a)
Figure 109B:
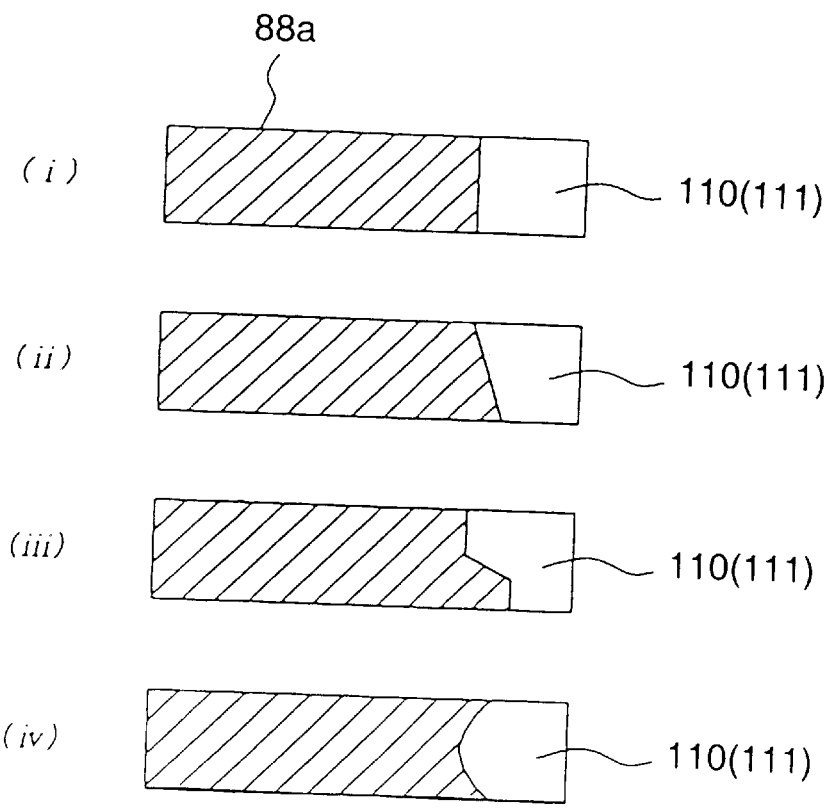

The sections, which are taken along line X—X' (normal to the parting line PL) of the gate hole 110 or 111, as shown in FIG. 109(a), can be constructed in the various shapes (i) to (iv), as shown in FIG. 109(b). The shape (i) is the simplest vertical section, for which the gate hole 110 or 11 can be easily formed to lower the mold manufacturing cost when the wire discharge machining or the polishing process is used for manufacturing the mold. The shape (ii) is a simple cone, and the shape (iii) is a step. In this shape (iii), the diameter changes so steeply that the stress seriously changes to cut the resin easily. The shape (iv) has a section of an undefinite shape. In this shape (iv), the upper and lower edges of the gate hole 110 or 111 have acute angles so that the stress can be concentrated at the edge portions in the resin.

Figure 110A:
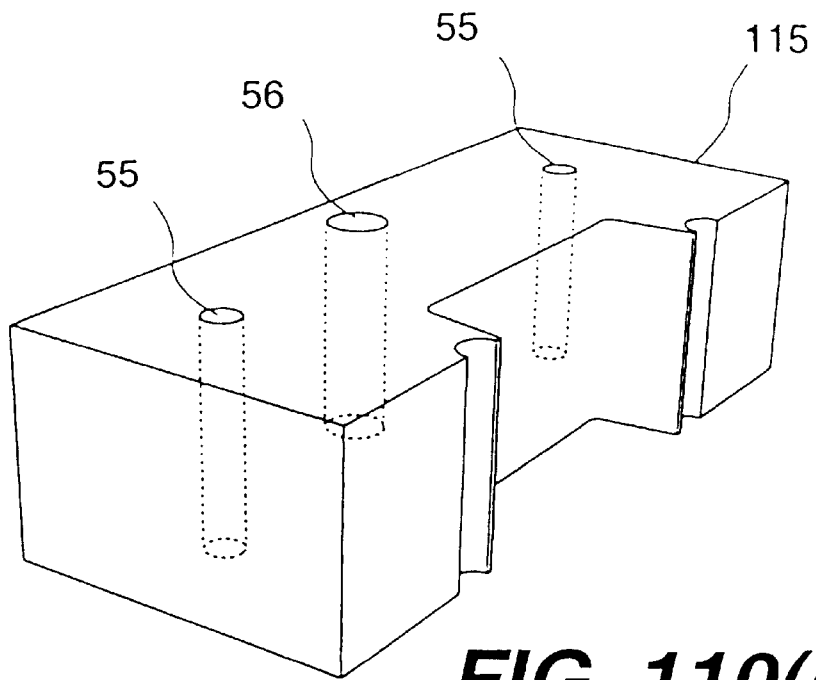
FIGS. 110(a) and 110(b) are perspective views showing a method of manufacturing the moving part.
Figure 110B:
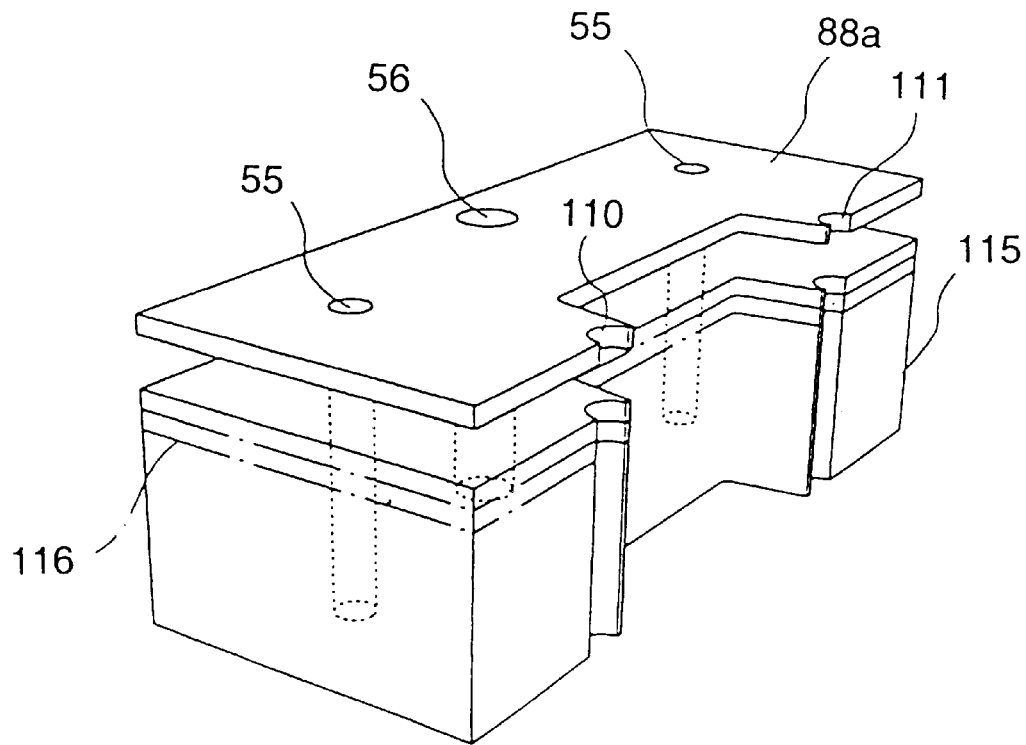

In the procedure of preparing the movable plate 88a (like the remaining movable plates), first of all, a block 115 is prepared from a mold block, as shown in FIG. 110(a), by the wire discharge machining, drill machining and polishing processes. Simultaneously with this, the guide pins 55 and 56 are formed to improve the registration of the stacked movable plates. Next, the movable plate 88a is prepared by slicing the block 115 thinly along a cutting line 116, as shown in FIG. 110(b), by using the discharge wire cutting method. At this time, the gate holes 110 and 111 are extended with respect to the wall faces of the block 115 so that the shape (i), as shown in FIG. 109(b), is directly formed. The movable plate 88a, as sliced, is polished by the surface grinder so as to have a highly accurate thickness. A plurality of movable plates 88a having an identical thickness are simultaneously ground "altogether" by the surface grinder so that the relative dispersion can be drastically reduced to arrange their heights highly accurately. By giving the shapes (ii) to (iv), as shown in FIG. 109(b), to the sections of the gate holes 110 and 111, the resin, as left in the gate holes 110 and 111, can be easily cut. In these shapes (ii) to (iv), the sections are partially changed in their internal diameters so that the stress can be concentrated in the resin in the gate holes 110 and 111.

The gate holes 110 and 111 of the movable plates 88a and 88b, as shown in FIG. 106(b), and the movable plates 88a, 88b and 88c, as shown in FIG. 106(c), can adopt any of the shapes (i) to (iv). If the side of the smaller diameter is arranged at the package side when the shape (ii) is adopted, the excess resin is reluctant to reside at the package side so that the workability is improved. In the case of the movable plate 88, as shown in FIG. 106(a), effects similar to the aforementioned ones can be achieved if the shape (iv) is adopted.

Here will be described an embodiment in which a redundancy function to relieve a defective chip is added to the DRAM module of the present invention.

Figure 111:
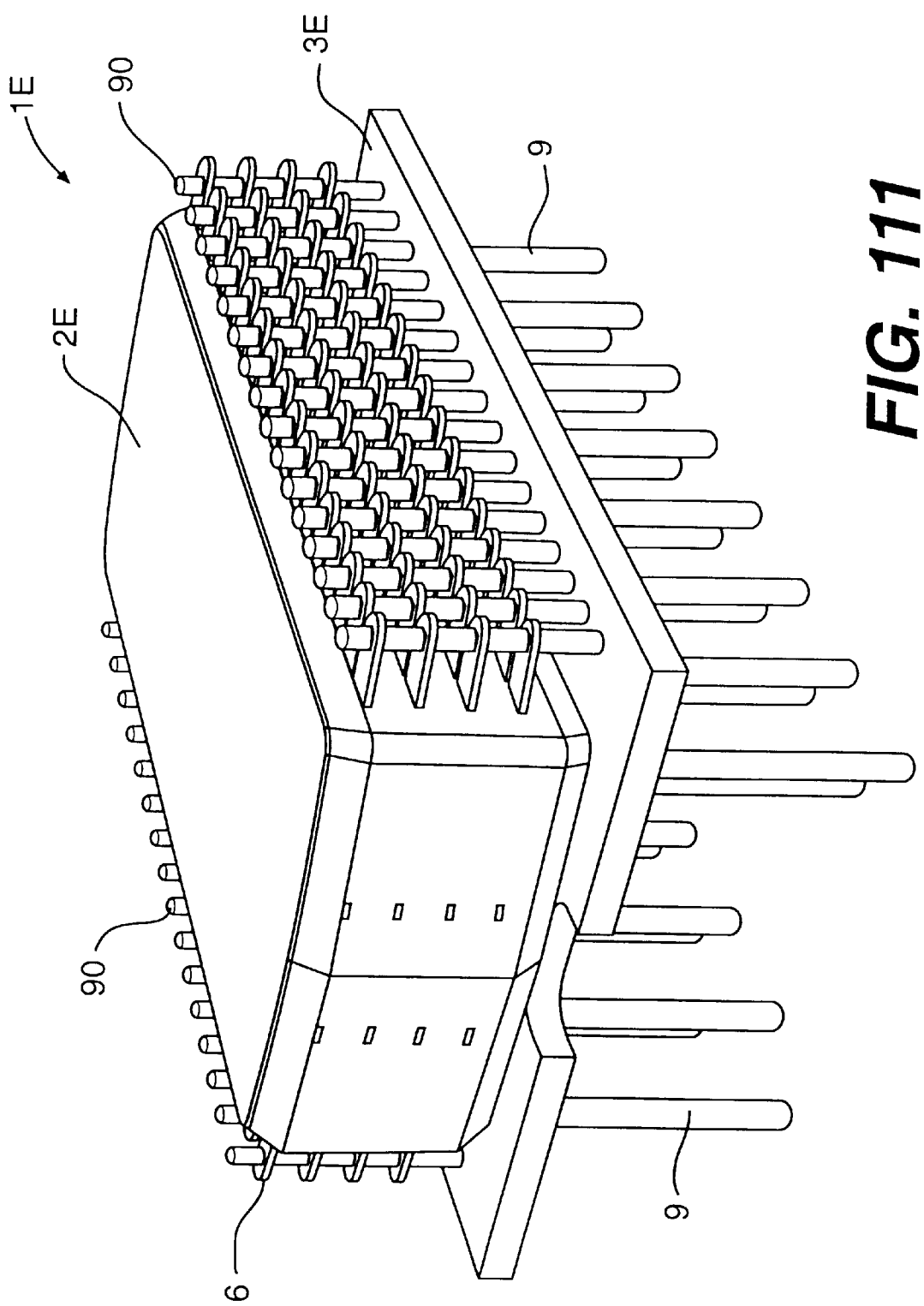
FIG. 111 is a perspective view showing another embodiment of DRAM module.
Figure 112:
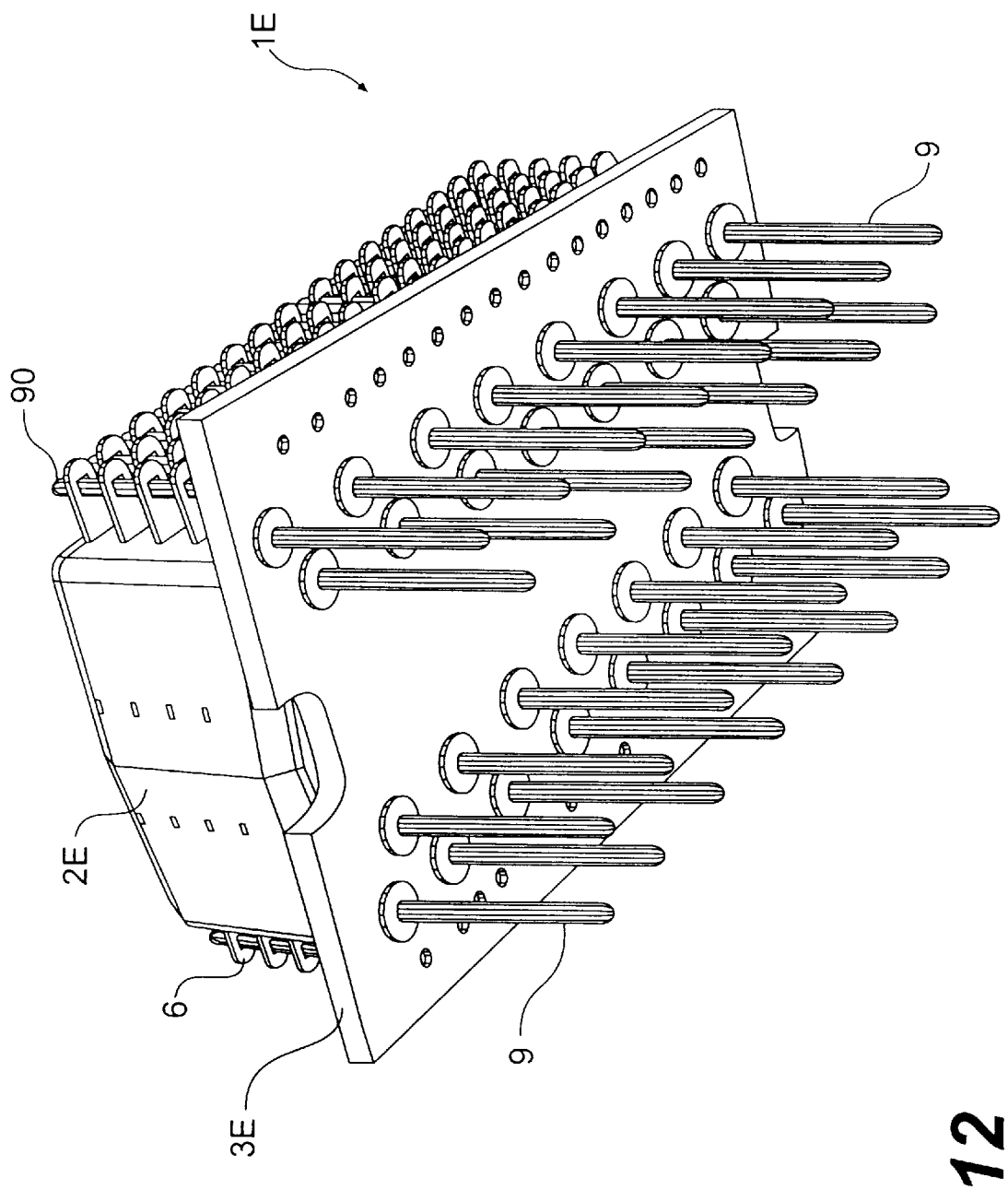
FIG. 112 is a perspective view showing the DRAM module from the back.

FIG. 111 is a perspective view showing the DRAM module of the present embodiment, viewed from front, and FIG. 112 is a perspective view showing the DRAM module from back. The DRAM module 1E of the present embodiment is constructed of: a package 2E, in which nine DRAM chips of 16 Mbits having a construction of [16777216 words×1 bit] are stacked and encapsulated as whole; and a mother socket 3E mounted with the package 2E thereon.

The mother socket 3E is constructed of a printed circuit board made of glass and an epoxy resin, correspondingly to the standard plastic PGA (Pin Grid Array) package. On the top face of the printed circuit board constructing the mother socket 3E, there are arranged connection pins 90 which are cross-connected with the leads 6 of the package 2E. On the back of the printed circuit board, there are mounted the module leads 9 which are electrically connected with the connection pins 90. This printed circuit board is additionally given the following redundancy functions.

Figure 113:
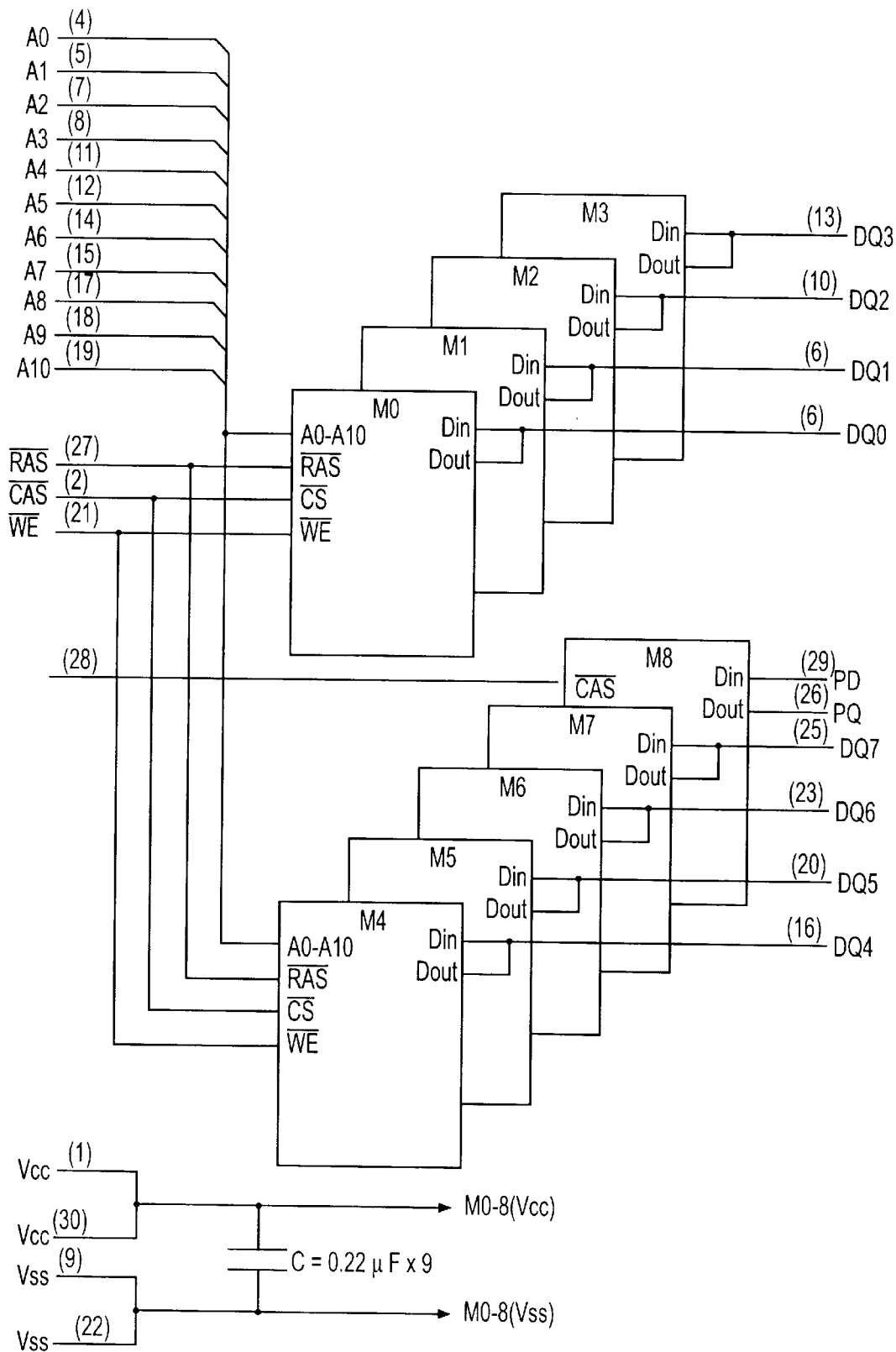
FIG. 113 is a block diagram showing an internal construction of the DRAM module.

FIG. 113 is a block diagram showing an internal construction of a DRAM module 1E of the present embodiment. In the present embodiment, nine DRAM chips ($M_0$ to $M_8$) of 16 Mbits are used to make a memory module having a construction of 8 bits with 1 parity bit as a basic construction. Considering the substitution by the memory module of the prior art, moreover, for the data of 8 bits, the individual DRAM chips ($M_0$ to $M_7$) are equipped with data input/output terminals DQ0 to DQ7 by sharing data input terminals Din and data output terminals Dout. For the parity bit of the DRAM chip ($M_8$), on the other hand, the input and the output are separated to provide an input parity terminal PD and an output terminal PQ. Moreover, the column address strobe terminal /CAS of the DRAM chip ($M_8$) is for a control signal /PCS.

Address signals of 12 bits are commonly fed through address terminals A0 to A11 to the individual DRAM chips ($M_0$ to $M_8$). A row address strobe signal /RAS and a write enable signal /WE are also commonly fed to the aforementioned individual DRAM chips ($M_0$ to $M_8$), and a chip select signal (or column address strobe signal) /CS is also commonly fed except the parity memory chip $M_8$. Moreover, a power supply voltage VCC and a circuit ground potential VSS are further fed commonly to the individual DRAM chips ($M_0$ to $M_8$). In this embodiment, in order to reduce the power supply impedance, the DRAM module 1E of the present embodiment is equipped in the individual DRAM chips ($M_0$ to $M_8$) with a decoupling capacitor C between the power supply terminals.

The LSI leads thus commonly connected are arranged in the same position with respect to the stack direction of a package 2E shown in FIG. 111 and are connected with each other through the connection pins 90 arranged in the stack direction. On the other hand, the data terminals DQ0 to DQ7, the parity terminals PD and PQ and the control signal /PCS are so led out one by one from the individual layers as to have no overlap in the stack direction of the package 2E and are individually equipped with the connection pins and led to the mother socket 3E.

Figure 114:
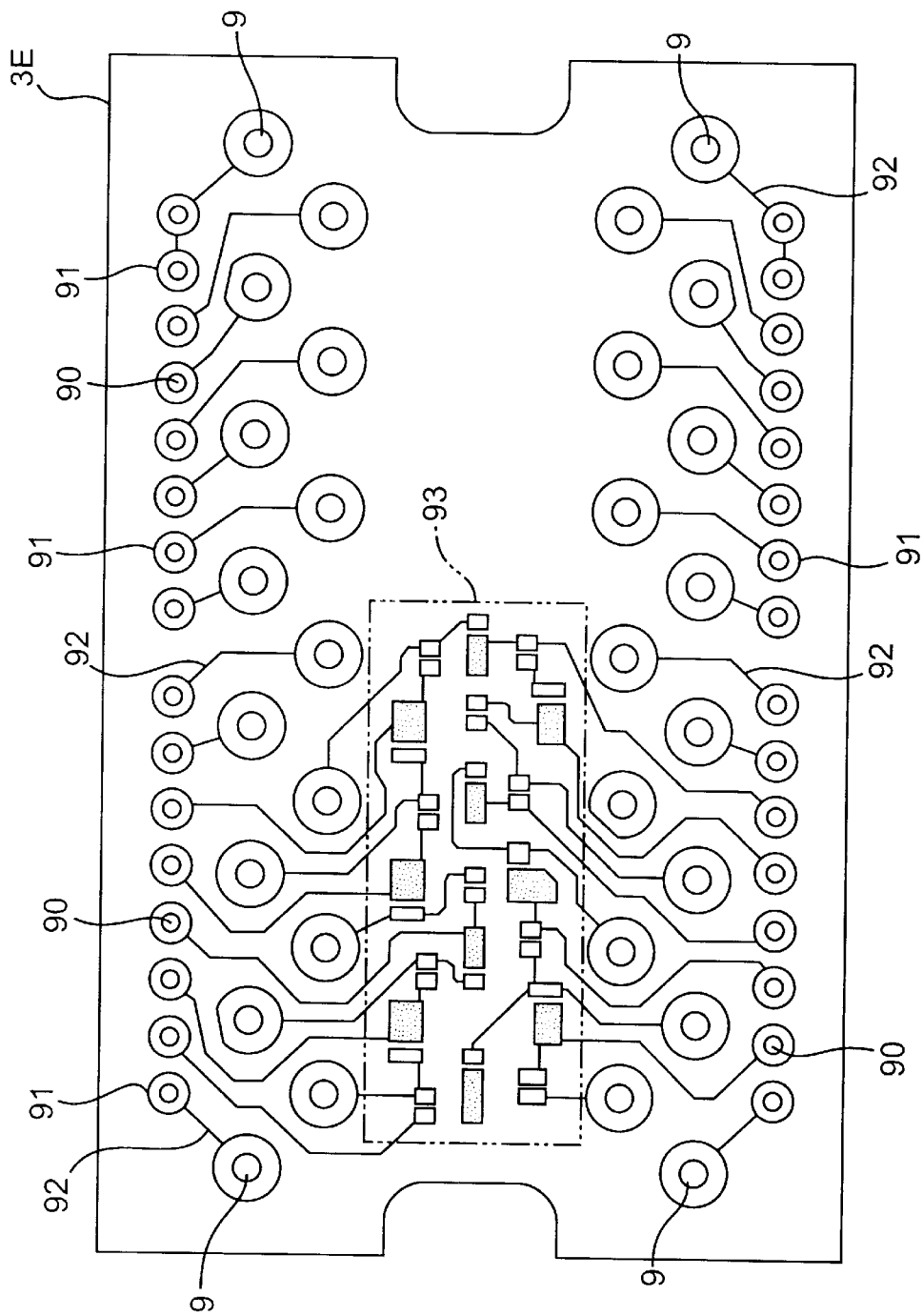
FIG. 114 is a top plan view showing the bottom face of the mother socket.

FIG. 114 is a bottom view of the aforementioned mother socket 3E. The bottom face of the mother socket 3E is equipped with the module leads 9 which are arranged zigzag on the two sides in the longitudinal direction of the bottom face. The pitch of the module leads 9 in each row is 300 mm. These module leads 9 are lead pins having circular sections as in the PGA terminals used in the ordinary PGA package. When the module leads 9 are such lead pins, a mechanical strength is enhanced better than that which is constructed of the lead frame (e.g., the mother socket lead frame shown in FIG. 72 or 73), so that the handling can be made so easy as to facilitate the automatic packaging on the printed circuit board of the SIMM.

Outside of the module leads 9, connection pin electrodes 91 are densely arranged in one row along the two sides of the long side direction of the mother socket 3E. This electrode 91 is given the through hole structure in which the connection pin 90 is inserted from the top face into the through hole and is electrically connected by soldering. Of the module leads 9 (or PGA terminals), the address terminals or control signals, as fixedly connected with the package 2E, are connected with the electrodes 91 through wiring lines 92, as shown by solid lines in FIG. 114.

When a plurality of semiconductor chips are integrally encapsulated in a stacked structure, as in the package of the present invention, a defect may occur in the semiconductor chips in the aging or burn-in test for finding out an initial defect. If the package having the encapsulated semiconductor chips is discarded as a defective, the production yield of the DRAM module is deteriorated. If the semiconductor chips having an aging percent non-defective of 92% are simply stacked in nine layers, the aging percent nondefective drops to 50%.

In the DRAM module 1E of the present embodiment, therefore, the basic structure is exemplified by the basic construction of a DRAM module of ×9 bits composed of data of 8 bits and a parity bit of 1 bit. If a defect is caused in one DRAM chip by the aging, the defective DRAM chip is disconnected so that the DRAM module may be used as one only for the data of 8 bits. Then, two kinds of DRAM modules can be provided and the aging percent non-defective can be improved to 80% if the two kinds of DRAM modules are combined even for the aging percent non-defective of 92%.

For this, a redundant hierarchy selector 93 is interposed between the module leads 9 (PGA terminals) corresponding to the data terminals and the connection pin electrodes 91 corresponding to the data terminals of the package 2E. In the redundant hierarchy selector 93, the hatched electrodes are connected in a one-to-one relation with the connection pin electrodes 91. In short, the connections are fixed in the one-to-one relation with the data input/output leads 6 of the nine DRAM chips. Thus, the hatched electrodes are used for aging or testing the DRAM module 1E according to the present invention.

Figure 115:
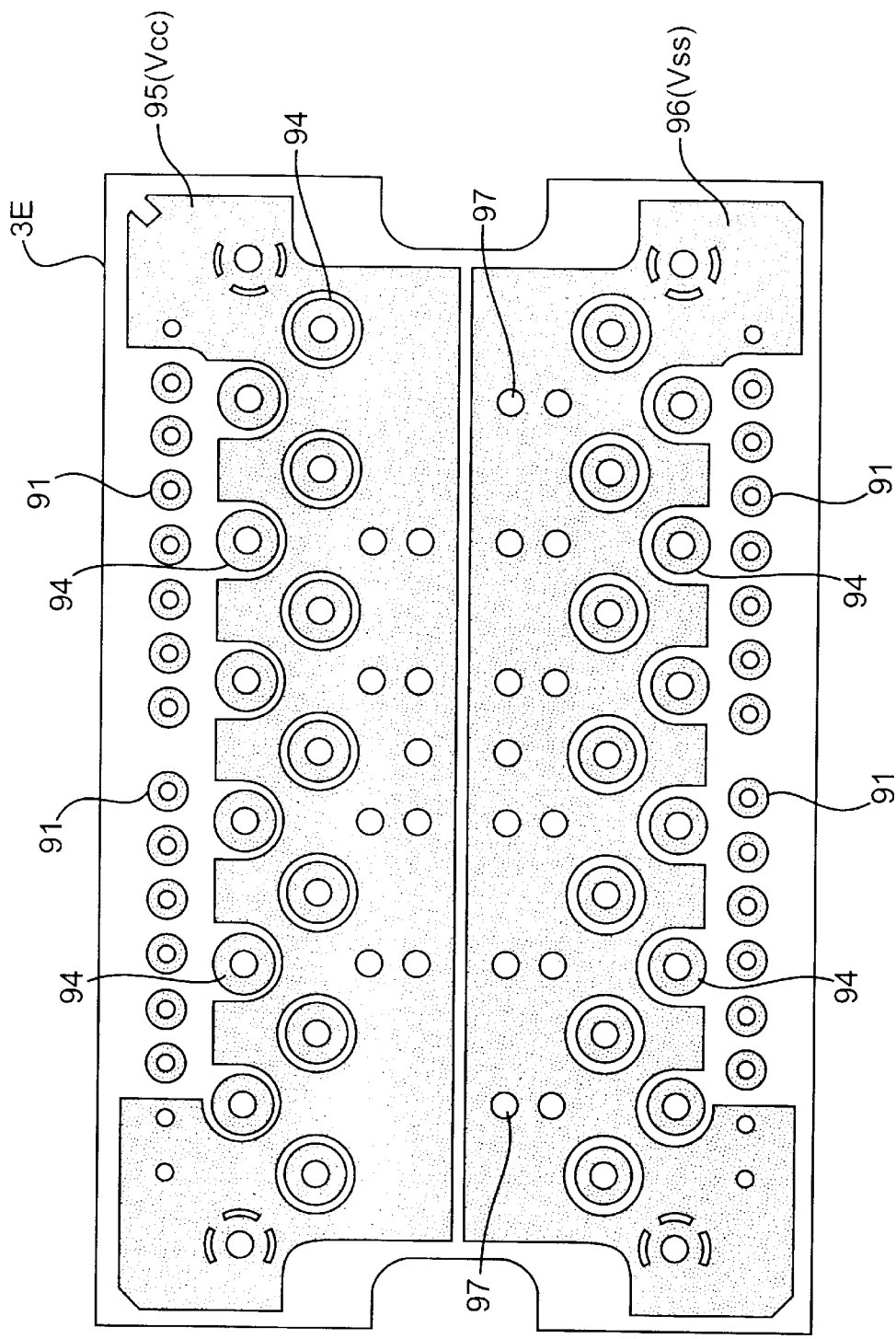
FIG. 115 is a top plan view showing the top face of the mother socket.

FIG. 115 is a top plan view showing the top face of the aforementioned mother socket 3E. In the top face of this mother socket 3E, there are shown through hole electrodes 94, into which are inserted the module leads 9, and patterns 95 and 96 of a wide area for supplying the circuit ground potential VSS and the power supply voltage VCC to lower the power supply impedance. These metal patterns 95 and 96 for the power supply are given a function as a radiation plate, and their center portion is formed with through holes 97 for the heat radiation.

In the DRAM module 1E of the present embodiment, the leads 6 of the package 2E and the module leads 9 of the mother socket 3E are cross-connected to form the matrix-shaped heat dissipation paths. Although the heat resistance of the package 2E is low, therefore, the lowermost DRAM chip ($M_0$) in the package 2E is in contact with the relatively thick mother socket 3E so that the radiation efficiency is deteriorated. Thus, devices are made to make the heat radiation of the lowermost DRAM chip ($M_0$) efficient by enlarging the areas of the power supplying metal patterns 95 and 96 to be formed on the surface of the mother socket 3E.

Figure 116:
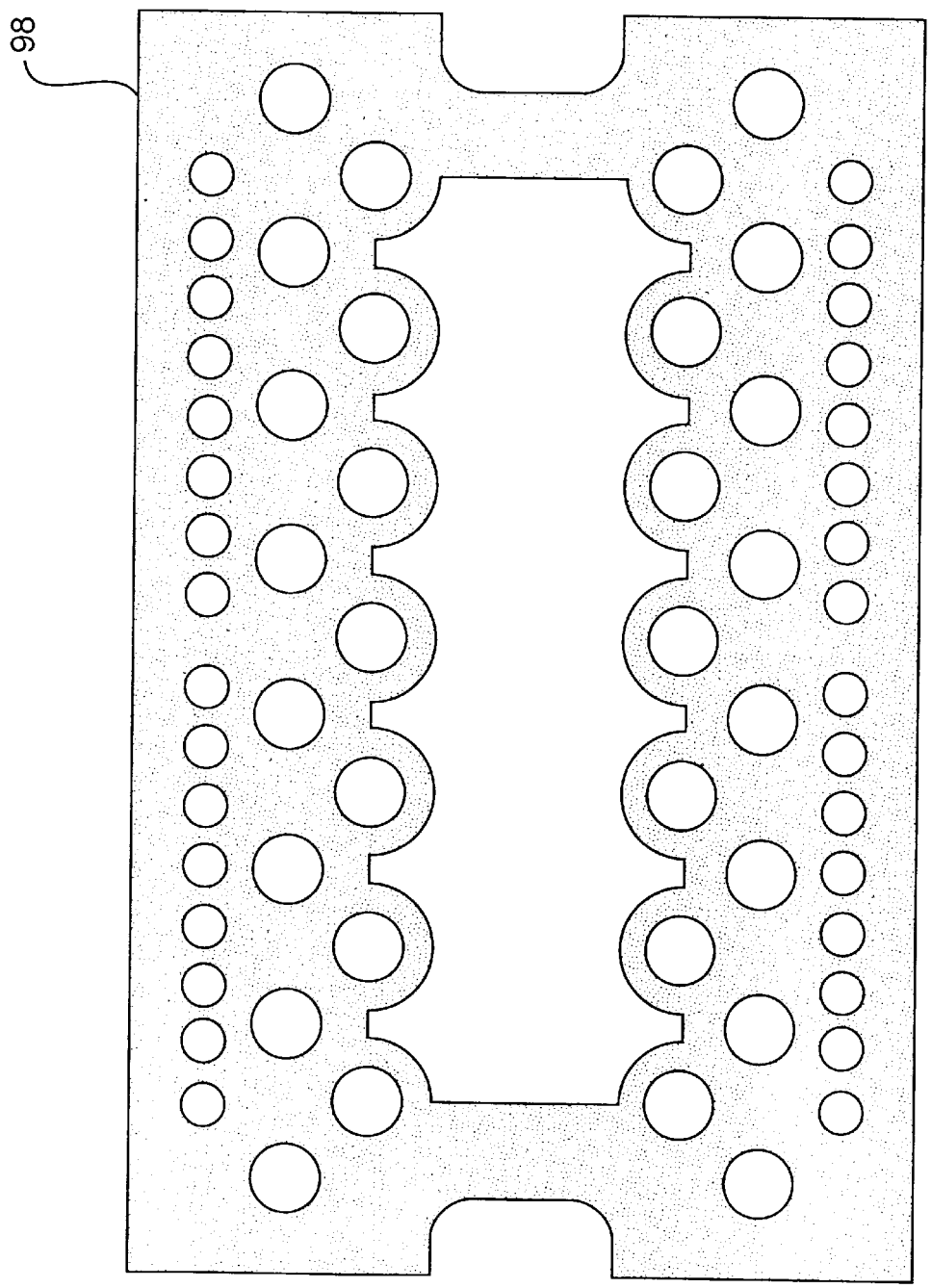
FIG. 116 is a top plan view showing a solder resist pattern the top face of the mother socket.

Over the upper face of the mother socket 3E, there is formed a solder resist 98 having the pattern, as shown in FIG. 116. The solder resist 98 is provided to prevent the solder for connections between the module leads 9 and the electrodes 95 and between the connection pins 90 and the electrodes 91 from flowing to short them with other terminals. Considering the heat radiation, the solder resist 98 is not formed over the individual surfaces of the power supplying metal patterns 95 and 96. Incidentally, on the bottom face of the mother socket 3E, there is formed the solder resist which has the pattern corresponding to that of the electrodes 91 and the wiring 92, although not shown. On the bottom face of the mother socket 3E, there is formed the pattern of the aforementioned redundant hierarchy selector 93. For this selective connection, moreover, there is required a step of thermally treating the solder balls or the solder pattern formed by a printing technique, as will be later described. Thus, the solder resist is required for preventing undesired circuit-short which might be caused by the solder.

Figure 117:
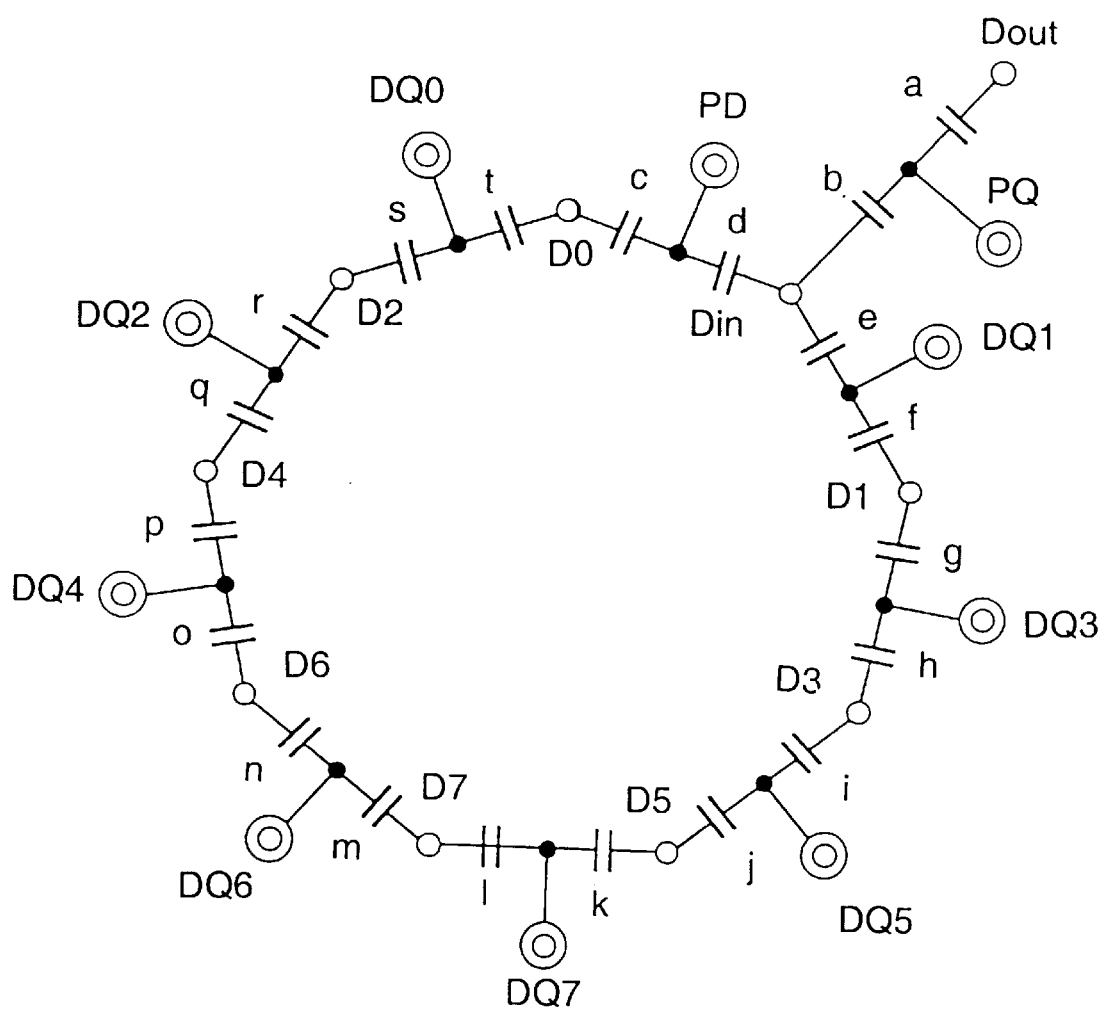
FIG. 117 is an equivalent circuit diagram showing a redundant hierarchy selector disposed on the bottom face of the mother socket.

FIG. 117 is an equivalent circuit diagram showing the redundant hierarchy selector 93 mounted on the bottom face of the aforementioned mother socket 3E. In FIG. 117, large double circles correspond to the module leads 9, and small circles correspond to the connection pin terminals. Moreover, solid lines show circuit wiring, and portions a to t, at which the circuit wiring is disconnected like the circuit symbols of capacitors, are selector portions for connecting the wiring selectively by the solder or the like.

One module lead DQ7 can be connected with the connection pin terminal D7 or D5 by the two selectors l and k. One connection pin terminal D5, if noted, can be connected with the module lead DQ5 by the selector j which is disposed on the opposite side of the selector k. The module lead DQ5 can be connected with the connection pin terminal D3 by the selector i which is disposed on the opposite side of the selector j. Likewise, the module leads DQ and the connection pin terminals D are alternately arranged to form a ring shape as a whole.

By using the nine DRAM LSI chips, as described hereinbefore, the present embodiment is used as the DRAM module composed of data of 8 bits and a parity bit of 1 bit, if all chips are non-defective, and as the DRAM module composed of data of 8 bits but no parity, if one DRAM chip is defective.

In order that the aforementioned memory module with the parity bit may be given the same interface as that of the memory module with the parity bit such as the SIMM of the prior art or that the input bits PD and the output bits PQ may be separated, the output parity terminal PQ is omitted from the aforementioned ring shape. In other words, the connection pin terminal Din is exclusively equipped with not only the selectors d and e of the ring but also the selector b to be connected with the aforementioned output parity terminal PQ. With this output parity terminal PQ, there can be connected by the selector a the connection pin terminal which corresponds to the data output terminal Dout of the aforementioned DRAM chip ($M_8$).

If all the memory chips are non-defective in the present embodiment, the selectors, marked with ○ in the following Table 1, are connected whereas the selectors, marked with x, are opened. In other words, the connection pin terminals D0 to D7 are connected with the module leads DQ0 to DQ7, and the connection pin terminal Dout is connected with the module lead PQ whereas the connection pin terminal Din is connected with the module lead PD, so that the DRAM module shown in FIG. 113 is constructed.

TABLE 1

| Selector | a | b | c | d | e | f | g | h | i | j | k | l | m | n | o | p | q | r | s | t |
|---|---|---|---|---|---|---|---|---|---|---|---|---|---|---|---|---|---|---|---|---|
| ON/OFF | o | x | x | o | x | o | x | o | x | o | x | o | x | o | x | o | x | o | x | o |

TABLE 2

| Selector | a | b | c | d | e | f | g | h | i | j | k | l | m | n | o | p | q | r | s | t |
|---|---|---|---|---|---|---|---|---|---|---|---|---|---|---|---|---|---|---|---|---|
| ON/OFF | o | o | x | x | o | x | o | x | o | x | o | x | o | x | o | x | o | x | x | o |

If a defect occurs in the DRAM chip $M_2$ to be connection with the connection pin terminal D2, the selectors, marked with ○ in Table 2, are connected, whereas the selectors, marked with x, are open. At this time, the aforementioned parity bit DRAM chip $M_8$ is replaced as a redundancy chip by the aforementioned defective DRAM chip.

In the parity bit DRAM chip $M_8$, the terminals Din and Dout are separated, as described above. In order that the memory chip M8 may be used in the data input/output data terminal DQ1, the selectors a, b and e are connected, as described above, to connect the connection pin terminals Dout and Din with the module lead DQ1.

The connection pin terminal D2 corresponding to the DRAM chip $M_2$, as found defective, is isolated as a result that the selectors r and s are open (X). In accordance with this, the module leads DQ2 to DQ7 other than the module lead DQ0 and the module lead DQ1 using the DRAM chip $M_8$ are connected with the selectors in the opposite direction that of Table 1.

If a defect occurs in the DRAM chip $M_8$ corresponding to the parity bit, the selectors a and d, connected in Table 1, may be opened. If a defect occurs in other DRAM chips $M_1$ or $M_2$ to $M_7$, on the other hand, the defective DRAM chips are not connected with the module leads by the same method as that of Table 2 so that they can be relieved by reversing the connection of the selectors in the counter-clockwise direction across the defective portions.

Alternatively, the LSI chip may be given a stacked structure of ten layers so that it may be a product of a DRAM module to be accessed to in units of 10 bits if all chips are non-defective, a DRAM module to be accessed to in units of 9 bits if one DRAM chip is defective, or a DRAM module in units of 8 bits if two DRAM chips are defective. In the redundant hierarchy selector of FIG. 117 of this case, the module leads DP and DQ may be the data DQ8 and DQ9 of the ninth bit and the tenth bit. Accordingly, the connection pin terminal Din may be connected with the data input/output lead of the DRAM chip $M_8$ of the ninth bit, and the connection pin terminal Dout may be connected with the data input/output lead of the DRAM chip $M_9$ of the tenth bit.

Figure 118A:
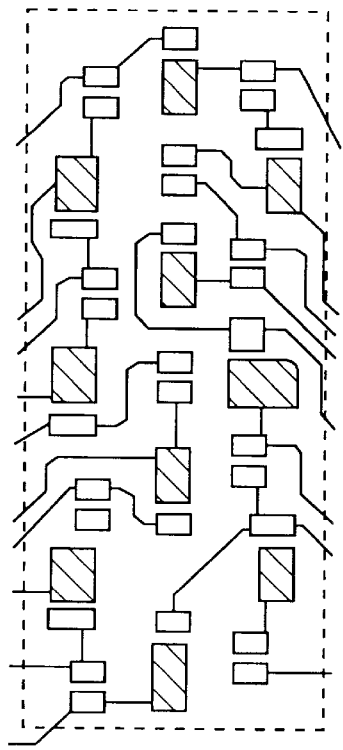
FIGS. 118(a) and 118(b) are a conceptional diagram for explaining a method of connecting the redundant hierarchy selector selectively.
Figure 118B:
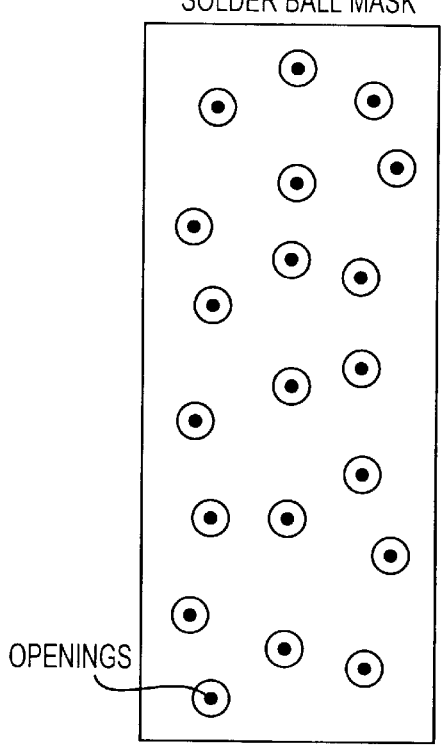
Figure 118C:
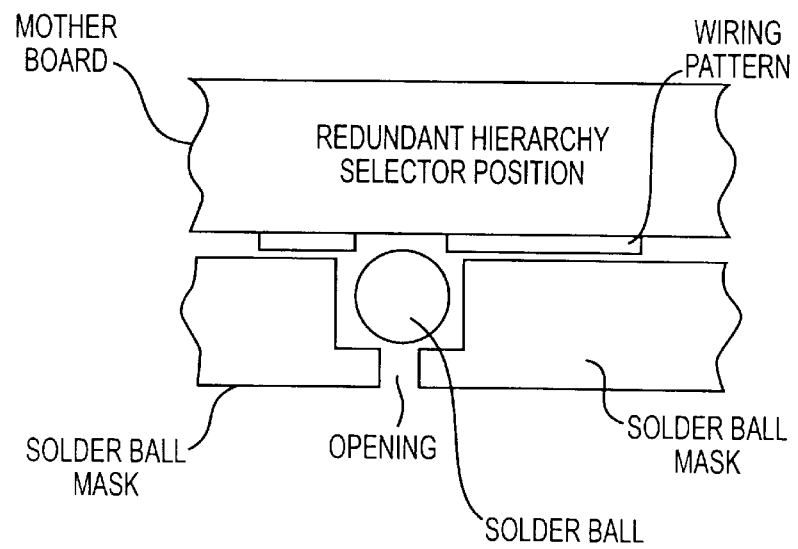

FIG. 118 is a conceptional diagram for explaining one embodiment of a selective connection method of the aforementioned redundant hierarchy selector. As shown in FIG. 118(a), a solder ball mask is provided corresponding to the arrangement pattern of the redundant hierarchy selector. As shown in FIG. 118(b), the solder ball mask has solder ball holes which correspond to the positions of the two electrodes of the selector. These solder ball holes are opened in their bottom faces. These openings are utilized to position the solder balls and to remove the excess solder which has been melted by the heat treatment.

Solder balls are inserted into the solder ball holes corresponding to the selector portions for the aforementioned connections and are fitted in the solder ball holes corresponding to the selector portions which are left open.

The solder ball mask, in which the solder balls are fitted in the solder ball holes corresponding to the connections/disconnections, is aligned and superposed on the bottom face of the mother socket 3e, as shown in FIG. 118(b). This alignment can be easily and accurately performed by forming the positioning holes in the solder ball mask at the PGA terminals, as described above. After this, the solder balls are melted in a heating furnace for the heat treatment so that the selector portions can be connected by the wiring which is formed in the bottom face of the mother socket 3E. Incidentally, in addition to the method using those solder balls, a solder layer is selectively formed in the aforementioned selector portion by the printing technique so that the solder can then be melted by the aforementioned heating furnace to connect the wiring patterns of the selector portion.

Figure 119:
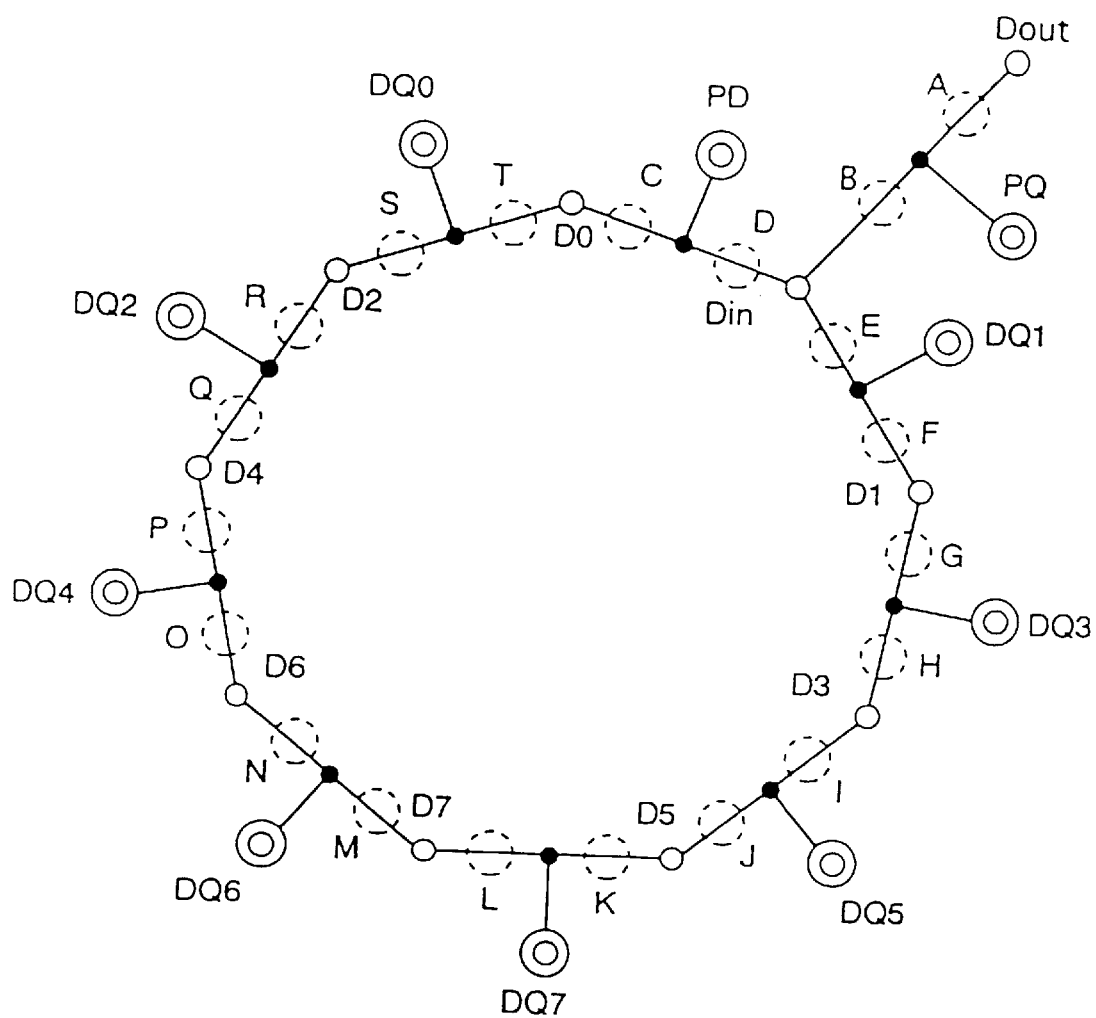
FIG. 119 is another equivalent circuit diagram showing the redundant hierarchy selector disposed on the bottom face of the mother socket.

FIG. 119 is another equivalent circuit diagram showing another embodiment of the redundant hierarchy selector 93 to be mounted on the bottom side of the aforementioned mother socket. In FIG. 119, large double circles correspond to the module leads (PGA terminals) of FIG. 114 like before, and small circles correspond to the connection pin electrodes 91. Moreover, solid lines show the circuit wiring, and dotted circles show the portions to be selectively cut by irradiating them with an energy beam such as a laser beam. In other words, this embodiment is constructed such that all the circuits are formed in a reverse way of that of the foregoing embodiment of FIG. 117 and such that the portions to be cut are cut to make the circuit.

One module lead DQ7 can be connected with the connection pin terminal D7 or D5 by the two cut portions L and K. One connection pin terminal D5, if noted, can be connected with the module lead DQ5 by the cut portion J which is disposed on the opposite side of the cut portion K. The module lead DQ5 can be connected with the connection pin terminal D3 by the cut portion I which is disposed on the opposite side of the cut portion J. Likewise, the module leads DQ and the connection pin terminals D are alternately arranged to form a ring shape as a whole.

By using the nine DRAM chips, as described hereinbefore, the present embodiment is used as the DRAM module composed of data of 8 bits and a parity bit of 1 bit, if all chips are non-defective, and as the DRAM module composed of data of 8 bits but no parity, if one DRAM chip is defective.

In order that the aforementioned memory module with the parity bit may be given the same interface as that of the memory module with the parity bit such as the SIMM of the prior art or that the input bits PD and the output bits PQ may be separated, the output parity terminal PQ is omitted from the aforementioned ring shape. In other words, the connection pin terminal Din is exclusively equipped with not only the cut portions D and E of the ring but also the cut portion B to be connected with the aforementioned output parity terminal PQ. With this output parity terminal PQ, there can be connected by the cut portion A the connection pin terminal which corresponds to the data output terminal Dout of the aforementioned DRAM chip $M_8$.

If all the DRAM chips are non-defective in the present embodiment, the cut portions, marked with ○ in the following Table 3, are left connected whereas the cut portions, marked with x, are cut and opened by irradiating them with an energy beam such as a laser beam. In other words, the connection pin terminals D0 to D7 are connected with the module leads DQ0 to DQ7, and the connection pin terminal Dout is connected with the module lead PQ whereas the connection pin terminal Din is connected with the module lead PD, so that the DRAM shown in FIG. 113 is constructed. By adopting this laser cutting method, the redundancy relief can be facilitated.

TABLE 3

| Cuts | A | B | C | D | E | F | G | H | I | J | K | L | M | N | O | P | Q | R | S | T |
|------|---|---|---|---|---|---|---|---|---|---|---|---|---|---|---|---|---|---|---|---|
| ON/OFF | o | x | x | o | x | o | x | o | x | o | x | o | x | o | x | o | x | o | x | o |

TABLE 4

| Cuts | A | B | C | D | E | F | G | H | I | J | K | L | M | N | O | P | Q | R | S | T |
|------|---|---|---|---|---|---|---|---|---|---|---|---|---|---|---|---|---|---|---|---|
| ON/OFF | o | o | x | x | o | x | o | x | o | x | o | x | o | x | o | x | o | x | x | o |

If a defect occurs in the DRAM chip $M_2$ to be connection with the connection pin terminal D2, the cut portions, marked with ○ in Table 2, are left connected, whereas the cut portions, marked with x, are cut and disconnected by irradiating them with the energy beam such as the laser beam. At this time, the aforementioned parity bit DRAM chip $M_8$ is replaced as a redundant chip by the aforementioned defective DRAM chip $M_2$.

In the parity bit DRAM chip $M_8$, the terminals Din and Dout are separated, as described above. In order that the DRAM chip $M_8$ may be used in the data input/output data terminal DQ1, the cut portions A, B and E are left connected, as described above, to connect the connection pin terminals Dout and Din with the module lead DQ1. The succeeding description is substantially similar to that of the foregoing embodiment, and the description will be omitted.

In order to relieve the defective chip by that laser cutting method, the aging or burn-in process is executed unlike the foregoing embodiment at the stage in which the package 2E is formed. In other words, before the state in which the package 2E is mounted on the mother socket through the connection pins 90, electric connections are made with the leads 6 led out independently from the semiconductor chips of the individual layers by the aging board or the like to effect the circuit operations.

Figure 120:
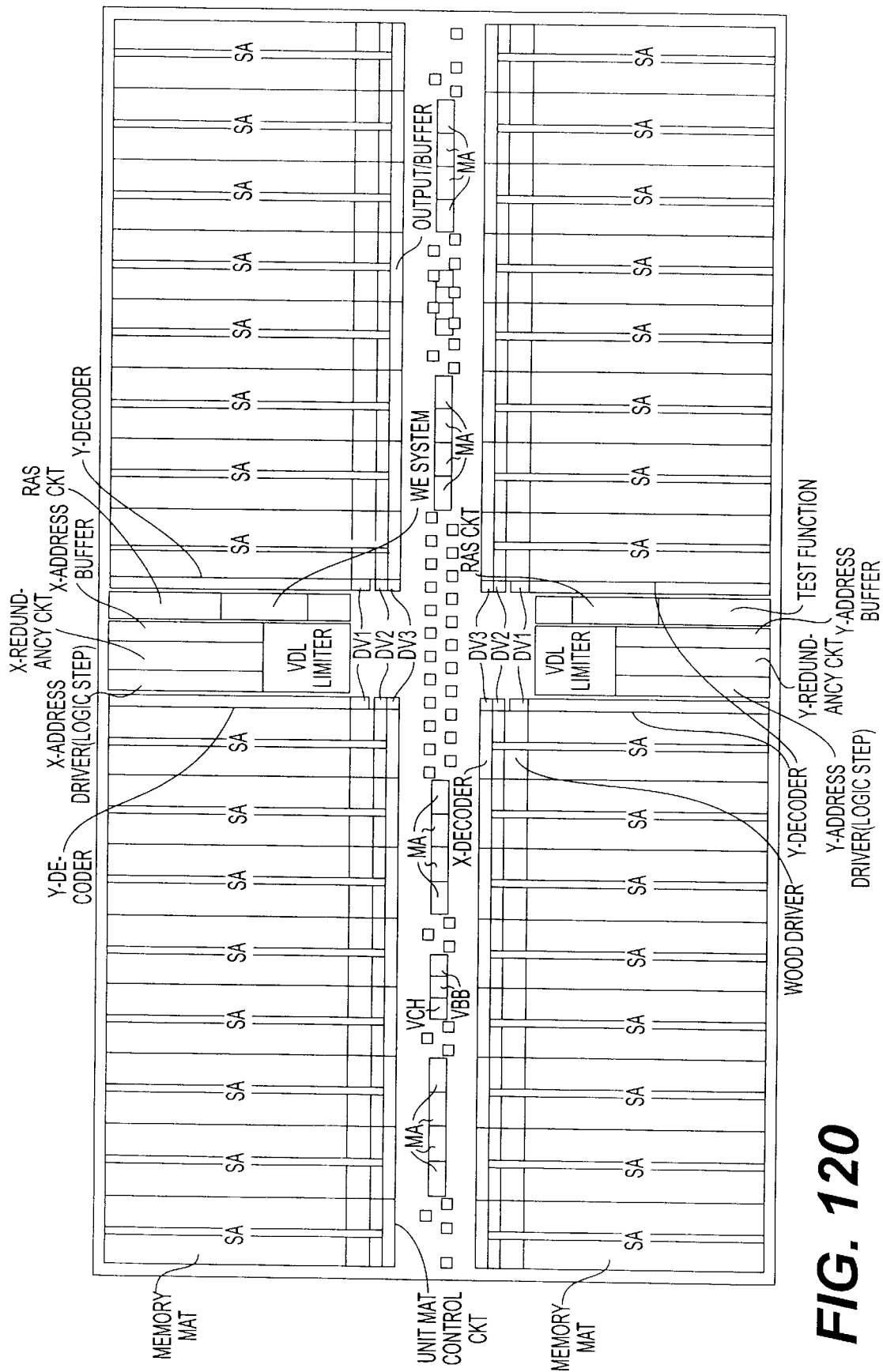
FIG. 120 is a block diagram showing a DRAM chip.

FIG. 120 is a block diagram showing one embodiment of the DRAM chip having the aforementioned stacked structure. The individual circuit blocks of FIG. 120 are formed over one semiconductor substrate of single crystal silicon by a well-known technique for manufacturing the semiconductor integrated circuit. The individual circuit blocks of FIG. 120 are drawn to conform to the geometrical arrangement in the actual semiconductor chip.

In the present embodiment, in order that the operation speed may be prevented from being delayed by the increase of the various wiring legnths for the control signals or the memory array drive signals as the chip size is enlarged according to the increase in the capacity of the memory, the following devices are made in the arrangements of the memory array units constructing the DRAM and the peripheral portions for screening the addresses of the former. In FIG. 120, there is provided a cross area which is formed to have a longitudinal center portion and a lateral center portion of the chip. The peripheral circuits are arranged mainly in that cross area, and the memory arrays are arranged in the areas, as quadrisected by the cross area. In other words, the cross area is formed at the longitudinal and lateral center portions of the chip, and the memory arrays are formed in the four quardrisected areas. These four memory arrays are individually given a memory capacity of about 4 Mbits, as will be described hereinafter. Accordingly, the four memory arrays are given a capacity of as large as about 16 Mbits as a whole.

One memory mat MEMORY MAT is so arranged that the word lines may extend laterally and that the paired complementary bit lines (e.g., the data lines or the digit lines), arranged in parallel in the longitudinal direction, may extend. The memory mats MEMORY MATS are arranged laterally in pairs around the sense amplifier SA. This sense amplifier SA is used commonly for the paired memory mats MEMORY MAT, arranged at the right and left sides, to make the so-called "shared sense amplifier".

At the center sides of the four quardrisected memory arrays, there are disposed Y-selectors Y-DECODER. The Y-select lines are extended from the Y-selectors Y-DECODER and over a plurality of memory mats MEMORY MAT of the corresponding memory arrays, to switch the gates of the column switch MOSFET of the individual memory mats MEMORY MAT.

On the lefthand side of the lateral center portion of the chip, there are disposed: X-circuits including an X-address buffer X-ADDRESS BUFFER, an X-redundant circuit X-REDUNDANCY CKT and an X-address driver X-ADDRESS DRIVER (a logic step LOGIC STEP); a RAS control signal circuit RAS CKT, a WE signal control circuit WE SYSTEM, a data input buffer DIN BUFFER and an internal step-down circuit VCL LIMITER. The aforementioned internal power supply circuit VCL LIMITER is disposed close to the center of the area so that it receives an external power supply voltage VCCE such as about 3.3 V to generate a constant voltage VCL corresponding to the voltage of about 2.2 V to the internal circuit.

On the righthand side of the lateral center of the aforementioned chip, there are disposed: Y-circuits including a Y-address buffer Y-ADDRESS BUFFER, a Y-redundancy circuit Y-REDUNDANCY and a Y-address driver Y-ADDRESS DRIVER (a logic step LOGIC STEP); a CAS control signal circuit CAS CKT; and a test circuit TEST FUNCTION. At the chip center portion, there is disposed an internal voltage step-down circuit VDL LIMITER for generating a power supply voltage VCL for the peripheral circuit such as the address buffer or the decoder.

If the redundancy circuits X- and Y-REDUNDANCY including the address buffer and the corresponding address comparator and the CAS and RAS control signal circuits RAS and CAS CKT for generating the control clocks are arranged in the concentrated position, a high integration can be achieved by sharing the clock generator and other circuits across the wiring channel, namely, by sharing the wiring channel, and the signals can be transmitted at the shortest and equal distance to the address driver (or logic step) and so on.

The RAS control circuit RAS CKT is used to receive the row address strobe signal RASB thereby to actuate the X-address buffer X-ADDRESS BUFFER. The address signal, taken in by the X-address buffer X-ADDRESS BUFFER, is fed to the X-redundancy circuit X-REDUNDANCY. Here, the comparison with the stored defective address is made to judge whether or not to be switched to the redundancy circuit. This result and the aforementioned address signal are fed to the X-predecoder. Here, a predecode signal is generated and is fed through X-address drivers DV2 and DV3 corresponding to the individual memory arrays, to the individual X-decoders X-DECODER corresponding to the aforementioned memory mats.

On the other hand, the internal signals of the aforementioned RAS circuits are fed to the WE control circuit WE SYSTEM and the CAS control circuit CAS CKT. By determining the input order of the RASB signal, the column address strobe signal CASB and the write enable signal WEB, for example, the automatic refresh mode (CBR) and the test mode (WCBR) are discriminated. In the test mode, the test circuit TEST FUNCTION is actuated so that the test function is set according to the specific address signals fed at the individual timings in the open/standard modes and in and closed test mode, if necessary.

The CAS control circuit CAS CKT is used to receive the signal CASB thereby to generate various Y-control signals. The address signals, taken in by the Y-address buffer Y-ADDRESS BUFFER in synchronism with the change of the signal CASB to the low level, is fed to the Y-redundancy circuit Y-REDUNDANCY. Here, the comparison is made with the stored address to judge whether or not to switch to the redundancy circuit. The result and the aforementioned address signal are fed to the Y-predecoder. This predecoder generates a predecode signal. This predecode signal is fed to each Y-decoder Y-DECODER through the Y-address driver DV1 which is provided for each of the four memory arrays. On the other hand, the CAS control circuit CAS CKT receives the RASB signal and the WEB signal, as described above, to determine the test mode from the judgment of the input order, thereby to actuate the adjacent test circuit TEST FUNCTION.

At the portion above the longitudinal center portion of the aforementioned chip, there are arranged totally sixteen memory mats MEMORY MAT and eight sense amplifiers SA, as located laterally symmetrically with the center axis of the area. Of these, for the four sets of right and left memory mats MEMORY MAT and sense amplifiers SA, there are provided four main amplifiers MA. Above this longitudinal center portion, there are further disposed a boosted voltage generator VCH for screening the word lines according to the internal step-down voltage, and an input pad area corresponding to an input signal such as the address signal or the control signal.

In the present embodiment, one block has eight memory mats MEMORY MAT and four sense amplifiers SA, and the sixteen memory mats MEMORY MAT and the eight sense amplifiers SA are assigned laterally symmetrically on the aforementioned longitudinal axis. According to this construction, the amplified signals coming from those individual sense amplifiers SA can be transmitted to the main amplifier MA through the short signal transmission passages by using as small as four main amplifiers MA.

At the portion below the longitudinal center portion of the aforementioned chip, too, there are arranged totally sixteen memory mats MEMORY MAT and eight sense amplifiers SA, as located laterally symmetrically with the center axis of the area. Of these, for the four sets of right and left memory mats MEMORY MAT and sense amplifiers SA, there are provided four main amplifiers MA.

At the longitudinal center portion, there are further disposed a substrate voltage generator VBB for generating a negative bias voltage to be fed to the substrate according to the internal step-down voltage, input pad areas corresponding to the input signals such as the address signals or the control signals, and a data output buffer circuit OUTPUT BUFFER. Like before, the amplified signals coming from those individual sense amplifiers SA can be transmitted to the main amplifier MA through the short signal transmission paths by using as small as four main amplifiers MA.

Although not shown, there are arranged in the region of the longitudinal center portion a variety of bonding pads. These bonding pads are exemplified by external power supplying pads. Specifically, the pads for supplying the circuit ground potential to increase the input level margin, that is, to lower the power supply impedance are arranged generally on a straight line by as many as totally ten and several pads. These ground potential pads are connected with the ground potential leads which are formed to extend in the longitudinal direction by the LOC technique. Some of these ground pads are provided for clearing the word lines or for preventing the unselected word lines of the word driver from floating by the coupling, and others are provided mainly for lowering the power supply impedance or for the common source of the sense amplifiers.

As a result, the circuit ground potential can minimize the generation and propagation of noises because the power supply impedance is lowered for the operation of the internal circuit and because the several kinds of ground wiring between the internal circuits are connected by a low-pass filter composed of the LOC lead frame and the bonding wires.

In this embodiment, the pads corresponding to the external power voltage VCC such as about 3.3 V are provided to correspond to the internal step-down circuits VCL, VDL and LIMITER for the aforementioned voltage transforming operation. These pads are also provided for lowering the power supply impedance and for suppressing the noise propagation of the voltage (e.g., VCL, VDL and VCC) between the internal circuits.

The address inputting pads and the pads for the control signals RAS, CAS, WE and OE are arranged in the area of the aforementioned center portion. In addition, there are provided the data inputting and data outputting pads and the bonding master, monitoring and monitoring control pads, as follows.

For the bonding master, there are the pads for designating the static column mode, the nibble mode and the write masking function of ×4 bit construction. For the monitoring operations, there are pads for monitoring the internal voltages VCL, VDL, VL, VBB, VCH and VPL. The VPL monitor judges in the probing whether or not the VPL is correctly adjusted.

The internal step-down circuit VCL LIMITER generates the power supply voltage VCL of about 2.2 V for the peripheral circuits. The internal step-down circuit VDL LIMITER generates the power supply voltage VDL of about 2.2 V to be fed to the memory array or the sense amplifier SA. According to the internal voltage VCL, the booster circuit VCH generates the boost power supply voltage for screening the select level of the word lines, as boosted to about 3.3 V, that is, the shared switch MOSFET. The plate voltage generator VPL generates the plate voltage of the memory cells.

Figure 121:
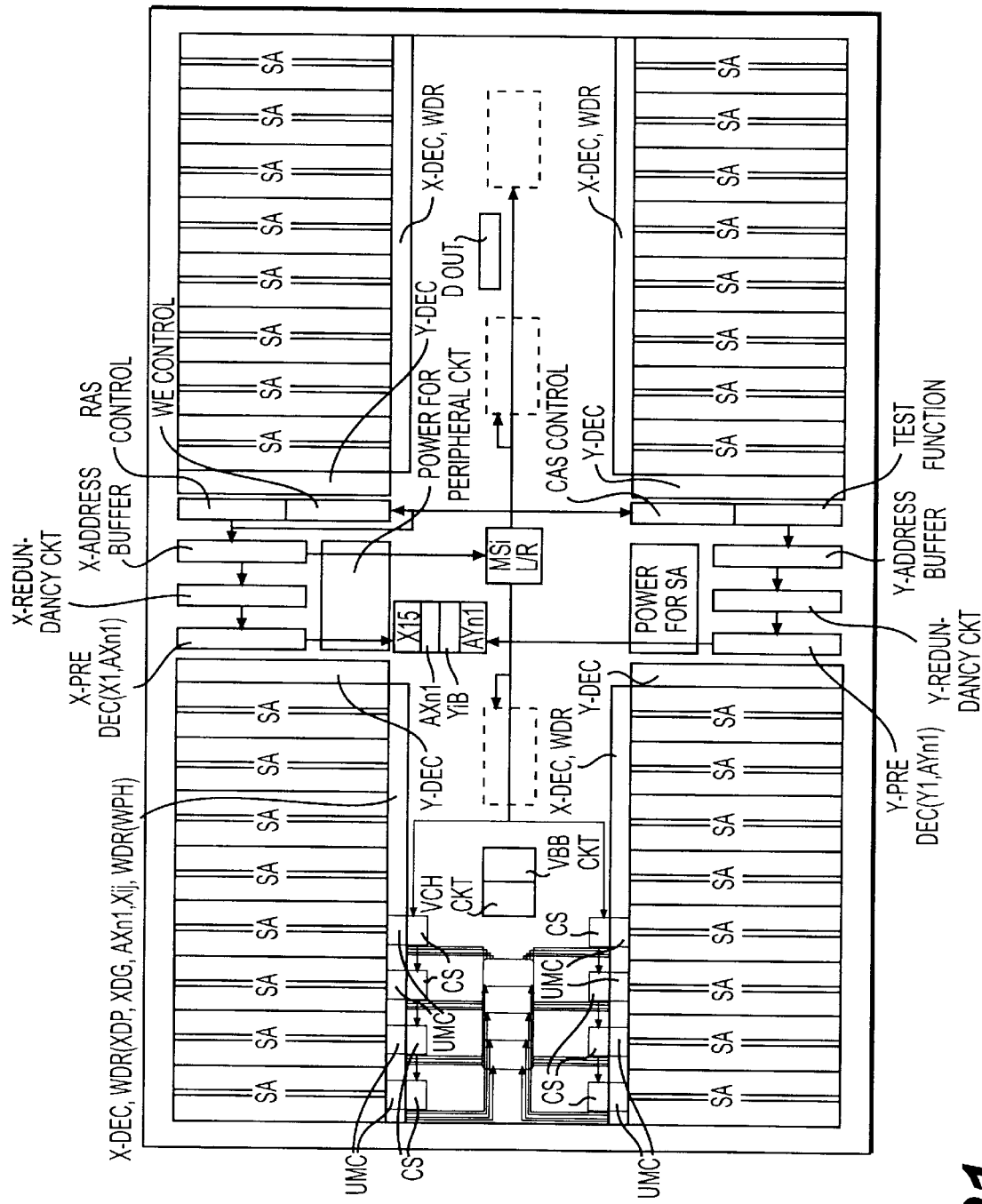
FIG. 121 is a block diagram of the DRAM chip noting control signals.

FIG. 121 is a block diagram noting the control signals in the DRAM chip to which is applied the present invention. FIG. 121 is drawn correspondingly to the layout shown in FIG. 120.

In response to the signal RASB, the RAS control circuit RAS CONTROL (CKT) actuates the X-address buffer X-ADDRESS BUFFER. The address signal, taken in by the X-address buffer X-ADDRESS BUFFER, is fed to the X-redundancy circuit X-REDUNDANCY CKT. Here, a comparison is made with the stored defective address to judge whether or not the redundancy circuit has been switched.

The result and the aforementioned address signal are fed to the X-predecoder X-PRE DEC (X1, AXn1). Here, a predecode signal composed of the Xi and AXn1 is generated and is fed through the X-address drivers XiB and AXn1, provided correspondingly to the individual memory arrays, to the individual X-decoder X-DEC corresponding to the aforementioned memory mat MEMORY MAT. In FIG. 121 only one driver is shown as a representative, by way of example.

The aforementioned RAS internal signals are fed to the WE control circuit WE CONTROL and the CAS control circuit CAS CONTROL (CKT). From the determination of the input order of the RAS signal, the CAS signal and the WE signal, for example, the automatic refresh mode (CBR) or the test mode (WXBR) is discriminated.

In this test mode, the test circuit TEST FUNCTION is actuated to set the test function in accordance with the specified address signals which are fed when in the open/standard test mode and in the closed test mode.

Of the address signals taken in by the X-address buffer X-ADDRESS BUFFER, the address signal representing the selection of the memory mats is transmitted to the mat select circuit MSiL/R, by which is selected any of the plurality of memory mats MEMORY MAT disposed in the individual memory arrays. Here, the CS corresponding to the memory mat MEMORY MAT is the common source switch MOSFET.

The four main amplifiers MA correspond to the four pairs of complementary data lines (or 4 bits) led from the totally eight memory mats which are disposed laterally symmetrically with respect to those amplifiers. According to the memory mat select signal MSiL/R, one of the eight memory mats is selected. This screening operation is executed by a unit mat control circuit UMC. In FIG. 121, the four pairs of main amplifiers MA are shown as one set by way of example, the remaining three sets of main amplifiers are shown by broken black boxes.

The mat select circuit MSiL/R generates four kinds of select signals MS0L/R to MS3L/R. If the signal MS0L is generated, for example, the corresponding four memory mats are selected. These four memory mats MS0L individually have input/output nodes of 4 bits so that they individually correspond to the aforementioned four main amplifier s MA.

The CAS control circuit CAS CONTROL (CKT) is used to generate the various Y-control signals in response to the signal CASB. The address signal, taken in by the Y-address buffer Y-ADDRESS BUFFER in synchronism with the change of the signal CASB to the low level, is fed to the Y-redundancy circuit Y-REDUNDANCY CKT. Here, a comparison is made with the stored defective address to judge whether or not the redundancy circuit has been switched.

This result and the aforementioned address signals are fed to the Y-predecoder Y-PRE DEC (Y1, AYn1). Here is generated the predecode signal which is composed of the Yi and the AYn1. These predecode signals Yi and AYn1 are fed to the individual Y-decoders Y-DEC through the Y-address driver (at the final step) YiB and AYn1 which corresponds to each of the four memory arrays. In FIG. 121, only the Y-drivers YiB and AYn1B are shown as a representative by way of example.

According to the RAS signal and the WE signal, the CAS control circuit CAS CONTROL (CKT) actuates, when it judges the test mode from the determination of the input order, the adjacent test circuit TEST FUNCTION. The bonding pads to be fed with the address signals and the control signals are collected and arranged at the center portion of the chip, although omitted from FIG. 121. Thus, the distances from the individual pads to the corresponding circuits can be shortened to generally uniform values. As a result, by adopting the layout of this embodiment, the take-in of the address signals and the control signals can be executed at a high speed while minimizing the skew which may be caused between the address signals of multiple bits.

As shown in FIG. 121, the power source VDL for the sense amplifiers (SA) and the power source VCL for the peripheral circuits are also arranged at the center portion of the chip. As a result, the various voltages can be supplied at the equal distances and by the short wires to the circuits which are arranged at the four corners of the chip. Although not shown for the individual circuits, however, the capacitors having relatively high capacitances for the voltage stabilization, i.e., for lowering the power supply impedance are dispersed in the circuit along the individual power supply lines.

Since the bonding pads are collected and arranged at the center portion of the chip, as described above, the data input/output terminals can be easily connected when made into the stacked structure, even if their lead positions are different for the individual layers. Especially, the leads may be shared among the patterns corresponding to the plurality of layers to change them by a bonding option method. Then, the leads can be easily connected while the unnecessary leads being cut or removed by forming the aforementioned slits.

Figure 122:
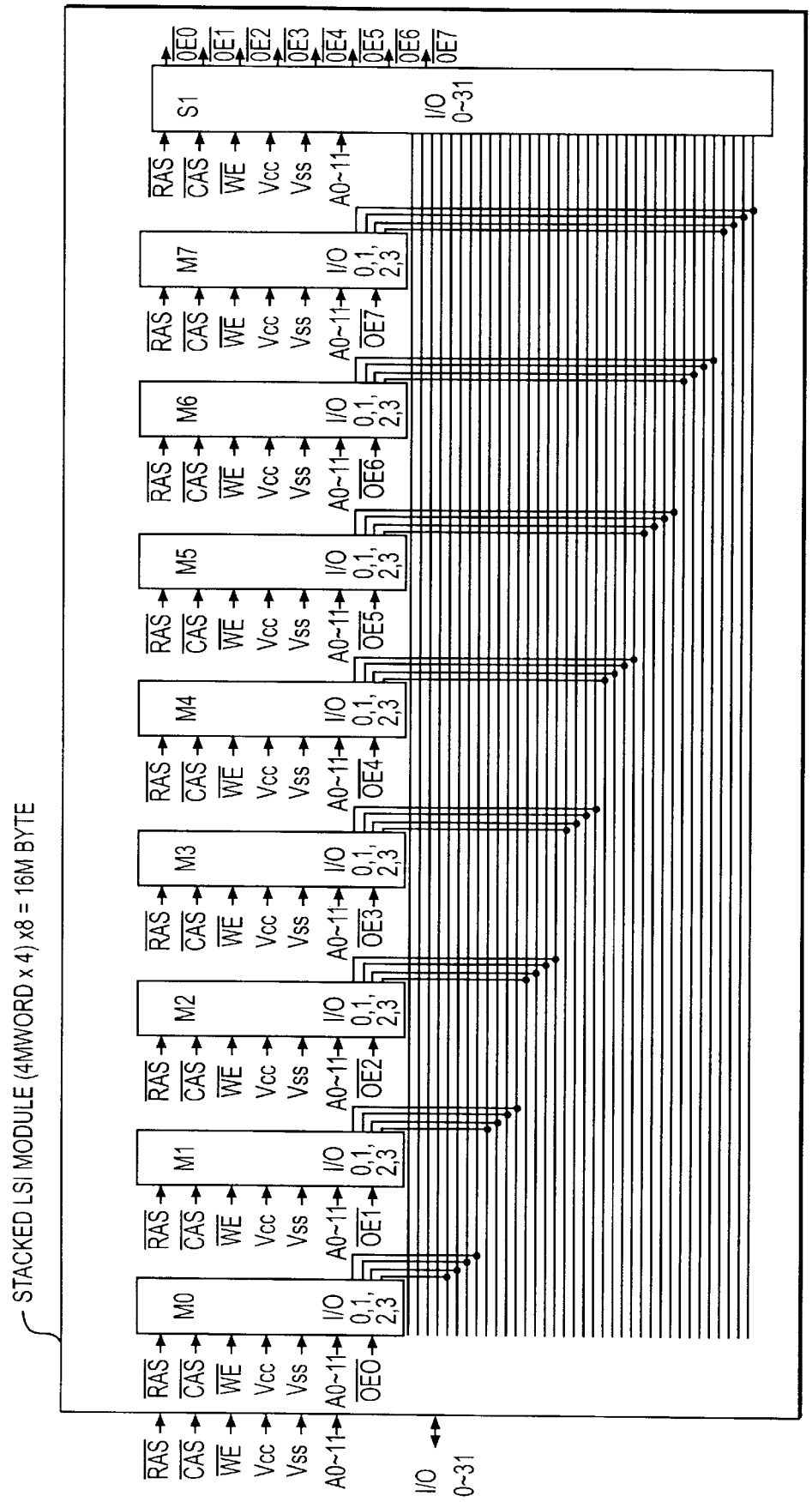
FIG. 122 is a block diagram showing another embodiment of the DRAM module.

FIG. 122 is a block diagram showing another embodiment of the DRAM module according to the present invention. This embodiment is directed to a mother socket of 72 pins. In other words, eight dynamic RAMs having a construction of about 4 M (Mega) words×4 bits are combined to construct a memory module of about 16 Mbytes.

The eight DRAM chips $M_0$ to $M_7$ are individually subjected to a memory access in units of 4 bits and are given a storage capacity of about 4 Mwords (or totally about 16 Mbits). Thus, the address signals are composed of A0 to A11 of 12 bits. The data terminals of the stacked LSI module are IO0 to IO31 of 32 (bits), and the eight dynamic RAMs $D_0$ to $D_7$ individually assign 4 bits so that the memory access is executed in units of 32 bits as a whole.

The individual DRAM chips $M_0$ to $M_7$ are fed as the memory modules in parallel with the inputted control signals /RAS, /CAS and /WE. Moreover, the power supply voltage VCC and the circuit ground potential VSS are also commonly connected. When the eight dynamic RAMs are accessed in parallel as above, the read signals from the memory chip, in which a defect exists, are masked by utilizing the output enable signals /OE0 to /OE7 which are not used in the memory module of the prior art.

In the memory module having the aforementioned stacked structure, the later-described defect relieving LSI (S1) is used so as to relieve a defect at the unit of word lines (or refresh addresses) in each DRAM. The defect relieving LSI, deemed as the DRAM module as above, is given the same input interface as that of the dynamic RAM and a data input/output interface corresponding to the data bus of the memory module. Moreover, the output enable signals /OE0 to /OE7, generated in the mask portion of the defect relieving LSI, are fed to the output enable terminals /OE0 to /OE7 of the individual memory chips M0 to M7. The connector electrodes, composed of seventy two pins of the not-shown memory module, are formed in the mother socket similar to the aforementioned PGA.

Figure 123:
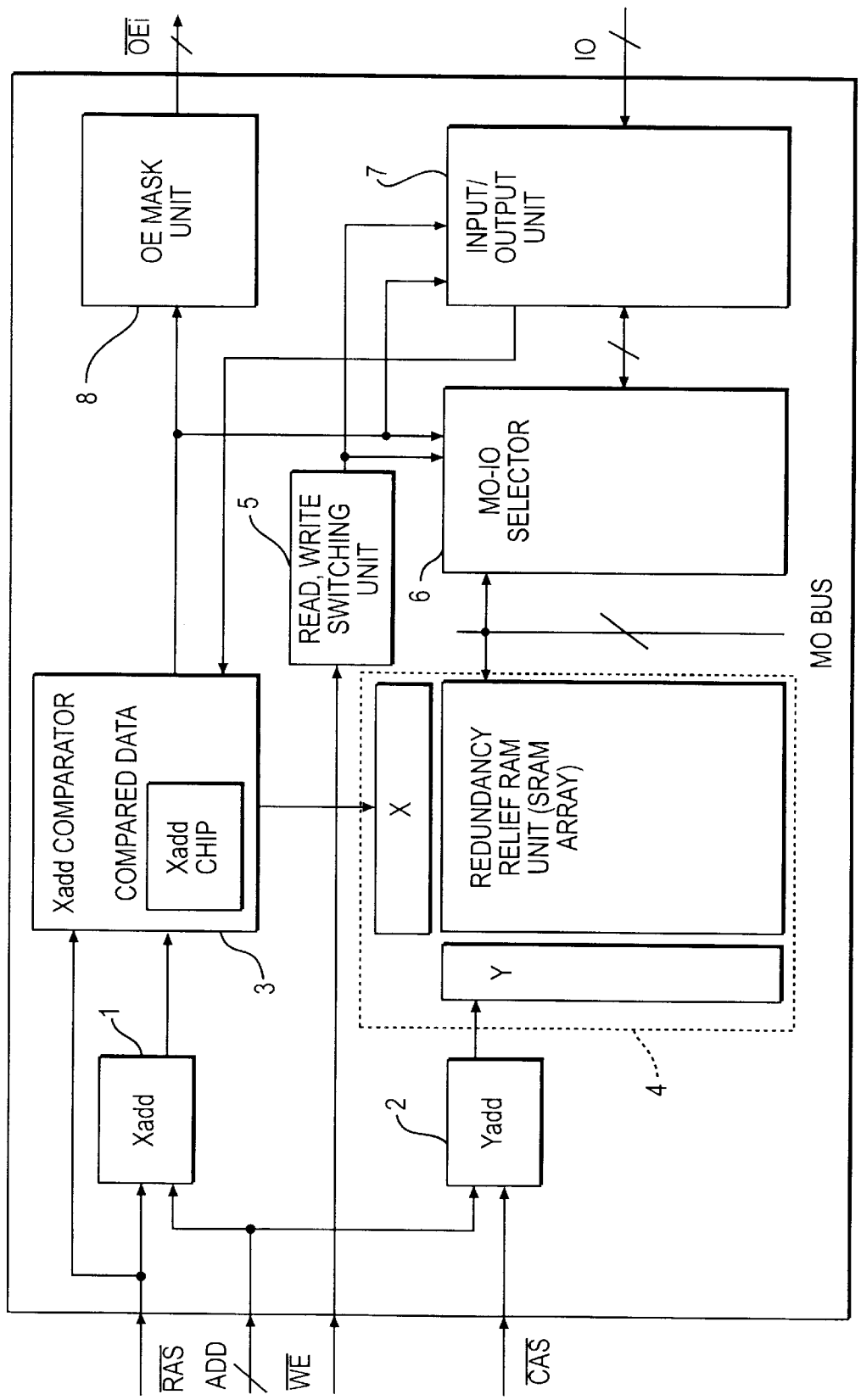
FIG. 123 is a block diagram showing one embodiment of a defect relieving LSI.

FIG. 123 is a block diagram showing one embodiment of the aforementioned defect relieving LSI. The individual circuit blocks of FIG. 17 are formed over one semiconductor substrate of single crystal silicon by a technique of manufacturing conventional semiconductor integrated circuits like the DRAMs.

An X-address buffer (Xadd) 1 and a Y-address buffer (Yadd) 2 are made identical to the X-address buffer and the Y-address buffer of the dynamic RAM. In other words, the X-address buffer 1 takes in the X-address signals in synchronism with the row address strobe signal /RAS. The Y-address buffer 2 takes in the Y-address signals in synchronism with the column address strobe signal /CAS. Here, the symbol / (slash) indicates the over bar representing that the row level is the active level in the drawing. This representation likewise applies to the over bars attached to other signals.

An X-address (Xadd) comparator 3 is given a function to store a defective address and a function to compare the inputted X-address and the stored defective address. In order that the defective address may be easily written in the packaging substrate while realizing those functions with the simple construction, the comparator 3 is constructed of a memory circuit made of a non-volatile storage element. In other words, the memory circuit constructing the comparator 3 stores the data like the EPROM or the flash EPROM in accordance with the amount of the electrons which are stored in the floating gate of the non-volatile storage element having a control gate and the floating gate.

The aforementioned comparator 3 is constructed of a memory circuit. This memory circuit is written with the defective chip address, the relief flag and the X-address of a redundancy relief RAM unit 4 to be used for replacing the defective word lines, by performing the memory access with the X-address signal. If the data corresponding to the X-address inputted by the memory access are read out to represent that the relief flag is valid, it is judged that the comparison is satisfied, and the X-address read out is fed to the X-selector of the redundancy relief RAM unit 4.

The redundancy relief RAM unit 4 is constructed of an SRAM for screening the word lines with the X-address outputted from the comparator 3 and the Y-line with the Y-address taken in by the Y-address buffer 2. The comparator 3 is fed with the /RAS signal, although not especially limited thereto, and it is operated in synchronism with the operation of the dynamic RAM by making the reading operation effective when the /RAS signal is active.

A read/write switching unit 5 judges that the operation is a write operation, if the write enable signal /WE is at the low level, and a read operation if at the high level, and controls the signal transmission direction of a select unit 6 and an input/output unit 7. The select unit 6 connects an input/output data bus $M_0$ of the redundancy relieving RAM unit correspondingly to a data bus IO which is connected with a defective dynamic RAM. The input/output unit 7 has an input/output corresponding to the data bus, which is connected with a plurality of dynamic RAMs, and selects and actuates the input/output circuit corresponding to the data bus which is connected with the defective dynamic RAM. A mask unit 8 generates the output enable signal /OE for bringing the output circuit of that dynamic RAM to the high impedance state, in accordance with the defective chip address from the comparator 3.

This comparator 3 is constructed of an EPROM array. However, no erasing window is formed for the array unit because an erasure with ultraviolet radiation is not required unlike ordinary EPROMs. In other words, the EPROM array means the use of same memory array as EPROMs, and the erasure is impossible unlike the general EPROM so that substantially only one time is allowed for the writing operation. In the present embodiment, the defective address or the like is stored, and the erasure is rather inhibited.

In the EPROM array acting as the comparator 3, the X-address has 4,096 word lines correspondingly to the refresh address of the DRAM. Moreover, the data line is composed of 32 lines. These 32 data lines have to be electrically written with the defective address or the like so that the write data may be accordingly inputted and so that as many as two word lines may be relieved at the same X-address.

If the number of redundancy sets is ensured for 128 word lines, it can be designated by the address signal of 8 bits. In order to designate the defective chip of the eight DRAMs, on the other hand, a chip address of 3 bits is required. Moreover, 1 bit is required as a relief flag indicating whether or not a defective address is stored in the read data. In order to relieve the defective word line of one DRAM with the X-address, data of 11 bits are required. However, the writing operation in units of 32 bits is convenient, as described above, and the data are so sufficient that two regions are ensured for relieving the defective word lines of as many as two DRAMs to enhance the relieving ability. Specifically, the data of 32 bits read out are divided into 16 bits, of which 11 bits are validated to output the address signals for the relieving regions 1 and 2 and two sets of the chip address signals.

When the number of redundancy sets is reduced to 64 so that its address signal is composed of 6 bits, the data necessary for relieving one DRAM with the X-address can be reduced to 10 bits. As a result, the maximum 3 sets can be relieved if the memory access of the memory circuit of 32 bits is to be made. In other words, the maximum three DRAM at the common X-address can be relieved if a defect occurs in the word lines.

The write circuit is provided, although omitted in FIG. 123. In order to take in the data of 32 bits, as described above, the signal of 32 bits is fed as a write signal to the data lines of the EPROM array through the input/output unit. In the non-volatile storage element, a voltage as high as about 12 V is applied to the word lines, and a voltage as high as about 10 V is fed to the data lines to be written, to inject hot electrons near the drain of the storage element into the floating gate.

The redundancy relieving RAM unit 4 has a storage unit composed of an SRAM array. When there are two sets of relief regions, two identical SRAMs are provided to give 128 redundancy word lines at the maximum. In short, the SRAM has 128 word lines, with which are individually connected 4,096 memory cells. As a matter of fact, if the word lines are elongated to increase the memory access time, the word lines can be suitably divided to reduce the number of memory cells to be connected with one physical word line.

In the aforementioned redundancy relieving RAM unit 4, the column screening operation is executed by the Y-address (Yadd) so that the memory access is performed in units of 4 bits. For this operation, four pairs of common data lines are provided and connected with the $M_0$ buses each equipped with the main amplifier. This main amplifier is rendered inoperative, when in the writing operation, to transmit the signals from the $M_0$ buses to the common data lines.

The OE mask unit 8 decodes the chip address of 3 bits, read out from the comparator, by a decoder and masks the output enable signal /OE, which is generated by the built-in timing generator, to retain the output enable signal corresponding to the chip of the relieved DRAM, at the high level thereby to change its output into the high impedance state.

The timing generator, as disposed in the OE mask unit 8, lowers the output enable signal /OE to the low level when it is brought into the reading operation by the write enable signal /WE. In the writing operation, therefore, the timing generator leaves the output enable signal /OE at the high level so that the function of the mask unit is substantially stopped. In other words, in the writing operation, the redundancy relieving RAM unit 4 is written, and the DRAM having a defective work line is also written.

A meaningless writing operation is executed for the defective word line, as described above. In the reading operation, the meaningless writing operation is ignored so that the stored data are outputted with no practical problem from the redundancy relieving RAM unit. Thus, there is required any special control circuit that will stop the memory access of the DRAM having a defective word line in the writing operation thereby to simplify the circuit.

The MO-IO selector 6 connects the input/output lines of the redundancy relieving RAM unit 4 and the input/output unit 7. In other words, over the memory module, the DRAMs $M_0$ to $M_7$ are shared by 4 bits over the data bus of 32 bits. As a result, a selector is required for fitting the bits corresponding to the DRAM having a defective word line. Especially when two relief regions are formed in the same X-address, as described above, connections are individually required for the relief of one DRAM and for the relief of two DRAMs.

The $M_0$ bus on the redundancy relieving RAM unit 4 side is equipped with the selector for connecting with arbitrary 4 bits of the data terminals to be connected with the input/output terminals of 4 bits of the DRAMs $M_0$ to $M_7$. This selector is given a tri-state output function such as that of the clocked inverter circuit thereby to connect two pairs of $M_0$ buses in units of 4 bits with the input/output unit 7 of 4 bits. The aforementioned selector is provided so bidirectionally as to cover both the writing and reading operations. Incidentally, if the CMOS transfer gate circuit is used, no amplifying function is achieved unlike the case of using the clocked inverter circuit. On the other hand, the signals can be bidirectionally transmitted by one selector to simplify the circuit.

In this embodiment, in the aforementioned stacked DRAM module, the defect of each DRAM chip is relieved in units of a word line. The percent defective occurring in each DRAM chip is so small, taken in units of word line, that the percent non-defective can be further increased as the stacked DRAM module.

In the semiconductor chip to be mounted on the DRAM module according to the present invention, the functions of the circuit are tested by the probing to be executed when the circuit is formed over the semiconductor wafer, so that the defective word line and the defective bit line are relieved for the aforementioned structure having the redundancy circuit. Therefore, the defect to be relieved by the redundant hierarchy selector, disposed in the aforementioned mother socket, or by the aforementioned redundancy relieving LSI is an initial defect to be caused by the aging or burn-in test. Therefore, the percent defective is relatively low so that the percent non-defective can be increased as the DRAM module by the aforementioned relieving method.

As described above, the redundancy relieving RAM unit has an ability to relieve relatively many defective bits. By utilizing this, the chips, judged to be defective by the aforementioned probing, may be combined and relieved by the redundancy relieving RAM unit. In short, the memory module can be formed by using the chip which has been judged to be defective because it cannot be relieved by its own redundancy circuit, so that the substantial production yield can be enhanced.

By making use of this, the DRAM chip for the DRAM module according to the present invention can be simplified by omitting the redundancy function. In other words, the DRAM module may be assembled while leaving the defective bit detected in the probing as it is, so that it may be relieved as a whole together with the defect, as detected after the aging, by the aforementioned redundancy relieving LSI.

The following effects can be obtained from the present embodiment.

(1) The number of DRAM chips stacked is larger by +1 than that of the data input/output bits, and the mother socket has a wiring pattern in a ring shape for one module lead connectable to the input/output leads of two semiconductor chips. When one of the semiconductor chips is defective, the module leads of the mother socket and the input/output leads of each semiconductor chip are connected except the input/output leads corresponding to the defective chip. As a result, the percent non-defective of the DRAM module can be enhanced to a practical level by the simple construction.

(2) The number of DRAM chips is N+1. When all the semiconductor chips are non-defective, the connection pins and the module leads of the mother socket are connected and used as a memory having parity bits so that one bit is used as the parity bit. When one semiconductor chip is defective, the module leads of the mother socket and the input/output leads of each semiconductor chip except the input/output leads corresponding to the defective chip are connected and used as a memory of N bits. As a result, the memory chips in the module can be effectively used while retaining a substantial percent of non-defective.

(3) The number of semiconductor chips stacked is N+1 with respect to the number of bits N of the data input/output bits, N LSI chips out of the semiconductor chips are DRAM chips whereas the remaining one semiconductor chip is a defect relieving chip for relieving the defective bit which occurs in the N DRAM chips. As a result, the percent nondefective of the DRAM module can be enhanced to a practical level.

(4) The aforementioned N DRAM chips have a defect which is within the range of the relieving ability of the defect relieving chip. As a result, the substantial production yield of the DRAM chip can be enhanced.

(5) The aforementioned wiring pattern is a ring-shaped wiring pattern connectable to the input/output signal leads of two semiconductor chips, and the connection of the wiring patterns is effected by soldering. As a result, a flexibility can be given in the redundancy function and in the connection between the leads of the semiconductor chips and the module leads.

(6) The input/output signal leads of each semiconductor chip are arranged in a ring shape in the wiring pattern, and the wiring patterns are selectively cut by irradiating the wiring patterns suitably with an energy beam so that one input/output leads may be connected to only one module lead. As a result, a flexibility can be easily given in the redundancy function and in the connection between the leads of the semiconductor chips and the module leads.

Here will be described an embodiment of the intelligent module which is prepared by combining the DRAM module of the present invention with either an error correcting circuit chip or an address, clock or I/O buffer chip.

Figure 124:
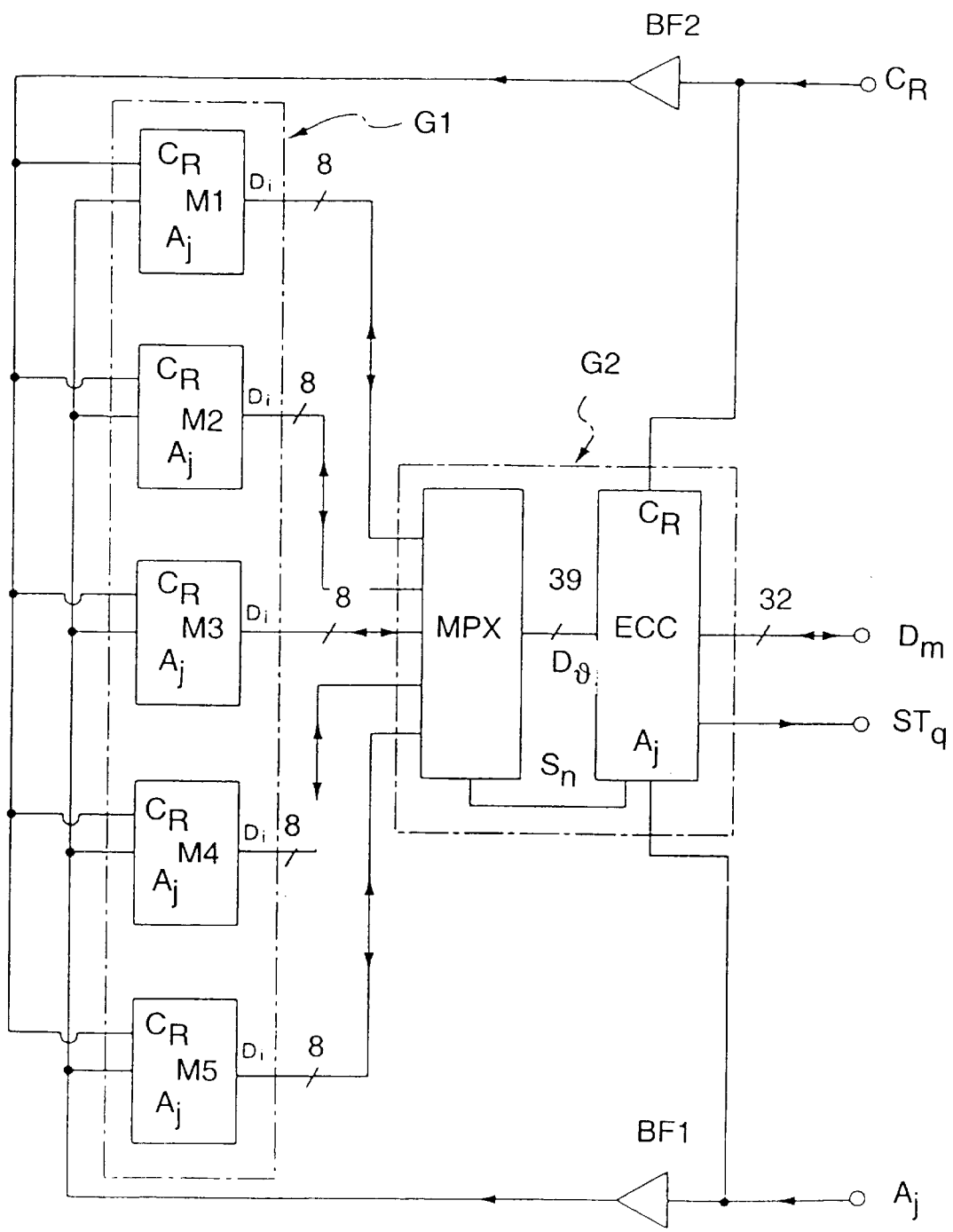
FIG. 124 is a block diagram showing an intelligent module.

FIG. 124 is a block diagram of the intelligent module of the present embodiment and shows the case using a DRAM chip of 64 Mbits having a construction of [8388608 words×8 bits]. Generally speaking, when defects of 2 bits are simultaneously detected by an error correcting circuit of a simultaneous defect of 1 bit, the bit number is 5 bits for a data length of 8 bits, 6 bits for a data length of 16 bits, and 7 bits for a data length of 32 bits. Here will be described the case of 8388608 words×32 bits.

In FIG. 124, reference symbols M1 to M5 designate DRAM chips of 64 Mbits having a construction of [8388608 words×8 bits]. These five DRAM chips are encapsulated as a whole into one package to construct a block G1. Each of the DRAM chips (M1 to M8) has eight bidirectional I/O (Di), the total number of which is 40 bits. Each of the DRAM chips (M1 to M5) is connected through a buffer BF1 with an address signal (Aj) and further through a buffer BF2 with a clock signal (Ck). These buffers BF1 and BF2 may be conveniently contained in a later-described block G2, although they can be omitted.

The I/O of 40 bits is connected to an I/O selector MPX in the block G2 so that an I/O of 40 bits matching the error correcting circuit can be arbitrarily selected. This I/O selector MPX may be constructed of the FPGA (Field Programmable Gate Array) using the EEPROM (Electrically Erasable PROM) technique, and selects thirty nine (D1) of the forty I/O terminals, in which no two bit defects simultaneously occur, on the basis of the testing result of the block G1 while using the remaining one I/O terminal for the redundancy.

The bidirectional I/O selector MPX is connected with an error correcting (parity code generating or restoring) circuit ECC to use the number of data+the number of parities=32 bits+7 bits. This number is inputted/outputting as the error-corrected 32 bits I/O (Dm) for the outside. There may be provided, if necessary, a status output terminal (STq) for reporting the presence or absence of an error from the error correcting circuit ECC, an error detection of 1 bit and an error detection of 2 bits.

In order that a change in the address may be detected to accelerate the access by doing the interface of each clock, the address (Aj) and the clock (Ck) are connected in the block G2. Moreover, the I/O selector MPX and the error correcting circuit ECC are controlled using a control signal (Sn).

According to the system thus far described, the DRAM chips (M1 to M5) of the block G1, encapsulated into the package, can use either non-defective chips with no burn-in test or a defective chip. Specifically, when the block having five stacked and encapsulated non-defective chips is subjected to the burn-in test, a chip partially having a defective bit appears. In the case of the present embodiment, the defect can be corrected if only 1 bit of 39 bits is simultaneously defective. Even if, moreover, the defective chip is used under the aforementioned condition, the error is corrected so that the correct data of 32 bits can be inputted/outputted at all times. This means that a sudden alpha ray error or a refresh margin defect in the memory mat can also be corrected.

Figure 125A:
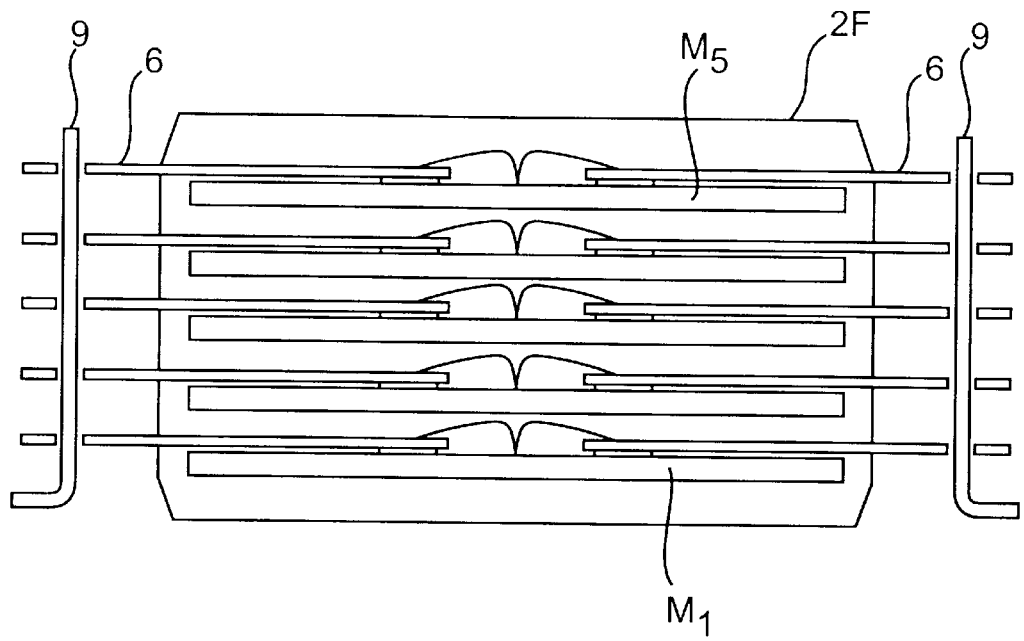

When the module having the aforementioned error correcting circuit is to be manufactured, the five DRAM chips (M1 to M5) constituting the block G1 are encapsulated at first into the package 2F, as shown in FIG. 125(a), by using the insert mold 40 of the foregoing embodiment, and the leads 6 and the module leads 9 are connected by soldering. Next, the package 2F is subjected to the burn-in test to determine 39 bits in the 40 bits. The burn-in test of the package 2F may be carried out before the connection of the leads 6 and the module leads 9.

Figure 125B:
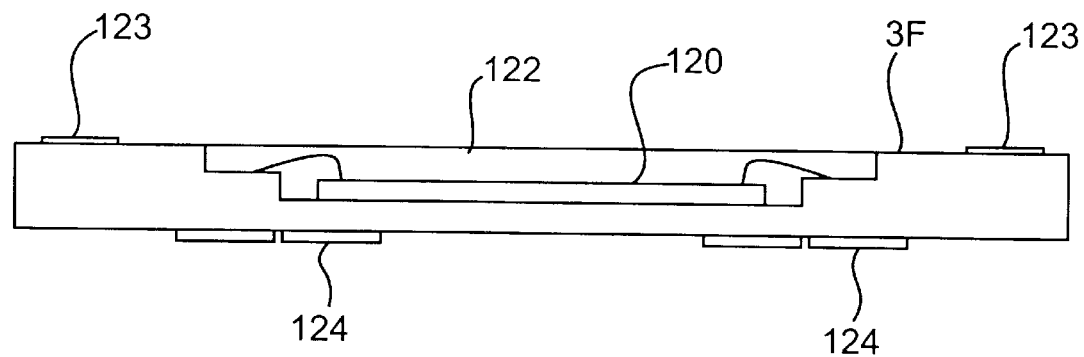
FIG. 125(b) is a diagram of a construction of the mother socket.

As shown in FIG. 125(b), on the other hand, the I/O selector MPX and the error correcting circuit ECC, constituting the block G2, are formed in another semiconductor chip 120 and are packaged in a mother socket 3F by using the wire bonding method or the like. This mother socket 3F is constructed of a printed circuit board for the BGA (Ball Grid Array) made of a BT resin. The semiconductor chip 120 is encapsulated with a potting resin 122 after wirebonded. This block G2 is also subjected to the burn-in test and selected separately from the package 2F (the block G1).

Next, terminals of the pogo pin type are applied to the electrodes 123 and 124 of the mother socket 3F so that the data of the block G1 are programmed in the semiconductor chip 120. For this, there are formed in the semiconductor chip 120 a PLD (Programmable Logic Device) having the ROM function such as an EEPROM or a flash memory, or an FPGA.

Figure 126:
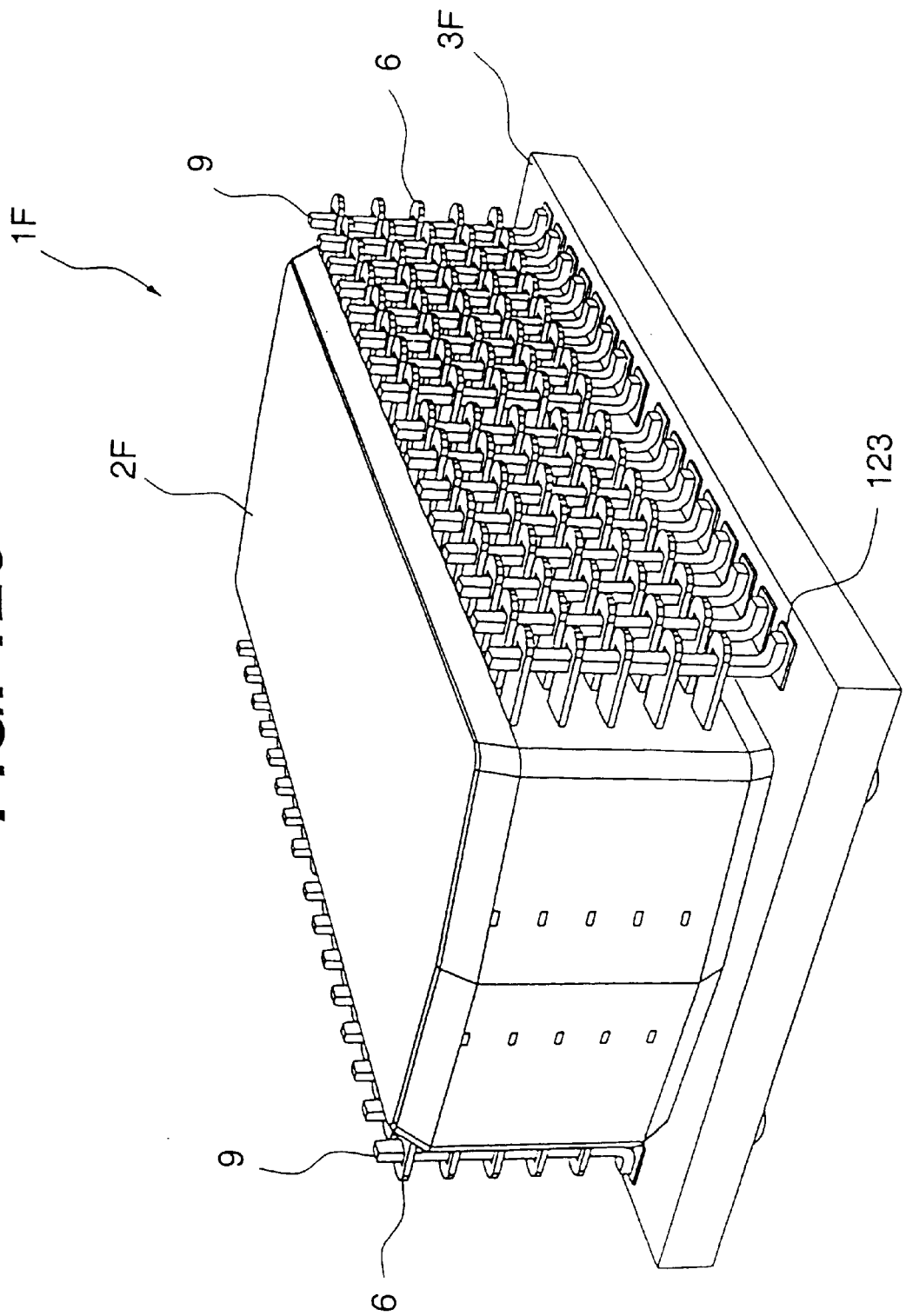
FIGS. 126 and 127 are perspective views showing the intelligent module.
Figure 127:
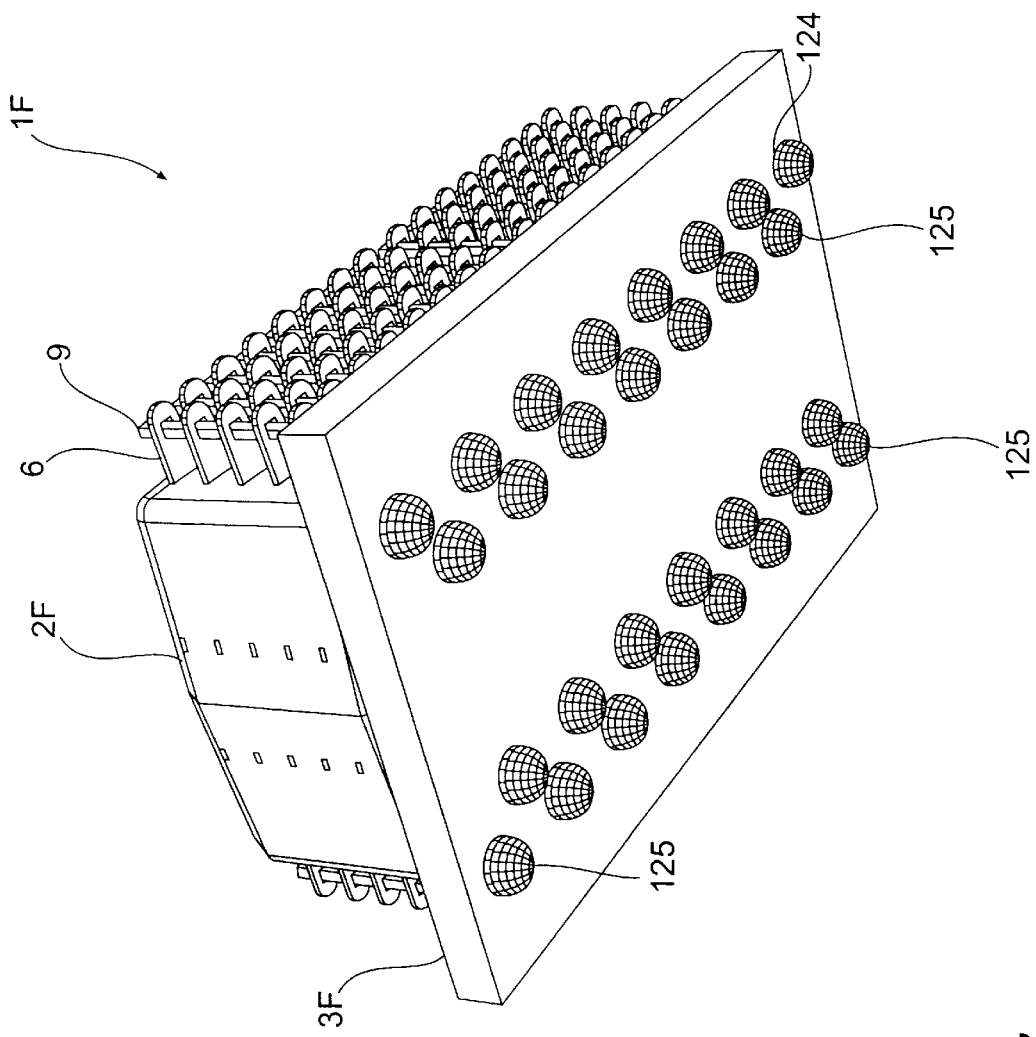

After this, the package 2F is mounted on the mother socket 3F, as shown in FIGS. 126 and 127, to complete the intelligent module 1F of the present embodiment. The connection between the module leads 9 of the package 2F and the electrodes 123 of the mother socket 3F are carried out by irradiating them with a laser beam or a light beam or by blowing hot air locally. As a result, it is possible to prevent the thermal stress upon the semiconductor chip 120 which is programmed with the data of the block G1. The application of solder bumps 125 to the electrodes 124 on the back of the mother socket 3F is carried out before the semiconductor chip 120 is programmed with the data of the block G1. As a result, it is possible to prevent the thermal stress upon the semiconductor chip 120 which is programmed with the data of the block G1.

Here will be described another example in which the DRAM module structure of the present invention is applied to an incomplete product of the 16 M-DRAM.

Usually, the I/O 4-bit product of the 16 M-DRAM has a construction of [4194304 words×4 bits]. During the LSI manufacture, the I/O of 4 bits becomes partially defective so that the DRAM manufactured is incomplete to have non-defective constructions of [4194304 words×3 bits], [4194304 words×2 bits] and [4194304 words×1 bit]. These are usually handled as defective products so that they have a low commercial value. If they are brought into the market, on the other hand, the market is troubled in terms of the terminal array, the stable supply and the bit price.

Thus, here will be described the method of arraying those incomplete DRAM with the complete terminals by applying the present invention. Here is presented the case in which three layers of incomplete DRAMs having the construction of [4194304 words×3 bits] are stacked to make the DRAM module having a constant terminal array of [4194304 words×9 bits].

Figure 128:
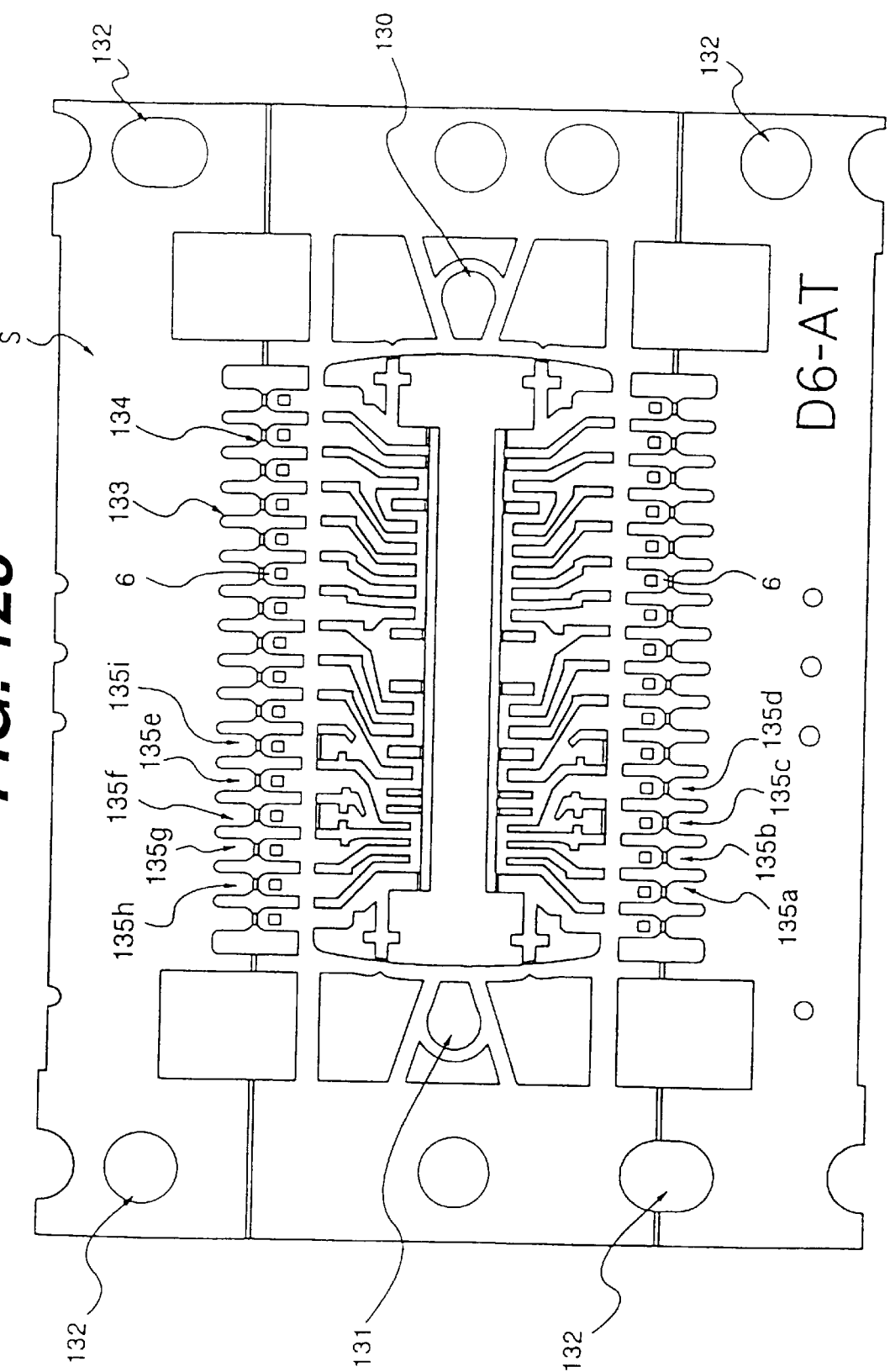
FIGS. 128 and 129 are top plan views showing the lead frame to be used in the intelligent module.
Figure 129:
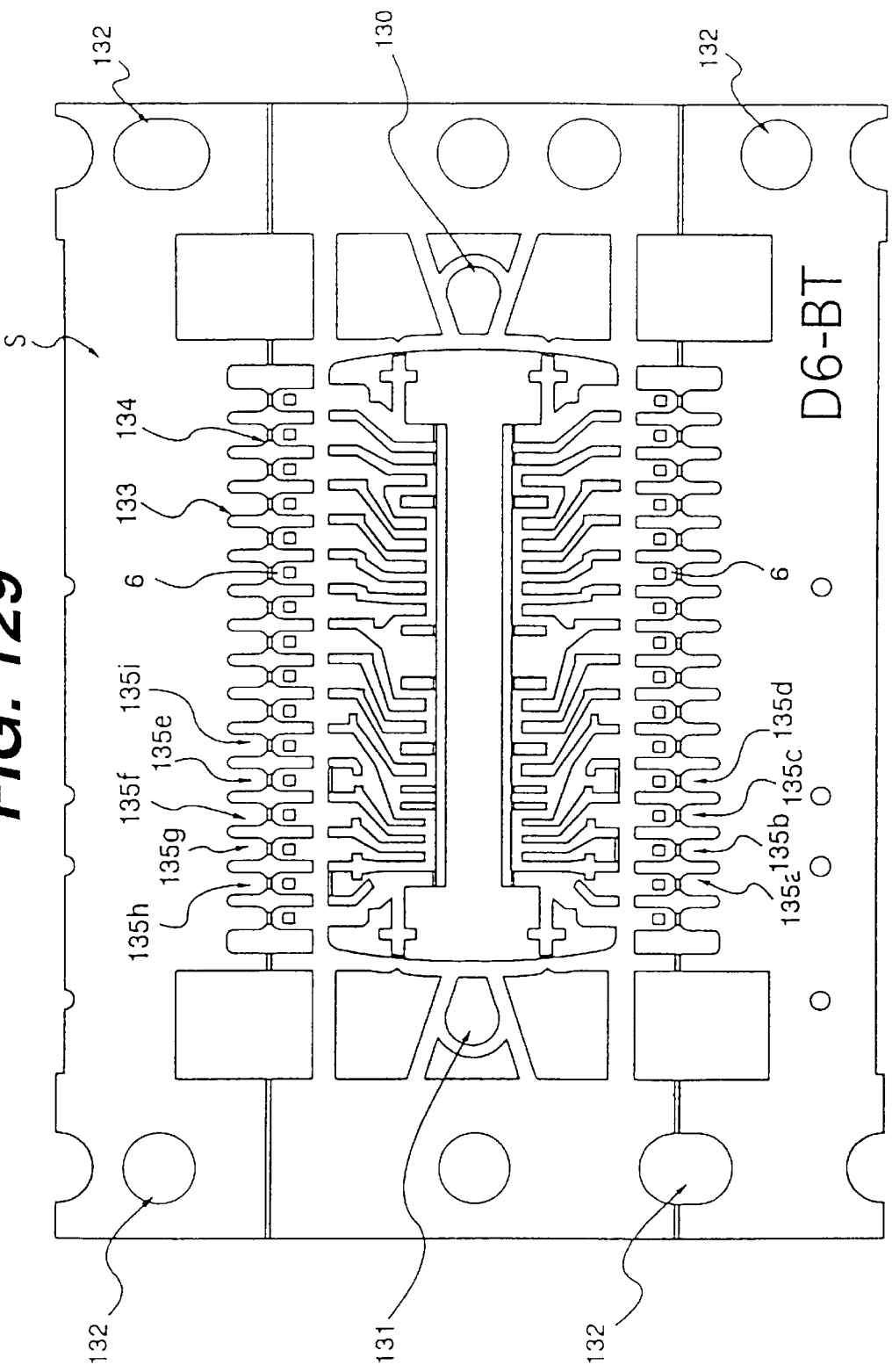

The lead frame (S) to be used has gate holes 130 and 131 and guide pin holes 132, as shown in FIGS. 128 and 129. In order to prevent the deformation of the lead frame in the mold, moreover, tie bars 133 for enhancing the structural strength are connected to the leading ends of the individual leads 6. In order to facilitate the cutting of the unnecessary portions after the molding step, grooves 134 are formed by the aforementioned half-etching method.

There are nine I/O terminals of each lead frame (S), designated by 135a to 135i. The I/O terminals 135c, 135f and 135i of FIG. 128 make use of the half-etched grooves 134, formed in the tie bars 133, and are removed after the tie bars are cut. The I/O terminals 135a, 135d, 135h and 135e of FIG. 129 are likewise removed.

Since each DRAM chip has three I/O terminals, the first-layered lead frame is, a lead frame (S) shown in FIG. 128, and a non-defective I/O is bonded to the I/O terminals 135b, 135h and 135e. The second-layered lead frame is a lead frame (S) shown in FIG. 129, and a non-defective I/O is bonded to the I/O terminals 135c, 135f and 135i. The third-layered lead frame is a lead frame (S) shown in FIG. 128, and a defective I/O is bonded to the I/O terminals 135a, 135d and 135g. The defective I/O pad is not bonded.

When the three lead frames (S) are stacked, the I/O terminals of 9 bits 135a to 135i are led out. Specifically, the incomplete DRAM chip of [4194304 words×3 bits] are bonded selectively at only the non-defective I/O to the lead frames (S) so that a DRAM module of [4194304 words×9 bits] having the complete I/O terminals can be manufactured after being stacked.

The three-layered mold package of the present embodiment is thinner than the SOJ package and has an integration of 36 Mbits so that the 72-pin SIMM module having a construction of [8388608 words×35 bits] or [4194304 words×36 bits] can be small-sized. In other words, the construction of [4194304 words×35 bits] usually has to be prepared by packaging totally twelve, i.e., eight DRAM chips of [4194304 words×4 bits] and four DRAM chips [4194304 words×1 bit], but the DRAM module of the present embodiment can be realized by packaging four. Likewise, totally twenty four chips are usually required for the construction of [8388608 words×36 bits], but only eight is sufficient for the DRAM module of the present embodiment. Moreover, the DRAM module of the present embodiment can reduce the number of wires on the printed circuit board of the SIMM to reduce the noise such as the crosstalk between the wires.

Figure 130:
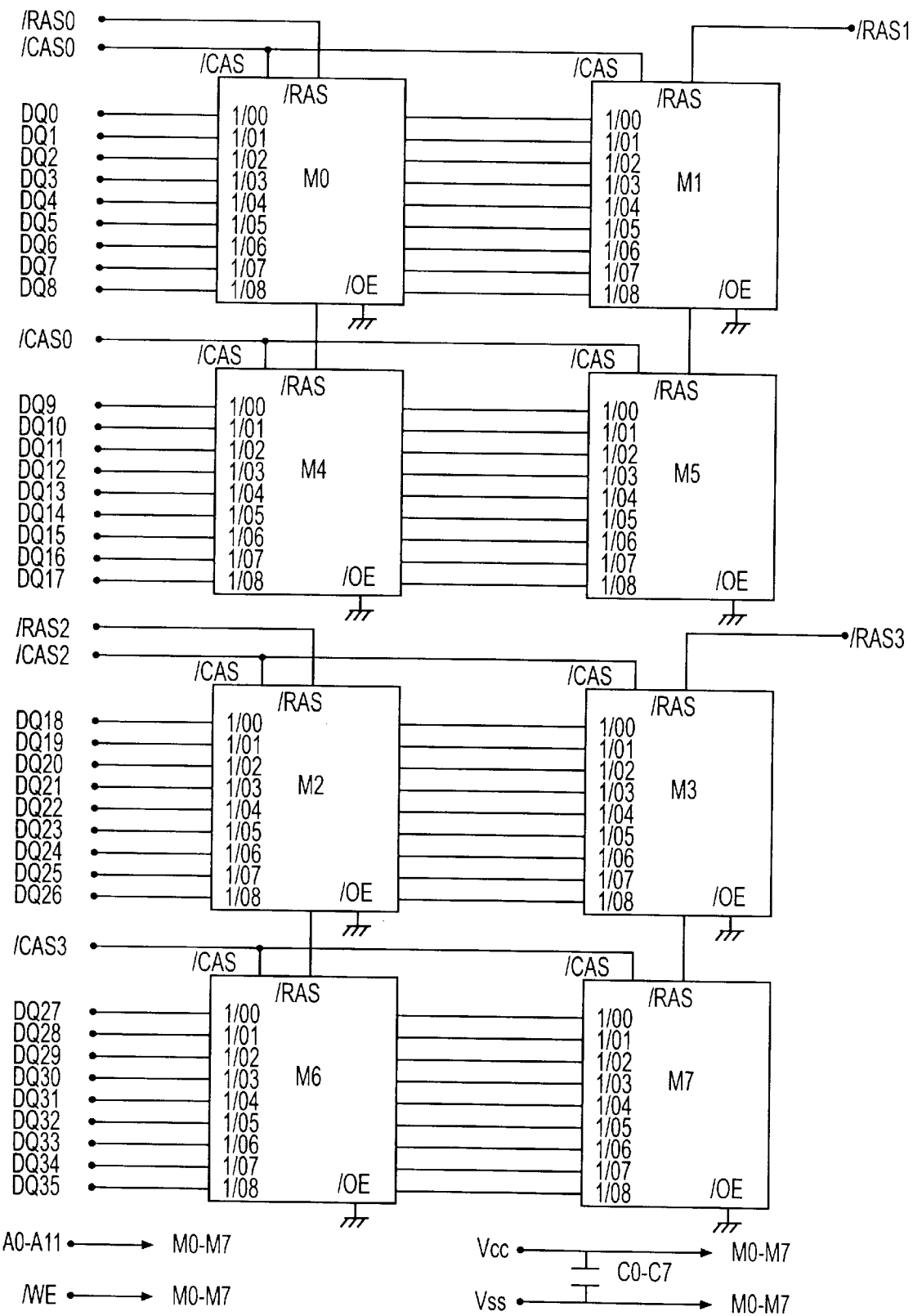
FIG. 130 is an equivalent circuit diagram showing another embodiment of the DRAM module.

FIG. 130 is an equivalent circuit diagram of the DRAM module having the construction of [8388608 words×36 bits] when eight DRAM chips (M0 to M7) of [4194304 words×9 bits] are used. This diagram presents the equivalent circuit of the DRAM module of [4194304 words×36 bits] when the shown DRAM chips (M1, M5, M3 and M7) are not mounted.

The DRAM module of [4194304 words×8 bits] can be realized by stacking two DRAM chips of [4194304 words×3 bits] and one DRAM chip of [4194304 words×2 bits]. In addition, the number stacked chips may be changed to the number of bits of the same I/O by using the DRAM chip of [4194304 words×1 bit]. As another method for achieving the [4194304 words×9 bits], for example, three [4194304 words×2 bits] and one [4194304 words×3 bits] may be combined and stacked to the four layers.

In order to share the lead frame of each layer in the stacked module, the bonding regions or the outer leads are provided, as in the lead frame shown in FIG. 128, so that they may be used by the plurality of layers. When the nine I/O 135a to 135i are led out completely independently, for example, the module having the construction of ×9 bits can be applied, using one kind of lead frame, to the individual layers regardless of the number of stacked layers. Then, the assembling steps can be drastically decreased to lower the cost manufacturing for the DRAM module remarkably.

Although our invention has been specifically described in connection with its embodiments, it should not be limited thereto but can naturally be modified in various manners without departing from the gist thereof.

Figure 131A:
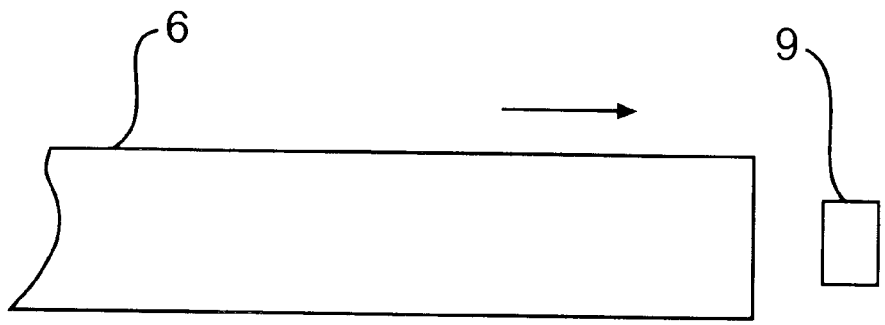
FIG. 131(a) is a top plan view showing another embodiment of the method of connecting the leads and the module leads and FIG 131(b) is a side elevation.
Figure 131B:
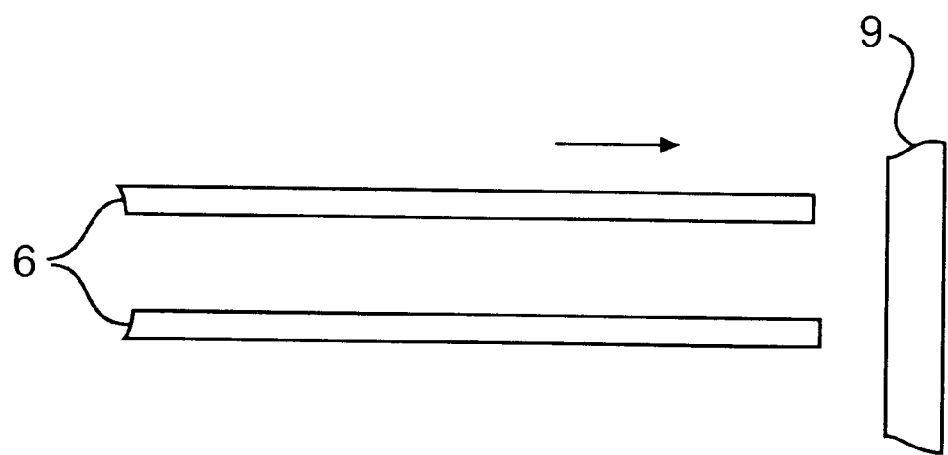
Figure 132:
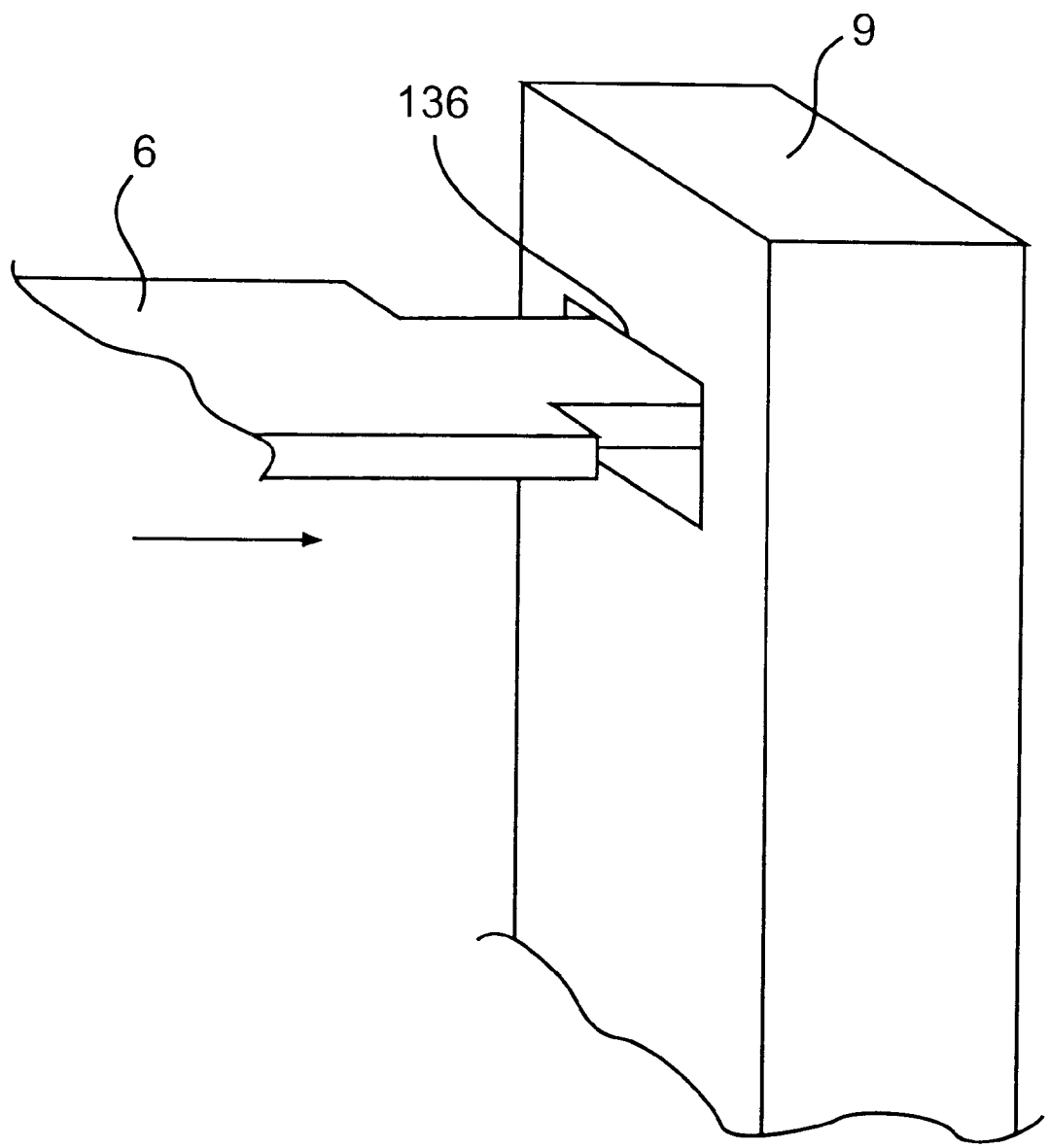
FIG. 132 is a perspective view showing another embodiment of the method of connecting the leads and the module leads.

In the foregoing embodiment, the leads of the package are connected to the module leads of the mother socket by inserting the module leads into the openings of the outer leads. These connections can be effected by a variety of methods such as the method of connecting the leading end of the lead 6 in abutment against the side wall of the module lead 9, as shown in FIG. 131(a) (a top plan view) and FIG. 131(b) (a side elevation), or the method of inserting the lead 6 into the opening 136 formed in the module lead 9, as shown in FIG. 132.

In the foregoing embodiment, a predetermined number of semiconductor chips are encapsulated into one or two packages. However, the semiconductor chips can be encapsulated into three or more packages, as included in the present invention. When the semiconductor chips are grouped and packaged in a plurality of packages, there can be selected one of a variety of combinations such as four layers+five layers, three layers+three layers+three layers, or four layers+four layers+one layer (especially for the parity). In this modification, moreover, the heat radiation efficiency can be improved by sandwiching heat radiation sheets of Al or Cu alloy having a high heat conductivity in the gaps between the separated packages.

The method of dividing the semiconductor chip into a plurality of packages and packaging them achieves marked effects if applied to the DRAM module of multi-bit construction, as described in connection with embodiment, or the SRAM module of high power consumption. There can also be conceived a method of decreasing the number of layers of the semiconductor chip in a region of low radiation efficiency and increasing the number of layers in a region of high radiation efficiency. When the lower package has a lower radiation efficiency than that of the upper package, for example, there can be adopted a structure in which four semiconductor chips are packaged into the upper package whereas two semiconductor chips are packaged into the lower package and in which the aforementioned radiation fins are attached between the packages and to the top and bottom portions of those packages.

In the aforementioned embodiment, there are buried in the mother socket of the DRAM module the semiconductor chips which have the error correcting circuit or the address, clock or I/O buffer circuits. In addition, semiconductor chips having DRAM controllers, memory managements and CPU may be mounted in the mother socket of the DRAM module and electrically connected with the semiconductor chips in the package through the module leads of the mother socket. The DRAM module itself of the present invention can be made very small so that the numerous microcomputers can be combined to assemble a high-performance computer system over one package substrate which can distributedly process the data discretely. In this modification, the address terminals and the data terminals can be shared by the connection pins, as described above, and used as a portion of the address bus or the data bus.

Figure 133:
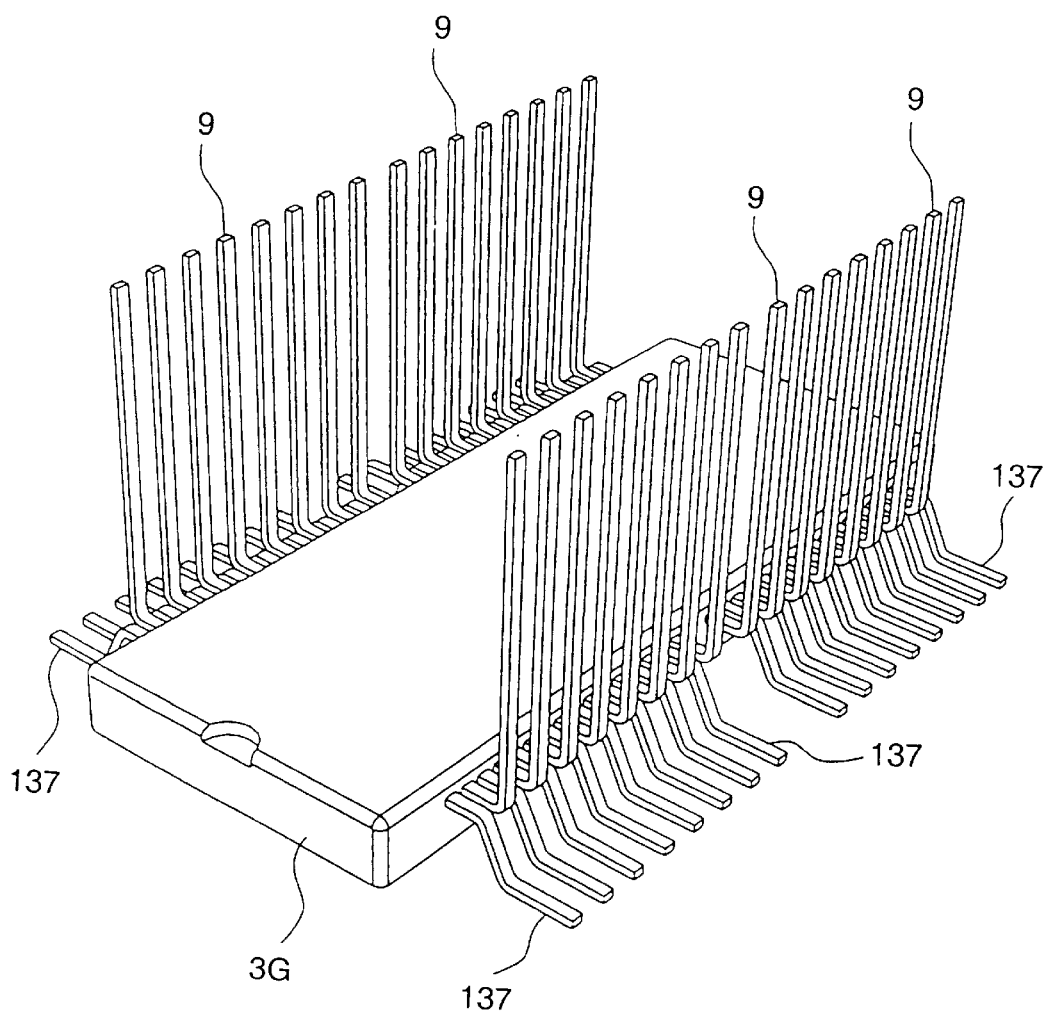
FIG. 133 is a perspective view showing another embodiment of the mother socket.

FIG. 133 is a perspective view of a mother socket 3G capable of packaging the aforementioned semiconductor chips. This mother socket 3G is equipped with the module leads 9 to be connected to the leads of the package, and a gull wing leads 137 connected to the printed circuit board. FIG. 134 is a perspective view showing a DRAM module 1G mounted with the package 2G on the mother socket 3G. This DRAM module 1G can be easily enabled merely by replacing the mother socket 3G to extend its functions, to improve the input impedance of the package 2G and to improve the driver ability of the output.

The foregoing embodiments have been described, taking the case in which the present invention is applied to the DRAM module. The module structure of the present invention can also be widely applied to a multi-chip module using another memory such as an SRAM or a flash memory or to a multi-chip module having a memory chip and a logic chip together.

As has been described hereinbefore, the stacked package of the prior art has a package unit structure in which, for example, package/an adhesive layer/a package/an adhesive layer—are stacked. The presence of the adhesive layers increases the heat resistance, and the resin thickness of the package is doubled to further increase the heat resistance.

On the contrary, the encapsulated mold structure of the present invention can reduce the heat resistance sufficiently because the stacked semiconductor chips are jointed through only thin uniform resin layers. By adding a high heat conductive filler such as silica to the resin, moreover, the heat conduction between the semiconductor chips or between the lead frames can be raised to further improve the reliability of the package.

As has been described hereinbefore, the multi-chip module of the present invention can realize a small-size/large-capacity memory module so that it finds a suitable application to a SIMM for an engineering workstation (EWS) or a personal computer requiring a memory of large capacity.

We claim:

1. A method for manufacturing a semiconductor integrated circuit device, comprising the steps of:

constructing a plurality of lead frames, each of said frames having leads which each include an inner portion and an outer portion;

electrically connecting a semiconductor chip to said inner portion of said leads of each frame;

stacking said lead frames one above each other to form a vertical stack;

inserting a plate between each of said lead frames, each said plate having an opening in the center thereof whereby a central cavity is formed in said stack;

placing said stack between a top mold member and a bottom mold member;

injecting a resin into said central cavity;

curing said resin to form a single resin package encapsulating said semiconductor chips of said lead frames; and releasing said resin package from said mold members.

2. A method for manufacturing a semiconductor integrated circuit device according to claim 1, further comprising a step of:

electrically connecting said outer portions of said leads of said stacked frame to mother leads.

3. A method for manufacturing a semiconductor integrated circuit device according to claim 1 wherein each of said plates comprises a first plate portion having an inner edge and a second plate portion having an inner edge, said inner edges normally abutting one another, said inner edges further each having a cutout portion, said cutout portions being in adjoining relationships to form said opening in said plate.

4. A method for manufacturing a semiconductor integrated circuit device according to claim 3 wherein said first plate portion and said second plate portion are separable from each other and said method further includes a step of removing said first and second plate portions after said resin package has been formed.

5. A method for manufacturing a semiconductor integrated circuit device according to claim 1, wherein four lead frames mounted with the semiconductor chips are encapsulated in one resin package.

6. A method for manufacturing a semiconductor integrated circuit device according to claim 2, further comprising a step of:

bending said mother leads in a direction away from said resin package.

7. A method for manufacturing a semiconductor integrated circuit device according to claim 1, further comprising a step of:

injecting the resin into said cavity through an opening in one of said top and bottom mold members and through corresponding openings in said lead frames.

8. A method for manufacturing a semiconductor integrated circuit device, comprising the steps of:

preparing first and second semiconductor memory chips, each chip having a main surface, a plurality of first bonding pads arranged on said main surface of said first semiconductor memory chip, a plurality of second bonding pads arranged on said main surface of said second semiconductor memory chip and positioned identically with said first bonding pads;

preparing first and second lead frames, the first lead frame having first leads each including an inner portion and an outer portion, the second lead frame having second leads each including an inner portion and outer portion;

electrically connecting said first bonding pads to said first leads and said second bounding pads to said second leads;

stacking said second lead frame with said second semiconductor memory chip on top of said first lead frame with said first semiconductor memory chip;

placing a top mold member on top of said second lead frame and placing a bottom mold member under said first lead frame;

inserting a plate between said first lead frame and said second lead frame, said plate having a central opening therein so as to form a central cavity with said top mold member and said bottom mold member;

injecting a resin into said cavity so as to form a resin package encapsulating said first and second semiconductor memory chips and inner portions of said first and second leads;

curing said resin; and releasing said resin package from said top mold and said bottom mold member.

9. A method for manufacturing a semiconductor integrated device according to claim 8 further comprising a step of:

electrically connecting said outer portions of said first leads and said outer portions of said second leads to mother leads.

10. A method for manufacturing a semiconductor integrated circuit device according to claim 9, wherein each of said first leads and said second leads are connected by said mother leads commonly to the first bonding pads and the second bonding pads to input an address signal.

11. A method for manufacturing a semiconductor integrated circuit device according to claim 9, further comprising a step of:

injecting the resin into said cavity through an opening in one of said top and bottom mold members and through corresponding openings provided in said first and second lead frames.

* * * * *